(12) United States Patent
Or-Bach et al.

(10) Patent No.: US 10,002,865 B2
(45) Date of Patent: Jun. 19, 2018

(54) 3D SEMICONDUCTOR STRUCTURE AND DEVICE

(71) Applicant: Monolithic 3D Inc., San Jose, CA (US)

(72) Inventors: Zvi Or-Bach, San Jose, CA (US); Zeev Wurman, Palo Alto, CA (US)

(73) Assignee: MONOLITHIC 3D INC., San Jose, CA (US)

( * ) Notice: Subject to any disclaimer, the term of this patent is extended or adjusted under 35 U.S.C. 154(b) by 0 days. days.

(21) Appl. No.: 15/482,761

(22) Filed: Apr. 8, 2017

(65) Prior Publication Data
US 2017/0301667 A1    Oct. 19, 2017

Related U.S. Application Data

(63) Continuation-in-part of application No. 15/089,394, filed on Apr. 1, 2016, now Pat. No. 9,691,760, which
(Continued)

(51) Int. Cl.
| | |
|---|---|
| *H01L 27/06* | (2006.01) |
| *H03K 19/096* | (2006.01) |
| *H01L 23/34* | (2006.01) |
| *H01L 23/50* | (2006.01) |
| *H01L 23/48* | (2006.01) |
| *H01L 23/525* | (2006.01) |

(52) U.S. Cl.
CPC .......... *H01L 27/0688* (2013.01); *H01L 23/34* (2013.01); *H01L 23/481* (2013.01); *H01L 23/50* (2013.01); *H03K 19/096* (2013.01); *H01L 23/5252* (2013.01); *H01L 2224/16145* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/00* (2013.01); *H01L 2924/0002* (2013.01); *H01L 2924/00014* (2013.01); *H01L 2924/15311* (2013.01)

(58) Field of Classification Search
CPC ....... H03K 19/17736; H03K 19/17796; H03K 2005/00097; H01L 27/0688
USPC .............................................. 326/37–41, 47
See application file for complete search history.

(56) References Cited

U.S. PATENT DOCUMENTS

| | | | |
|---|---|---|---|
| 7,274,207 B2* | 9/2007 | Sugawara ........... | H01L 27/0207 257/E27.004 |
| 7,342,415 B2* | 3/2008 | Teig ................. | H03K 19/17736 326/113 |

(Continued)

*Primary Examiner* — Jason M Crawford
(74) *Attorney, Agent, or Firm* — Tran & Associates

(57) ABSTRACT

A 3D structure, the structure including: a first stratum overlaid by a second stratum, the second stratum is less than two microns thick, where the first stratum includes an array of memory cells including at least four rows of memory cells, each of the rows is controlled by a bit-line, where the array of memory cells includes a plurality of columns of memory cells, each of the columns is controlled by a word-line, and where the second stratum includes memory control circuits directly connected to the bit-lines and the word-lines, where the second stratum includes a first layer including first transistors and a second layer including second transistors, where the first layer includes a first bus, the first bus interconnecting a plurality of first logic units, where the second layer includes a second bus, the second bus interconnecting a plurality of second logic units.

20 Claims, 79 Drawing Sheets

Related U.S. Application Data is a continuation-in-part of application No. 14/828,517, filed on Aug. 18, 2015, now Pat. No. 9,318,408, which is a continuation-in-part of application No. 14/628,231, filed on Feb. 21, 2015, now Pat. No. 9,142,553, which is a continuation of application No. 13/796,930, filed on Mar. 12, 2013, now Pat. No. 8,994,404.

(56) References Cited

U.S. PATENT DOCUMENTS

| | | | | |
|---|---|---|---|---|
| 7,965,102 B1 * | 6/2011 | Bauer | ............ | H03K 19/177 326/37 |
| 7,969,193 B1 * | 6/2011 | Wu | ............ | H01L 25/0657 257/758 |
| 8,106,520 B2 * | 1/2012 | Keeth | ............ | H01L 23/50 257/777 |
| 2007/0103191 A1 * | 5/2007 | Sugawara | ............ | H01L 27/0207 326/38 |
| 2008/0143379 A1 * | 6/2008 | Norman | ............ | H01L 23/50 326/39 |
| 2012/0129301 A1 * | 5/2012 | Or-Bach | ............ | H01L 21/6835 438/129 |
| 2013/0049796 A1 * | 2/2013 | Pang | ............ | G01B 31/318513 326/16 |
| 2014/0103959 A1 * | 4/2014 | Andreev | ............ | H03K 19/018585 326/41 |
| 2014/0253196 A1 * | 9/2014 | Du | ............ | H01L 27/0688 327/202 |

\* cited by examiner

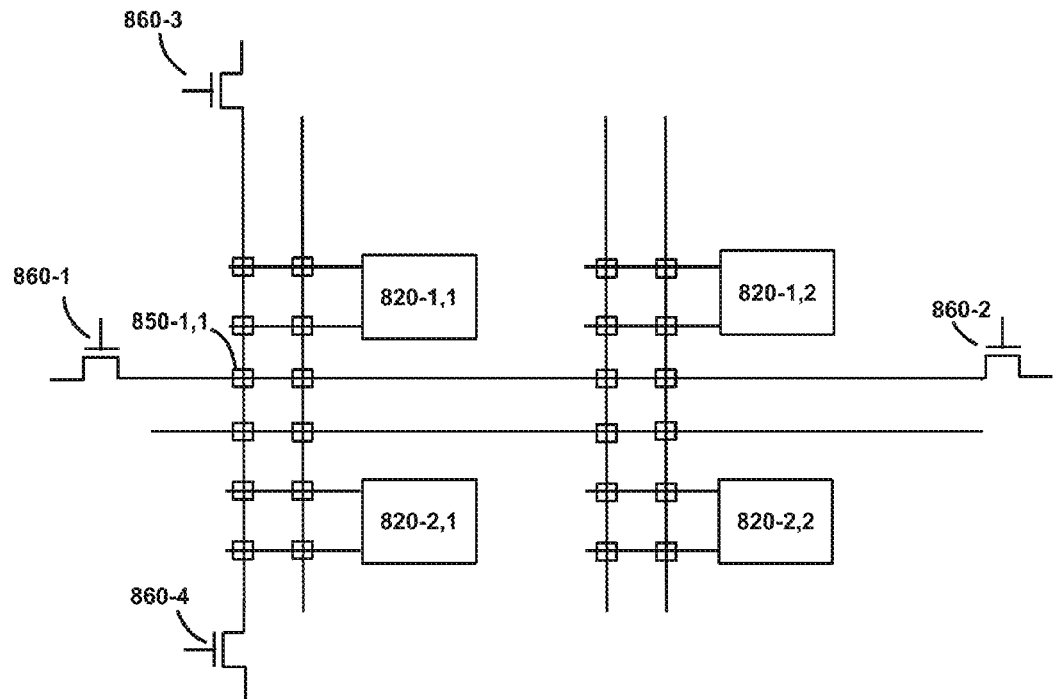
Prior Art
Fig. 1
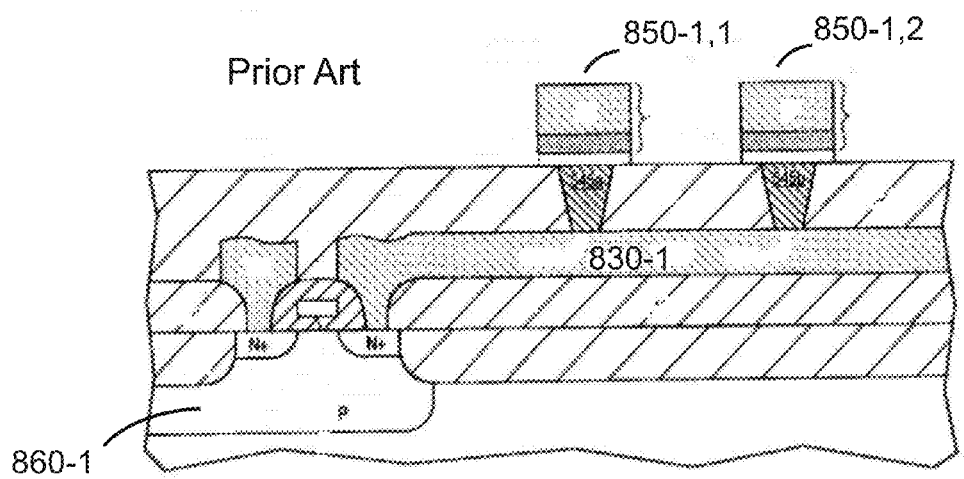
Fig. 2 - prior art

| 1101 | | | | | | | | | |
|---|---|---|---|---|---|---|---|---|---|
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |
| FPGA | FPGA | FPGA | FPGA | FPGA | FPGA | FPGA | FPGA | FPGA | FPGA |

| STRUCTURED ASIC | STRUCTURED ASIC | STRUCTURED ASIC | STRUCTURED ASIC | STRUCTURED ASIC |
|---|---|---|---|---|
| STRUCTURED ASIC | STRUCTURED ASIC | STRUCTURED ASIC | STRUCTURED ASIC | STRUCTURED ASIC |
| STRUCTURED ASIC | STRUCTURED ASIC | STRUCTURED ASIC | STRUCTURED ASIC | STRUCTURED ASIC |
| STRUCTURED ASIC | STRUCTURED ASIC | STRUCTURED ASIC | STRUCTURED ASIC | STRUCTURED ASIC |
| STRUCTURED ASIC | STRUCTURED ASIC | STRUCTURED ASIC | STRUCTURED ASIC | STRUCTURED ASIC |

1100C: 10×10 grid of cells labeled "RAM"

Fig. 11D

1100D: 10×9 grid of cells labeled "DRAM"

Fig. 11E

1100E — 6×6 grid of "Micro Processor" cells

Fig. 11F

1100F — 9×9 grid of "I/Os SERDES" cells

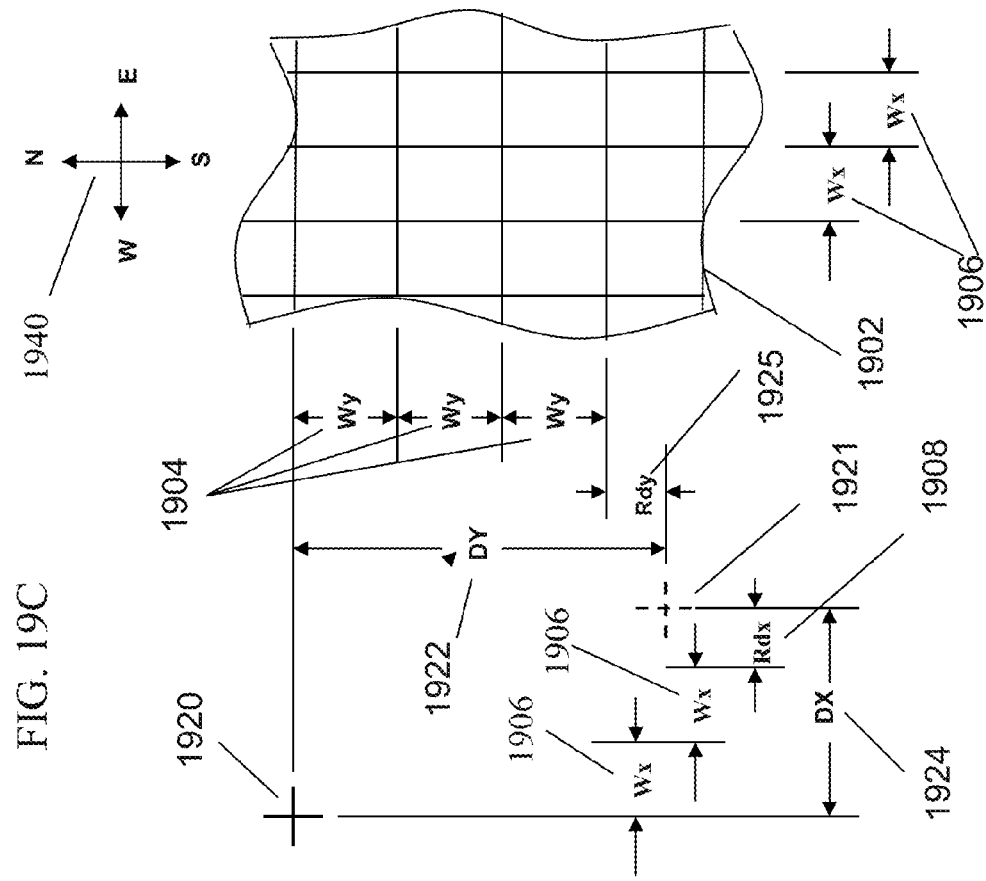
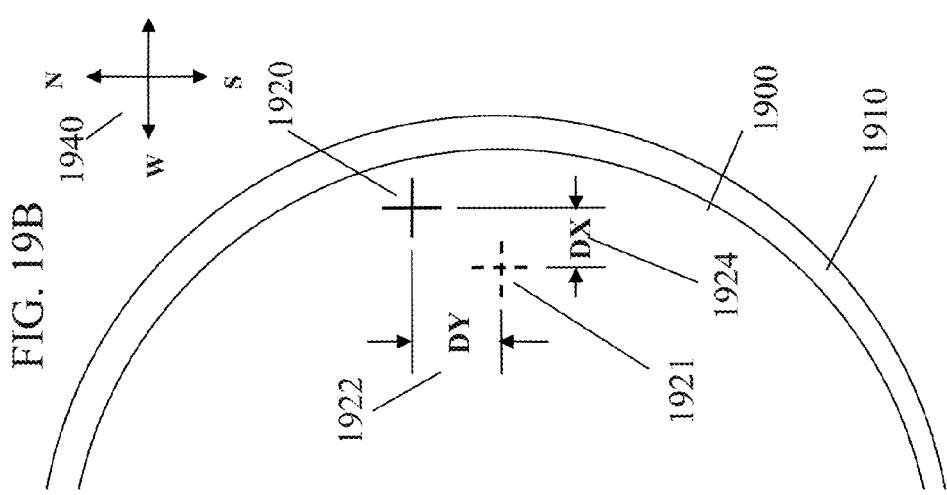

2202

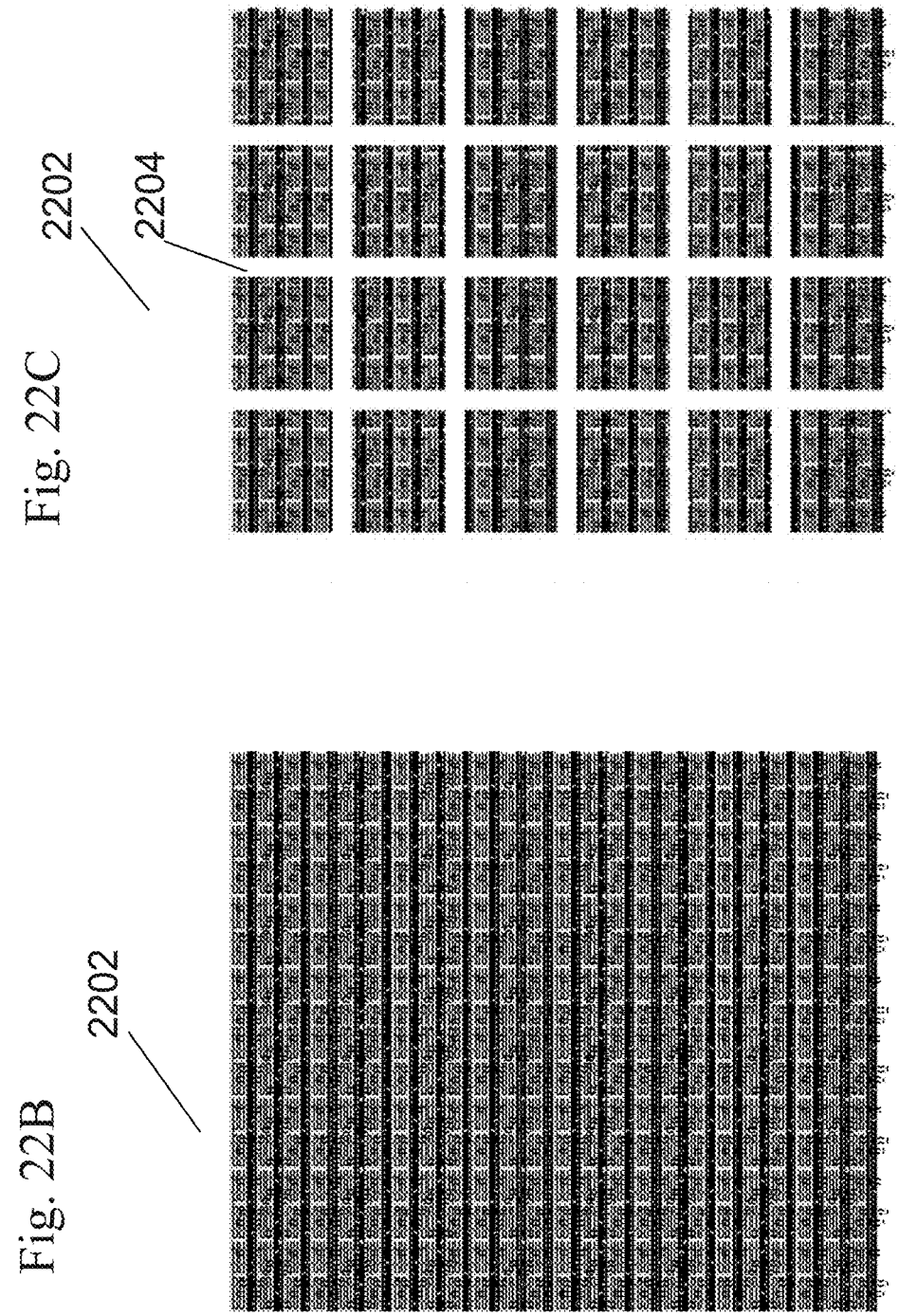

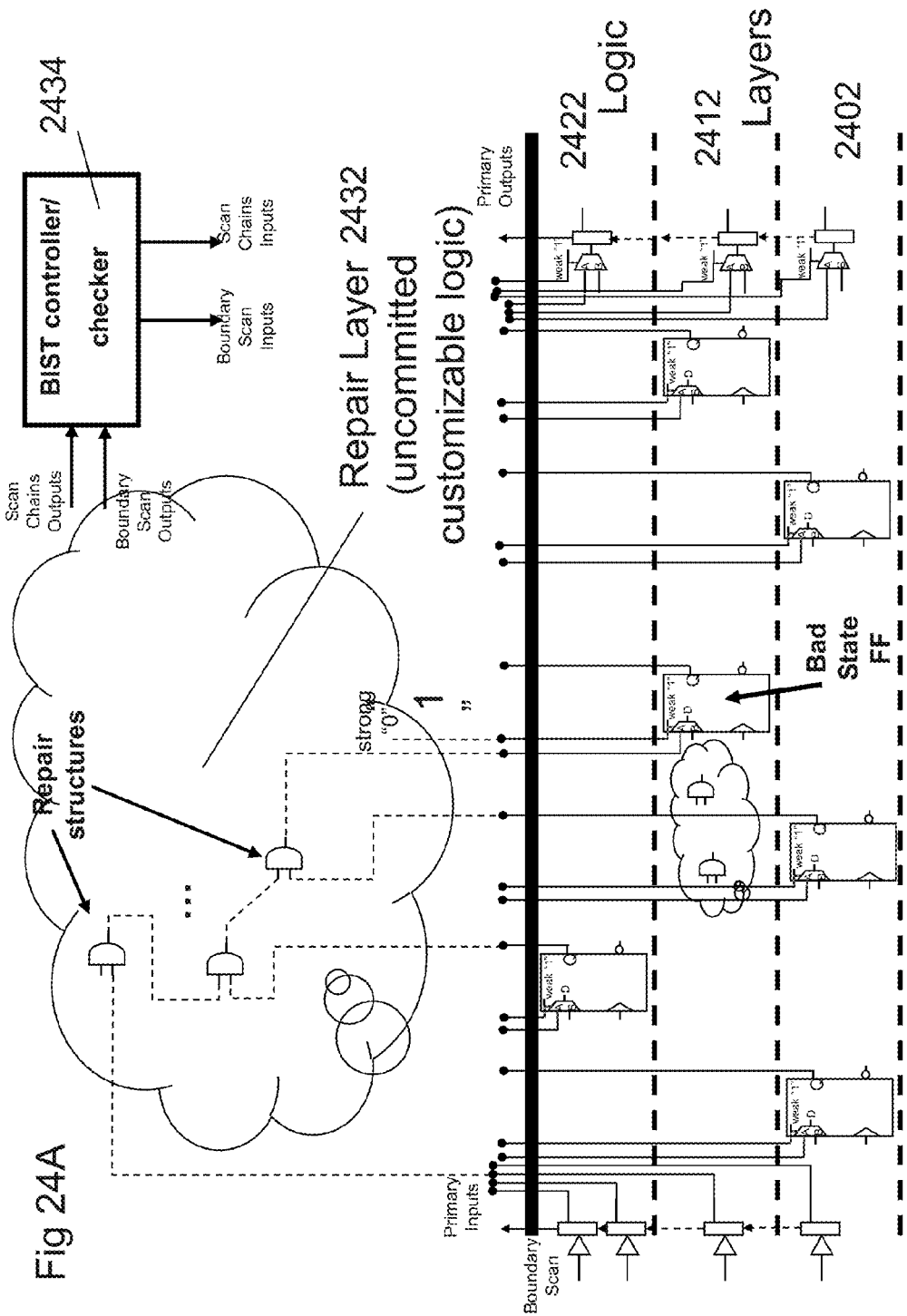

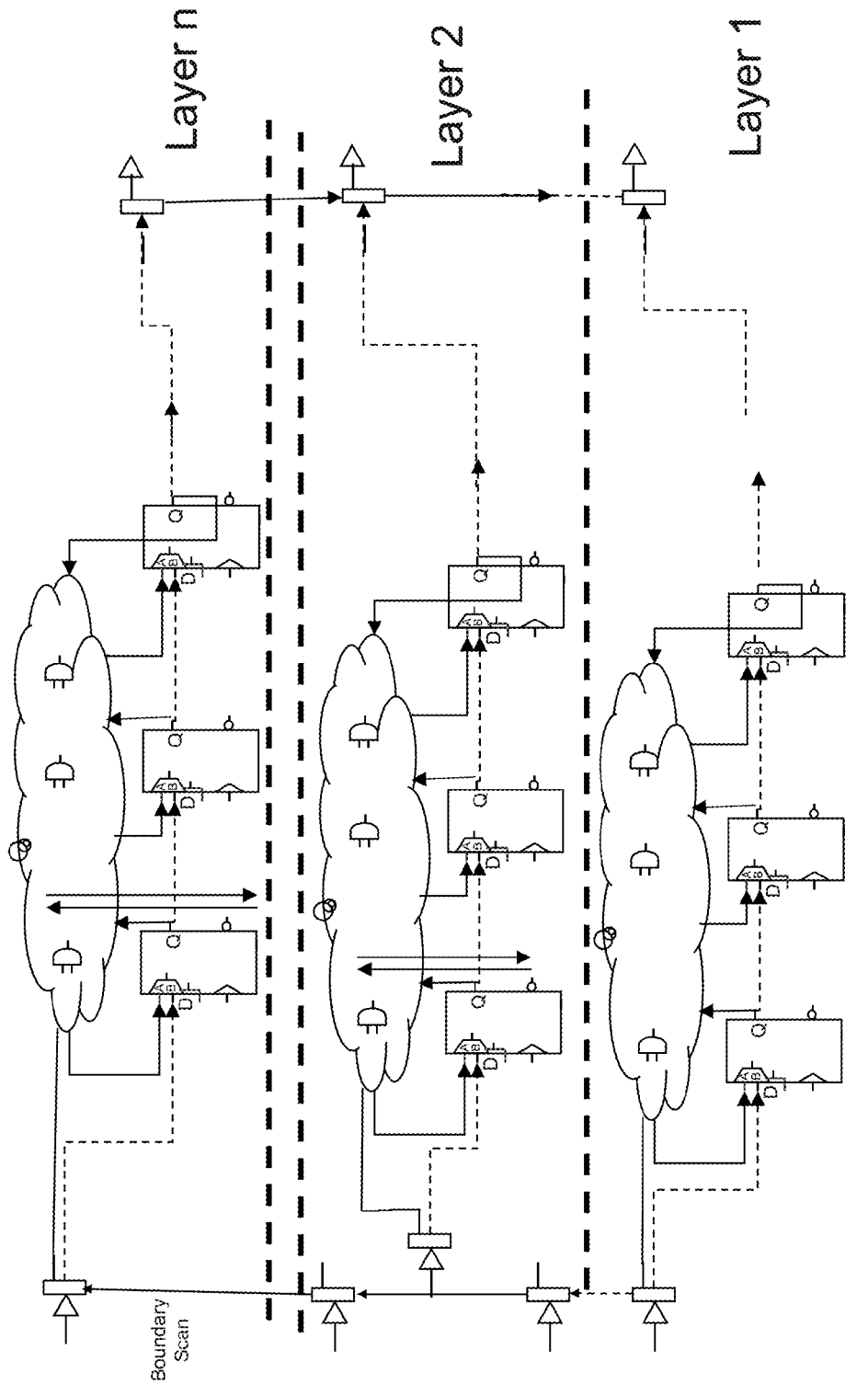

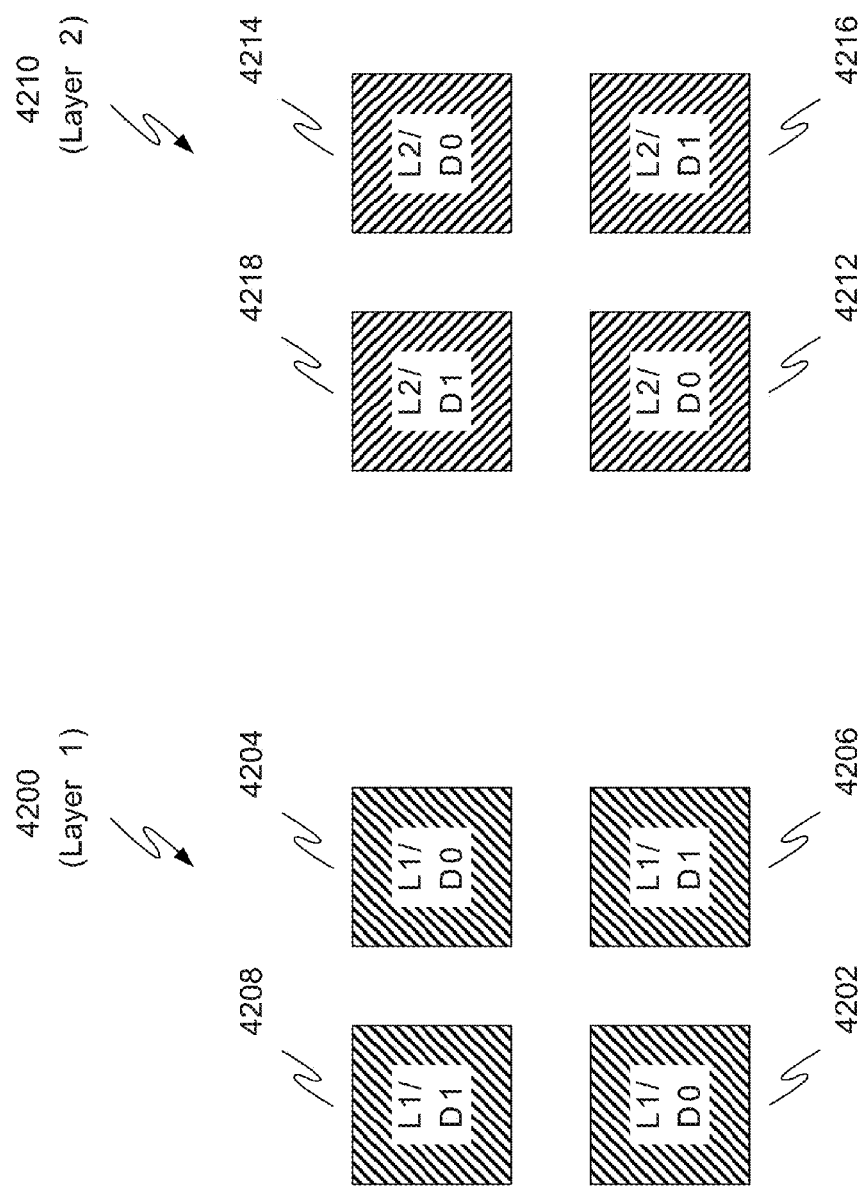

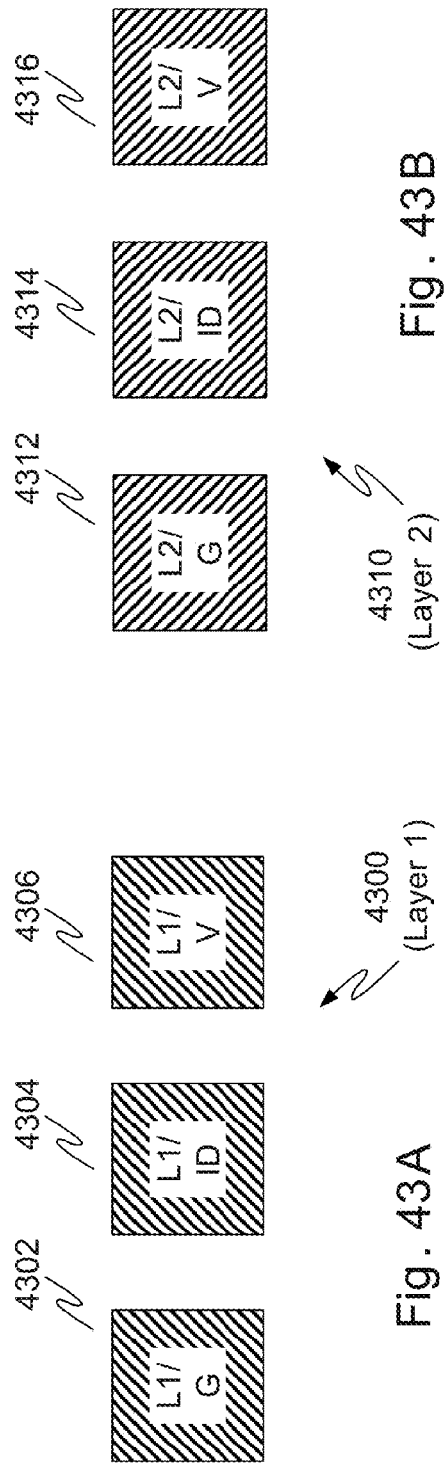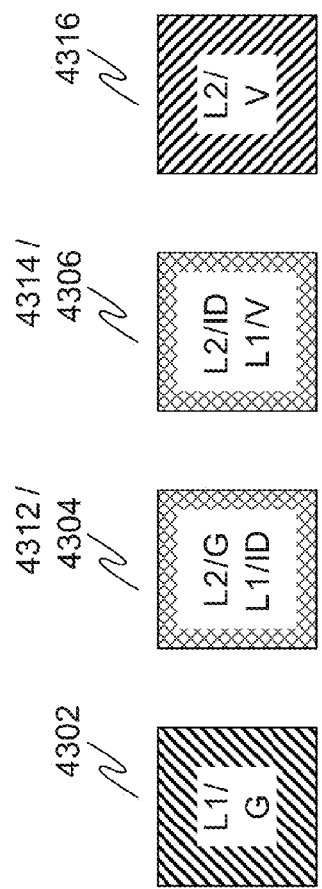

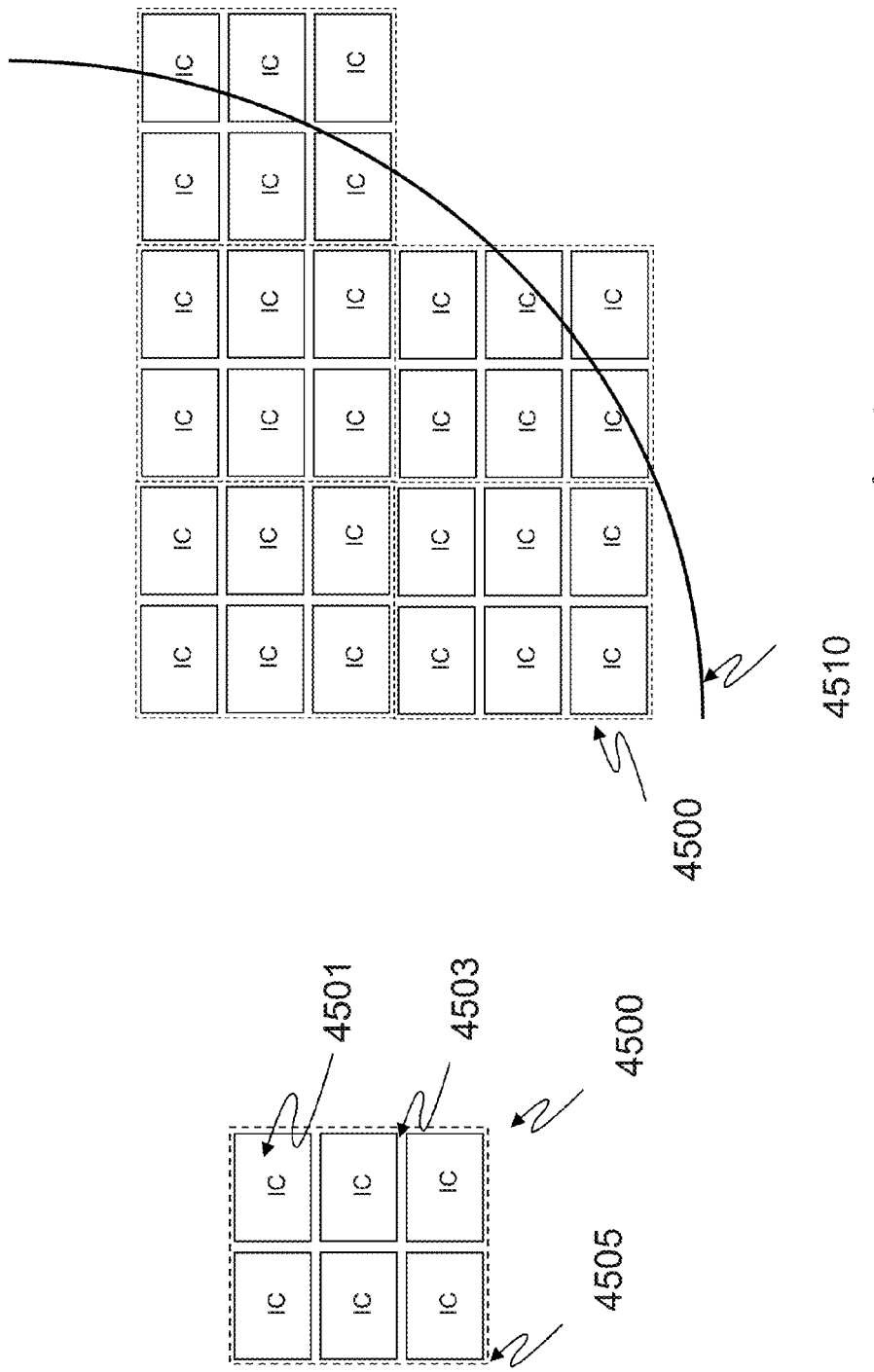

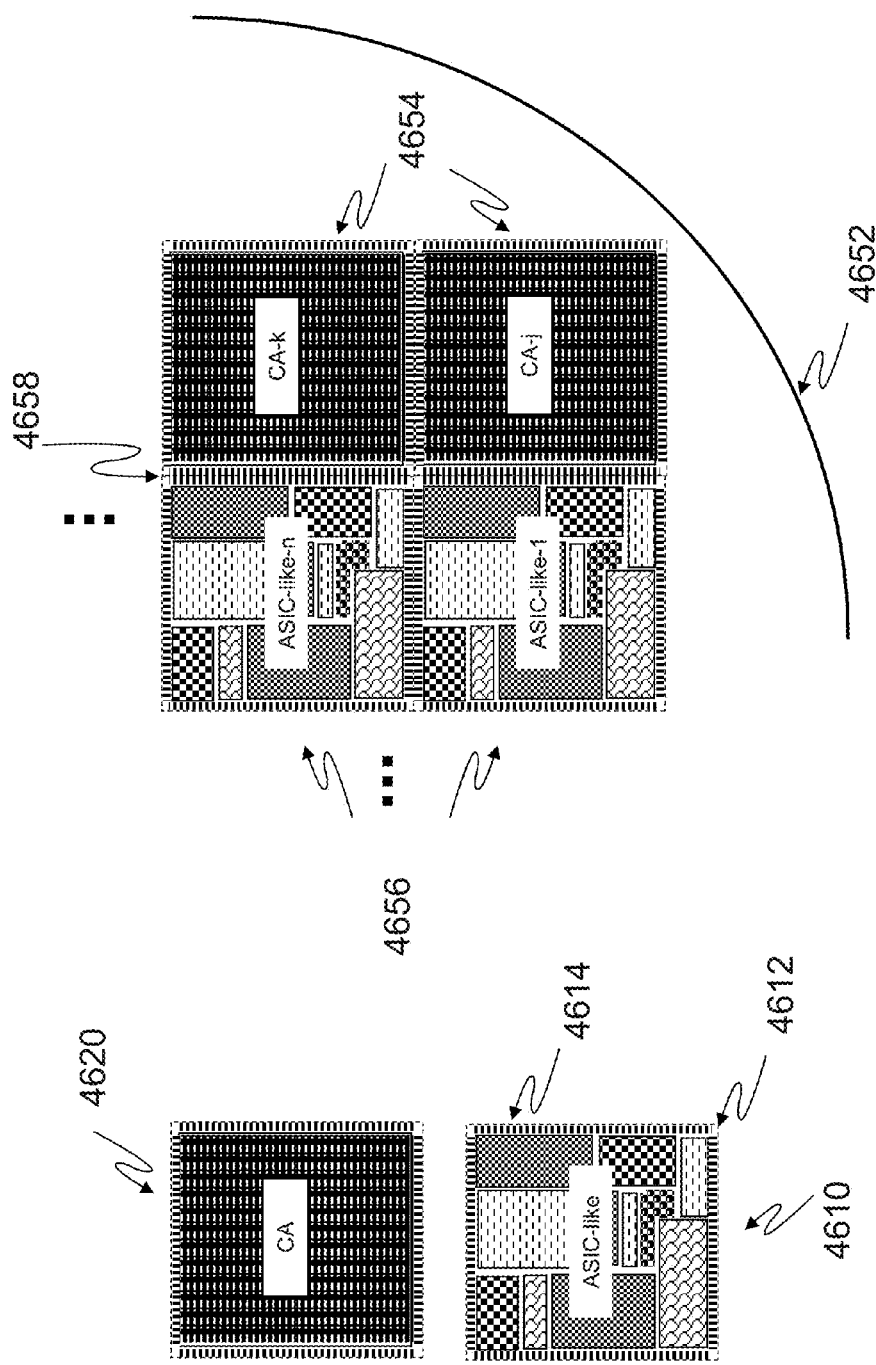

3D SEMICONDUCTOR STRUCTURE AND DEVICE

This application is a continuation-in-part of U.S. patent application Ser. No. 15/089,394 filed on Apr. 1, 2016; which is a continuation-in-part U.S. patent application Ser. No. 14/828,517 filed on Aug. 18, 2015 (now U.S. Pat. No. 9,318,408 issued on Apr. 19, 2016); which is a continuation-in-part of U.S. patent application Ser. No. 14/628,231 (now U.S. Pat. No. 9,142,553 issued on Sep. 22, 2015) filed on Feb. 21, 2015; which is a continuation of U.S. patent application Ser. No. 13/796,930 (now U.S. Pat. No. 8,994,404 issued on Mar. 31, 2015) filed Mar. 12, 2013; the entire contents of the foregoing are incorporated herein by reference.

BACKGROUND OF THE INVENTION

1. Field of the Invention

The present invention relates to three dimensional integrated circuit (3D IC) devices.

Some monolithic 3D approaches and other inventive concepts relevant to this document are described in U.S. Pat. Nos. 8,273,610, 8,557,632, 8,298,875, 8,642,416, 8,362,482, 8,378,715, 8,379,458, 8,450,804, 8,476,145, 8,536,023, 8,574,929, 8,581,349, 8,642,416, 8,687,399, 8,742,476, 8,674,470, 8,803,206, 8,836,073, 8,902,663, 8,994,404, 9,021,414, 9,023,688, 9,030,858, 9,117,749, 9,142,553, 9,219,005, 9,385,088, 9,406,670, 9,460,978, 9,509,313; U.S. patent application publications 2011/0092030, 2016/0218046; and pending U.S. patent application Ser. Nos. 14/607,077, 14/642,724, 62/307,568, 62/297,857, 15/095,187, 15/150,395, 15/173,686, 62/383,463, 62/440,720, 62/443,751, 15/243,941, PCT/US16/52726, 62/406,376, 62/432,575, 62/440,720, 62/297,857, 15/333,138, 15/344,562, and 15/351,389. The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031; and U.S. patent application publication 2016/0064439. The entire contents of the foregoing patents, publications, and applications are incorporated herein by reference.

2. Background

Three dimensional integrated circuits are known in the art, though the field is in its infancy with a dearth of commercial products. Many manufacturers sell multiple standard two dimensional integrated circuit (2DIC) devices in a single package known as a Multi-Chip Modules (MCM) or Multi-Chip Packages (MCP). Often these 2DICs are laid out horizontally in a single layer, like the Core 2. Quad microprocessor MCMs available from Intel Corporation of Santa Clara, Calif. In other products, the standard 2DICs are stacked vertically in the same MCP like in many of the moviNAND flash memory devices available from Samsung Electronics of Seoul, South Korea like the illustration shown in FIG. 9C. None of these products are true 3DICs.

Devices where multiple layers of silicon or some other semiconductor (where each layer comprises active devices and local interconnect like a standard 2DIC) are bonded together with Through Silicon Via (TSV) technology to form a true 3D IC have been reported in the literature in the form of abstract analysis of such structures as well as devices constructed doing basic research and development in this area. FIG. 9A illustrates an example in which Through Silicon Vias are constructed continuing vertically through all the layers creating a global interlayer connection. FIG. 9B provides an illustration of a 3D IC system in which a Through Silicon Via 404 is placed at the same relative location on the top and bottom of all the 3D IC layers creating a standard vertical interface between the layers.

Constructing future 3DICs will require new architectures and new ways of thinking In particular, yield and reliability of extremely complex three dimensional systems will have to be addressed, particularly given the yield and reliability difficulties encountered in complex Application Specific Integrated Circuits (ASIC) built in recent deep submicron process generations. In this specification the terms stratum, tier or layer might be used for the same structure and they may refer to transistors or other device structures (such as capacitors, resistors, inductors) that may lie substantially in a plane format and in most cases such stratum, tier or layer may include the interconnection layers used to interconnect the transistors on each. In a 3D device as herein described there may at least two such planes called tier, or stratum or layer.

Fortunately, current testing techniques will likely prove applicable to 3D IC manufacturing, though they will be applied in very different ways. FIG. 28 illustrates a prior art set scan architecture in a 2D IC ASIC 2800. The ASIC functionality is present in logic clouds 2820, 2822, 2824 and 2826 which are interspersed with sequential cells like, for example, pluralities of flip flops indicated at 2812, 2814 and 2816. The ASIC 2800 also has input pads 2830 and output pads 2840. The flip flops are typically provide with circuitry to allow them to function as a shift register in a test mode. In FIG. 28 the flip flops form a scan register chain where pluralities of flip flops 2812, 2814 and 2816 are coupled together in series with Scan Test Controller 2810. One scan chain is shown in FIG. 28, but in a practical design comprising millions of flip flops many sub-chains will be used.

In the test architecture of FIG. 28, test vectors are shifted into the scan chain in a test mode. Then the part is placed into operating mode for one or more clock cycles, after which the contents of the flip flops are shifted out and compared with the expected results. This provides an excellent way to isolate errors and diagnose problems, though the number of test vectors in a practical design can be very large and an external tester is often required.

FIG. 29 shows a prior art boundary scan architecture in exemplary ASIC 2900. The part functionality is shown in logic function block 2910. The part also has a variety of input/output cells 2920, each comprising a bond pad 2922, an input buffer 2924, and a tri-state output buffer 2926. Boundary Scan Register Chains 2932 and 2934 are shown coupled in series with Scan Test Control block 2930. This architecture operates in a similar manner as the set scan architecture of FIG. 28. Test vectors are shifted in, the part is clocked, and the results are then shifted out to compare with expected results. Typically, set scan and boundary scan are used together in the same ASIC to provide complete test coverage.

FIG. 30 shows a prior art Built-In Self Test (BIST) architecture for testing a logic block 3000 which comprises a core block function 3010 (what is being tested), inputs 3012, outputs 3014, a BIST Controller 3020, an input Linear Feedback Shift Register (LFSR) 3022, and an output Cyclical Redundancy Check (CRC) circuit 3024. Under control of BIST Controller 3020, LFSR 3022 and CRC 3024 are seeded (set to a known starting value), the logic block 3000 is clocked a predetermined number of times with LFSR 3022 presenting pseudo-random test vectors to the inputs of Block Function 3010 and CRC 3024 monitoring the outputs of Block Function 3010. After the predetermined number of clocks, the contents of CRC 3024 are compared to the expected value (or "signature"). If the signature matches, logic block 3000 passes the test and is deemed good. This sort of testing is good for fast "go" or "no go" testing as it is self-contained to the block being tested and does not require storing a large number of test vectors or use of an external tester. BIST, set scan, and boundary scan techniques are often combined in complementary ways on the same ASIC. A detailed discussion of the theory of LSFRs and CRCs can be found in *Digital Systems Testing and Testable Design*, by Abramovici, Breuer and Friedman, Computer Science Press, 1990, pp 432-447.

SUMMARY

In one aspect, a 3D structure, the structure comprising: a first stratum overlaid by a second stratum, said second stratum is less than two microns thick, wherein said first stratum comprises an array of memory cells comprising at least four rows of memory cells, each of said rows is controlled by a bit-line, wherein said array of memory cells comprises a plurality of columns of memory cells, each of said columns is controlled by a word-line, and wherein said second stratum comprises memory control circuits directly connected to said bit-lines and said word-lines.

In another aspect, a 3D structure, the structure comprising: a first stratum overlaid by a second stratum, said second stratum is less than two microns thick, wherein said first stratum comprises an array of memory cells comprising at least four rows of memory cells, each of said rows is controlled by a bit-line, wherein said array of memory cells comprises a plurality of columns of memory cells, each of said columns is controlled by a word-line, wherein said second stratum comprises memory control circuits directly connected to control said memory cells, wherein said 3D structure is designed such that it could be processed to form a first 3D device and a second 3D device, and wherein said first 3D device comprises many more memory cells than said second 3D device.

In another aspect, a 3D structure, the structure comprising: a first stratum overlaid by a second stratum, said second stratum is less than two microns thick, wherein said first stratum comprises an array of memory cells comprising at least four rows of memory cells, each of said rows is controlled by a bit-line, wherein said array of memory cells comprises a plurality of columns of memory cells, each of said columns is controlled by a word-line, wherein said second stratum comprises memory control circuits directly connected to control said memory cells, and wherein said 3D structure is designed to perform self-test and repair itself partly by activating a built-in redundancy.

BRIEF DESCRIPTION OF THE DRAWINGS

FIG. 1 illustrates a prior art antifuse programming circuit.

FIG. 2 illustrates a cross section of a prior art antifuse programming transistor.

FIG. 11A illustrates a continuous array reticle of FPGA tiles according to the present invention.

FIG. 11B illustrates a continuous array reticle of structured ASIC tiles according to the present invention.

FIG. 11C illustrates a continuous array reticle of RAM tiles according to the present invention.

FIG. 11D illustrates a continuous array reticle of DRAM tiles according to the present invention.

FIG. 11E illustrates a continuous array reticle of microprocessor tiles according to the present invention.

FIG. 11F illustrates a continuous array reticle of I/O SERDES tiles according to the present invention.

FIG. 19B illustrates donor and receptor wafer alignment in the alignment reduction scheme of FIG. 19A.

FIG. 19C illustrates alignment with respect to a repeatable structure in the alignment in the alignment reduction scheme of FIG. 19A.

FIG. 22B illustrates a reticle of the repeatable structure of FIG. 20C.

FIG. 22C illustrates the application of a dicing line mask to a continuous array of the structure of FIG. 22A.

FIG. 24A illustrates a factory repairable 3D IC with three logic layers and a repair layer according to the present invention.

FIG. 24B illustrates boundary scan and set scan chains of the 3D IC of FIG. 24A.

FIG. 42A illustrates a first via metal overlap pattern according to the present invention.

FIG. 42B illustrates a second via metal overlap pattern according to the present invention.

FIG. 43A illustrates a third via metal overlap pattern according to the present invention.

FIG. 43B illustrates a fourth via metal overlap pattern according to the present invention.

FIG. 43C illustrates the alignment of the via metal overlap patterns of FIGS. 43A and 43B in a 3DIC according to the present invention.

FIG. 45A illustrates a prior art of reticle design.

FIG. 45B illustrates a prior art of how such reticle image from FIG. 45A can be used to pattern the surface of a wafer.

FIG. 46A illustrates a reticle design for a WSI design and process.

FIG. 46B illustrates how such reticle image from FIG. 46A can be used to pattern the surface of a wafer.

DETAILED DESCRIPTION OF THE INVENTION

Figure 3A:
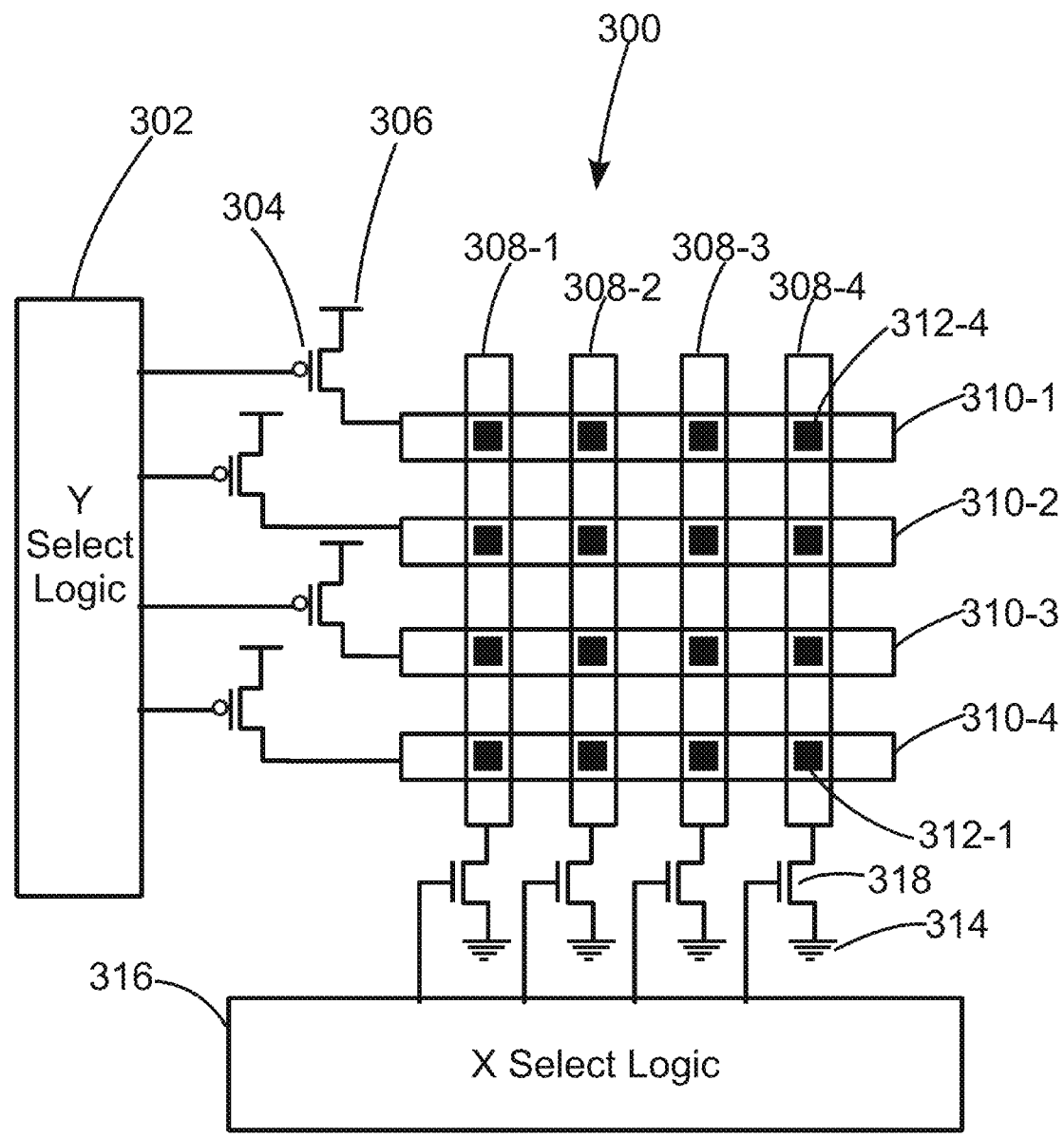
FIG. 3A illustrates a programmable interconnect tile using antifuses.

Embodiments of the present invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the spirit of the appended claims.

The thinner the transferred layer, the smaller the through layer via (TLV) diameter obtainable, due to the potential limitations of manufacturable via aspect ratios. Thus, the transferred layer may be, for example, less than about 2 microns thick, less than about 1 micron thick, less than about 0.4 microns thick, less than about 200 nm thick, or less than about 100 nm thick. The TLV diameter may be less than about 400 nm, less than about 200 nm, less than about 80 nm, less than about 40 nm, or less than about 20 nm. The thickness of the layer or layers transferred according to some embodiments of the present invention may be designed as such to match and enable the best obtainable lithographic resolution capability of the manufacturing process employed to create the through layer vias or any other structures on the transferred layer or layers.

In many of the embodiments of the invention, the layer or layers transferred may be of a crystalline material, for example, mono-crystalline silicon, and after layer transfer, further processing, such as, for example, plasma/RIE or wet etching, may be done on the layer or layers that may create islands or mesas of the transferred layer or layers of crystalline material, for example, mono-crystalline silicon, the crystal orientation of which has not changed. Thus, a mono-crystalline layer or layers of a certain specific crystal orientation may be layer transferred and then processed whereby the resultant islands or mesas of mono-crystalline silicon have the same crystal specific orientation as the layer or layers before the processing. After this processing, the resultant islands or mesas of crystalline material, for example, mono-crystalline silicon, may be still referred to herein as a layer, for example, mono-crystalline layer, layer of mono-crystalline silicon, and so on.

Alignment is a basic step in semiconductor processing. For most cases it is part of the overall process flow that every successive layer is patterned when it is aligned to the layer below it. These alignments could all be done to one common alignment mark, or to some other alignment mark or marks that are embedded in a layer underneath. In today's equipment such alignment would be precise to below a few nanometers and better than 40 nm or better than 20 nm and even better than 10 nm. In general such alignment could be observed by comparing two devices processed using the same mask set. If two layers in one device maintain their relative relationship in both devices—to few nanometers—it is clear indication that these layers are one aligned each to the other. This could be achieved by either aligning to the same alignment mark (sometimes called a zero mark alignment scheme), or one layer is using an alignment mark embedded in the other layer (sometimes called a direct alignment), or using different alignment marks of layers that are aligned to each other (sometimes called an indirect alignment).

FIG. 1 illustrates a circuit diagram illustration of a prior art, where, for example, 860-1 to 860-4 are the programming transistors to program Antifuse ("AF") 850-1,1.

FIG. 2 is a cross-section illustration of a portion of a prior art represented by the circuit diagram of FIG. 1 showing the programming transistor 860-1 built as part of the silicon substrate.

FIG. 3A is a drawing illustration of the principle of programmable (or configurable) interconnect tile 300 using Antifuse. Two consecutive metal layers have orthogonal arrays of metal strips, 310-1, 310-2, 310-3, 310-4 and 308-1, 308-2, 308-3, 308-4. AFs are present in the dielectric isolation layer between two consecutive metal layers at crossover locations between the perpendicular traces, e.g., 312-1, 312-4. Normally the AF starts in its isolating state, and to program it so the two strips 310-1 and 308-4 will connect, one needs to apply a relatively high programming voltage 306 to strip 310-1 through programming transistor 304, and ground 314 to strip 308-4 through programming transistor 318. This is done by applying appropriate control pattern to Y decoder 302 and X decoder 316, respectively. A typical programmable connectivity array tile will have up to a few tens of metal strips to serve as connectivity for a Logic Block ("LB") described later.

Figure 3B:
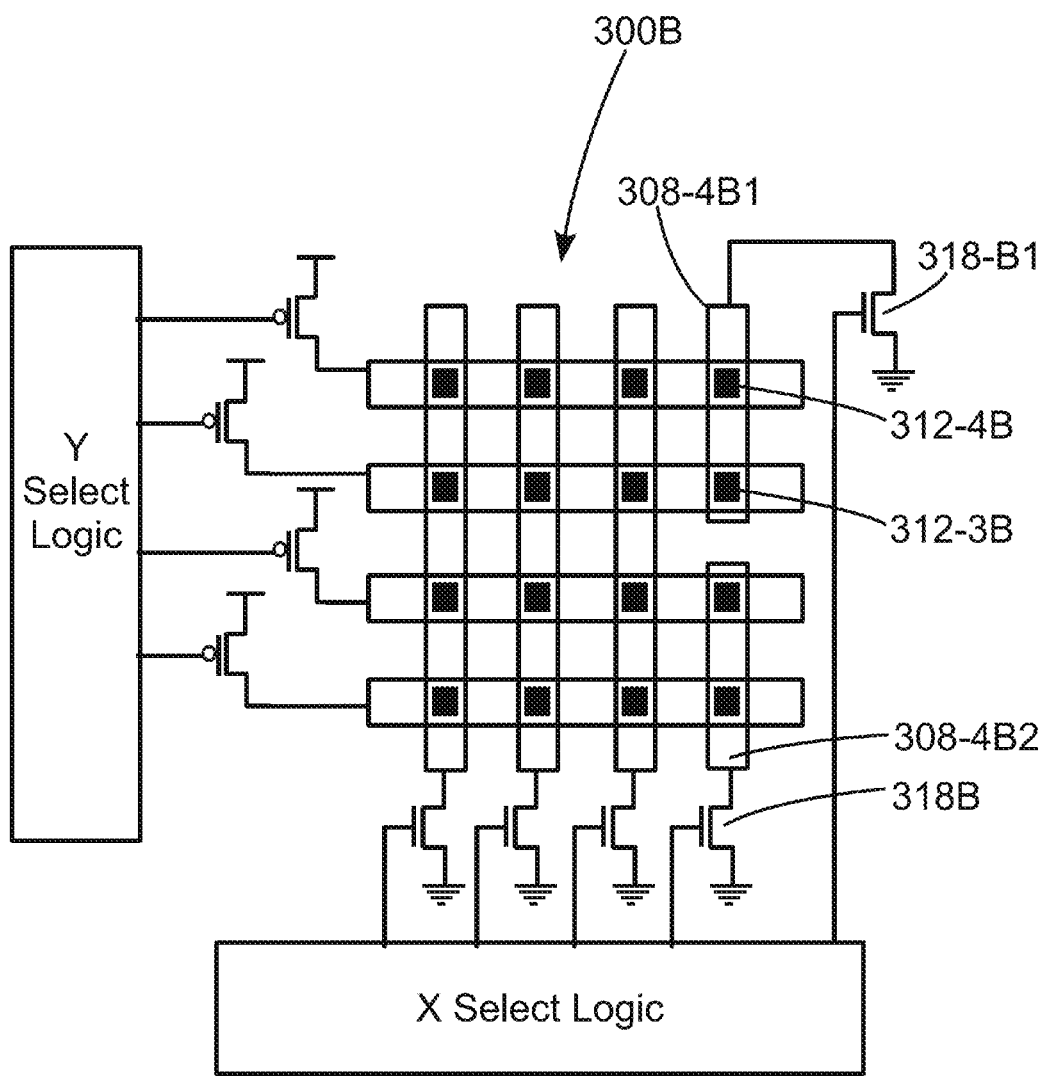
FIG. 3B illustrates a programmable interconnect tile with a segmented routing line.

One should recognize that the regular pattern of FIG. 3A often needs to be modified to accommodate specific needs of the architecture. FIG. 3B describes a routing tile 300B where one of the full-length strips was partitioned into shorter sections 308-4B1 and 308-4B2. This allows, for example, for two distinct electrical signals to use a space assigned to a single track and is often used when LB input and output ("I/O") signals need to connect to the routing fabric. Since Logic Block may have 10-20 (or even more) I/O pins, using a full-length strip wastes a significant number of available tracks. Instead, splitting of strips into multiple section is often used to allow I/O signals to connect to the programmable interconnect using at most two, rather than four, AFs 312-3B, 312-4B, and hence trading access to routing tracks with fabric size. Additional penalty is that multiple programming transistors, 318-B and 318-B1 in this case instead of just 318-B, and additional decoder outputs, are needed to accommodate the multiplicity of fractional strips. Another use for fractional strips may be to connect to tracks from another routing hierarchy, e.g., longer tracks, or for bringing other special signals such as local clocks, local resets, etc., into the routing fabric.

Unlike prior art for designing Field Programmable Gate Array ("FPGA"), the current invention suggests constructing the programming transistors and much or all of the programming circuitry at a level above the one where the functional diffusion level circuitry of the FPGA resides, hereafter referred to as an "Attic.". This provides an advantage in that the technology used for the functional FPGA circuitry has very different characteristics from the circuitry used to program the FPGA. Specifically, the functional circuitry typically needs to be done in an aggressive low-voltage technology to achieve speed, power, and density goals of large scale designs. In contrast, the programming circuitry needs high voltages, does not need to be particularly fast because it operates only in preparation of the actual in-circuit functional operation, and does not need to be particularly dense as it needs only on the order of 2N transistors for N*N programmable AFs. Placing the programming circuitry on a different level from the functional circuitry allows for a better design tradeoff than placing them next to each other. A typical example of the cost of placing both types of circuitry next to each other is the large isolation space between each region because of their different operating voltage. This is avoided in the case of placing programming circuitry not in the base (i.e., functional) silicon but rather in the Attic above the functional circuitry.

It is important to note that because the programming circuitry imposes few design constraints except for high voltage, a variety of technologies such as Thin Film Transistors ("TFT"), Vacuum FET, bipolar transistors, and others, can readily provide such programming function in the Attic.

A possible fabrication method for constructing the programming circuitry in an Attic above the functional circuitry on the base silicon is by bonding a programming circuitry wafer on top of functional circuitry wafer using Through Silicon Vias. Other possibilities include layer transfer using ion implantation (typically but not exclusively hydrogen), spraying and subsequent doping of amorphous silicon, carbon nano-structures, and similar. The key that enables the use of such techniques, that often produce less efficient semiconductor devices in the Attic, is the absence of need for high performance and fast switching from programming transistors. The only major requirement is the ability to withstand relatively high voltages, as compared with the functional circuitry.

Another advantage of AF-based FPGA with programming circuitry in an Attic is a simple path to low-cost volume production. One needs simply to remove the Attic and replace the AF layer with a relatively inexpensive custom via or metal mask.

Another advantage of programming circuitry being above the functional circuitry is the relatively low impact of the vertical connectivity on the density of the functional circuitry. By far, the overwhelming number of programming AFs resides in the programmable interconnect and not in the Logic Blocks. Consequently, the vertical connections from the programmable interconnections need to go upward towards the programming transistors in the Attic and do not need to cross downward towards the functional circuitry diffusion area, where dense connectivity between the routing fabric and the LBs occurs, where it would incur routing congestion and density penalty.

Figure 4A:
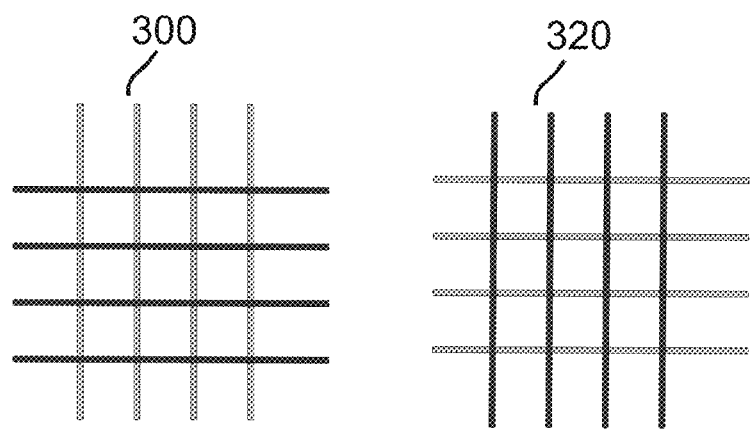
FIG. 4A illustrates two routing tiles.
Figure 4B:
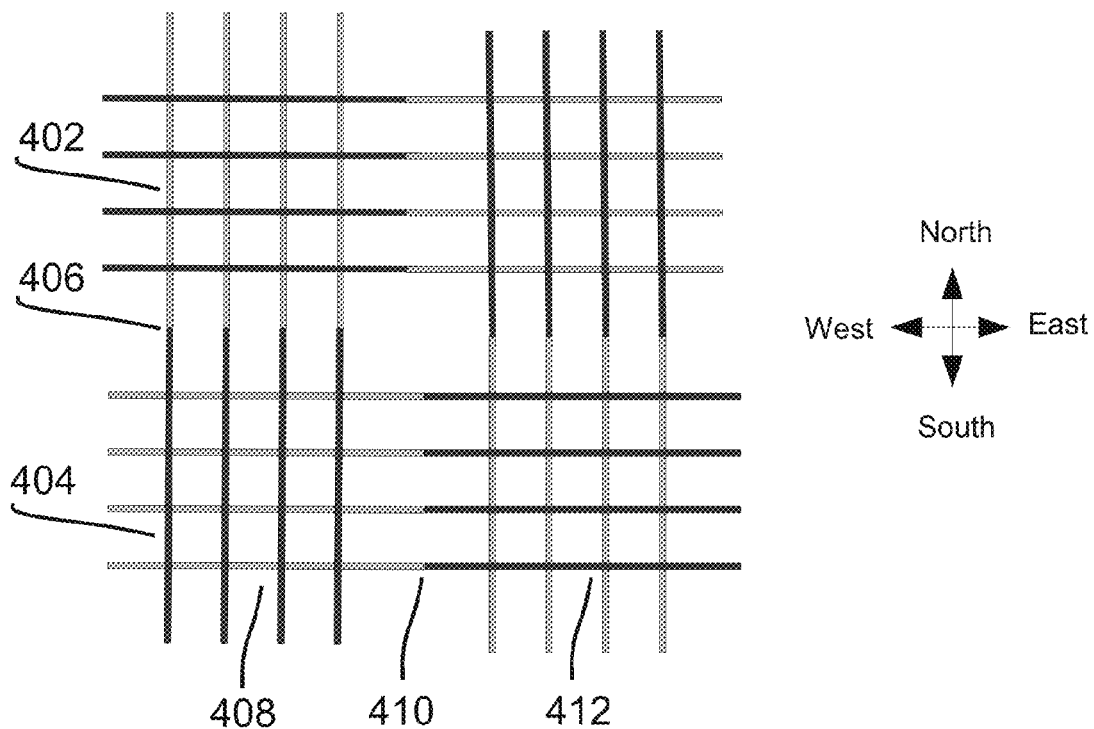
FIG. 4B illustrates an array of four routing tiles.

FIG. 4A is a drawing illustration of a routing tile 300 similar to that in FIG. 3A, where the horizontal and vertical strips are on different but adjacent metal layers. Tile 320 is similar to 300 but rotated 90 degrees. When larger routing fabric is constructed from individual tiles, we need to control signal propagation between tiles. This can be achieved by stitching the routing fabric from same orientation tiles (as in either 300 or 320 with bridges such as 701A or 701VV, described later, optionally connecting adjacent strips) or from alternating orientation tiles, such as illustrated in FIG. 4B. In that case the horizontal and vertical tracks alternate between the two metals such as 402 and 404, or 408 and 412, with AF present at each overlapping edge such as 406 and 410. When a segment needs to be extended its edge AF 406 (or 410) is programmed to conduct, whereas by default each segment will span only to the edge of its corresponding tile Change of signal direction, such as vertical to horizontal (or vice versa) is achieved by programming non-edge AF such as 312-1 of FIG. 3A.

Logic Blocks are constructed to implement programmable logic functions. There are multiple ways of constructing LBs that can be programmed by AFs. Typically LBs will use low metal layers such as metal 1 and 2 to construct its basic functions, with higher metal layers reserved for the programmable routing fabric.

Figure 5A:
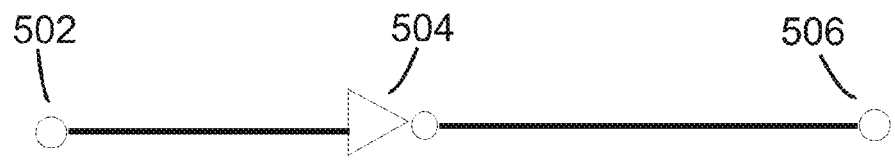
FIG. 5A illustrates an inverter.
Figure 5B:
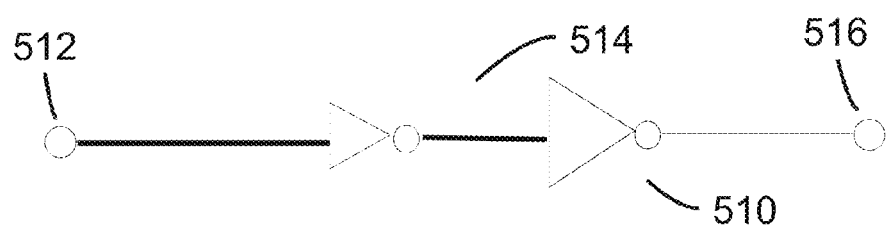
FIG. 5B illustrates a buffer.
Figure 5C:
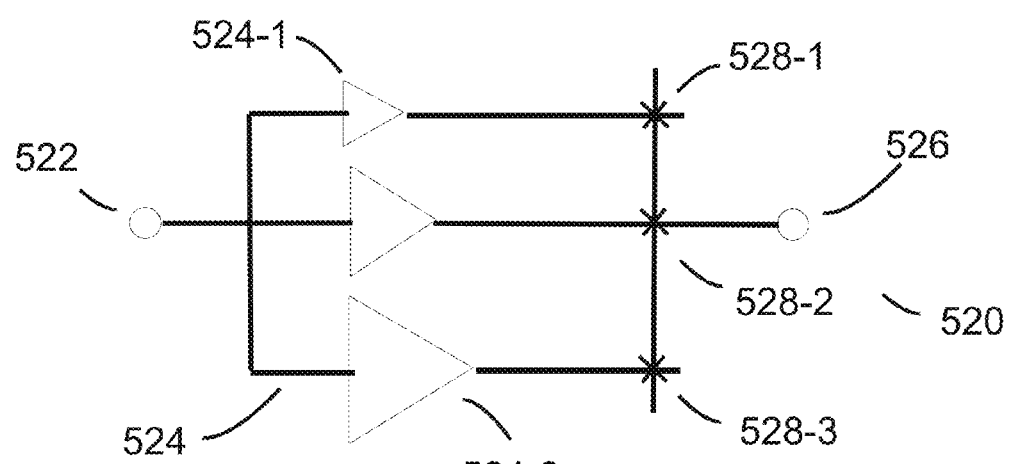
FIG. 5C illustrates a variable drive buffer.

Each logic block needs to be able to drive its outputs onto the programmable routing. FIG. 5A illustrates an inverter 504 (with input 502 and output 506) that can perform this function with logical inversion. FIG. 5B describes two inverters configured as a non-inverting buffer 514 (with input 512 and output 516) made of variable size inverters 510. Such structures can be used to create a variable-drive buffer 520 illustrated in FIG. 5C (with input 522 and output 526), where programming AFs 528-1, 528-2, and 528-3 will be used to select the varying sized buffers such as 524-1 or 524-3 to drive their output with customized strength onto the routing structure. A similar (not illustrated) structure can be implemented for programmable strength inverters.

Figure 5D:
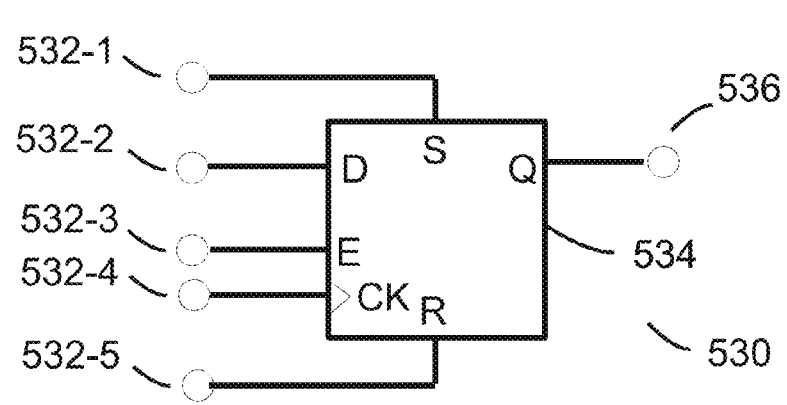
FIG. 5D illustrates a flip flop.

FIG. 5D is a drawing illustration of a flip flop ("FF") 530 with its input 532-2, output 536, and typical control signals 532-1, 532-3, 532-4 and 532-5. AFs can be used to connect its inputs, outputs, and controls, to LB-internal signals, or to drive them to and from the programmable routing fabric.

Figure 6:
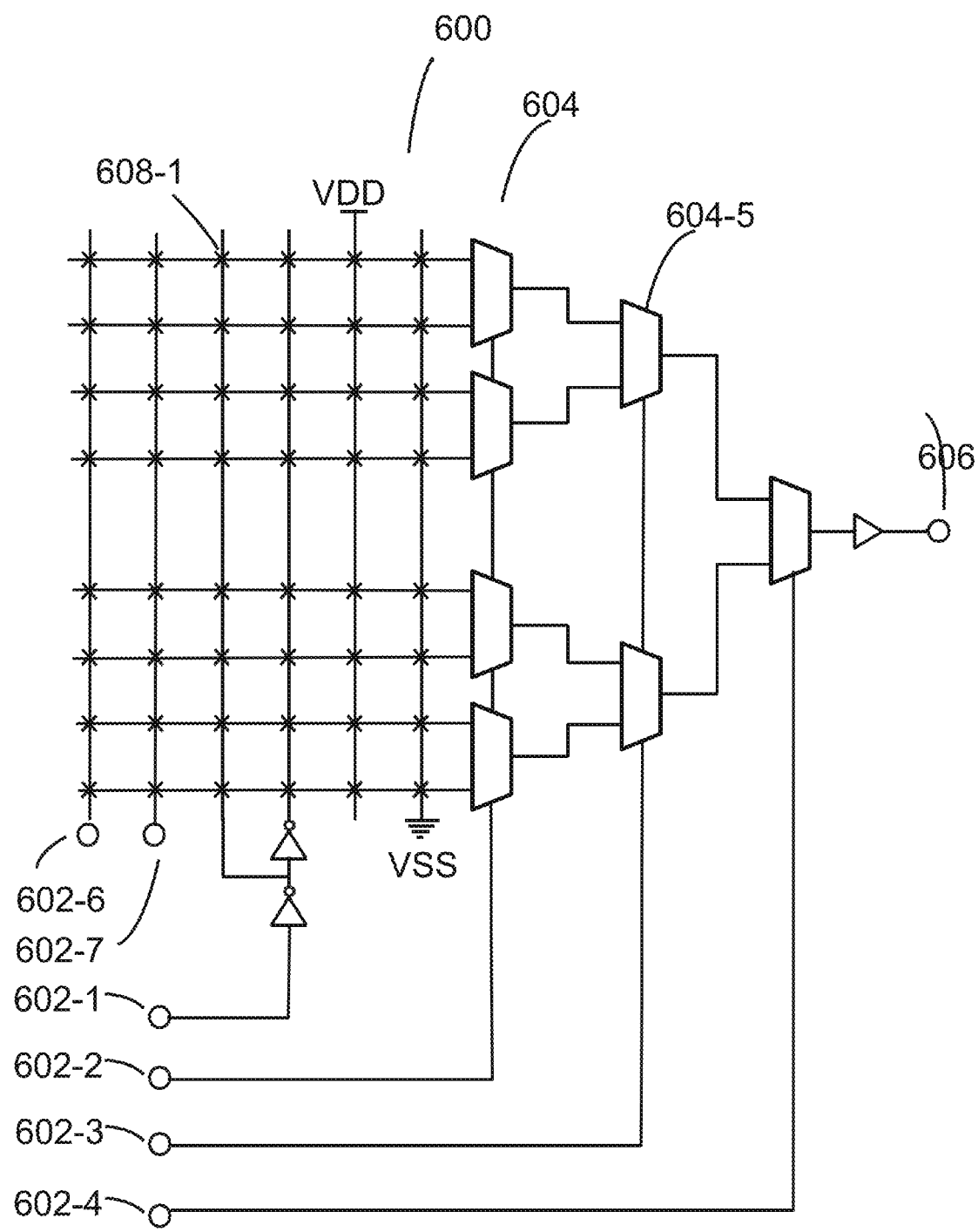
FIG. 6 illustrates a four input look up table logic module.

FIG. 6 is a drawing illustration of one possible implementation of a four input lookup table 600 ("LUT4") that can implement any combinatorial function of 4 inputs. The basic structure is that of a 3-level 8:1 multiplexer tree 604 made of 2:1 multiplexers 604-5 with output 606 controlled by 3 control lines 602-2, 602-3, 602-4, where each of the 8 inputs to the multiplexer is defined by AFs 608-1 and can be VSS, VDD, or the fourth input 602-1 either directly or inverted. The programmable cell of FIG. 6 may comprise additional inputs 602-6, 602-7 with additional 8 AFs for each input to allow some functionality in addition to just LUT4. Such function could be a simple select of one of the extra input 602-6 or 602-7 or more complex logic comprising the extra inputs.

Figure 6A:
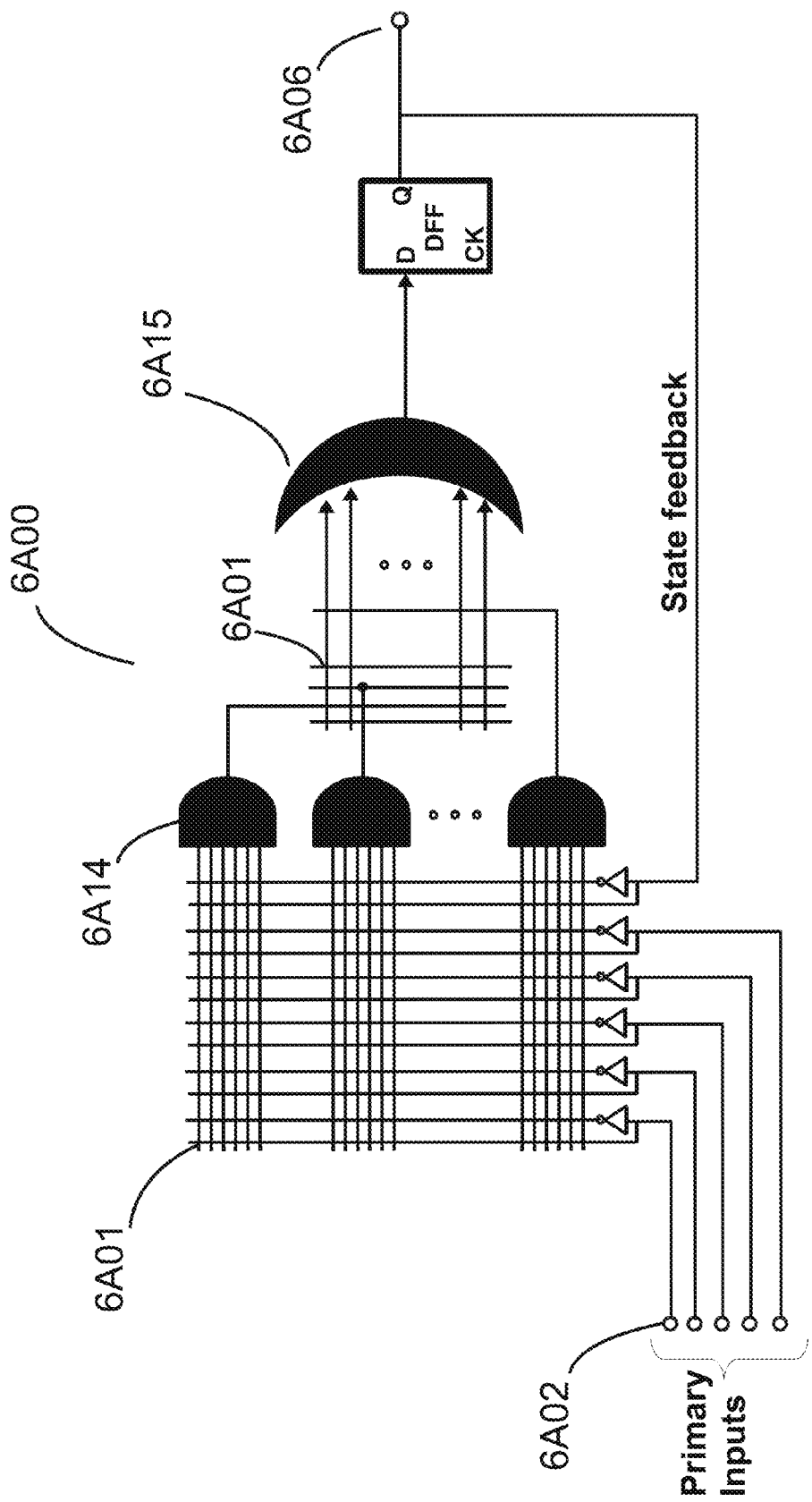
FIG. 6A illustrates a programmable logic array module.

FIG. 6A is a drawing illustration of another common universal programmable logic primitive, the Programmable Logic Array 6A00 ("PLA") Similar structures are sometimes known as Programmable Logic Device ("PLD") or Programmable Array Logic ("PAL"). It comprises of a number of wide AND gates such as 6A14 that are fed by a matrix of true and inverted primary inputs 6A02 and a number of state variables. The actual combination of signals fed to each AND is determined by programming AFs such as 6A01. The output of some of the AND gates is selected—also by AF—through a wide OR gate 6A15 to drive a state FF with output 6A06 that is also available as an input to 6A14.

Figure 7:
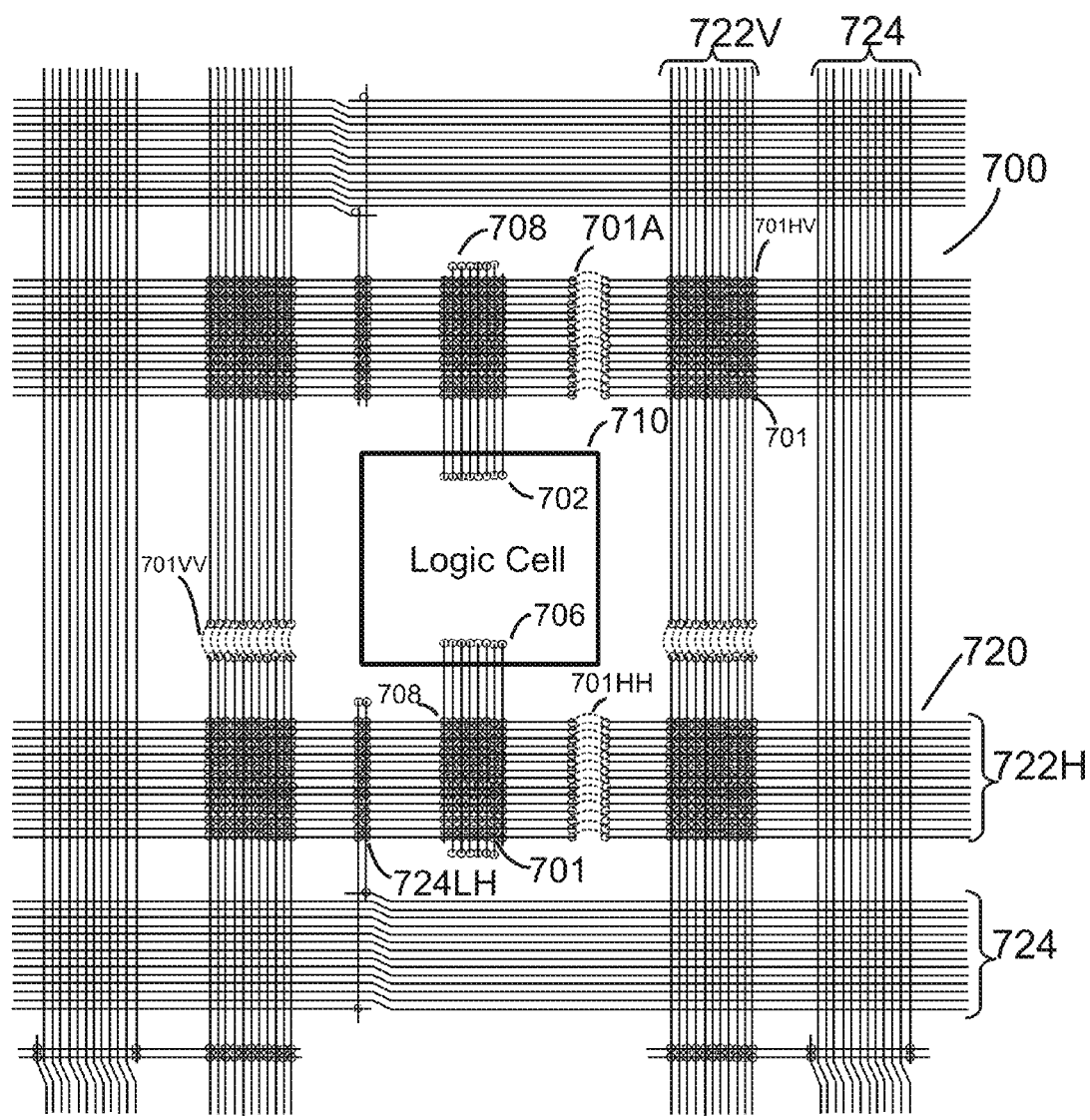
FIG. 7 illustrates an antifuse-based FPGA tile.

Antifuse-programmable logic elements such as described in FIGS. 5A-D, 6, and 7, are just representative of possible implementation of Logic Blocks of an FPGA. There are many possible variations of tying such element together, and connecting their I/O to the programmable routing fabric. The whole chip area can be tiled with such logic blocks logically embedded within programmable fabric 700 as illustrated in FIG. 7. Alternately, a heterogeneous tiling of the chip area is possible with LBs being just one possible element that is used for tiling, other elements being selected from memory blocks, configurable memory, Digital Signal Processing ("DSP") blocks, arithmetic elements, and many others.

FIG. 7 is a drawing illustration of an example Antifuse-based FPGA tiling 700 as mentioned above. It comprises of LB 710 embedded in programmable routing fabric 720. The LB can include any combination of the components described in FIGS. 5A-D and 6-6A, with its inputs and outputs 702 and 706. Each one of the inputs and outputs can be connected to short horizontal wires such as 722H by an AF-based connection matrix 708 made of individual AFs such as 701. The short horizontal wires can span multiple tiles through activating AF-based programming bridges 701HH and 701A. These programming bridges are constructed either from short strips on adjacent metal layer in the same direction as the main wire and with an AF at each end of the short strip, or through rotating adjacent tiles by 90 degree as illustrated in FIG. 4B and using single AF for bridging. Similarly, short vertical wires 722V can span multiple tiles through activating AF-based programming bridges 701VV. Change of signal direction from horizontal to vertical and vice versa can be achieved through activating AFs 701 in connection matrices like 701HV. In addition to short wires the tile also includes horizontal and vertical long wires 724. These wires span multiple cells and only a fraction of them is accessible to the short wires in a given tile through AF-based connection 724LH.

The depiction of the AF-based programmable tile above is just one example, and other variations are possible. For example, nothing limits the LB from being rotated 90 degrees with its inputs and outputs connecting to short vertical wires instead of short horizontal wires, or providing access to multiple long wires 724 in every tile.

Figure 8:
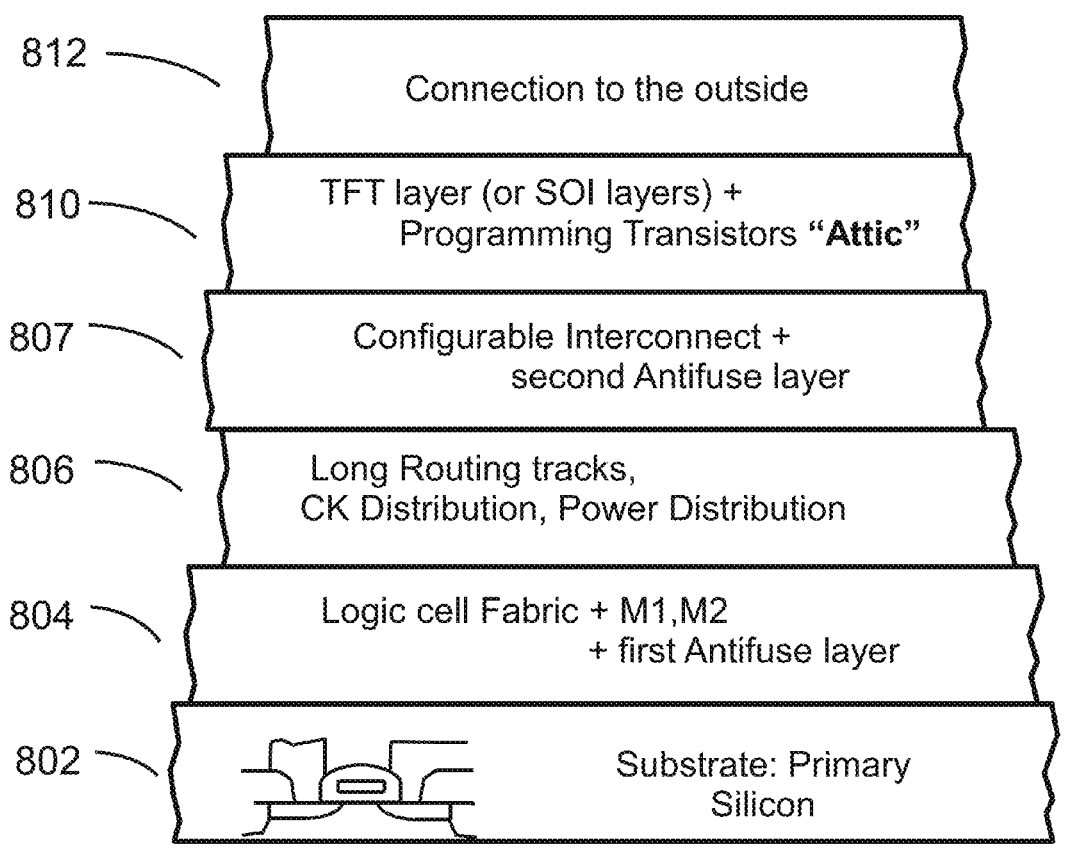
FIG. 8 illustrates a first 3D IC according to the present invention.

FIG. 8 is a drawing illustration of alternative implementation of the current invention, with AFs present in two dielectric layers. Here the functional transistors of the Logic Blocks are defined in the base substrate 802, with low metal layers 804 (M1 & M2 in this depiction, can be more as needed) providing connectivity for the definition of the LB. AFs are present in select locations between metal layers of low metal layers 804 to assist in finalizing the function of the LB. AFs in low metal layers 804 can also serve to configure clocks and other special signals (e.g., reset) present in layer 806 for connection to the LB and other special functions that do no require high density programmable connectivity to the configurable interconnect fabric 807. Additional AF use can be to power on used LBs and unpower unused ones to save on power dissipation of the device.

On top of layer 806 comes configurable interconnect fabric 807 with a second Antifuse layer. This connectivity is done similarly to the way depicted in FIG. 7 typically occupying two or four metal layers. Programming of AFs in both layers is done with programming circuitry designed in an Attic TFT layer 810, or other alternative over the oxide transistors, placed on top of configurable interconnect fabric 807 similarly to what was described previously. Finally, additional metals layers 812 are deposited on top of Attic TFT layer 810 to complete the programming circuitry in Attic TFT layer 810, as well as provide connections to the outside for the FPGA.

The advantage of this alternative implementation is that two layers of AFs provide increased programmability (and hence flexibility) for FPGA, with the lower AF layer close to the base substrate where LB configuration needs to be done, and the upper AF layer close to the metal layers comprising the configurable interconnect.

U.S. Pat. Nos. 5,374,564 and 6,528,391, describe the process of Layer Transfer whereby a few tens or hundreds nanometer thick layer of monocrystalline silicon from "donor" wafer is transferred on top of a base wafer using oxide-oxide bonding and ion implantation Such a process, for example, is routinely used in the industry to fabricate the so-called Silicon-on-Insulator ("SOI") wafers for high performance integrated circuits ("IC"s).

Figure 8A:
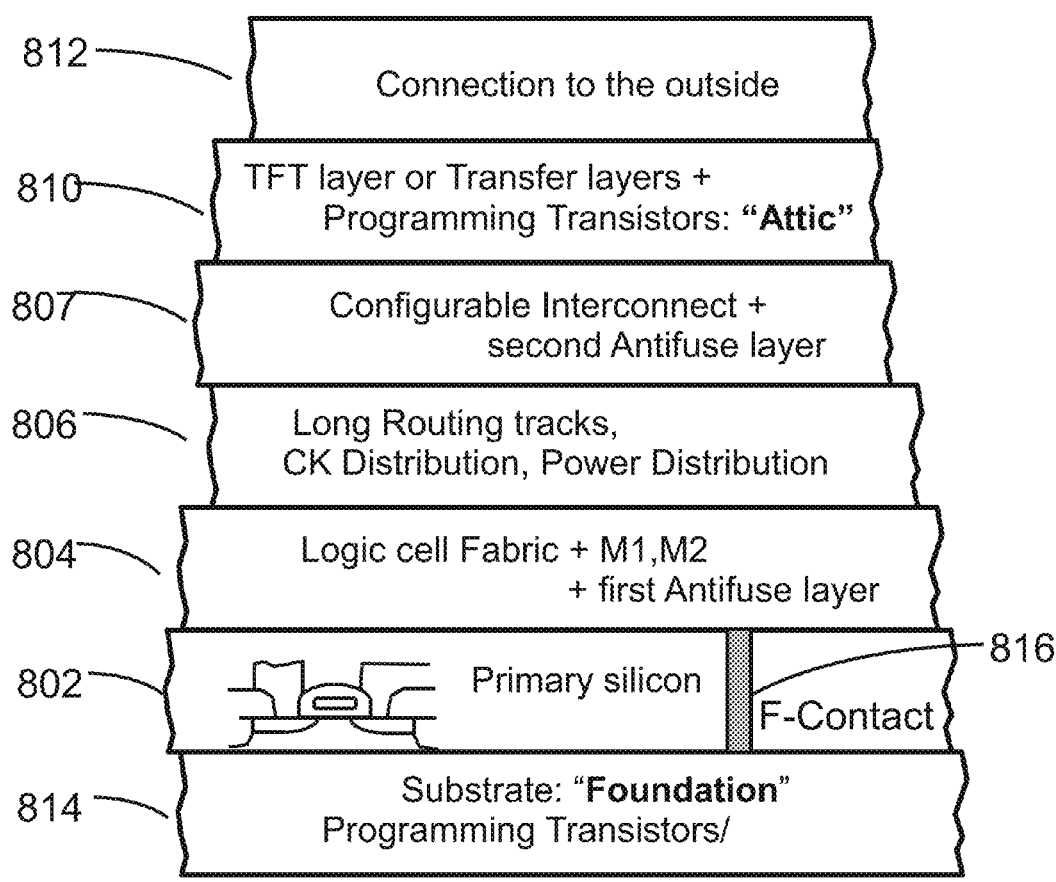
FIG. 8A illustrates a second 3D IC according to the present invention.

Yet another alternative implementation of the current invention is illustrated in FIG. 8A. It builds on the structure of FIG. 8, except that what was base substrate 802 in FIG. 8 is now a primary silicon layer 802A placed on top of an insulator above base substrate 814 using the abovementioned Layer Transfer process.

In contrast to the typical SOI process where the base substrate carries no circuitry, the current invention suggest to use base substrate 814 to provide high voltage programming circuits that will program the lower level low metal layers 804 of AFs. We will use the term "Foundation" to describe this layer of programming devices, in contrast to the "Attic" layer of programming devices placed on top that has been previously described.

The major obstacle to using circuitry in the Foundation is the high temperature potentially needed for Layer Transfer, and the high temperature needed for processing the primary silicon layer 802A. High temperatures in excess of 400° C. that are often needed cause damage to pre-existing copper or aluminum metallization patterns that may have been previously fabricated in Foundation base substrate 814. U.S. Patent Application Publication 2009/0224364 proposes using tungsten-based metallization to complete the wiring of the relatively simple circuitry in the Foundation. Tungsten has very high melting temperature and can withstand the high temperatures that may be needed for both for Layer Transfer and for processing of primary silicon layer 802A. Because the Foundation provides mostly the programming circuitry for AFs in low metal layers 804, its lithography can be less advanced and less expensive than that of the primary silicon layer 802A and facilitates fabrication of high voltage devices needed to program AFs. Further, the thinness and hence the transparency of the SOI layer facilitates precise alignment of patterning of primary silicon layer 802A to the underlying patterning of base substrate 814.

Having two layers of AF-programming devices, Foundation on the bottom and Attic on the top, is an effective way to architect AF-based FPGAs with two layers of AFs. The first AF layer low metal layers 804 is close to the primary silicon base substrate 802 that it configures, and its connections to it and to the Foundation programming devices in base substrate 814 are directed downwards. The second layer of AFs in configurable interconnect fabric 807 has its programming connections directed upward towards Attic TFT layer 810. This way the AF connections to its programming circuitry minimize routing congestion across layers 802, 804, 806, and 807.

Figure 9A:
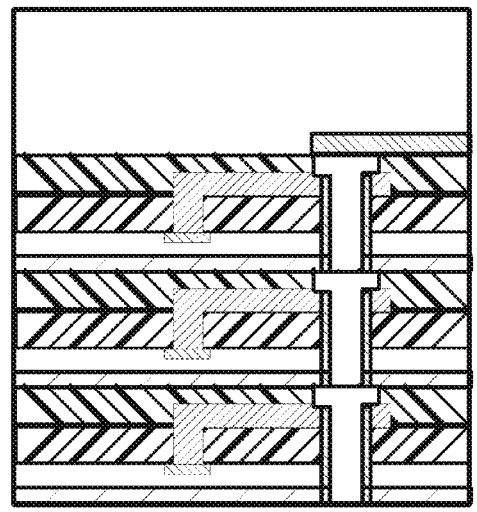
FIG. 9A illustrates a first prior art 3DIC.
Figure 9B:
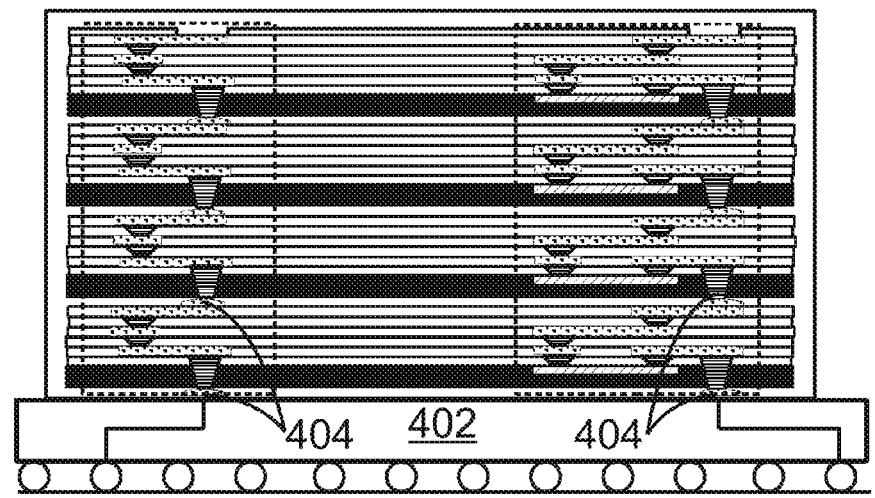
FIG. 9B illustrates a second prior art 3DIC.
Figure 9C:
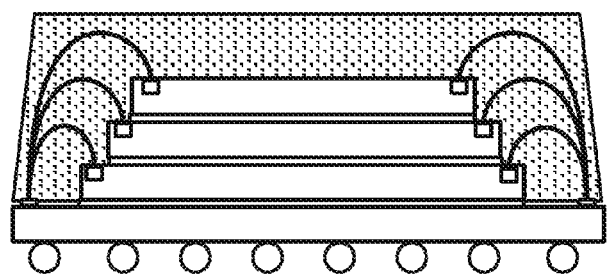
FIG. 9C illustrates a third prior art 3DIC.

FIGS. 9A through 9C illustrates prior art alternative configurations for three-dimensional ("3D") integration of multiple dies constructing IC system and utilizing Through Silicon Via. FIG. 9A illustrates an example in which the Through Silicon Via is continuing vertically through all the dies constructing a global cross-die connection. FIG. 9B provides an illustration of similar sized dies constructing a 3D system. 9B shows that the Through Silicon Via 404 is at the same relative location in all the dies constructing a standard interface.

FIG. 9C illustrates a 3D system with dies having different sizes. FIG. 9C also illustrates the use of wire bonding from all three dies in connecting the IC system to the outside.

Figure 10A:
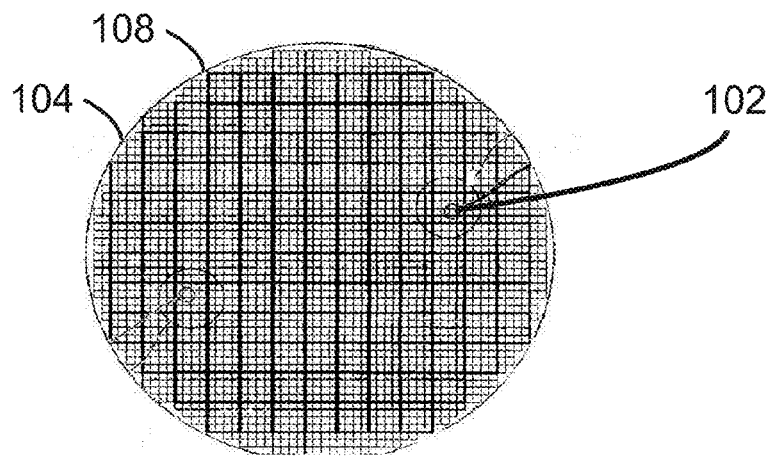
FIG. 10A illustrates a prior art continuous array wafer.
Figure 10B:
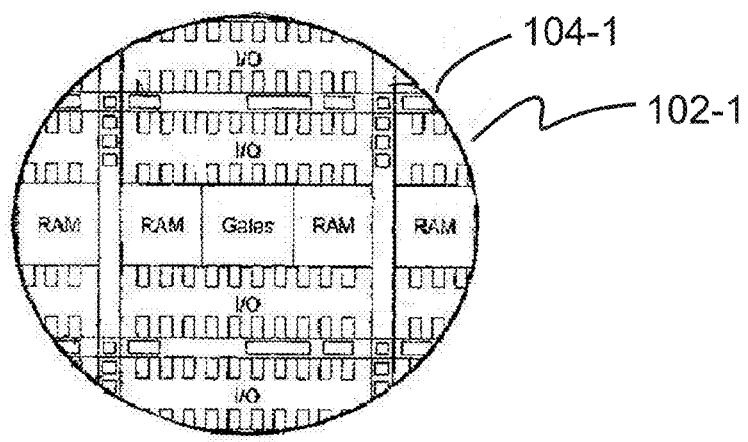
FIG. 10B illustrates a first prior art continuous array wafer tile.
Figure 10C:
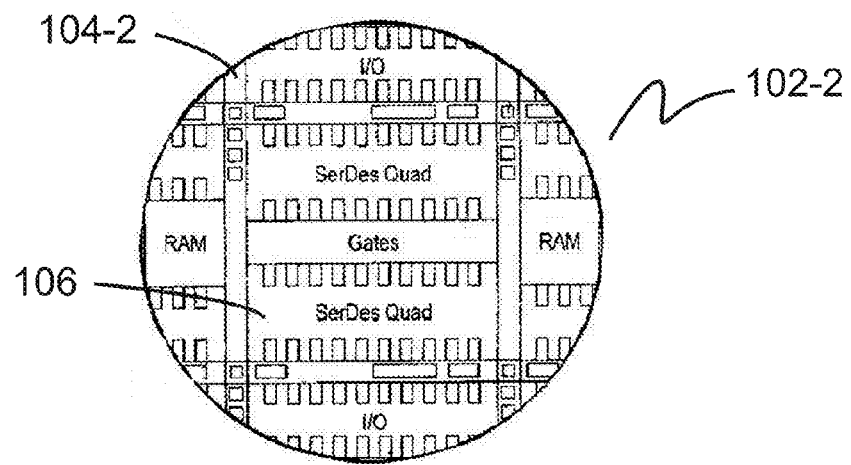
FIG. 10C illustrates a second prior art continuous array wafer tile.

FIG. 10A is a drawing illustration of a continuous array wafer of a prior art U.S. Pat. No. 7,337,425. The bubble 102 shows the repeating tile of the continuous array, 104 are the horizontal and vertical potential dicing lines (or dice lines). The tile 102 could be constructed as in FIG. 10B 102-1 with potential dicing line 104-1 or as in FIG. 10C with SerDes Quad 106 as part of the tile 102-2 and potential dicing lines 104-2.

In general, logic devices need varying amounts of logic, memory, and I/O. The continuous array ("CA") of U.S. Pat. No. 7,105,871 allows flexible definition of the logic device size, yet for any size the ratio between the three components remained fixed, barring minor boundary effect variations. Further, there exist other types of specialized logic that are difficult to implement effectively using standard logic such as DRAM, Flash memory, DSP blocks, processors, analog functions, or specialized I/O functions such as SerDes. The continuous array of prior art does not provide effective solution for these specialized yet not common enough functions that would justify their regular insertion into CA wafer.

Embodiments of the current invention enable a different and more flexible approach. Additionally the prior art proposal for continuous array were primarily oriented toward Gate Array and Structured ASIC where the customization includes some custom masks. In contrast, the current invention proposes an approach which could fit well FPGA type products including options without any custom masks. Instead of adding a broad variety of such blocks into the CA which would make it generally area-inefficient, and instead of using a range of CA types with different block mixes which would require large number of expensive mask sets, the current invention allows using Through Silicon Via to enable a new type of configurable system. Modern integrated circuits mask sets may include more than 20 masks and typically may include more than 40 masks. In general any metal interconnect layer is associated with two masks so a device that has eight metal layers would comprise 16 masks just for these interconnection layers.

The technology of "Package of integrated circuits and vertical integration" has been described in U.S. Pat. No. 6,322,903 issued to Oleg Siniaguine and Sergey Savastiouk on Nov. 27, 2001. Accordingly, embodiment of the current invention suggests the use of CA tiles, each made of one type, or of very few types, of elements. The target system is then constructed using desired number of tiles of desired type stacked on top of each other and connected with TSVs comprising 3D Configurable System.

Figures 11C, 11D:
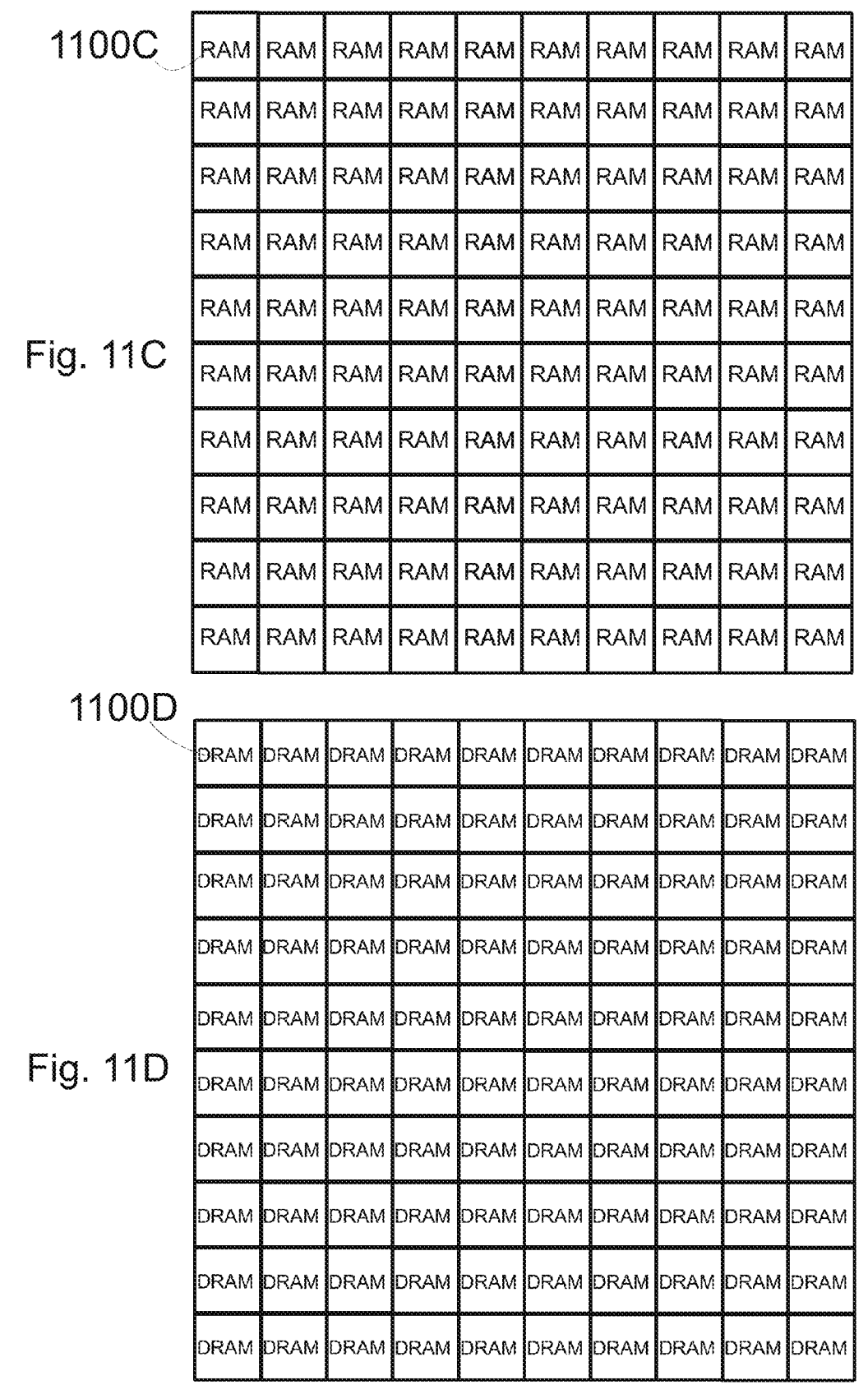

FIG. 11A is a drawing illustration of one reticle size area of CA wafer, here made of FPGA-type of tiles 1100A. Between the tiles there exist potential dicing lines 1102 that allow the wafer to be diced into desired configurable logic die sizes. Similarly, FIG. 11B illustrates CA comprising structured ASIC tiles 1109B that allow the wafer to be diced into desired configurable logic die sizes. FIG. 11C illustrates CA comprising RAM tiles 1100C that allow the wafer to be diced into desired RAM die sizes. FIG. 11D illustrates CA comprising DRAM tiles 1100D that allow the wafer to be diced into desired DRAM die sizes. FIG. 11E illustrates CA comprising microprocessor tiles 1100E that allow the wafer to be diced into desired microprocessor die sizes. FIG. 11F illustrates CA comprising I/O or SerDes tiles 1100F that allow the wafer to be diced into desired I/O die or SERDES die or combination I/O and SERDES die sizes. It should be noted that the edge size of each type of repeating tile may differ, although there may be an advantage to make all tile sizes a multiple of the smallest desirable tile size. For FPGA-type tile 1100A an edge size between 0.5 mm and 1 mm represents a good tradeoff between granularity and area loss due to unused potential dicing lines.

In some types of CA wafers it may be advantageous to have metal lines crossing perpendicularly the potential dicing lines, which will allow connectivity between individual tiles. This requires cutting some such lines during wafer dicing. Alternate embodiment may not have metal lines crossing the potential dicing lines and in such case connectivity across uncut dicing lines can be obtained using dedicated mask and custom metal layers accordingly to provide connections between tiles for the desired die sizes.

It should be noted that in general the lithography over the wafer is done by repeatedly projecting what is named reticle over the wafer in a "step-and-repeat" manner. In some cases it might be preferable to consider differently the separation between repeating tile 102 within a reticle image vs. tiles that relate to two projections. For simplicity this description will use the term wafer but in some cases it will apply only to tiles within one reticle.

Figure 12A:
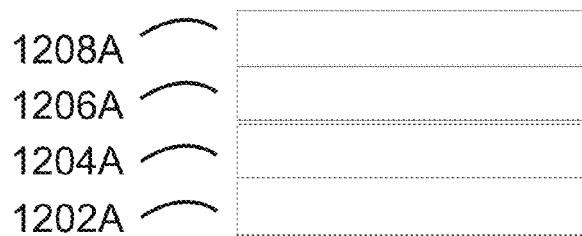
FIG. 12A illustrates a 3D IC of the present invention comprising equal sized continuous array tiles.
Figure 12B:
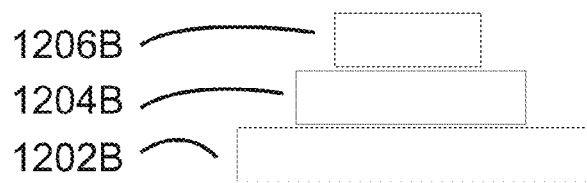
FIG. 12B illustrates a 3D IC of the present invention comprising different sized continuous array tiles.
Figure 12C:
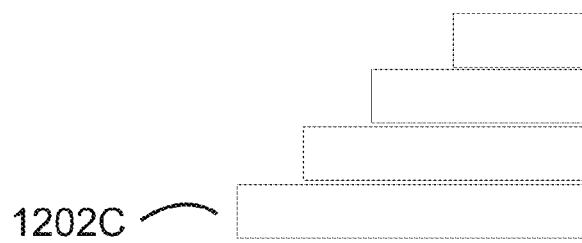
FIG. 12C illustrates a 3D IC of the present invention comprising different sized continuous array tiles with a different alignment from FIG. 12B.
Figure 12D:
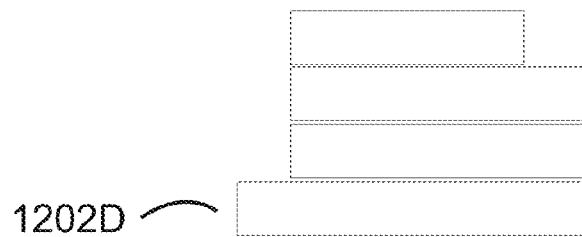
FIG. 12D illustrates a 3D IC of the present invention comprising some equal and some different sized continuous array tiles.
Figure 12E:
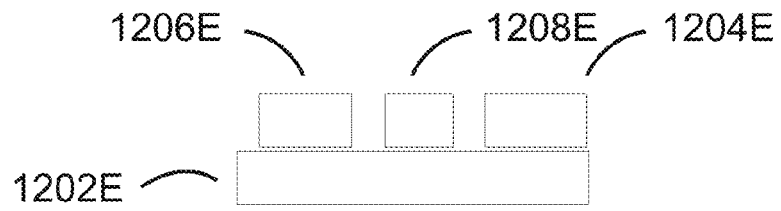
FIG. 12E illustrates a 3D IC of the present invention comprising smaller sized continuous array tiles at the same level on a single tile.

FIGS. 12A-E is a drawing illustration of how dies cut from CA wafers such as in FIGS. 11A-F can be assembled into a 3D Configurable System using TSVs. FIG. 12A illustrates the case where all dies 1202A, 1204A, 1206A and 1208A are of the same size. FIGS. 12B and 12C illustrate cases where the upper dies are decreasing in size and have different type of alignment. FIG. 12D illustrates a mixed case where some, but not all, of the stacked dies are of the same size. FIG. 12E illustrates the case where multiple smaller dies are placed at a same level on top of a single die. It should be noted that such architecture allows constructing wide variety of logic devices with variable amounts of specific resources using only small number of mask sets. It should be also noted that the preferred position of high power dissipation tiles like logic is toward the bottom of such 3D stack and closer to external cooling access, while the preferred position of I/O tiles is at the top of the stack where it can directly access the Configurable System I/O pads or bumps.

Person skilled in the art will appreciate that a major benefit of the approaches illustrated by FIGS. 12A-12E occurs when the TSV patterns on top of each die are standardized in shape, with each TSV having either predetermined or programmable function. Once such standardization is achieved an aggressive mix and match approach to building broad range of System on a Chip ("SoC") 3D Configurable Systems with small number of mask sets defining borderless Continuous Array stackable wafers becomes viable. Of particular interest is the case illustrated in 12E that is applicable to SoC or FPGA based on high density homogenous CA wafers, particularly without off-chip I/O Standard TSV pattern on top of CA sites allows efficient tiling with custom selection of I/O, memory, configurable memory, DSP, and similar blocks and with a wide variety of characteristics and technologies on top of the high-density SoC 3D stack.

A 3D system, such as has been described in relation to at least FIG. 11 and FIG. 12 herein, is not limited to a configurable system and could be used in other types of platform configurations. The strata of such a 3D system could be connected by TSV and might use an interposer or be directly placed one on top of the other. Also the strata might be connected by what has been called in this application and the patents, publications, and applications that are incorporated by reference, through layer via ("TLV") where the layer carrying the transistor is thin (below 2 micron or even below 100 nm in thickness).

Figure 52:
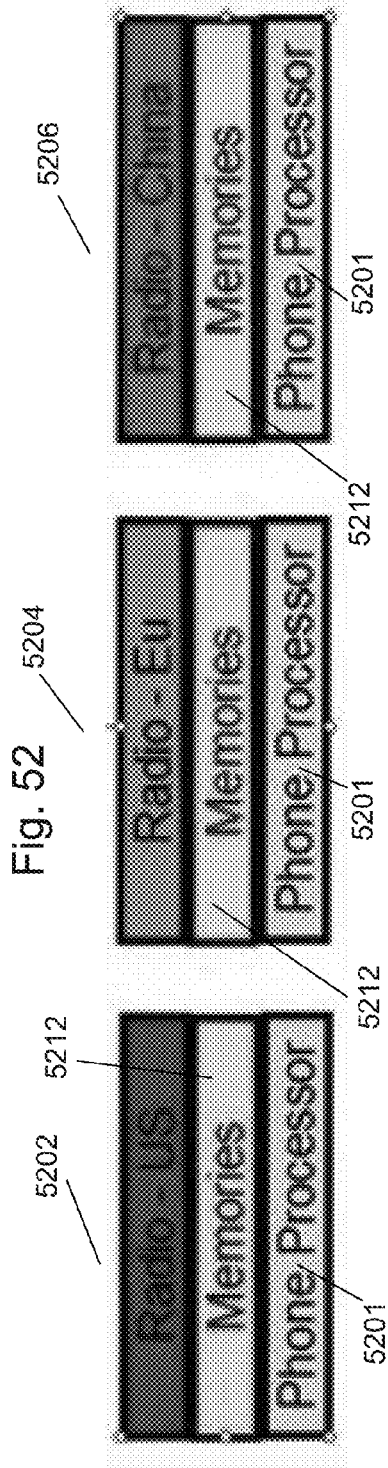
FIG. 52 illustrates a 3D platform.

FIG. 52 illustrates a 3D platform constructed accordingly. Platform base 5201 could be the same type of stratum, for example, a Phone Processor, which may be overlaid by and connected to a second stratum 5212, for example, a memory stratum. This platform could be produced in high volume and could be stocked in wafer form or die form. A market specific 3D system could be constructed by overlaying and connecting to the platform (formed by platform base 5201 and second stratum 5212), a third stratum which maybe designed and manufactured for a specific market, for example, a Radio for US 5202, a Radio for Europe 5204 or a Radio for China 5206. The system could be constructed of stratum on top of a stratum interconnected by TSV or TLV or side by side wiring using, what is now called by the industry, interposers. There are many advantages for such a 3D platform, including reduced cost of the common element design, reduced cost of volume manufacturing, and shorter time to market and to volume for any new specific market that need only few, and ideally only one, customized stratum and the remainder of the system a similar set of stratums.

Additional embodiment for a 3D platform is to use a variation of strata which might include in some platforms a single stratum of memory and in another platform two strata of memory offering a larger memory. Another variation could use a different amount of programmable logic ranging from no programmable logic to multiple strata of programmable logic. Another variation could add special system input/output resources ranging from no SERDES to one or more strata of I/O (Input Output) that may include various amounts of SERDES enabled I/O.

Figure 13:
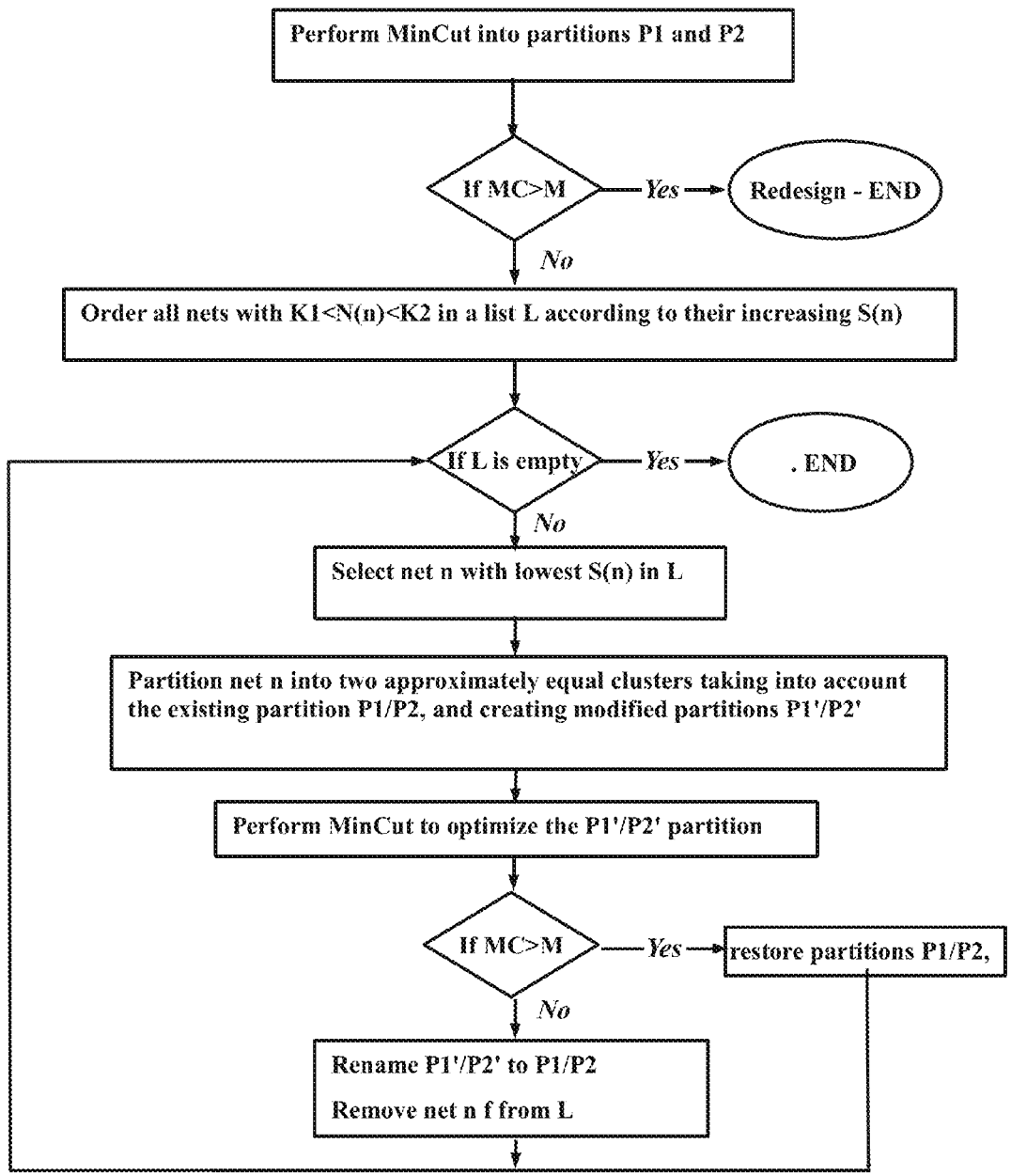
FIG. 13 illustrates a flow chart of a partitioning method according to the present invention.

FIG. 13 is a flow chart illustration of a partitioning method to take advantage of the 3D increased concept of proximity. It uses the following notation:

M—Maximum number of TSVs available for a given IC
MC—Number of nets (connections) between two partitions
S(n)—Timing slack of net n
N(n)—The fanout of net n
K1, K2—constants determined by the user
min-cut—a known algorithm to split a graph into two partitions each of about equal number of nodes with minimal number of arcs between the partitions.

The key idea behind the flow is to focus first on large-fanout low-slack nets that can take the best advantage of the added three-dimensional proximity. K1 is selected to limit the number of nets processed by the algorithm, while K2 is selected to remove very high fanout nets, such as clocks, from being processed by it, as such nets are limited in number and may be best handled manually Choice of K1 and K2 should yield MC close to M.

A partition is constructed using min-cut or similar algorithm. Timing slack is calculated for all nets using timing analysis tool. Targeted high fanout nets are selected and ordered in increasing amount of timing slack. The algorithm takes those nets one by one and splits them about evenly across the partitions, readjusting the rest of the partition as needed.

Person skilled in the art will appreciate that a similar process can be extended to more than 2 vertical partitions using multi-way partitioning such as ratio-cut or similar.

Figure 14:
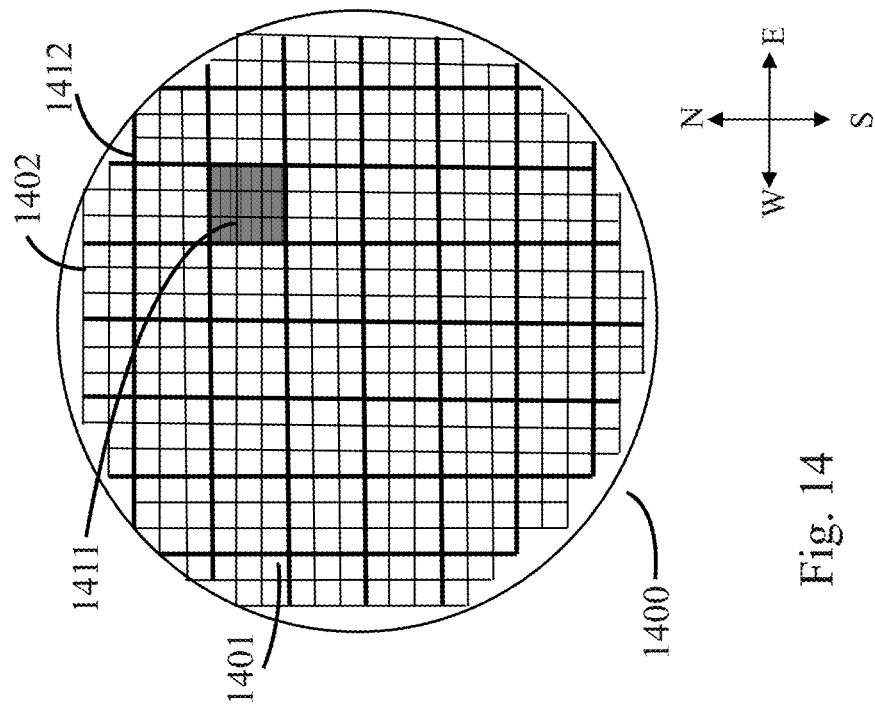
FIG. 14 illustrates a continuous array wafer with different dicing options according to the present invention.

There are many manufacturing and performance advantages to the flexible construction and sizing of 3D Configurable System as described above. At the same time it is also helpful if the complete 3D Configurable System behaves as a single system rather than as a collection of individual tiles. In particular it is helpful is such 3D Configurable System can automatically configure itself for self-test and for functional operation in case of FPGA logic and the likes. FIG. 14 illustrates how this can be achieved in CA architecture, where a wafer 1400 carrying a CA of tiles 1401 with potential dicing lines 1412 has targeted 3×3 die size for device 1411.

Figure 15:
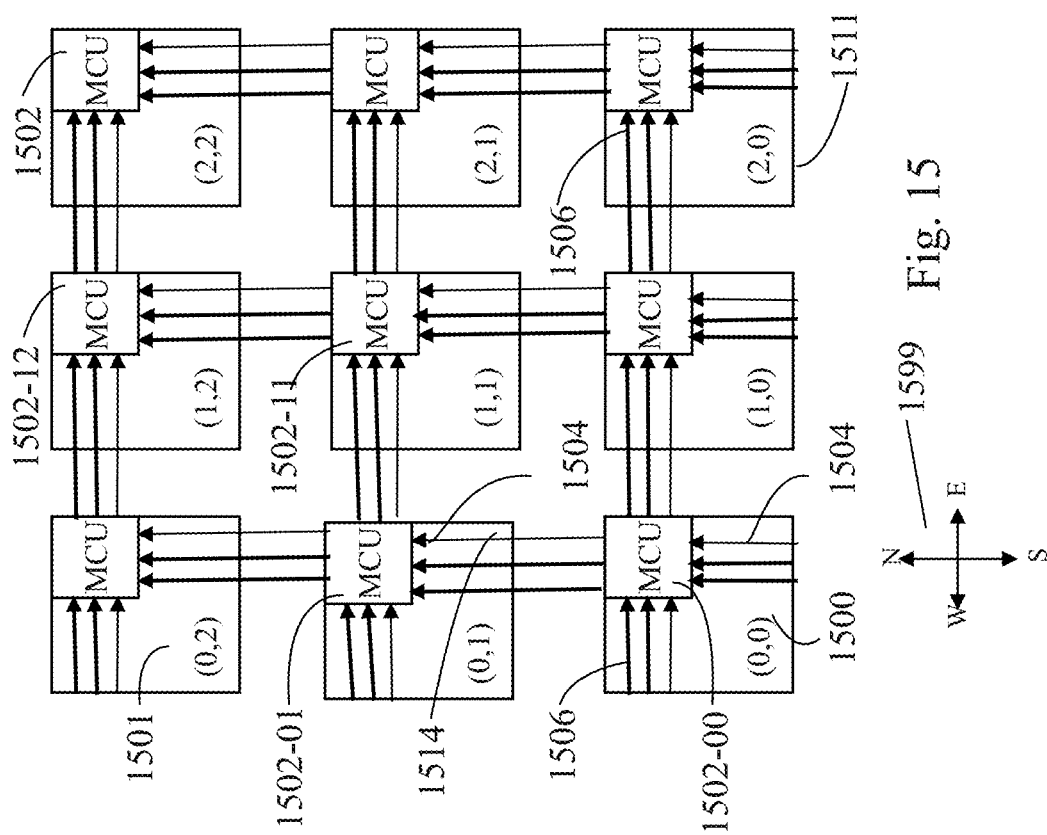
FIG. 15 illustrates a 3×3 array of continuous array tiles according to the present invention with a microcontroller testing scheme.

FIG. 15 is a drawing illustration of the 3×3 target device 1411 comprising 9 tiles 1501 such as 1401. Each tile 1501 includes a small microcontroller unit ("MCU") 1502. For ease of description the tiles are indexed in 2 dimensions starting at bottom left corner. The MCU is a fully autonomous controller such as 8051 with program and data memory and input/output lines. The MCU of each tile is used to configure, initialize, and potentially tests and manage, the configurable logic of the tile. Using the compass rose 1599 as a reference in FIG. 15, MCU inputs of each tile are connected to its southern neighbor through fixed connection lines 1504 and its western neighbor through fixed connection lines 1506. Similarly each MCU drives its northern and eastern neighbors. Each MCU is controlled in priority order by its western neighbor and by its southern neighbor. For example, MCU 1502-11 is controlled by MCU 1502-01, while MCU 1502-01 having no western neighbor is controlled by MCU 1502-00 south of it. MCU 1502-00 that senses neither westerly nor southerly neighbors automatically becomes the die master. It should be noted that the directions in the discussion above are representative and the system can be trivially modified to adjust to direction changes.

Figure 16:
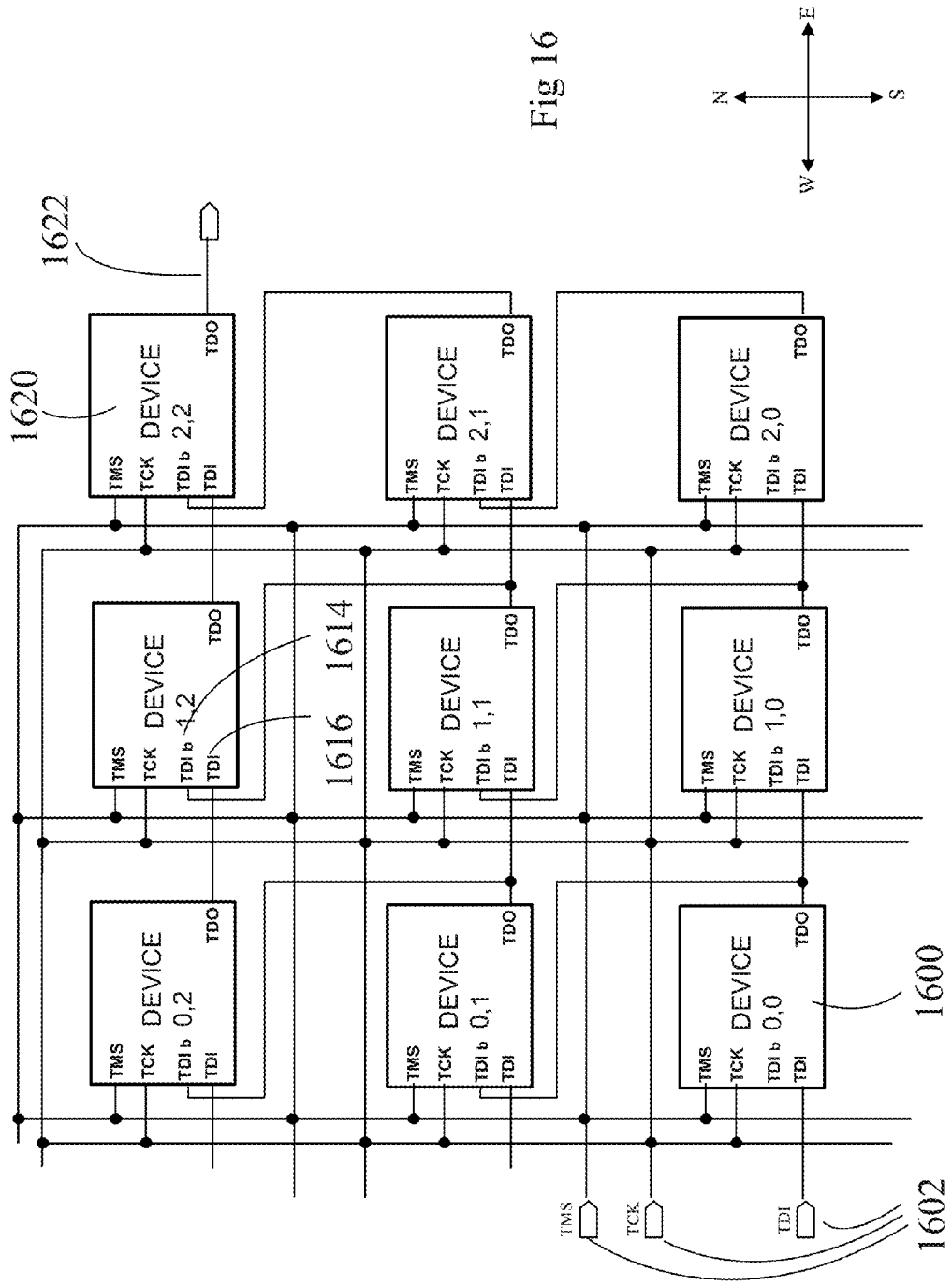
FIG. 16 illustrates a 3×3 array of continuous array tiles according to the present invention with a Joint Test Action Group (JTAG) testing scheme.

FIG. 16 is a drawing illustration of a scheme using modified Joint Test Action Group ("JTAG") (also known as IEEE Standard 1149.1) industry standard interface interconnection scheme. Each MCU has two TDI inputs TDI 1616 and TDIb 1614 instead of one, which are priority encoded with 1616 having the higher priority. JTAG inputs TMS and TCK are shared in parallel among the tiles, while JTAG TDO output of each MCU is driving its northern and eastern neighbors. Die level TDI, TMS, and TCK pins 1602 are fed to tile 1600 at lower left, while die level TDO 1622 is output from top right tile 1620. Accordingly, such setup allows the MCUs in any convex rectangular array of tiles to self configure at power-on and subsequently allow for each MCU to configure, test, and initialize its own tile using uniform connectivity.

The described uniform approach to configuration, test, and initialization is also helpful for designing SoC dies that include programmable FPGA array of one or more tiles as a part of their architecture. The size-independent self-configuring electrical interface allows for easy electrical integration, while the autonomous FPGA self test and uniform configuration approach make the SoC boot sequence easier to manage.

U.S. Patent Application Publication 2009/0224364 describes methods to create 3D systems made of stacking very thin layers, of thickness of few tens to few hundreds of nanometers, of monocrystalline silicon with pre-implanted patterning on top of base wafer using low-temperature (below approximately 400° C.) technique called layer transfer.

Figure 17:
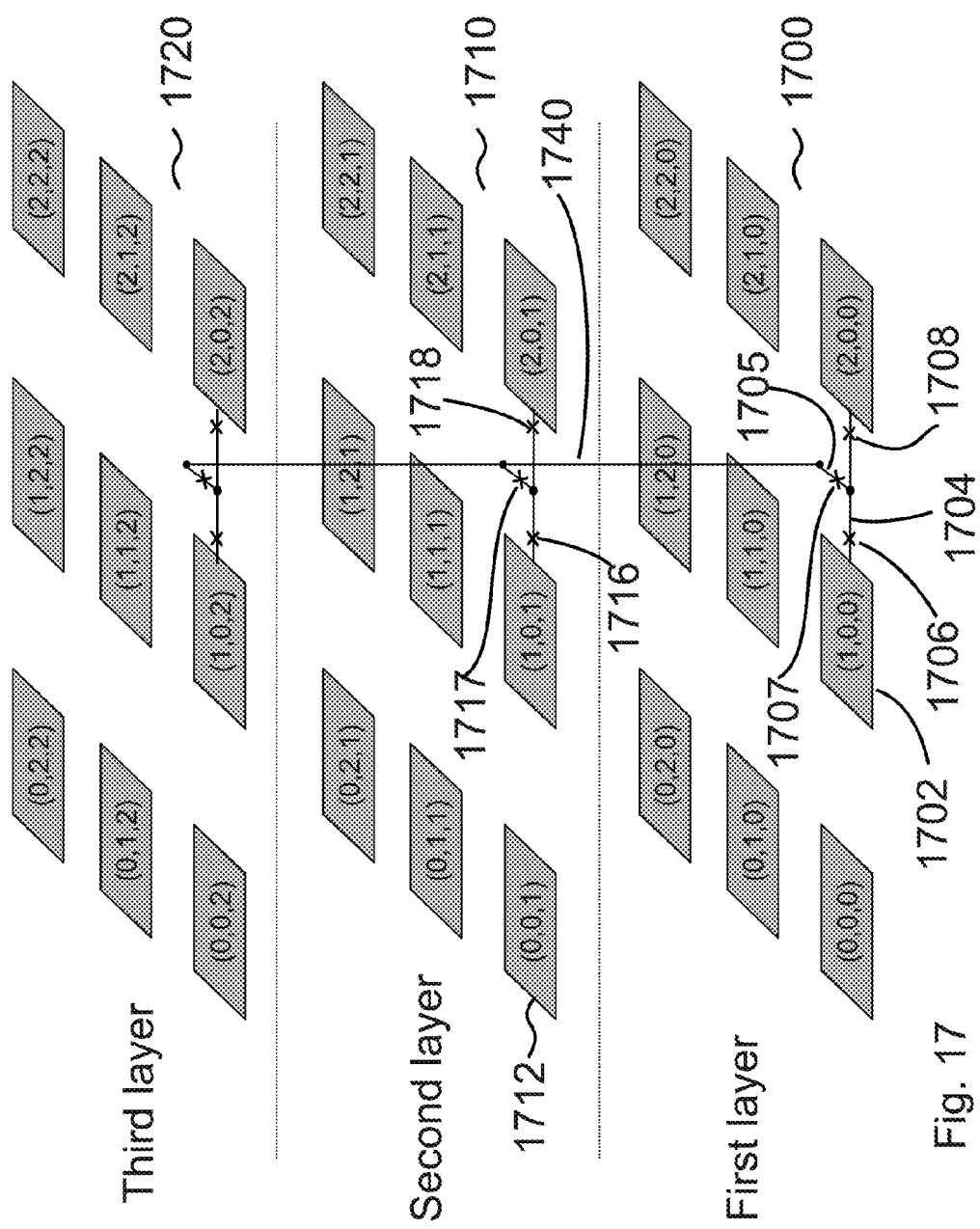
FIG. 17 illustrates a programmable 3D IC with redundancy according to the present invention.

An alternative of the invention uses vertical redundancy of configurable logic device such as FPGA to improve the yield of 3DICs. FIG. 17 is a drawing illustration of a programmable 3D IC with redundancy. It comprises of three stacked layers 1700, 1710 and 1720, each having 3×3 array of programmable LBs indexed with three dimensional subscripts. One of the stacked layers is dedicated to redundancy and repair, while the rest of the layers—two in this case—are functional. In this discussion we will use the middle layer 1710 as the repair layer. Each of the LB outputs has a vertical connection such as 1740 that can connect the corresponding outputs at all vertical layers through programmable switches such as 1707 and 1717. The programmable switch can be Antifuse-based, a pass transistor, or an active-device switch.

Functional connection 1704 connects the output of LB (1, 0, 0) through switches 1706 and 1708 to the input of LB (2, 0, 0). In case LB (1, 0, 0) malfunctions, which can be found by testing, the corresponding LB (1, 0, 1) on the redundancy/ repair layer can be programmed to replace it by turning off switch 1706 and turning on switches 1707, 1717, and 1716 instead. The short vertical distance between the original LB and the repair LB guarantees minimal impact on circuit performance. In a similar way LB (1, 0, 1) could serve to repair malfunction in LB (1, 0, 2). It should be noted that the optimal placement for the repair layer is about the center of the stack, to optimize the vertical distance between malfunctioning and repair LBs. It should be also noted that a single repair layer can repair more than two functional layers, with slowly decreasing efficacy of repair as the number of functional layers increases.

In a 3D IC based on layer transfer in U.S. Patent Applications Publications 2006/0275962 and 2007/0077694 we will call the underlying wafer a Receptor wafer, while the layer placed on top of it will come from a Donor wafer. Each such layer can be patterned with advanced fine pitch lithography to the limits permissible by existing manufacturing technology. Yet the alignment precision of such stacked layers is limited. Best layer transfer alignment between wafers is currently on the order of 1 micron, almost two orders of magnitude coarser than the feature size available at each individual layer, which prohibits true high-density vertical system integration.

Figure 18A:
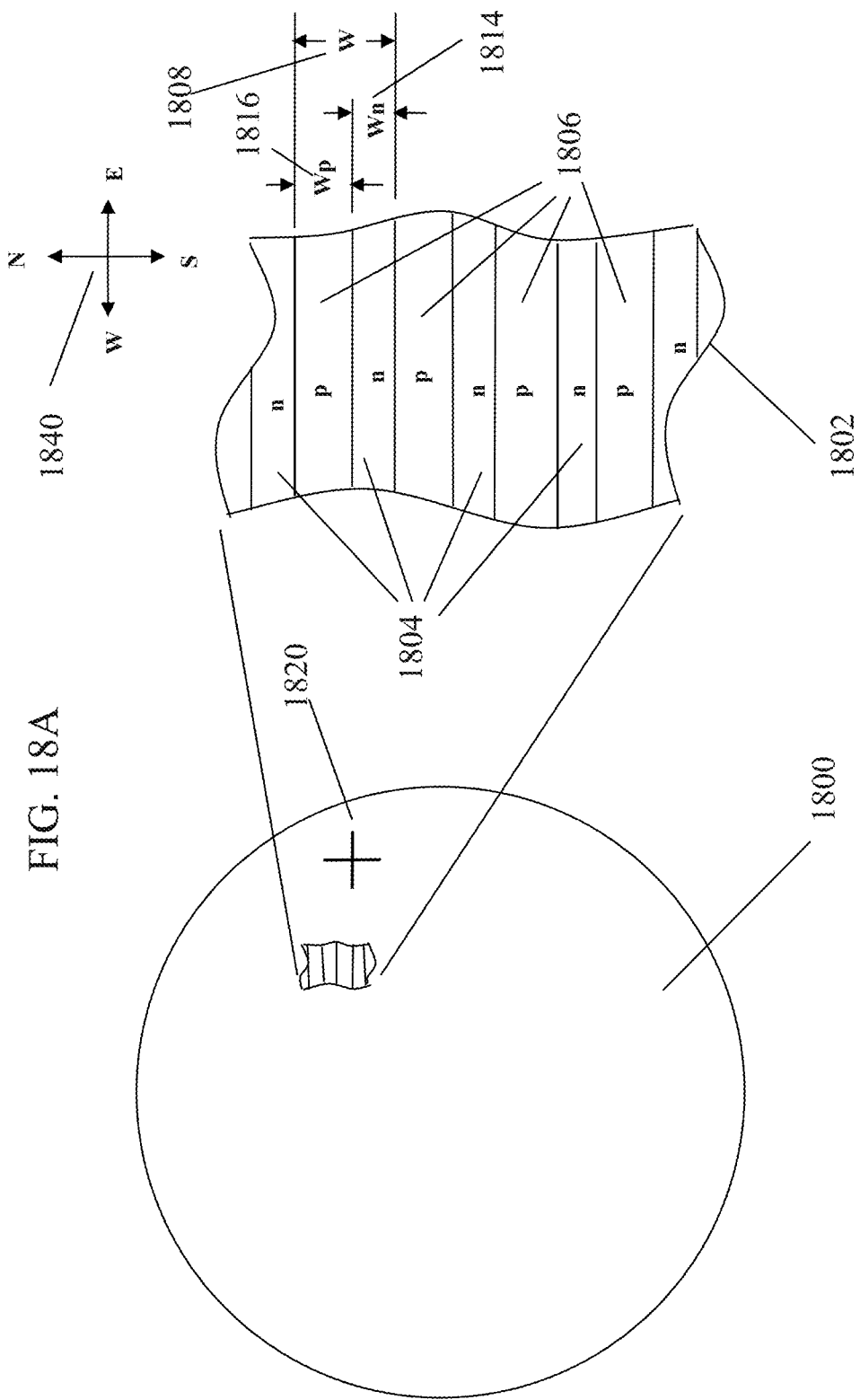
FIG. 18A illustrates a first alignment reduction scheme according to the present invention.
Figure 18C:
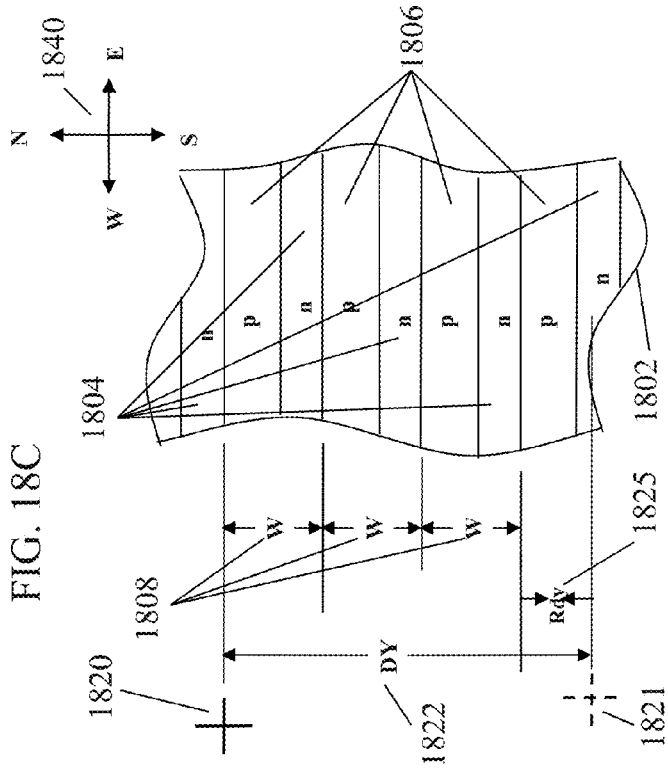
FIG. 18C illustrates alignment with respect to a repeatable structure in the alignment in the alignment reduction scheme of FIG. 18A.

FIG. 18A is a drawing illustration that sets the basic elements to show how such large misalignment can be reduced for the purpose of vertical stacking of pre-implanted monocrystalline silicon layers using layer transfer. Compass rose 1840 is used throughout to assist in describing the invention. Donor wafer 1800 comprises repetitive bands of P devices 1806 and N devices 1804 in the north-south direction as depicted in its magnified region 1802. The width of the P band 1806 is Wp 1816, and that of the N band 1804 is Wn 1814. The overall pattern repeats every step W 1808, which is the sum of Wp, Wn, and possibly an additional isolation band. Alignment mark 1820 is aligned with these patterns on 1800. FIG. 18B is a drawing illustration that demonstrates how such donor wafer 1800 can be placed on top of a Receptor wafer 1810 that has its own alignment mark 1821. In general, wafer alignment for layer transfer can maintain very precise angular alignment between wafers, but the error DY 1822 in north-south direction and DX 1824 in east-west direction are large and typically much larger than the repeating step W 1808. This situation is illustrated in drawing of FIG. 18C. However, because the pattern on the donor wafer repeats in the north-south direction, the effective error in that direction is only Rdy 1825, the remainder of DY 1822 modulo W 1808. Clearly, Rdy 1825 is equal or smaller than W 1808.

Figure 18D:
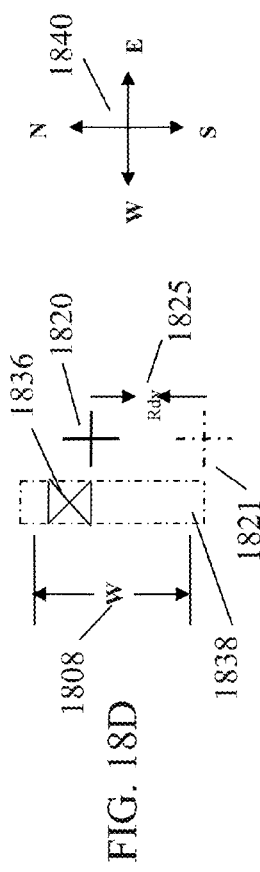
FIG. 18D illustrates an inter-wafer via contact landing area in the alignment reduction scheme of FIG. 18A.
Figure 18B:
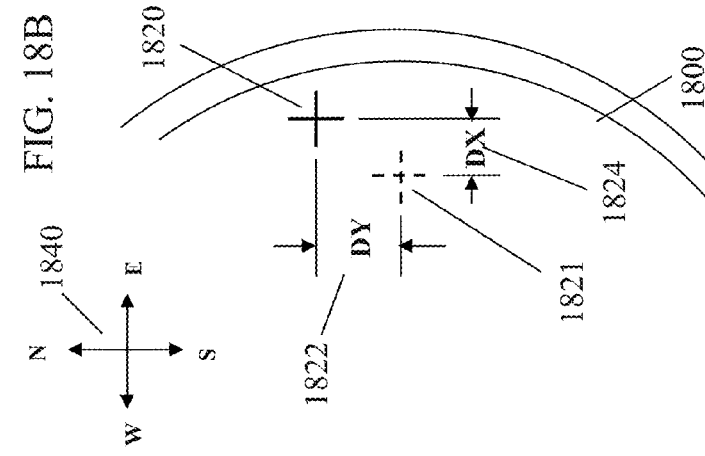
FIG. 18B illustrates donor and receptor wafer alignment in the alignment reduction scheme of FIG. 18A.

FIG. 18D is a drawing illustration that completes the explanation of this concept. For a feature on the Receptor to have an assured connection with any point in a metal strip 1838 of the Donor, it is sufficient that the Donor strip is of length W in the north-south direction plus the size of an inter-wafer via 1836 (plus any additional overhang as dictated by the layout design rules as needed, plus accommodation for angular wafer alignment error as needed, plus accommodations for wafer bow and warp as needed). Also, because the transferred layer is very thin as noted above, it is transparent and both alignment marks 1820 and 1821 are visible readily allowing calculation of Rdy and the alignment of via 1836 to alignment mark 1820 in east-west direction and to alignment mark 1821 in north-south direction.

Figure 19A:
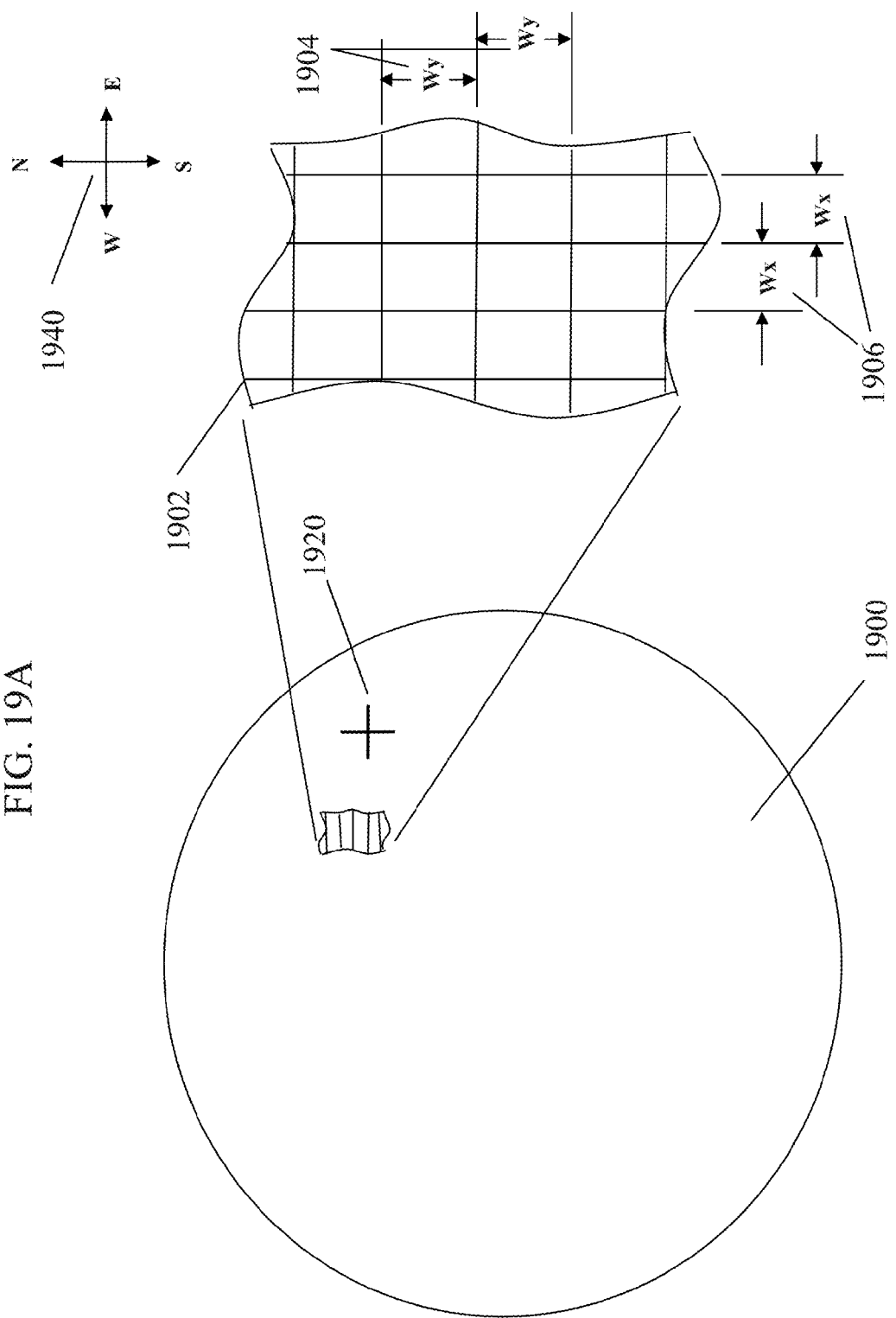
FIG. 19A illustrates a second alignment reduction scheme according to the present invention.

FIG. 19A is a drawing illustration that extends this concept into two dimensions. Compass rose 1940 is used throughput to assist in describing the invention. Donor wafer 1900 has an alignment mark 1920 and the magnification 1902 of its structure shows a uniform repeated pattern of devices in both north-south and east-west directions, with steps Wy 1904 and Wx 1906 respectively. FIG. 19B shows a placement of such wafer 1900 onto a Receptor wafer 1910 with its own alignment mark 1921, and with alignment errors DY 1922 and DX 1924 in north-south and east-west respectively. FIG. 19C shows, in a manner analogous to FIG. 18C, shows that the maximum effective misalignments in both north-south and east-west directions are the remainders Rdy 1925 of DY modulo Wy and Rdx 1908 of DX modulo Wx respectively, both much smaller than the original misalignments DY and DX. As before, the transparency of the very thin transferred layer readily allows the calculation of Rdx and Rdy after layer transfer. FIG. 19D, in a manner analogous to FIG. 18D, shows that the minimum landing area 1938 on the Receptor wafer to guarantee connection to any region of the Donor wafer is of size Ly 1905 (Wy plus inter-wafer via 1966 size) by Lx 1907 (Wx plus via 1966 size), plus any overhangs that may be required by layout rules and additional wafer warp, bow, or angular error accommodations as needed. As before, via 1966 is aligned to both marks 1920 and 1921. Landing area 1938 may be much smaller than wafer misalignment errors DY and DX.

Figure 19E:
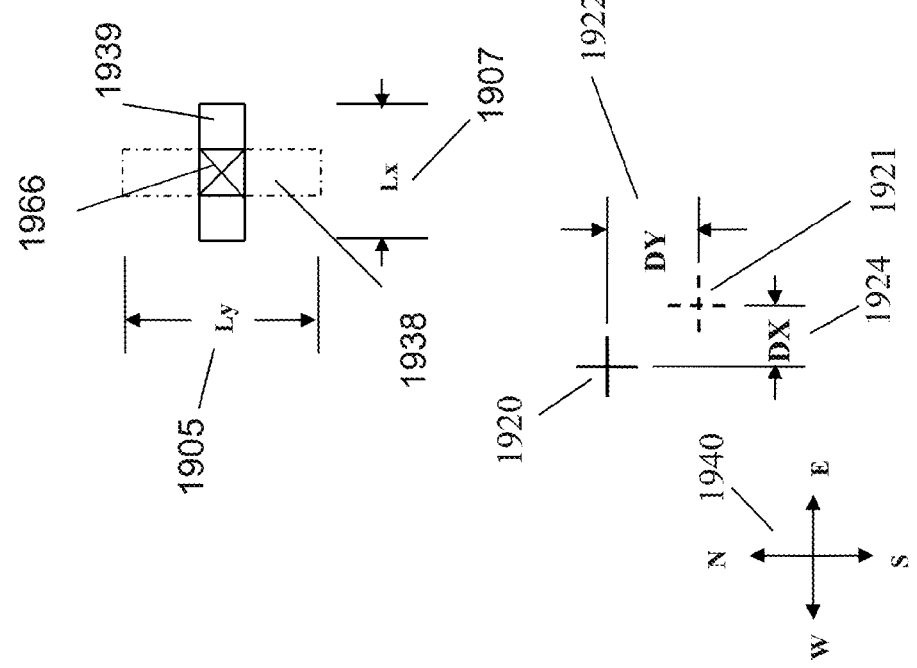
FIG. 19E illustrates a reduction in the size of the inter-wafer via contact landing area of FIG. 19D.
Figure 19D:
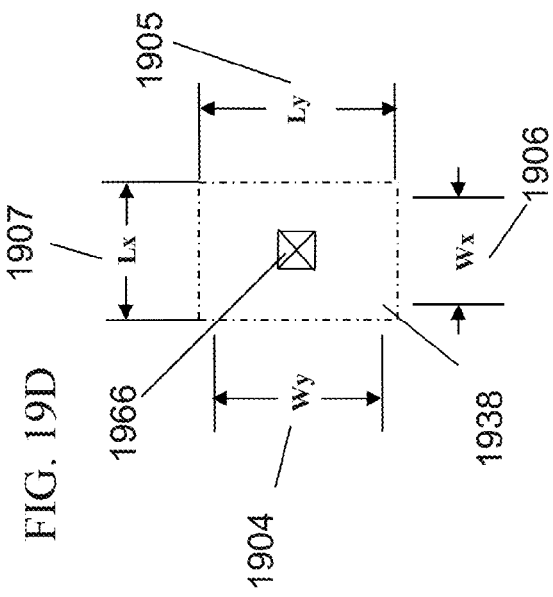
FIG. 19D illustrates an inter-wafer via contact landing area in the alignment reduction scheme of FIG. 19A.

FIG. 19E is a drawing illustration that suggests that the landing area can actually be smaller than Ly times Lx. The Receptor wafer 1910 may have metal strip landing area 1938 of minimum width necessary for fully containing a via 1966 and of length Ly 1905. Similarly, the Donor wafer 1900 may include metal strip 1939 of minimum width necessary for fully containing a via 1966 and of length Lx 1907. This guarantees that irrespective of wafer alignment error the two strips will always cross each other with sufficient overlap to fully place a via in it, aligned to both marks 1920 and 1921 as before.

This concept of small effective alignment error is only valid in the context of fine grain repetitive device structure stretching in both north-south and east-west directions, which will be described in the following sections.

Figure 20A:
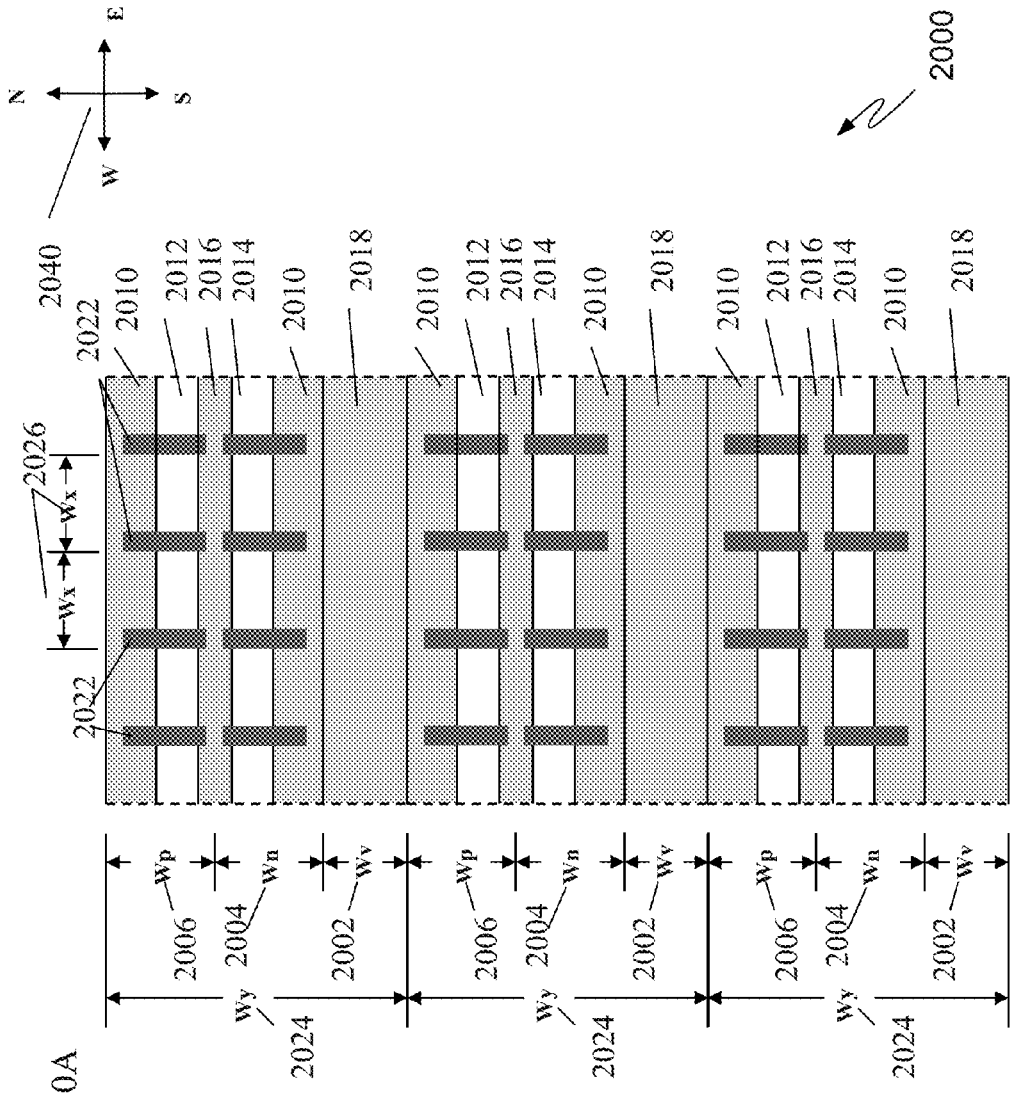
FIG. 20A illustrates a repeatable structure suitable for use with the wafer alignment reduction scheme of FIG. 18C.

FIG. 20A is a drawing illustration of exemplary repeating transistor structure 2000 (or repeating transistor cell structure) suitable for use as repetitive structure, such as n bands 1804 in FIG. 18C. Repeating transistor structure 2000 comprises continuous east-west strips of isolation regions 2010, 2016 and 2018, active P and N regions 2012 and 2014 respectively, and with repetition step Wy 2024 in north-south direction. A continuous array of gates 2022 may be formed over active regions, with repetition step Wx 2026 in east-west direction.

Such structure is conducive for creation of customized CMOS circuits through metallization. Horizontally adjacent transistors can be electrically isolated by properly biasing the gate between them, such as grounding the NMOS gate and tying the PMOS to Vdd using custom metallization.

Using F to denote feature size of twice lambda, the minimum design rule, we shall estimate the repetition steps in such terrain. In the east-west direction gates 2022 are of F width and spaced perhaps 4F from each other, giving east-west step Wx 2026 of 5F. In north-south direction the active regions width can be perhaps 3F each, with isolation regions 2010, 2016 and 2018 being 3F, 1F and 5F respectively yielding 18F north-south step Wy 2024.

Figure 20B:
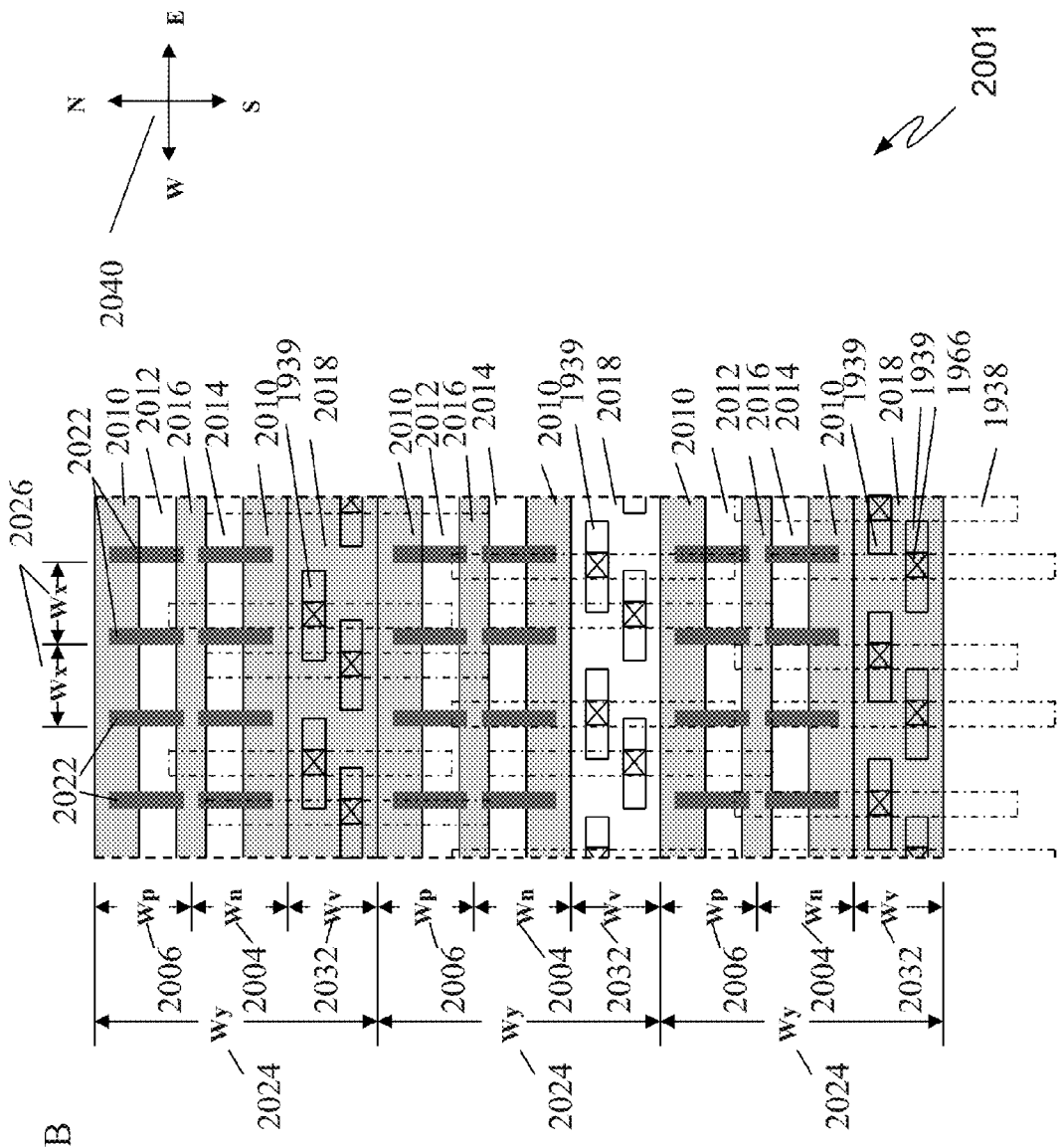
FIG. 20B illustrates an alternative repeatable structure to the repeatable structure of FIG. 20A.

FIG. 20B illustrates an alternative exemplary repeating transistor structure 2001 (or repeating transistor cell structure), where isolation region 2018 in the Donor wafer is enlarged and contains preparation for metal strips 1939 that form one part of the connection between Donor and Receptor wafers. The Receptor wafer contains orthogonal metal strip landing areas 1938 and the final locations for vias 1966, aligned east-west to mark 1921 and north-south to mark 1920, are bound to exist at their intersections, as shown in FIG. 19E. The width of isolation region 2018 needs to grow to 10F yielding north-south Wy step of 23F in this case.

Figure 20C:
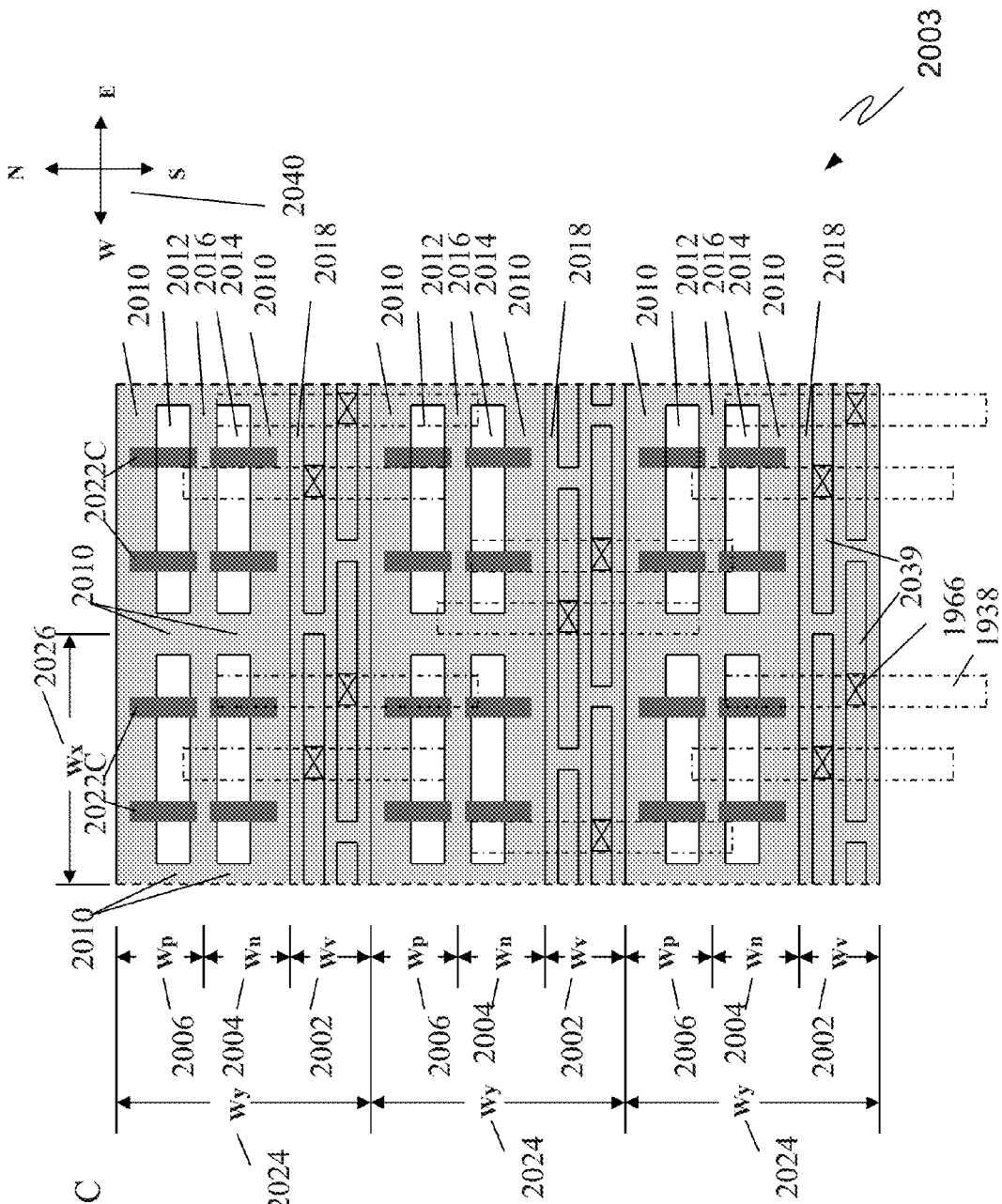
FIG. 20C illustrates an alternative repeatable structure to the repeatable structure of FIG. 20B.

FIG. 20C illustrates an alternative exemplary array of repeating transistor structures 2003 (or repeating transistor cell structure). Here the east-west active regions are broken every two gates by a north-south isolation region, yielding an east-west Wx repeat step 2026 of 14F. This two dimensional repeating transistor structure is suitable for use in the embodiment of FIG. 19C.

Figure 20D:
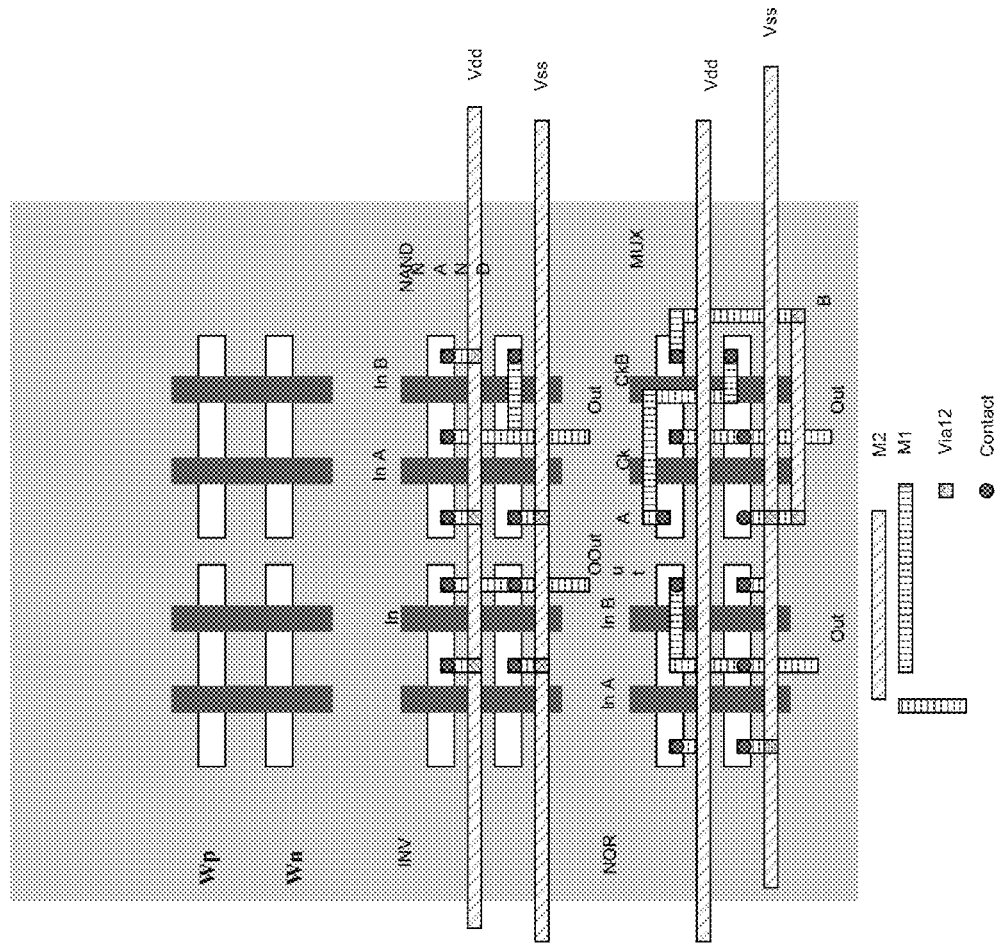
FIG. 20D illustrates an alternative repeatable gate array structure to the repeatable structure of FIG. 20C.

FIG. 20D illustrates a section of a Gate Array terrain with a repeating transistor cell structure. The cell is similar to the one of FIG. 20C wherein the respective gate of the N transistors are connected to the gate of the P transistors. FIG. 20D illustrate an implementation of basic logic cells: Inv, NAND, NOR, MUX It should be noted that in all these alternatives of FIGS. 20A-20D, mostly same mask set can be used for patterning multiple wafers with the only customization needed for a few metal layers after each layer transfer. Preferably, in some embodiments the masks for the transistor layers and at least some of the metal layers would be identical. What this invention allows is the creation of 3D systems based on the Gate Array (or Transistor Array) concept, where multiple implantation layers creating a sea of repeating transistor cell structures are uniform across wafers and customization after each layer transfer is only done through non-repeating metal interconnect layers. Preferably, the entire reticle area comprises repeating transistor cell structures. However in some embodiments some specialized circuitry may be required and a small percentage of the reticle on the order of at most 20% would be devoted to the specialized circuitry.

Figure 21:
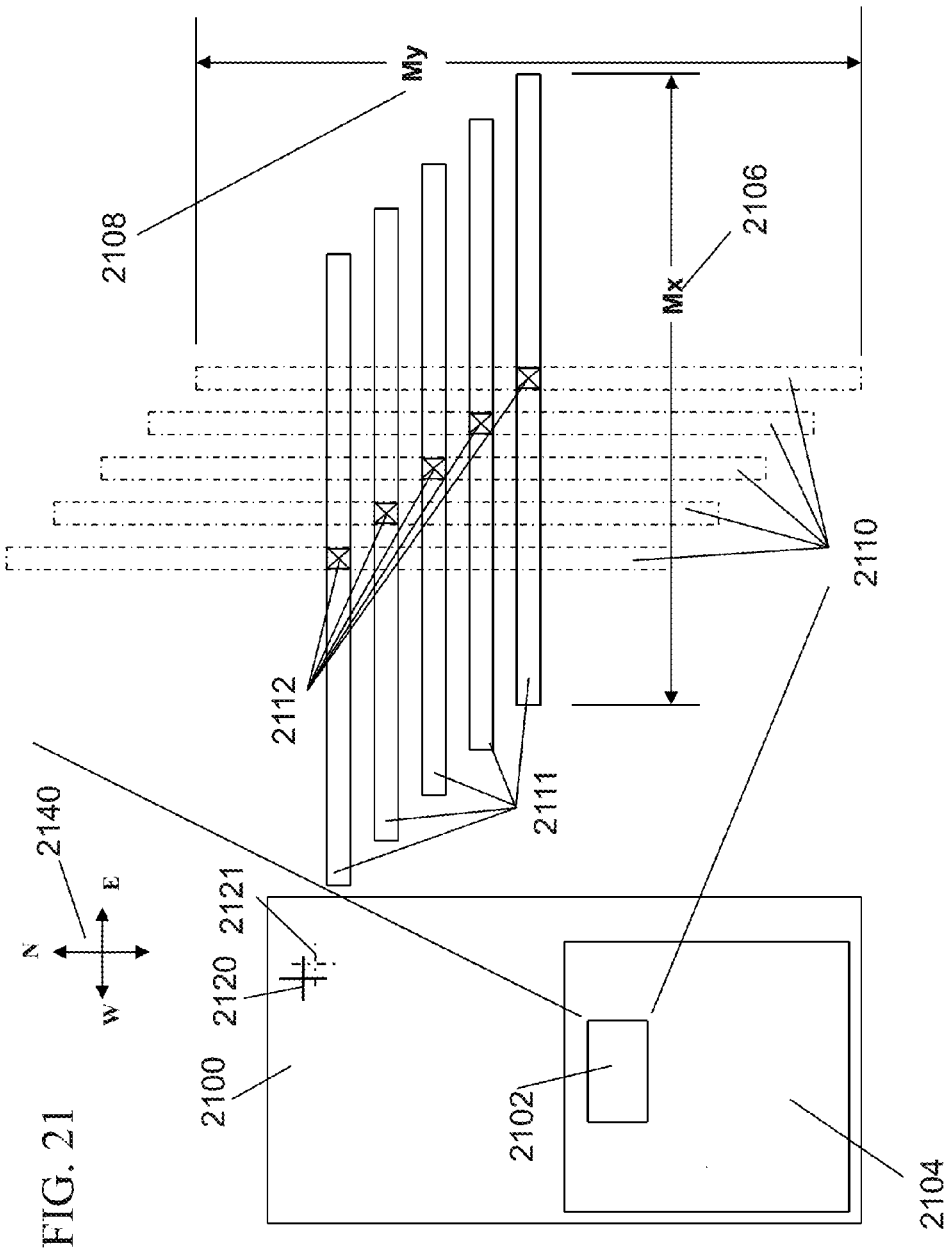
FIG. 21 illustrates an inter-wafer alignment scheme suitable for use with non-repeating structures.

FIG. 21 is a drawing illustration of similar concept of inter-wafer connection applied to large grain non repeating structure 2104 on a donor wafer 2100. Compass rose 2140 is used for orientation, with Donor alignment mark 2120 and Receptor alignment mark 2121. The connectivity structure 2102, which may be inside or outside large grain non repeating structure 2104 boundary, comprises of donor wafer metal strips 2111, aligned to 2120, of length Mx 2106; and of metal strips 2110 on the Receptor wafer, aligned to 2121 and of length My 2108. The lengths Mx and My reflect the worst-case wafer misalignment in east-west and north-south respectively, plus any additional extensions to account for via size and overlap, as well as for wafer warp, bow, and angular wafer misalignment if needed. The inter-wafer vias 2112 will be placed after layer transfer aligned to alignment mark 2120 in north-south direction, and to alignment mark 2121 in east-west direction.

Figure 22A:
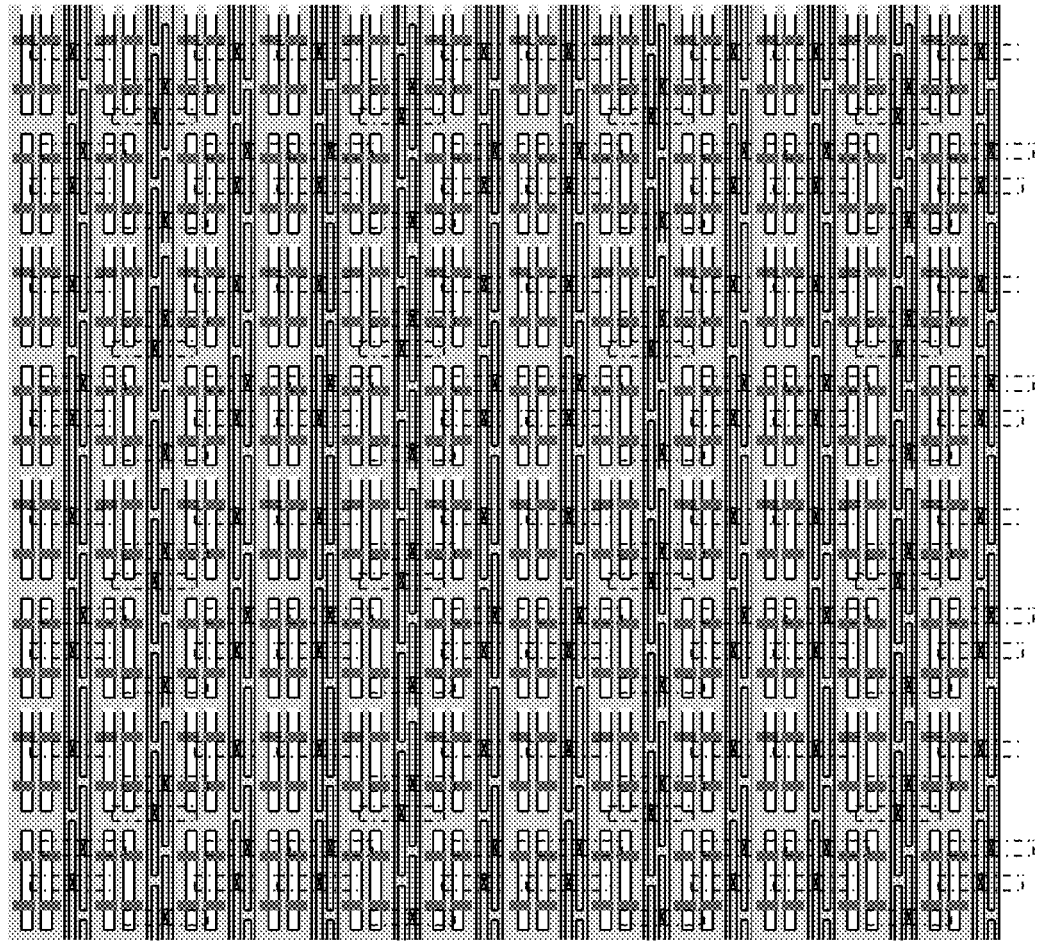
FIG. 22A illustrates an 8×12 array of the repeatable structure of FIG. 20C.

FIG. 22A is a drawing illustration of extending the structure of FIG. 20C to a 8×12 array. This can be extended as in FIG. 22B to fill a full reticle with that pattern. That reticle size area can be then repeated across the whole wafer. This is an extension of the Continuous Array idea from U.S. Pat. No. 6,953,956, except that the repeated structure is of much finer granularity. Such structure does not have the definition of wafer dicing lines—those can be created by custom mask to etch away the devices as illustrated in FIG. 22C.

Persons skilled in the art will recognize that it is now possible to assemble a true monolithic 3D stack of monocrystalline silicon layers or strata with high performance devices using advanced lithography that repeatedly reuse same masks, with only few custom metal masks for each device layer. Such a person will also appreciate that one can stack in the same way a mix of disparate layers, some carrying transistor array for general logic and other carrying larger scale blocks such as memories, analog elements, and I/O.

Figure 23A:
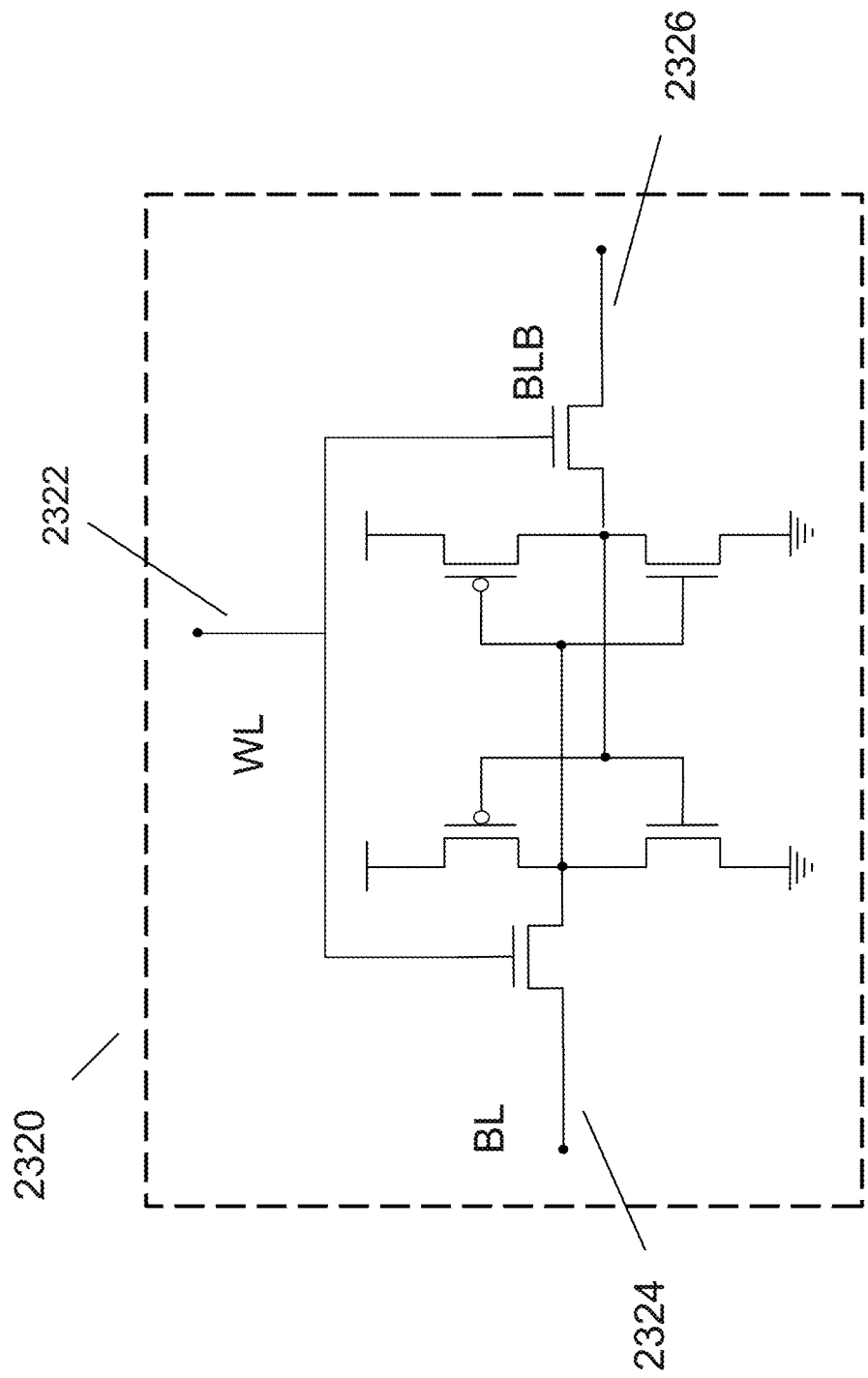
FIG. 23A illustrates a six transistor memory cell suitable for use in a continuous array memory according to the present invention.
Figure 23B:
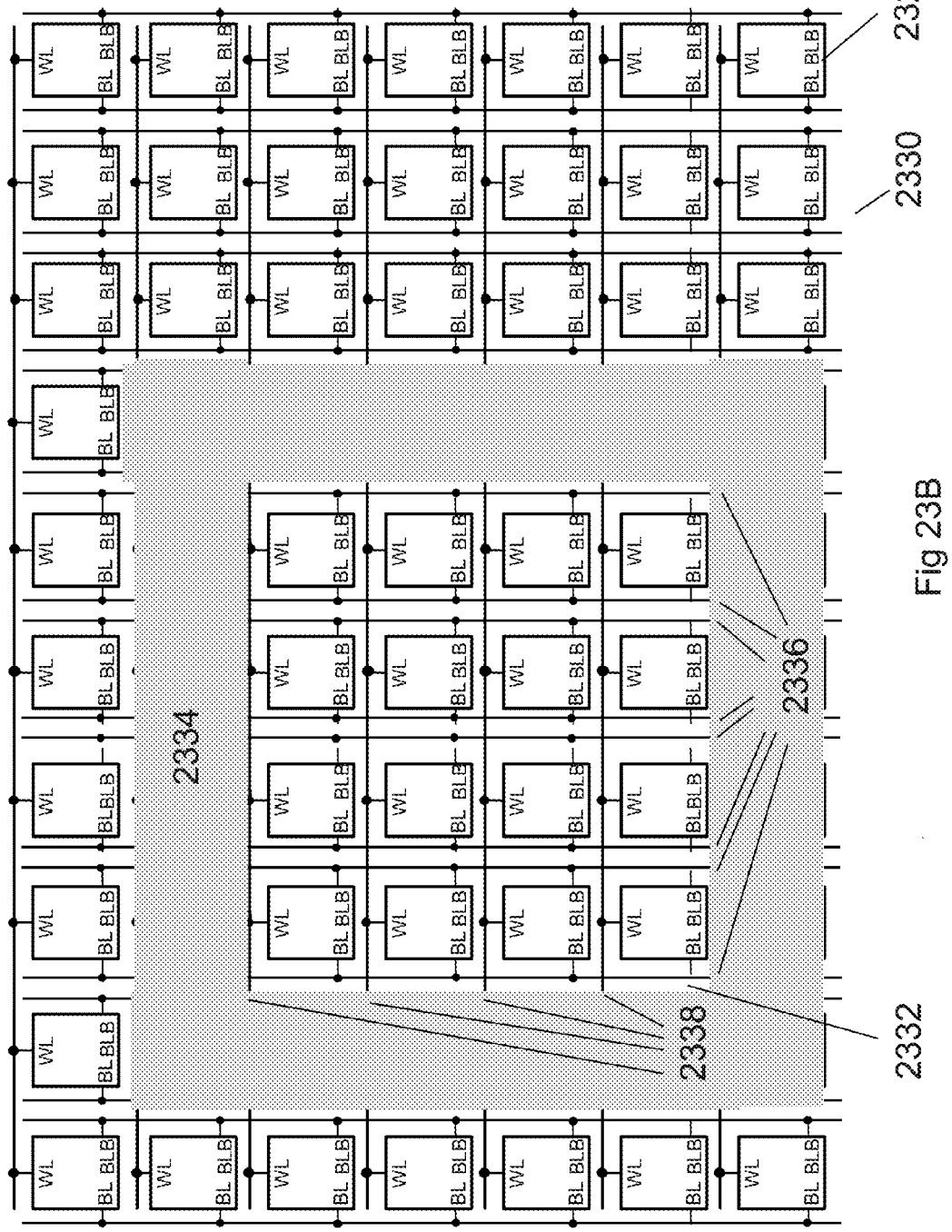
FIG. 23B illustrates a continuous array of the memory cells of FIG. 23A with an etching pattern defining a 4×4 array.
Figure 23C:
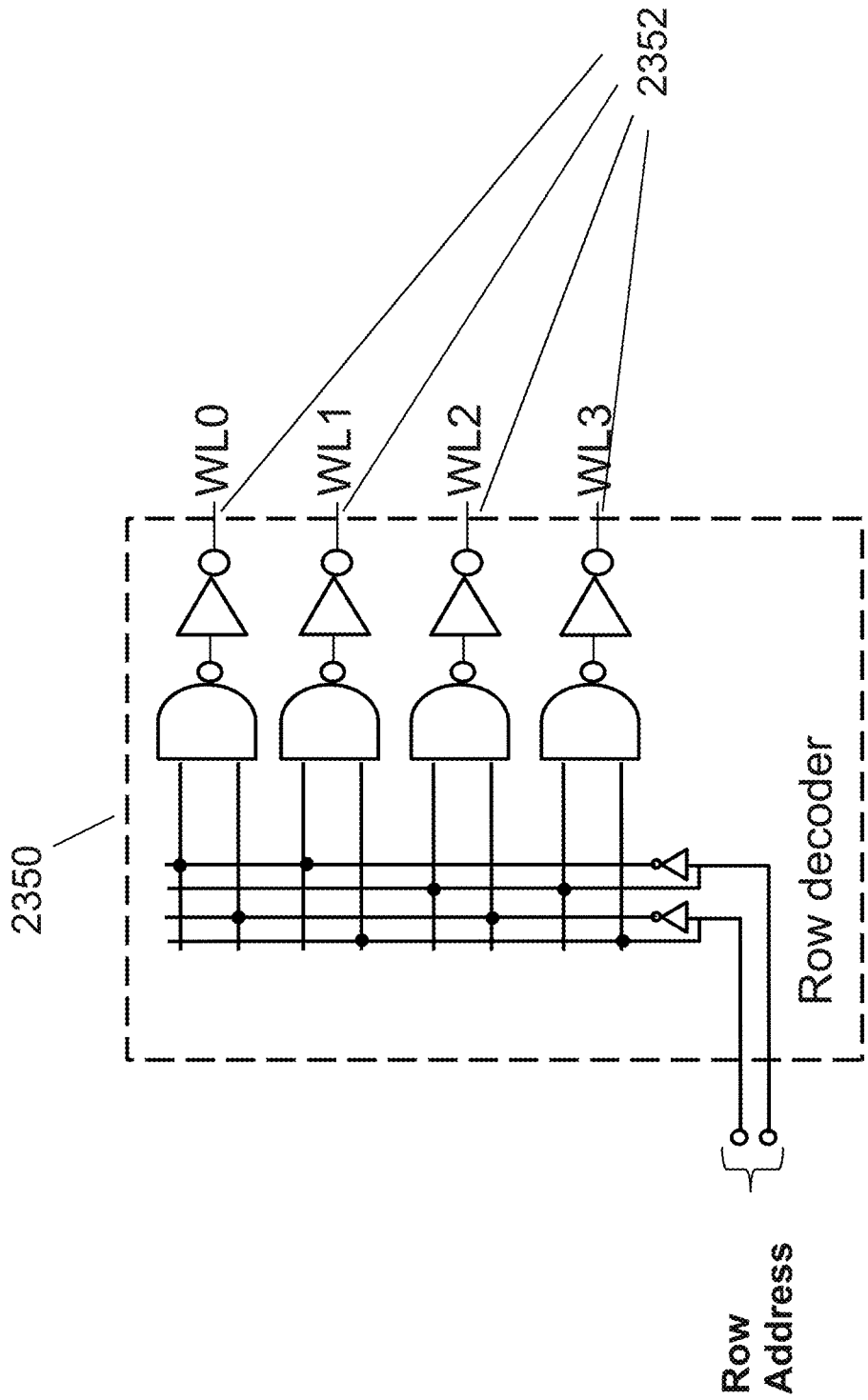
FIG. 23C illustrates a word decoder on another layer suitable for use with the defined array of FIG. 23B.
Figure 23D:
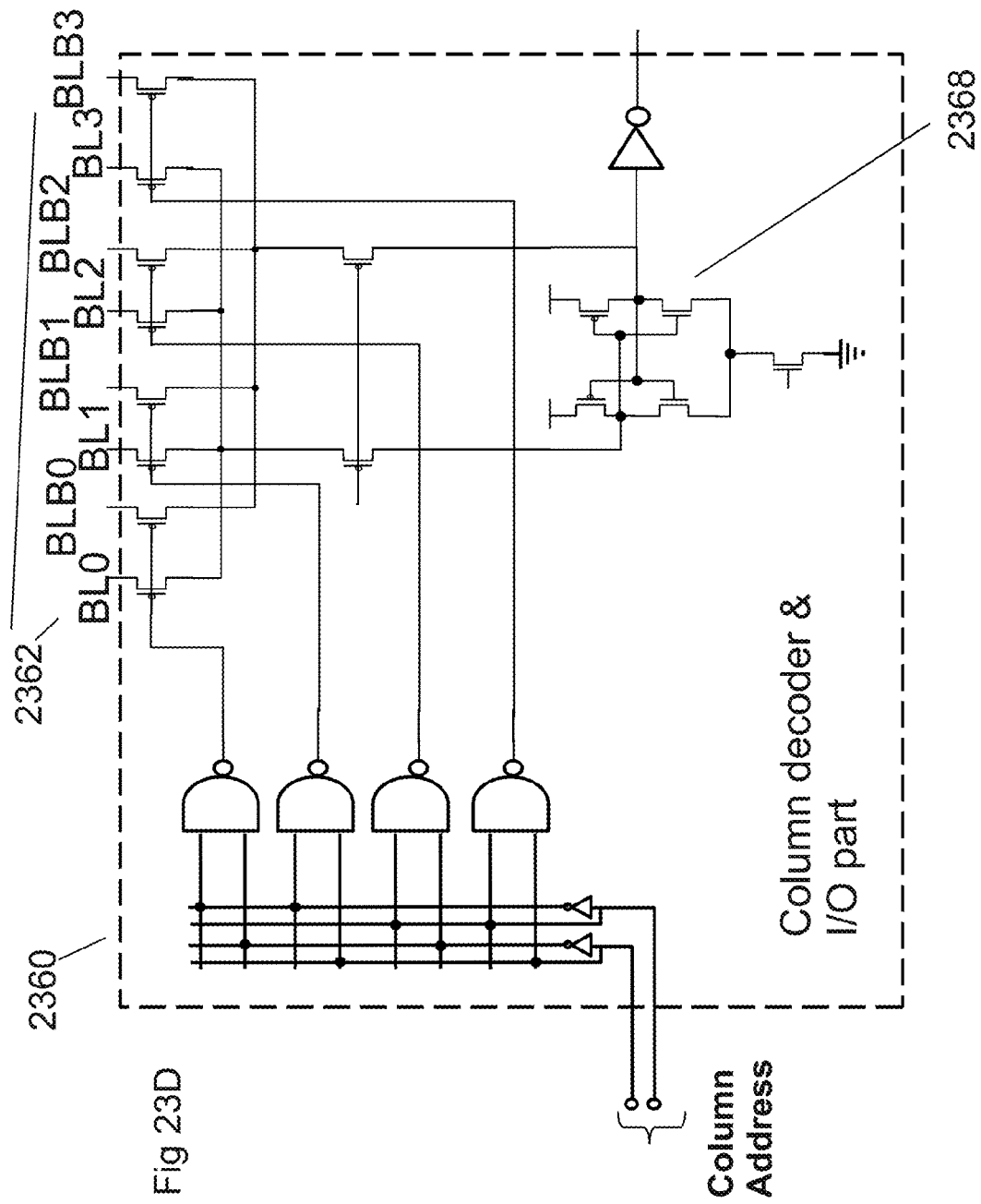
FIG. 23D illustrates a column decoder and sense amplifier on another layer suitable for use with the defined array of FIG. 23B.

The concept of dense Continuous Array concept can be also applied to memory structure. Memory arrays have non-repetitive elements such as bit and word decoders, or sense amplifier, that need to be tailored to each memory size. The idea is to tile the whole wafer with a dense pattern of memory cell, and then customize it using selective etching as before, and providing the required non-repetitive structures through an adjacent logic layer below or above the memory layer. The memory array may include configurable memory. FIG. 23A is a drawing illustration of a typical 6-transistor SRAM cell 2320, with its word line 2322, bit line 2324 and its inverse 2326. Such bit cell is typically densely packed and highly optimized for a given process. A dense array of such 2330 is illustrated in FIG. 23B. A four by four array 2332 may be defined through custom etching away the cells in channel 2334, leaving bit lines 2336 and word lines 2338 unconnected. These word lines 2338 may be then connected to an adjacent logic layer below the memory layer/stratum that will have a word decoder 2350 in FIG. 23C that will drive them through outputs 2352. Similarly the bit lines may be driven by another decoder such as 2360 in FIG. 23D through its outputs 2362. A sense amplifier 2368 is also shown. A critical feature of this approach is that the customized logic can be provided from below or above in close vertical proximity to the area where it is needed assuring high performance customized memory blocks.

In some cases the logic layer including the memory control circuits of decoders and sense amplifiers may be formed on top of the memory rather than below. The memory control circuits needs a high number of connections to the memory layer as every bit cell requires its selection in the form of a crossing word-line and bit-line. When the decoder circuits are on top and reach down by use of through-layer-via, these connections to the word-lines and bit-lines in the memory layer do not block other logic interconnection of the same layer. In such case the illustrated structure of FIG. 23C and FIG. 23D will be on the layer that is on top of the layer associated with the memory bit-cells illustrated by FIG. 22 and FIG. 23A and FIG. 23B.

Additional advantage of the bit-cell only memory layer is related to the cost of manufacturing associated with advanced lithography. In advanced lithography many bit-cell layers may use a spacer technique to form the very advanced node and small feature size pattern. This is a far lower cost than the techniques of double and quad patterning usually required for advanced logic terrain. While the illustration of FIG. 23A is of a six transistor SRAM, these methods and architecture are relevant for and may be applied to most types of memories, including those memories presented by the patents incorporated herein by reference such as, for example, Floating-Body single transistor RAM, R-RAM and others.

Figure 53:
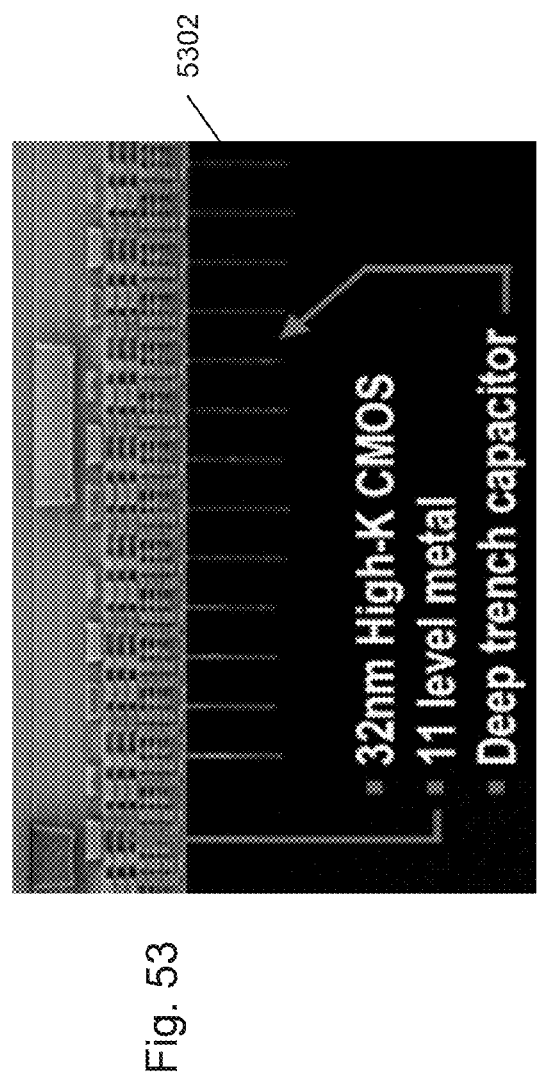
FIG. 53 illustrates a cross-section picture of a device that includes trench capacitors.

Additional advantage for having the memory layer first and the logic on top of it is for using the bulk silicon for the memory layer. FIG. 53 illustrates a cross-section picture of a device that includes trench capacitor 5302. The trench capacitor is a known technique for constructing DRAM (Dynamic Random Access Memory) or embedded DRAM memory. The trench might be few tenths of a micron deep to a couple of microns, and forming the trench on the bottom most layer can be very effective. Another type of memory that could benefit from being formed on the bulk silicon or substrate are two-state stable floating body memory as described in U.S. Pat. No. 8,206,302 which is incorporated herein by reference. In the two-stable states floating body memory, a deep implant of n+ layer in the bulk may be used to provide a back bias to the floating body, so to form a two-state stable memory. A similar structure could be formed on layers other than the bottom-most layer, yet it might be preferred to use the bulk of the bottom layer for such a memory layer.

Figure 54:
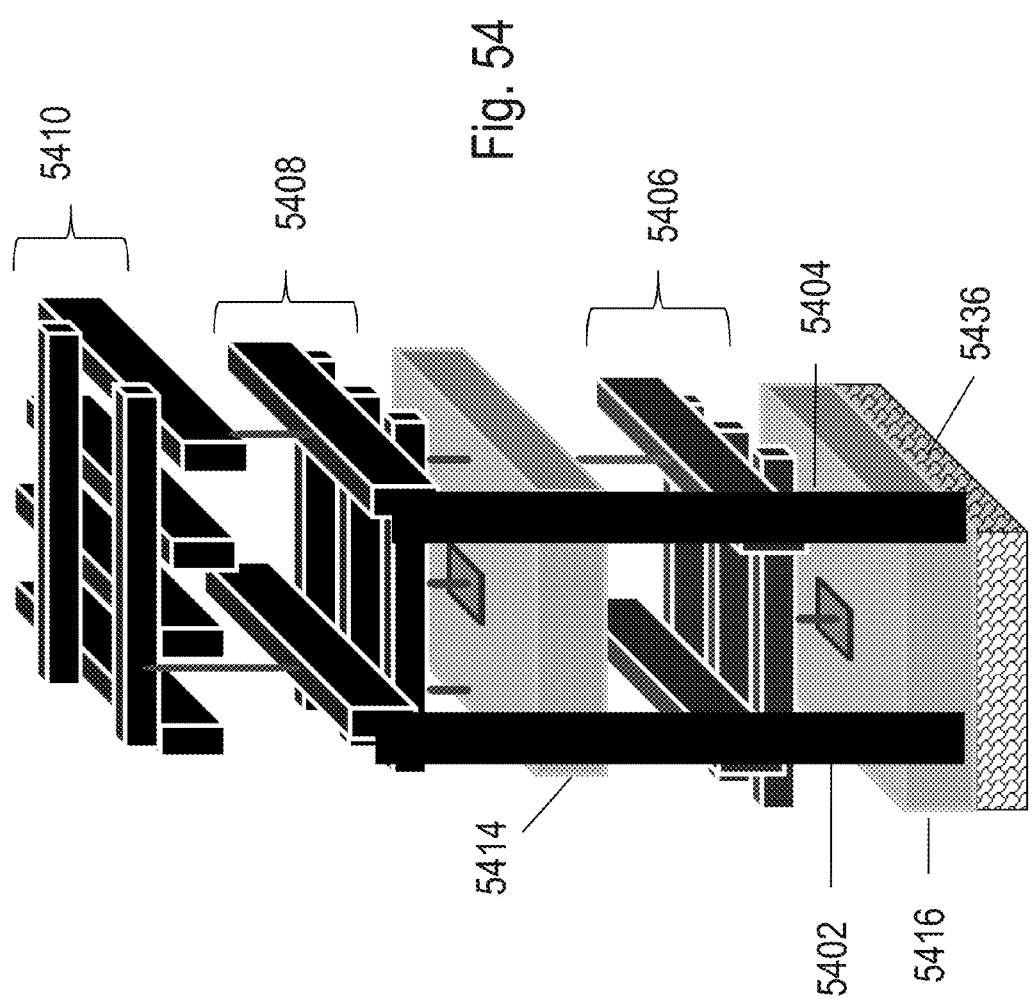
FIG. 54 illustrates a 3D device power distribution structure.

Another alternative is to use the trench capacitor 5302 to help stabilize the power lines. It is well known technique in the art to use capacitors to stabilize power lines in electronic circuits. In a 3D system a trench capacitors in the bulk could help stabilize power lines and not just for the bottom-most layer but also for the upper layers of circuits. In many 3D systems it is useful to construct the power delivery buses to all circuit layers in a uniform structure. FIG. 54 is a drawing illustration of a 3D device power distribution structure. The bottom-most transistor layer 5416 may include the bulk silicon which sometimes might be called the base layer. The upper most transistor layer 5414 may be the second layer, as shown. The main system power distribution sub-structures 5410 may be connected to the external source of power and provide the first horizontal power distributions. The per-layer power distribution is illustrated by second layer power distribution 5408 and first layer power distribution 5406. In FIG. 54 the power distribution may include the two main power sources often called Vss and Vdd, or power and ground. In many 3D system the power distribution may include additional power lines for voltages other than Vss and Vdd as sometime might be required. In some 3D systems at least one layer/stratum may use a different voltage than the other layers or stratum, as often will be the case when Flash types of memory or some analog circuitry is used. It might be preferred to place the special voltages on dedicated layers and form most layers with just one power and one ground. It might be preferred to keep the multiple voltages layer as the upper-most layer, and drive power to lower layers having a lower number of different power types/voltages. FIG. 54 illustrates the connection of the power between layers (such as upper most transistor layer 5414 and bottom-most transistor layer 5416) utilizing first vertical connection 5402 and second vertical connection 5404. It may be advantageous to design the power connection, such as for example TLVs or TSV, or a multiplicity of TLVs or TSVs, between layers aligned one on top of the other as illustrated in FIG. 54 by first vertical connection 5402 and second vertical connection 5404. Such aligned power connection could be connected to trench capacitors 5302 that may reside in the bulk silicon of bottom-most transistor layer 5416. Additionally such aligned power distribution structures between layers could efficiently channel the heat generated at the various layers down to the bulk silicon and from there to the device heat-sink 5436.

In 3D systems, a portion of the layers/strata might be dedicated to memory and a porion to logic. The memory layer could include various type of memory such SRAM, DRAM, Floating Body RAM, R-RAM and Flash types. The memory layer might include the memory control circuits and memory peripheral circuits or those could be in a layer above or below the memory layer. The memory could be constructed on a single layer or might include two or more layers. An effective option could be to use two or more layers of memories utilizing an architecture such as have been presented in the incorporated by reference patents, publications, and applications, wherein a lithography step may be used to pattern two or more layers together, thus reducing the overall cost by sharing the costly step of lithography across two or more layers. Some memory layers could be dedicated to a single type of memory or to mix of various types of memory. For example, a compute layer may be supported by multiple layers of memory processed with lithography that is shared across these multiple layers, and where these layers may include non-volatile memory to hold the program and volatile memory to hold data.

An attractive advantage of having the memory decoders and logic above the memory layer wherein the memory layer may be an array of bit cells, relates to an option of pre-patterning the transferred layer prior to the layer transfer. In such a case many high temperature steps could be performed on that layer before the layer transfer, such as forming trench isolation or even full transistors as has been presented in at least U.S. Pat. No. 8,273,610 and before in relation to FIG. 19 herein. Accordingly a transferred layer misalignment could be reduced when the transfer layer is patterned with a repeating pattern. The same concept could be inverted, with a non-repeating layer transferred on top of a repeating one. Accordingly, the alignment error could be reduced to about the size of the repeating element, the bit cell. This approach is similar to the method presented in relation to FIG. 19 herein, except that in this case the shift to compensate for the misalignment may be done in respect to the bit-cell array. This approach will require a relatively larger window to be etched so the required memory could be sized through the overlaying transferred layer and then a connection to the bit lines and word lines could be made by including large enough landing zones/strips to connect to them.

In such way a single expensive mask set can be used to build many wafers for different memory sizes and finished through another mask set that is used to build many logic wafers that can be customized by few metal layers.

Another alternative of the invention for general type of 3D logic IC is presented on FIG. 24A. Here logic is distributed across multiple layers such as 2402, 2412 and 2422. An additional layer of logic ("Repair Layer") 2432 is used to effect repairs as needed in any of logic layers 2402, 2412 or 2422. Repair Layer's essential components include BIST Controller Checker ("BCC") 2434 that has access to I/O boundary scans and to all FF scan chains from logic layers, and uncommitted logic such as Gate Array described above. Such gate array can be customized using custom metal mask. Alternately it can use Direct-Write e-Beam technology such as available from Advantest or Fujitsu to write custom masking patterns in photoresist at each die location to repair the IC directly on the wafer during manufacturing process.

Figure 25:
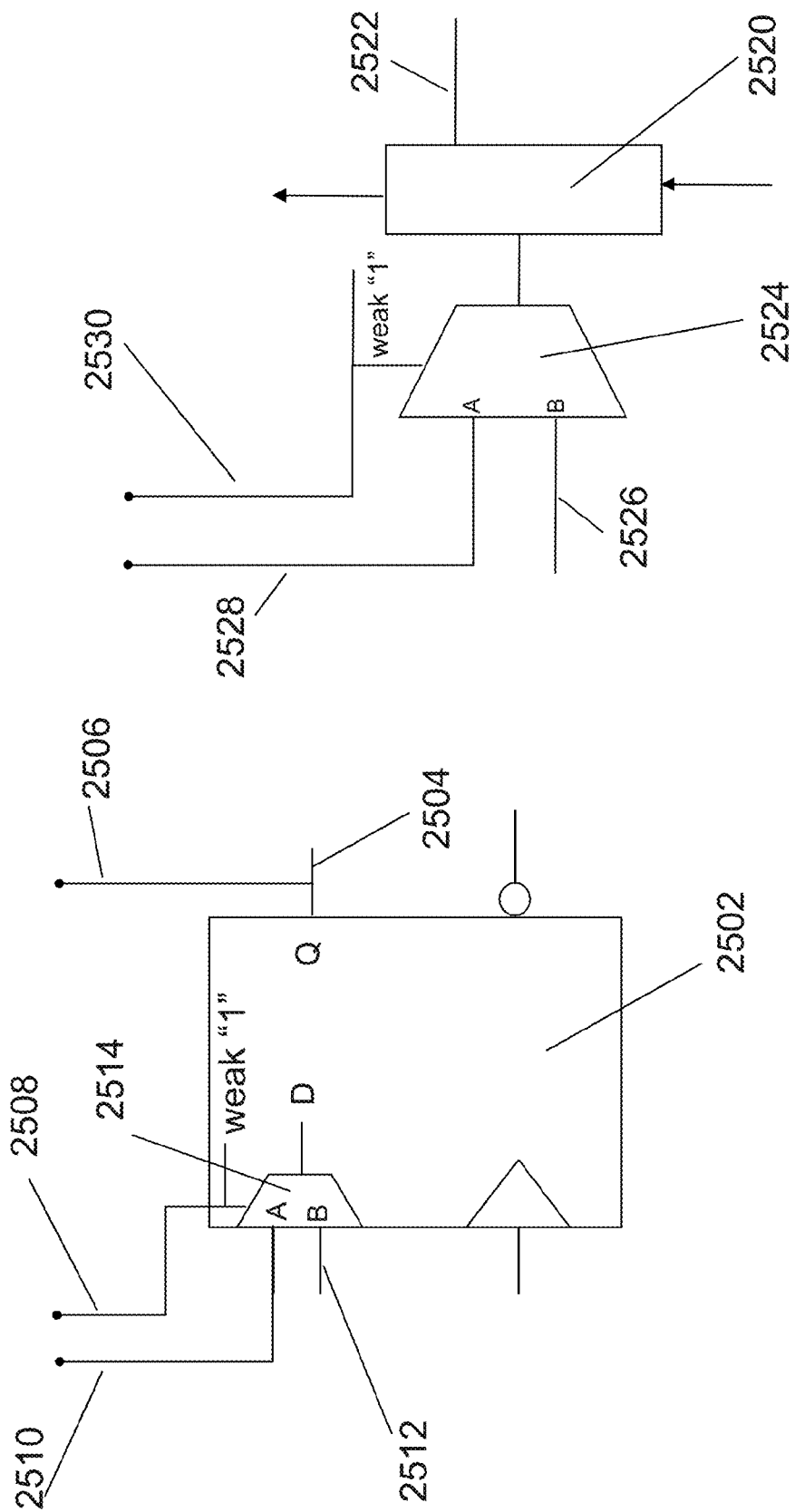
FIG. 25 illustrates a scan flip flop suitable for use with the 3D IC of FIG. 24A.

It is important to note that substantially all the sequential cells like, for example, flip flops (FFs), in the logic layers as well as substantially all the primary output boundary scan have certain extra features as illustrated in FIG. 25. Flip flop 2502 shows a possible embodiment and has its output 2504 drive gates in the logic layers, and in parallel it also has vertical stub 2506 raising to the Repair Layer 2432 through as many logic layer as required such as logic layers 2402 and 2412. In addition to any other scan control circuitry that may be necessary, flip flop 2502 also has an additional multiplexer 2514 at its input to allow selective or programmable coupling of replacement circuitry on the Repair Layer to flip flop 2502 D input. One of the multiplexer inputs 2510 can be driven from the Repair Layer, as can multiplexer control 2508. By default, when 2508 is not driven, multiplexer control is set to steer the original logic node 2512 to feed the FF, which is driven from the preceding stages of logic. If a repair circuit is to replace the original logic coupled to original logic node 2512, a programmable element like, for example, a latch, an SRAM bit, an antifuse, a flash memory bit, a fuse, or a metal link defined by the Direct-Write e-Beam repair, is used to control multiplexer control 2508. A similar structure comprising of input multiplexer 2524, inputs 2526 and 2528, and control input 2530 is present in substantively every primary output 2522 boundary scan cell 2520, in addition to its regular boundary scan function, which allows the primary outputs to be driven by the regular input 2526 or replaced by input 2528 from the Repair Layer as needed.

The way the repair works can be now readily understood from FIG. 24A. To maximize the benefit from this repair approach, designs need to be implemented as partial or full scan designs. Scan outputs are available to the BCC on the Repair Layer, and the BCC can drive the scan chains. The uncommitted logic on the Repair Layer can be finalized by processing a high metal or via layer, for example a via between layer 5 and layer 6 ("VIA6"), while the BCC is completed with metallization prior to that via, up to metal 5 in this example. During manufacturing, after the IC has been finalized to metal 5 of the repair layer, the chips on the wafer are powered up through a tester probe, the BIST is executed, and faulty FFs are identified. This information is transmitted by BCC to the external tester, and is driving the repair cycle. In the repair cycle the logic cone that feeds the faulty FF is identified, the net-list for the circuit is analyzed, and the faulty logic cone is replicated on the Repair Layer using Logic cone is a common term used in respect to logic circuits. Its origin relates to the fundamental concept of testability and to the introduction of scan chain in logic circuits to support testability. The idea is to see into logic circuits comprising Flip-Flops and combinatorial logic. In general, combinatorial logic that has n (n is an integer) inputs could be fully tested by 2**n test vectors by observing the m outputs of that logic circuit. If all the Flip-Flops are made to be connected as a daisy chain in a test mode, then in a test mode the tester can load all the Flip-Flops according to the desired test pattern. So the combinatorial logic could be seen as a plurality of combinatorial logic gates that has n inputs which are considered the primary inputs for the logic cone. These primary inputs may be the output of a Flip Flop or a primary input of the circuit. Each output of the combinatorial logic may be considered a primary output which would be an input to a Flip Flop. And representing one logic cone whose base is all the primary inputs that are affecting that primary output which is the head of the logic cone. The advantage of this approach is the reduction of the test vectors required for testing a logic circuit and the testability of such circuit. The combinatorial logic may include gates such as inverter, NAND, NOR, XOR, Multiplexers, AND, OR, and other combinatorial logic. The combinatorial logic does not include sequential cells such as Flip Flop and latches.

Direct-Write e-Beam technology to customize the uncommitted logic through writing VIA6, and the replicated output is fed down to the faulty FF from the Repair Layer replacing the original faulty logic cone. It should be noted that because the physical location of the replicated logic cone can be made to be approximately the same as the original logic cone and just vertically displaced, the impact of the repaired logic on timing should be minimal In alternate implementation additional features of uncommitted logic such as availability of variable strength buffers, may be used to create repair replica of the faulty logic cone that will be slightly faster to compensate for the extra vertical distance.

People skilled in the art will appreciate that Direct-Write e-Beam customization can be done on any metal or via layer as long as such layer is fabricated after the BCC construction and metallization is completed. They will also appreciate that for this repair technique to work the design can have sections of logic without scan, or without special circuitry for FFs such as described in FIG. 25. Absence of such features in some portion of the design will simply reduce the effectiveness of the repair technique. Alternatively, the BCC can be implemented on one or more of the Logic Layers, or the BCC function can be performed using an external tester through JTAG or some other test interface. This allows full customization of all contact, metal and via layers of the Repair Layer.

FIG. 24B is a drawing illustration of the concept that it may be beneficial to chain FFs on each logic layer separately before feeding the scan chains outputs to the Repair Layer because this may allow testing the layer for integrity before continuing with 3D IC assembly.

It should be noted that the repair flow just described can be used to correct not only static logic malfunctions but also timing malfunctions that may be discovered through the scan or BIST test. Slow logic cones may be replaced with faster implementations constructed from the uncommitted logic on the Repair Layer further improving the yield of such complex systems.

Figure 24C:
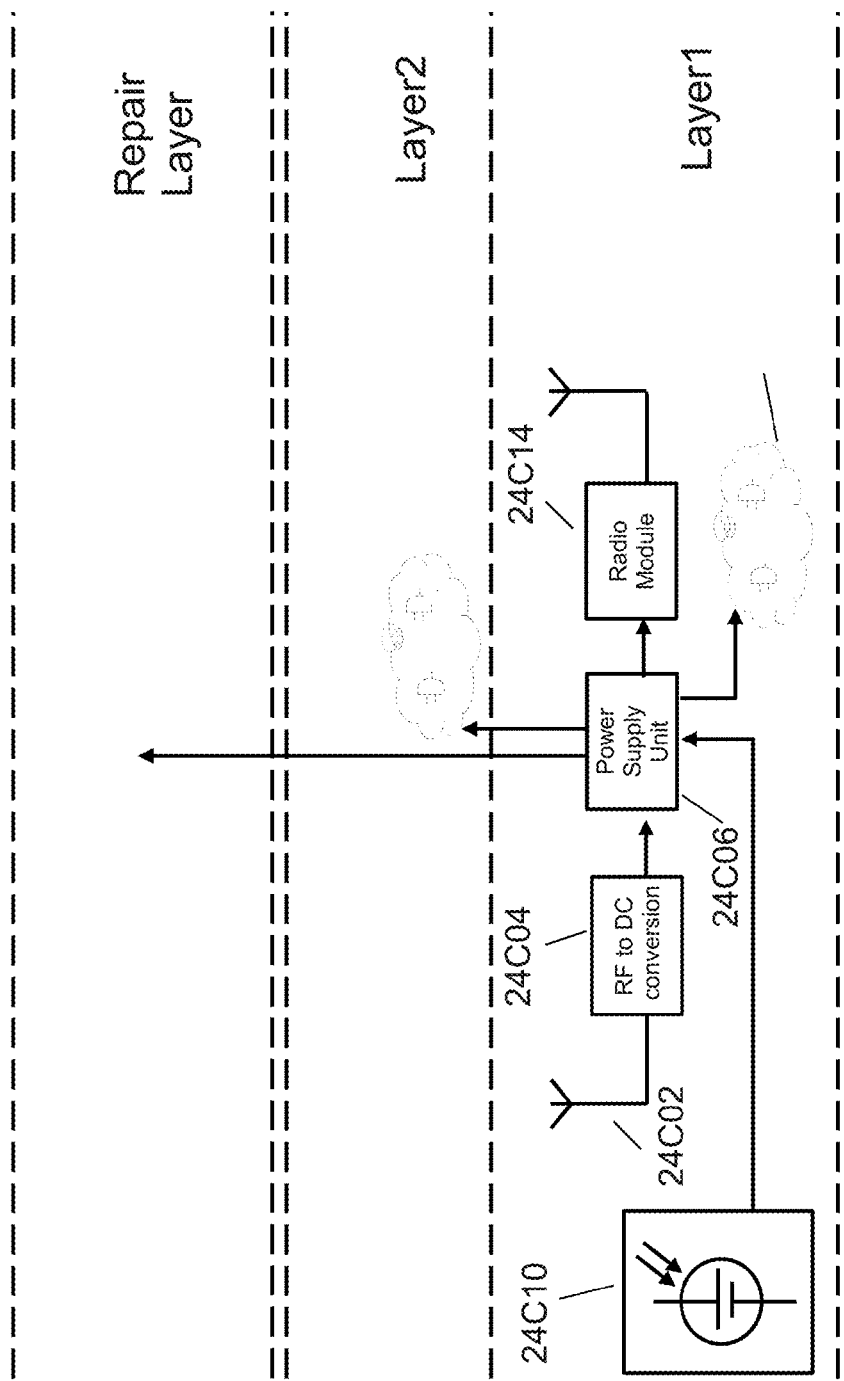
FIG. 24C illustrates methods of contactless testing of the 3D IC of FIG. 24A.

FIG. 24C is a drawing illustration of an alternative implementation of the invention where the ICs on the wafer may be powered and tested through contactless means instead of probes, avoiding potential damage to the wafer surface. One of the active layers of the 3D IC may include Radio Frequency ("RF") antenna 24C02 and RF to Direct Current ("DC") converter 24C04 that powers the power supply unit 24C06. Using this technique the wafer can be powered in a contactless manner to perform self-testing. The results of such self-testing can be communicated with computing devices external to the wafer under test using RF module 24C14.

An alternative embodiment of the invention may use a small photovoltaic cell 24C10 to power the power supply unit instead of RF induction and RF to DC converter.

An alternative approach to increase yield of complex systems through use of 3D structure is to duplicate the same design on two layers vertically stacked on top of each other and use BIST techniques similar to those described in the previous sections to identify and replace malfunctioning logic cones. This should prove particularly effective repairing very large ICs with very low yields at manufacturing stage using one-time, or hard to reverse, repair structures such as antifuses or Direct-Write e-Beam customization. Similar repair approach can also assist systems that require self-healing ability at every power-up sequence through use of memory-based repair structures as described with regard to FIG. 26 below.

Figure 26:
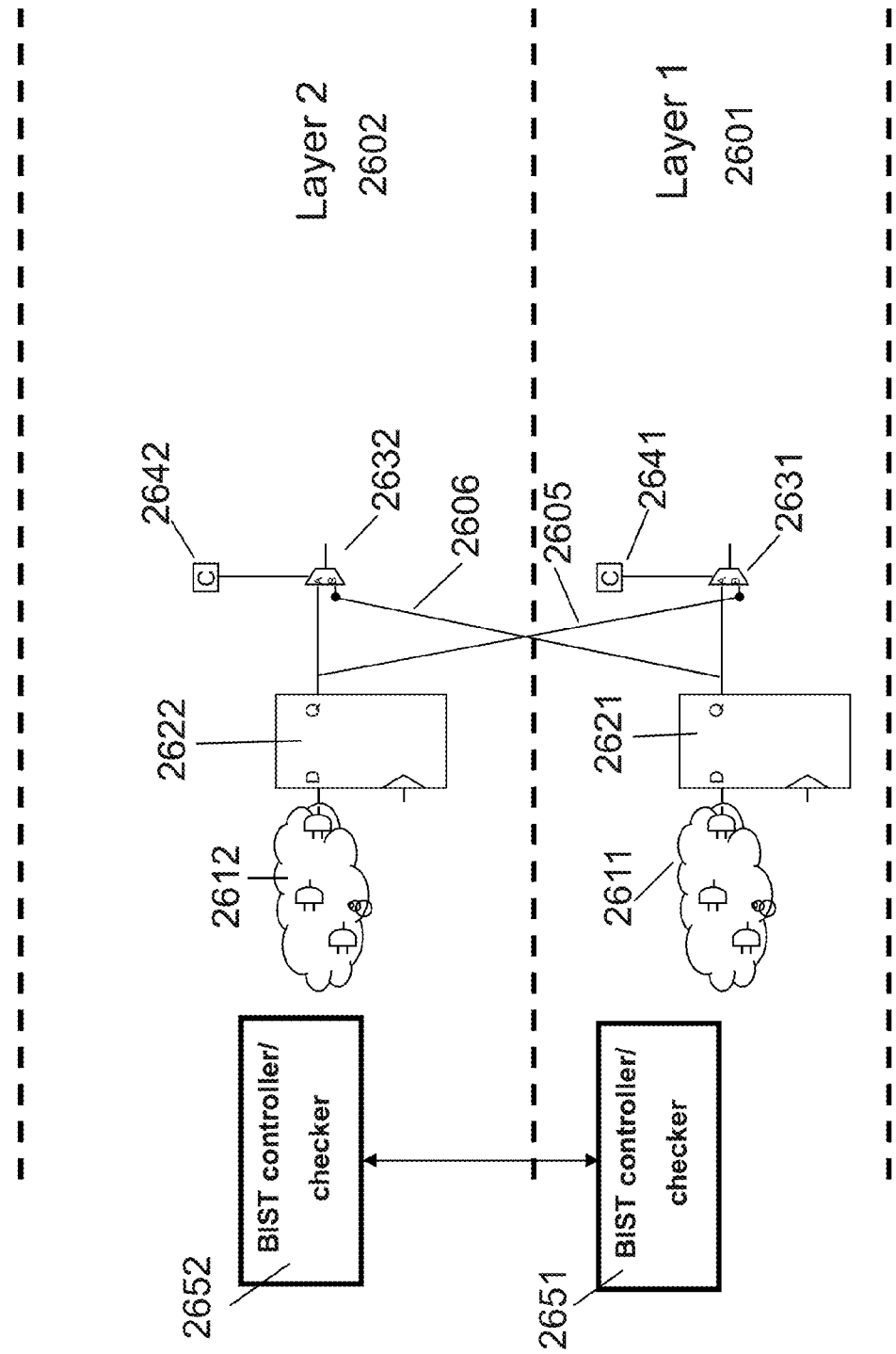
FIG. 26 illustrates a first field repairable 3D IC according to the present invention.

FIG. 26 is a drawing illustration of one possible implementation of this concept. Two vertically stacked logic layers 2601 and 2602 implement essentially an identical design. The design (same on each layer) is scan-based and includes BIST Controller/Checker on each layer 2651 and 2652 that can communicate with each other either directly or through an external tester. 2621 is a representative FF on the first layer that has its corresponding flip flop 2622 on layer 2, each fed by its respective identical logic cones 2611 and 2612. The output of flip flop 2621 is coupled to the A input of multiplexer 2631 and the B input of multiplexer 2632 through vertical connection 2606, while the output of flip flop 2622 is coupled to the A input of multiplexer 2632 and the B input of multiplexer 2631 through vertical connection 2605. Each such output multiplexer is respectively controlled from control points 2641 and 2642, and multiplexer outputs drive the respective following logic stages at each layer. Thus, either logic cone 2611 and flip flop 2621 or logic cone 2612 and flip flop 2622 may be either programmably coupleable or selectively coupleable to the following logic stages at each layer.

It should be noted that the multiplexer control points 2641 and 2642 can be implemented using a memory cell, a fuse, an Antifuse, or any other customizable element such as metal link that can be customized by a Direct-Write e-Beam machine. If a memory cell is used, its contents can be stored in a ROM, a flash memory, or in some other non-volatile storage mechanism elsewhere in the 3D IC or in the system in which it is deployed and loaded upon a system power up, a system reset, or on-demand during system maintenance.

Upon power on the BCC initializes all multiplexer controls to select inputs A and runs diagnostic test on the design on each layer Failing FF are identified at each logic layer using scan and BIST techniques, and as long as there is no pair of corresponding FF that fails, the BCCs can communicate with each other (directly or through an external tester) to determine which working FF to use and program the multiplexer controls 2641 and 2642 accordingly.

It should be noted that if multiplexer controls 2641 and 2642 are reprogrammable as in using memory cells, such test and repair process can potentially occur at every power on instance, or on demand, and the 3D IC can self-repair in-circuit. If the multiplexer controls are one-time programmable, the diagnostic and repair process may need to be performed using external equipment. It should be noted that the techniques for contact-less testing and repair as previously described with regard to FIG. 24C can be applicable in this situation.

An alternative embodiment of this concept can use multiplexer 2514 at the inputs of the FF such as described in FIG. 25. In that case both the Q and the inverted Q of FFs may be used, if present.

Person skilled in the art will appreciate that this repair technique of selecting one of two possible outputs from two essentially similar blocks vertically stacked on top of each other can be applied to other type of blocks in addition to FF described above. Examples of such include, but are not limited to, analog blocks, I/O, memory, configurable memory, and other blocks. In such cases the selection of the working output may require specialized multiplexing but it does not change its essential nature.

Such person will also appreciate that once the BIST diagnosis of both layers is complete, a mechanism similar to the one used to define the multiplexer controls can be also used to selectively power off unused sections of a logic layers to save on power dissipation.

Yet another variation on the invention is to use vertical stacking for on the fly repair using redundancy concepts such as Triple (or higher) Modular Redundancy ("TMR"). TMR is a well known concept in the high-reliability industry where three copies of each circuit are manufactured and their outputs are channeled through a majority voting circuitry. Such TMR system will continue to operate correctly as long as no more than a single fault occurs in any TMR block. A major problem in designing TMR ICs is that when the circuitry is triplicated the interconnections become significantly longer slowing down the system speed, and the routing becomes more complex slowing down system design. Another major problem for TMR is that its design process is expensive because of correspondingly large design size, while its market is limited.

Figure 27:
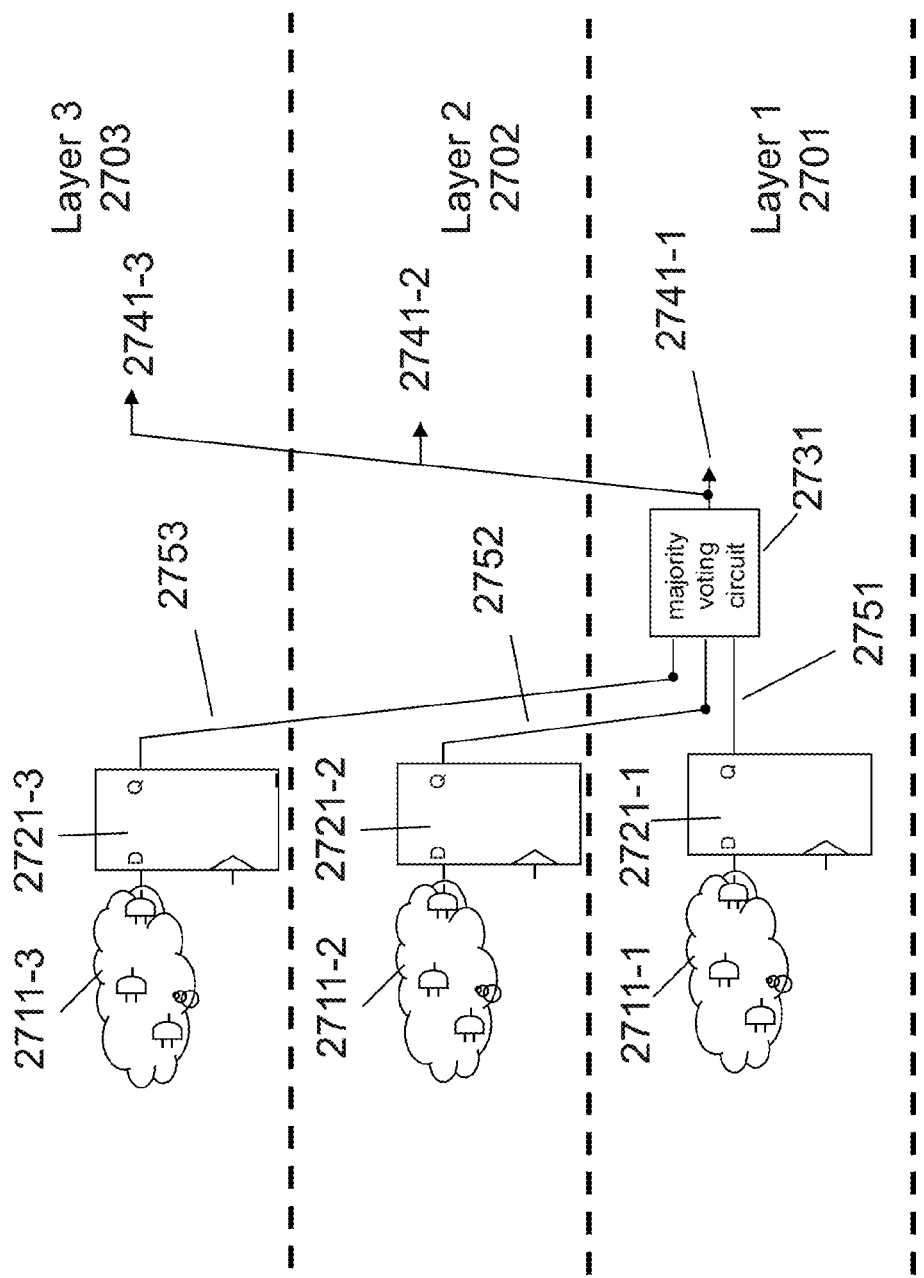
FIG. 27 illustrates a first Triple Modular Redundancy 3D IC according to the present invention.
Figure 28:
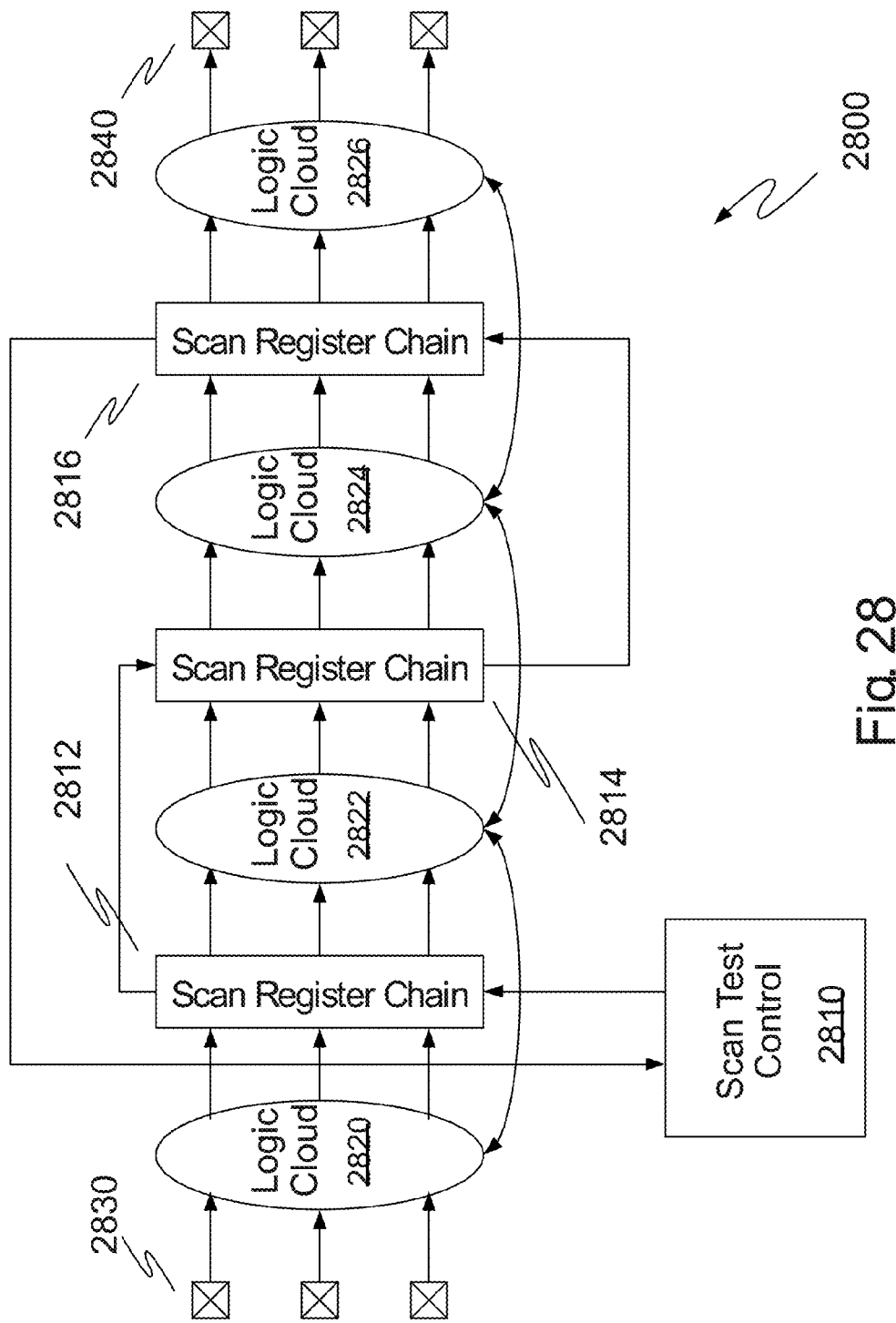
FIG. 28 illustrates a set scan architecture of the prior art.
Figure 29:
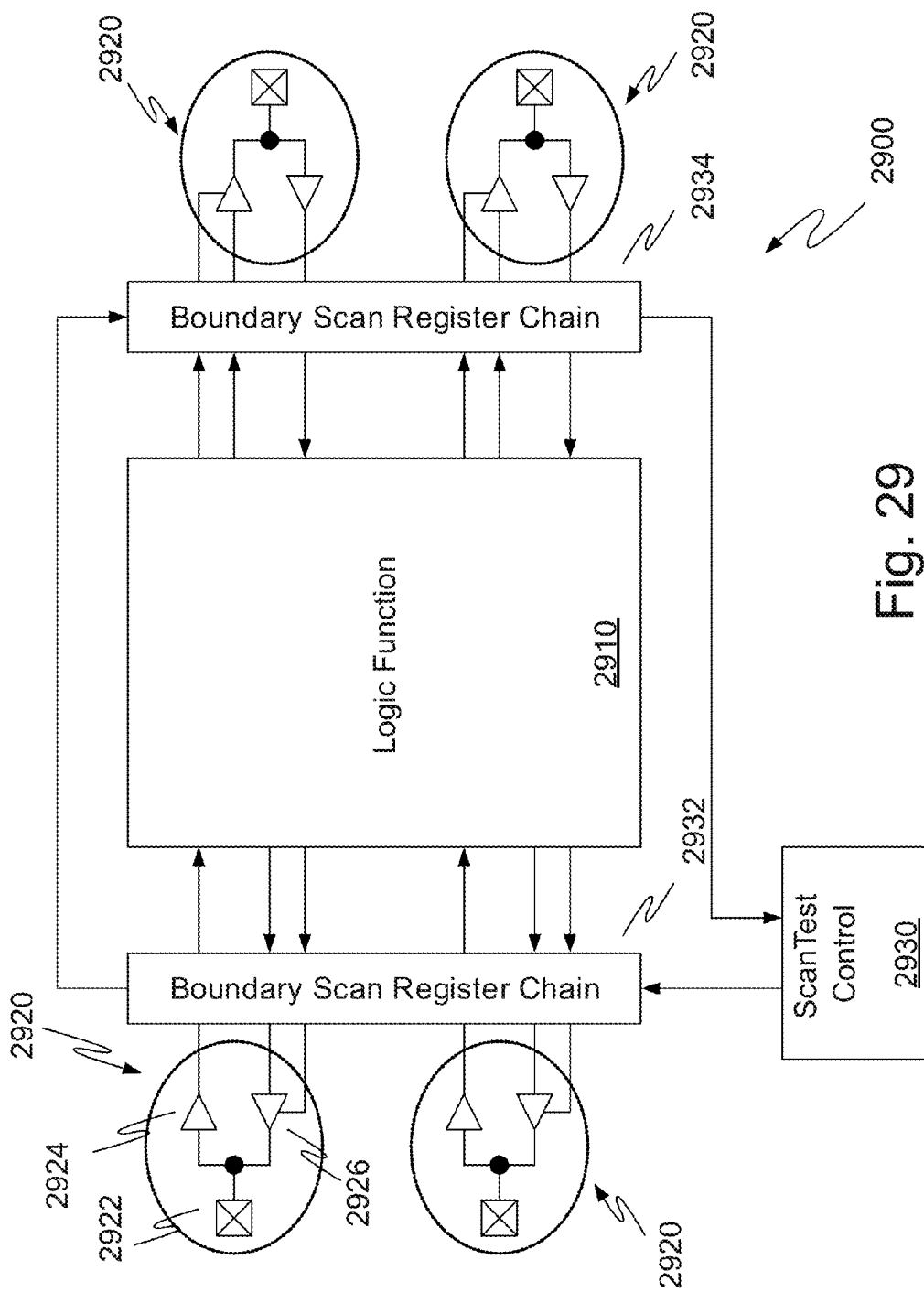
FIG. 29 illustrates a boundary scan architecture of the prior art.
Figure 30:
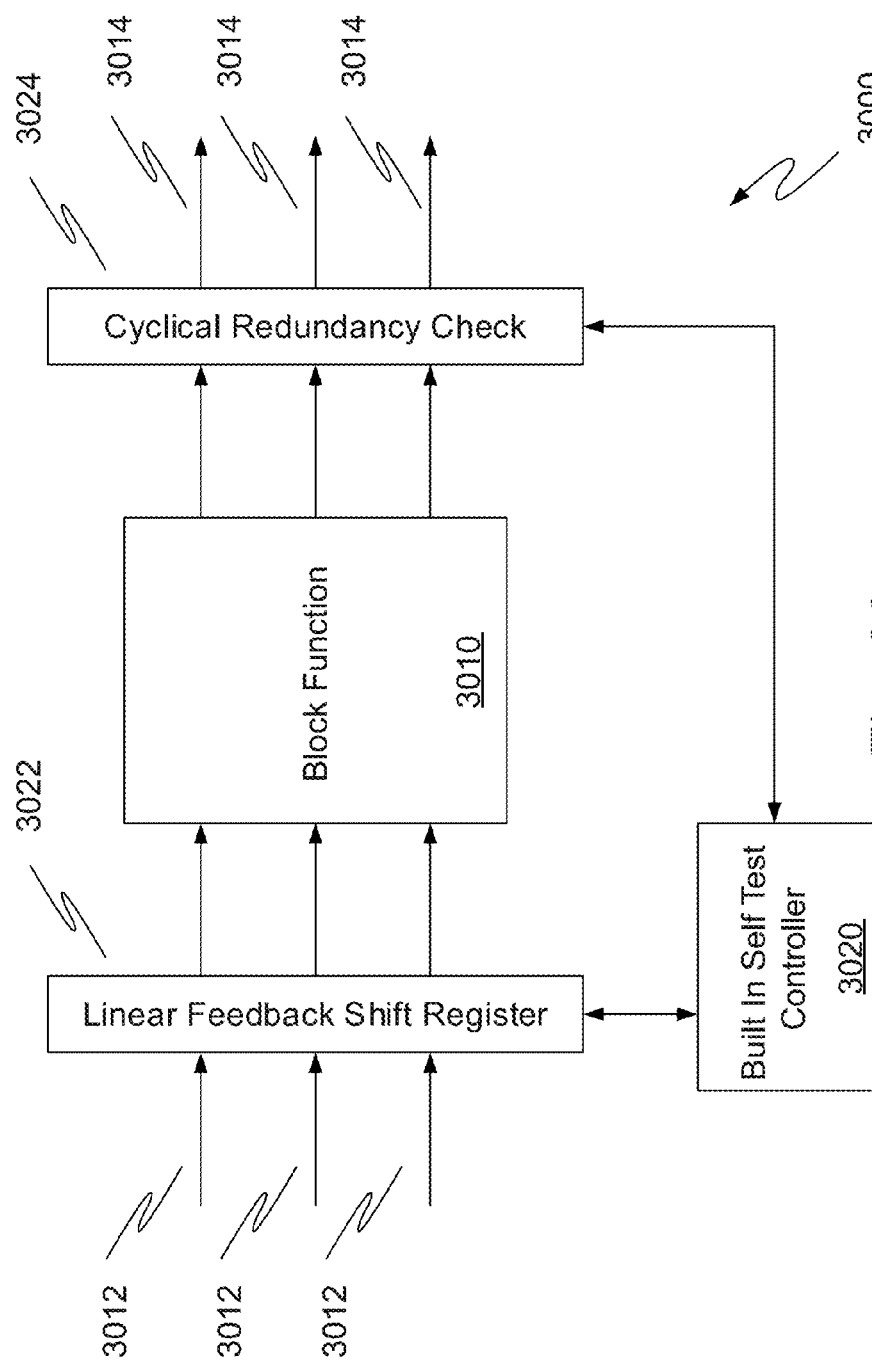
FIG. 30 illustrates a BIST architecture of the prior art.

Vertical stacking offers a natural solution of replicating the system image on top of each other. FIG. 27 is a drawing illustration of such system with three layers 2701 2702 2703, where combinatorial logic is replicated such as in logic cones 2711-1, 2711-2, and 2711-3, and FFs are replicated such as 2721-1, 2721-2, and 2721-3. One of the layers, 2701 in this depiction, includes a majority voting circuitry 2731 that arbitrates among the local FF output 2751 and the vertically stacked FF outputs 2752 and 2753 to produce a final fault tolerant FF output that needs to be distributed to all logic layers as 2741-1, 2741-2, 2741-3.

Person skilled in the art will appreciate that variations on this configuration are possible such as dedicating a separate layer just to the voting circuitry that will make layers 2701, 2702 and 2703 logically identical; relocating the voting circuitry to the input of the FFs rather than to its output; or extending the redundancy replication to more than 3 instances (and stacked layers).

The abovementioned method for designing TMR addresses both of the mentioned weaknesses. First, there is essentially no additional routing congestion in any layer because of TMR, and the design at each layer can be optimally implemented in a single image rather than in triplicate. Second, any design implemented for non high-reliability market can be converted to TMR design with minimal effort by vertical stacking of three original images and adding a majority voting circuitry either to one of the layers, to all three layers as in FIG. 27, or as a separate layer. A TMR circuit can be shipped from the factory with known errors present (masked by the TMR redundancy), or a Repair Layer can be added to repair any known errors for an even higher degree of reliability.

The exemplary embodiments discussed so far are primarily concerned with yield enhancement and repair in the factory prior to shipping a 3D IC to a customer. Another aspect of the present invention is providing redundancy and self-repair once the 3D IC is deployed in the field. This is a desirable product characteristic because defects may occur in products that tested as operating correctly in the factory. For example, this can occur due to a delayed failure mechanism such as a defective gate dielectric in a transistor that develops into a short circuit between the gate and the underlying transistor source, drain or body. Immediately after fabrication such a transistor may function correctly during factory testing, but with time and applied voltages and temperatures, the defect can develop into a failure which may be detected during subsequent tests in the field. Many other delayed failure mechanisms are known. Regardless of the nature of the delayed defect, if it creates a logic error in the 3D IC then subsequent testing according to the present invention may be used to detect and repair it.

Figure 31:
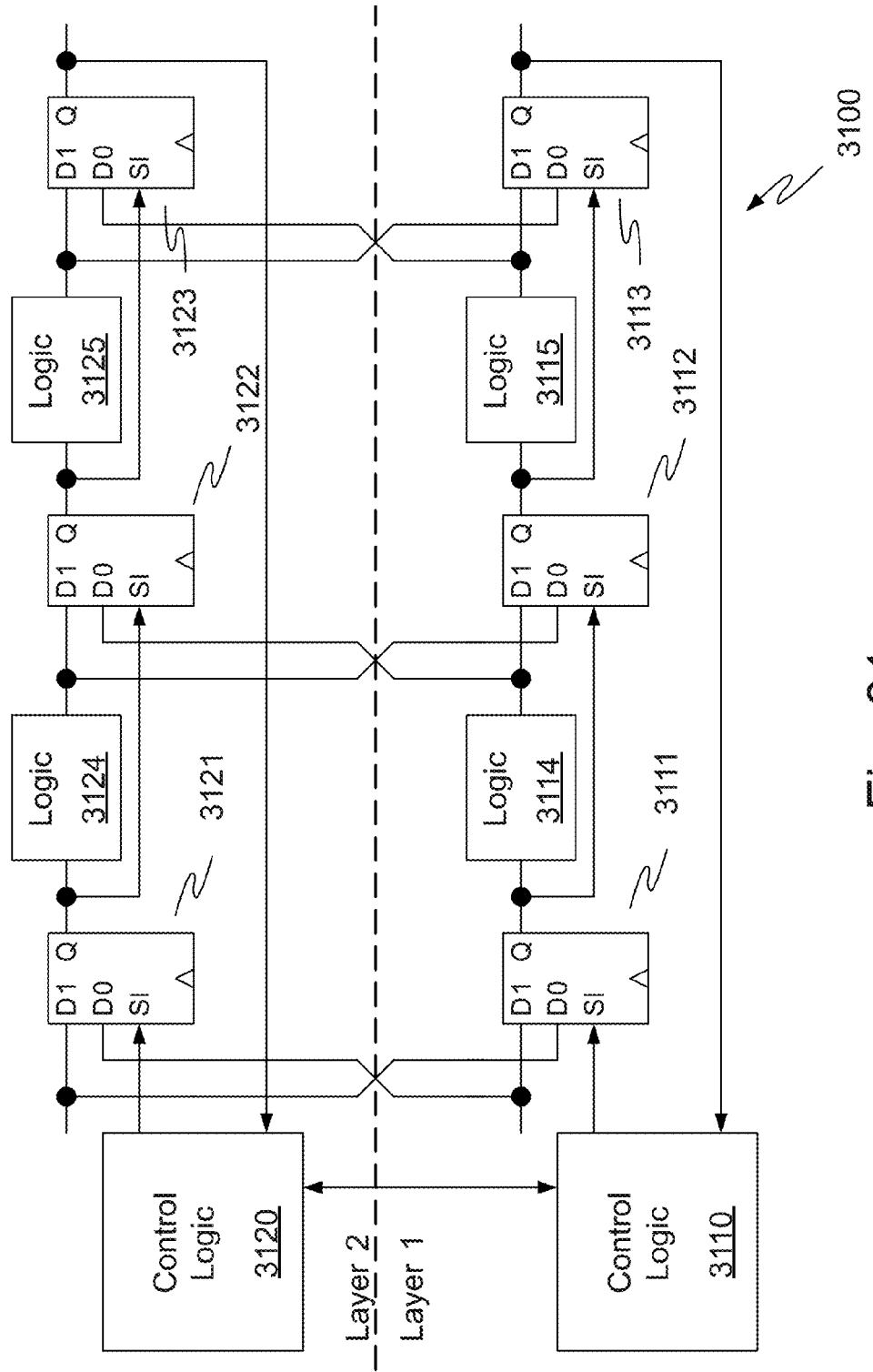
FIG. 31 illustrates a second field repairable 3D IC according to the present invention.

FIG. 31 illustrates an exemplary 3D IC generally indicated by 3100 according to the present invention. 3D IC 3100 comprises two layers labeled Layer 1 and Layer 2 and separated by a dashed line in the figure. Layer 1 and Layer 2 may be bonded together into a single 3D IC using methods known in the art. The electrical coupling of signals between Layer 1 and Layer 2 may be realized with Through-Silicon Via (TSV) or some other interlayer technology. Layer 1 and Layer 2 may each comprise a single layer of semiconductor devices called a Transistor Layer and its associated interconnections (typically realized in one or more physical Metal Layers) which are called Interconnection Layers. The combination of a Transistor Layer and one or more Interconnection Layers is called a Circuit Layer. Layer 1 and Layer 2 may each comprise one or more Circuit Layers of devices and interconnections as a matter of design choice.

Regardless of the details of their construction, Layer 1 and Layer 2 in 3D IC 3100 perform substantially identical logic functions. In some embodiments, Layer 1 and Layer 2 may each be fabricated using the same masks for all layers to reduce manufacturing costs. In other embodiments there may be small variations on one or more mask layers. For example, there may be an option on one of the mask layers which creates a different logic signal on each layer which tells the control logic blocks on Layer 1 and Layer 2 that they are the controlling Layer 1 and Layer 2 respectively in cases where this is important. Other differences between the layers may be present as a matter of design choice.

Layer 1 comprises Control Logic 3110, representative scan flip flops 3111, 3112 and 3113, and representative combinational logic clouds 3114 and 3115, while Layer 2 comprises Control Logic 3120, representative scan flip flops 3121, 3122 and 3123, and representative logic clouds 3124 and 3125. Control Logic 3110 and scan flip flops 3111, 3112 and 3113 are coupled together to form a scan chain for set scan testing of combinational logic clouds 3114 and 3115 in a manner previously described. Control Logic 3120 and scan flip flops 3121, 3122 and 3123 are also coupled together to form a scan chain for set scan testing of combinational logic clouds 3124 and 3125. Control Logic blocks 3110 and 3120 are coupled together to allow coordination of the testing on both Layers. In some embodiments, Control Logic blocks 3110 and 3120 may be able to test either themselves or each other. If one of them is bad, the other can be used to control testing on both Layer 1 and Layer 2.

Persons of ordinary skill in the art will appreciate that the scan chains in FIG. 31 are representative only, that in a practical design there may be millions of flip flops which may broken into multiple scan chains, and the inventive principles disclosed herein apply regardless of the size and scale of the design.

As with previously described embodiments, the Layer 1 and Layer 2 scan chains may be used in the factory for a variety of testing purposes. For example, Layer 1 and Layer 2 may each have an associated Repair Layer (not shown in FIG. 31) which was used to correct any defective logic cones or logic blocks which originally occurred on either Layer 1 or Layer 2 during their fabrication processes. Alternatively, a single Repair Layer may be shared by Layer 1 and Layer 2.

Figure 32:
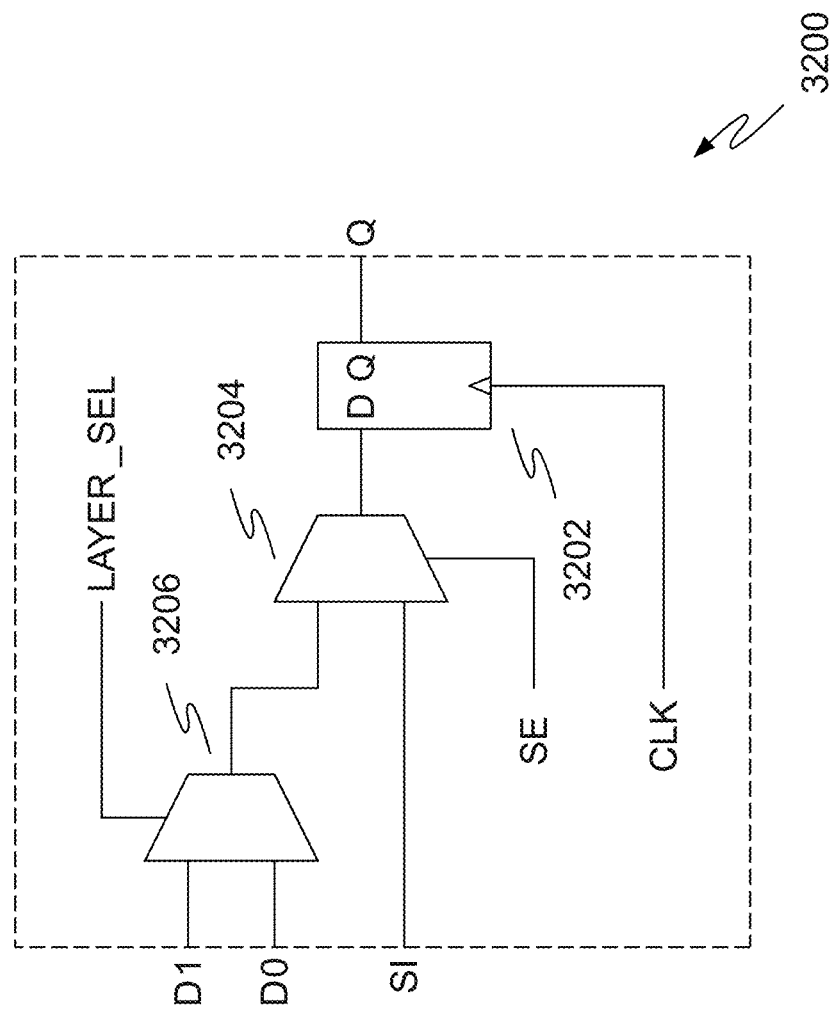
FIG. 32 illustrates a scan flip flop suitable for use with the 3D IC of FIG. 31.

FIG. 32 illustrates exemplary scan flip flop 3200 (surrounded by the dashed line in the figure) suitable for use with the present invention. Scan flip flop 3200 may be used for the scan flip flop instances 3111, 3112, 3113, 3121, 3122 and 3123 in FIG. 31. Present in FIG. 32 is D-type flip flop 3202 which has a Q output coupled to the Q output of scan flip flop 3200, a D input coupled to the output of multiplexer 3204, and a clock input coupled to the CLK signal. Multiplexer 3204 also has a first data input coupled to the output of multiplexer 3206, a second data input coupled to the SI (Scan Input) input of scan flip flop 3200, and a select input coupled to the SE (Scan Enable) signal. Multiplexer 3206 has a first and second data inputs coupled to the D0 and D1 inputs of scan flip flop 3200 and a select input coupled to the LAYER_SEL signal.

The SE, LAYER_SEL and CLK signals are not shown coupled to input ports on scan flip flop 3200 to avoid over complicating the disclosure—particularly in drawings like FIG. 31 where multiple instances of scan flip flop 3200 appear and explicitly routing them would detract from the concepts being presented. In a practical design, all three of those signals are typically coupled to an appropriate circuit for every instance of scan flip flop 3200.

When asserted, the SE signal places scan flip flop 3200 into scan mode causing multiplexer 3204 to gate the SI input to the D input of D-type flip flop 3202. Since this signal goes to all scan flip flops 3200 in a scan chain, this has the effect of connecting them together as a shift register allowing vectors to be shifted in and test results to be shifted out. When SE is not asserted, multiplexer 3204 selects the output of multiplexer 3206 to present to the D input of D-type flip flop 3202.

The CLK signal is shown as an "internal" signal here since its origin will differ from embodiment to embodiment as a matter of design choice. In practical designs, a clock signal (or some variation of it) is typically routed to every flip flop in its functional domain In some scan test architectures, CLK will be selected by a third multiplexer (not shown in FIG. 32) from a domain clock used in functional operation and a scan clock for use in scan testing. In such cases, the SCAN_EN signal will typically be coupled to the select input of the third multiplexer so that D-type flip flop 3202 will be correctly clocked in both scan and functional modes of operation. In other scan architectures, the functional domain clock is used as the scan clock during test modes and no additional multiplexer is needed. Persons of ordinary skill in the art will appreciate that many different scan architectures are known and will realize that the particular scan architecture in any given embodiment will be a matter of design choice and in no way limits the present invention.

The LAYER_SEL signal determines the data source of scan flip flop 3200 in normal operating mode. As illustrated in FIG. 31, input D1 is coupled to the output of the logic cone of the Layer (either Layer 1 or Layer 2) where scan flip flop 3200 is located, while input D0 is coupled to the output of the corresponding logic cone on the other Layer. The default value for LAYER_SEL is thus logic-1 which selects the output from the same Layer. Each scan flip flop 3200 has its own unique LAYER_SEL signal. This allows a defective logic cone on one Layer to be programmably or selectively replaced by its counterpart on the other Layer. In such cases, the signal coupled to D1 being replaced is called a Faulty Signal while the signal coupled to D0 replacing it is called a Repair Signal.

Figure 33A:
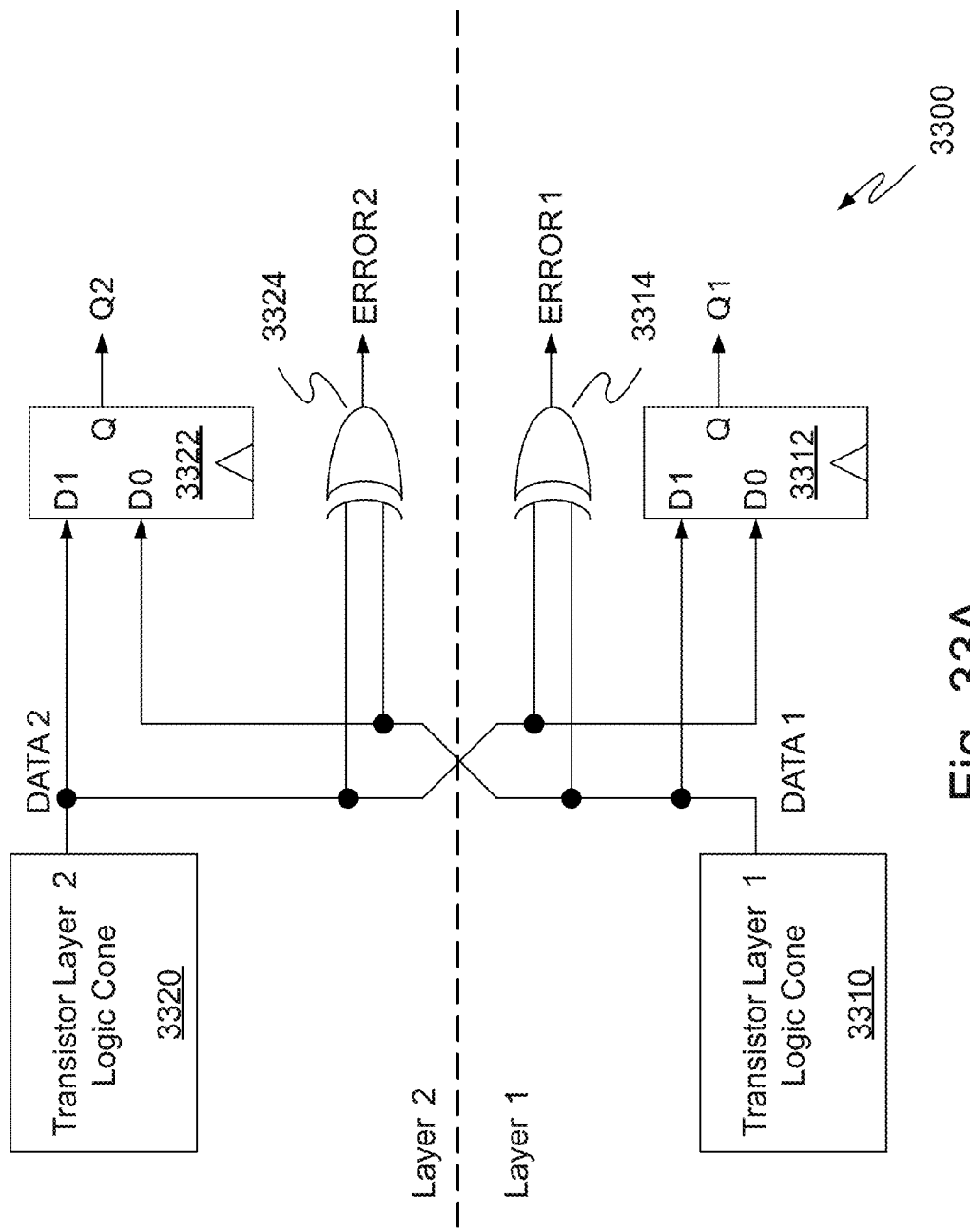
FIG. 33A illustrates a third field repairable 3D IC according to the present invention.

FIG. 33A illustrates an exemplary 3D IC generally indicated by 3300. Like the embodiment of FIG. 31, 3D IC 3300 comprises two Layers labeled Layer 1 and Layer 2 and separated by a dashed line in the drawing figure. Layer 1 comprises Layer 1 Logic Cone 3310, scan flip flop 3312, and XOR gate 3314, while Layer 2 comprises Layer 2 Logic Cone 3320, scan flip flop 3322, and XOR gate 3324. The scan flip flop 3200 of FIG. 32 may be used for scan flip flops 3312 and 3322, though the SI and other internal connections are not shown in FIG. 33A. The output of Layer 1 Logic Cone 3310 (labeled DATA1 in the drawing figure) is coupled to the D1 input of scan flip flop 3312 on Layer 1 and the D0 input of scan flip flop 3322 on Layer 2. Similarly, the output of Layer 2 Logic Cone 3320 (labeled DATA2 in the drawing figure) is coupled to the D1 input of scan flip flop 3322 on Layer 2 and the D0 input of scan flip flop 3312 on Layer 1. Each of the scan flip flops 3312 and 3322 has its own LAYER_SEL signal (not shown in FIG. 33A) that selects between its D0 and D1 inputs in a manner similar to that illustrated in FIG. 32.

XOR gate 3314 has a first input coupled to DATA1, a second input coupled to DATA2, and an output coupled to signal ERROR1. Similarly, XOR gate 3324 has a first input coupled to DATA2, a second input coupled to DATA1, and an output coupled to signal ERROR2. If the logic values present on the signals on DATA1 and DATA2 are not equal, ERROR1 and ERROR2 will equal 1 signifying there is a logic error present. If the signals on DATA1 and DATA2 are equal, ERROR1 and ERROR2 will equal logic-0 signifying there is no logic error present. Persons of ordinary skill in art will appreciate that the underlying assumption here is that only one of the Logic Cones 3310 and 3320 will be bad simultaneously. Since both Layer 1 and Layer 2 have already been factory tested, verified and, in some embodiments, repaired, the statistical likelihood of both logic cones developing a failure in the field is extremely unlikely even without any factory repair, thus validating the assumption.

In 3D IC 3300, the testing may be done in a number of different ways as a matter of design choice. For example, the clock could be stopped occasionally and the status of the ERROR1 and ERROR2 signals monitored in a spot check manner during a system maintenance period. Alternatively, operation can be halted and scan vectors run with a comparison done on every vector. In some embodiments a BIST testing scheme using Linear Feedback Shift Registers to generate pseudo-random vectors for Cyclic Redundancy Checking may be employed. These methods all involve stopping system operation and entering a test mode. Other methods of monitoring possible error conditions in real time will be discussed below.

In order to effect a repair in 3D IC 3300, two determinations are typically made: (1) the location of the logic cone with the error, and (2) which of the two corresponding logic cones is operating correctly at that location. Thus a method of monitoring the ERROR1 and ERROR2 signals and a method of controlling the LAYER_SEL signals of scan flip flops 3312 and 3322 are may be needed, though there are other approaches. In a practical embodiment, a method of reading and writing the state of the LAYER_SEL signal may be needed for factory testing to verify that Layer 1 and Layer 2 are both operating correctly.

Typically, the LAYER_SEL signal for each scan flip flop will be held in a programmable element like, for example, a volatile memory circuit like a latch storing one bit of binary data (not shown in FIG. 33A). In some embodiments, the correct value of each programmable element or latch may be determined at system power up, at a system reset, or on demand as a routine part of system maintenance. Alternatively, the correct value for each programmable element or latch may be determined at an earlier point in time and stored in a non-volatile medium like a flash memory or by programming antifuses internal to 3D IC 3300, or the values may be stored elsewhere in the system in which 3D IC 3300 is deployed. In those embodiments, the data stored in the non-volatile medium may be read from its storage location in some manner and written to the LAYER_SEL latches.

Various methods of monitoring ERROR1 and ERROR2 are possible. For example, a separate shift register chain on each Layer (not shown in FIG. 33A) could be employed to capture the ERROR1 and ERROR2 values, though this would carry a significant area penalty. Alternatively, the ERROR1 and ERROR2 signals could be coupled to scan flip flops 3312 and 3322 respectively (not shown in FIG. 33A), captured in a test mode, and shifted out. This would carry less overhead per scan flip flop, but would still be expensive.

The cost of monitoring the ERROR1 and ERROR2 signals can be reduced further if it is combined with the circuitry necessary to write and read the latches storing the LAYER_SEL information. In some embodiments, for example, the LAYER_SEL latch may be coupled to the corresponding scan flip flop 3200 and have its value read and written through the scan chain. Alternatively, the logic cone, the scan flip flop, the XOR gate, and the LAYER_SEL latch may all be addressed using the same addressing circuitry.

Figure 33B:
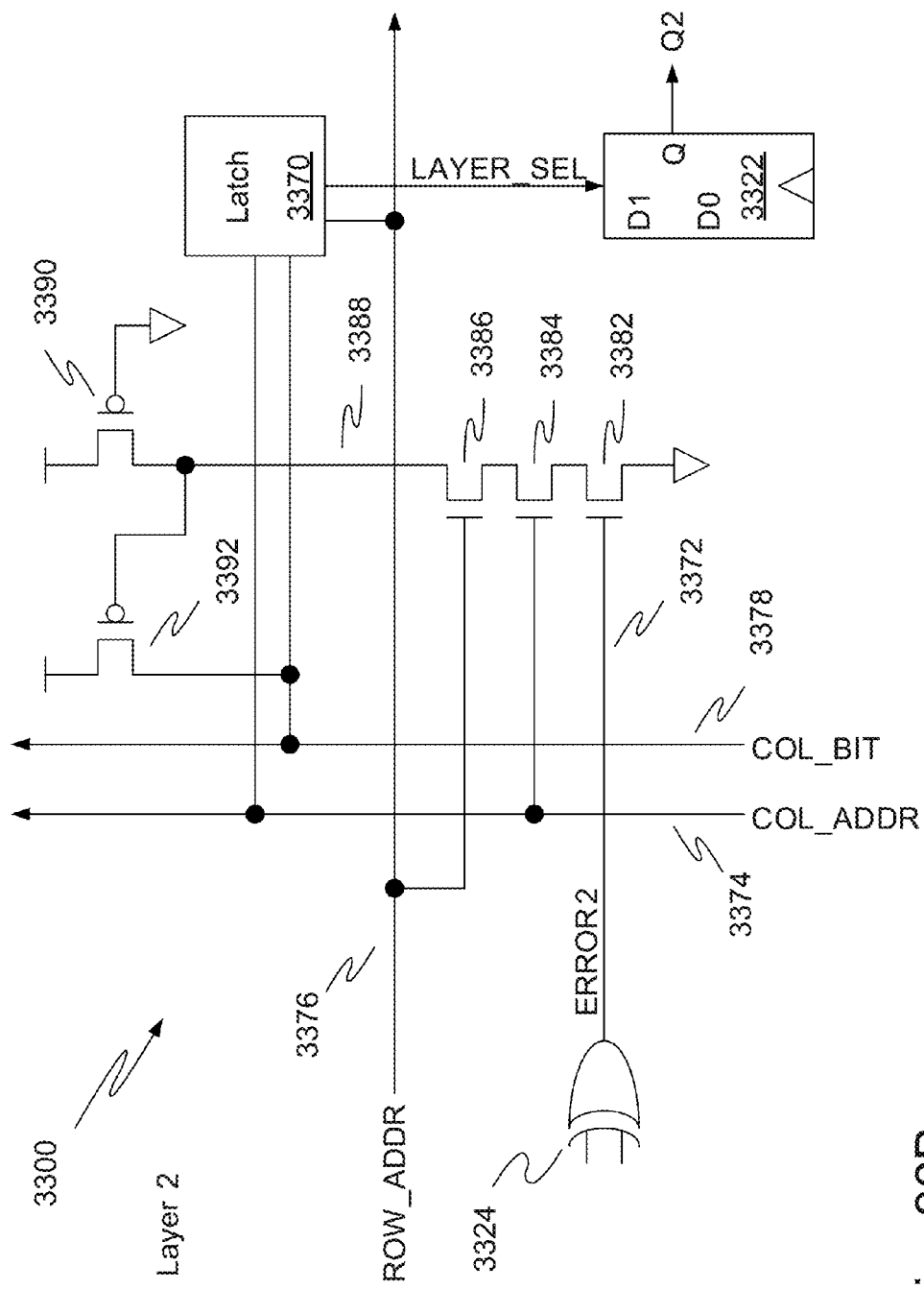
FIG. 33B illustrates additional aspects of the field repairable 3D IC of FIG. 33A.

Illustrated in FIG. 33B is circuitry for monitoring ERROR2 and controlling its associated LAYER_SEL latch by addressing in 3D IC 3300. Present in FIG. 33B is 3D IC 3300, a portion of the Layer 2 circuitry discussed in FIG. 33A including scan flip flop 3322 and XOR gate 3324. A substantially identical circuit (not shown in FIG. 33B) will be present on Layer 1 involving scan flip flop 3312 and XOR gate 3314.

Also present in FIG. 33B is LAYER_SEL latch 3370 which is coupled to scan flip flop 3322 through the LAYER_SEL signal. The value of the data stored in latch 3370 determines which logic cone is used by scan flip flop 3322 in normal operation. Latch 3370 is coupled to COL_ADDR line 3374 (the column address line), ROW_ADDR line 3376 (the row address line) and COL_BIT line 3378. These lines may be used to read and write the contents of latch 3370 in a manner similar to any SRAM circuit known in the art. In some embodiments, a complementary COL_BIT line (not shown in FIG. 33B) with inverted binary data may be present. In a logic design, whether implemented in full custom, semi-custom, gate array or ASIC design or some other design methodology, the scan flip flops will not line up neatly in rows and columns the way memory cells do in a memory block. In some embodiments, a tool may be used to assign the scan flip flops into virtual rows and columns for addressing purposes. Then the various virtual row and column lines would be routed like any other signals in the design.

The ERROR2 line 3372 may be read at the same address as latch 3370 using the circuit comprising N-channel transistors 3382, 3384 and 3386 and P-channel transistors 3390 and 3392. N-channel transistor 3382 has a gate terminal coupled to ERROR2 line 3372, a source terminal coupled to ground, and a drain terminal coupled to the source of N-channel transistor 3384. N-channel transistor 3384 has a gate terminal coupled to COL_ADDR line 3374, a source terminal coupled to N-channel transistor 3382, and a drain terminal coupled to the source of N-channel transistor 3386. N-channel transistor 3386 has a gate terminal coupled to ROW_ADDR line 3376, a source terminal coupled to the drain N-channel transistor 3384, and a drain terminal coupled to the drain of P-channel transistor 3390 and the gate of P-channel transistor 3392 through line 3388. P-channel transistor 3390 has a gate terminal coupled to ground, a source terminal coupled to the positive power supply, and a drain terminal coupled to line 3388. P-channel transistor 3392 has a gate terminal coupled to line 3388, a source terminal coupled to the positive power supply, and a drain terminal coupled to COL_BIT line 3378.

If the particular ERROR2 line 3372 in FIG. 33B is not addressed (i.e., either COL_ADDR line 3374 equals the ground voltage level (logic-0) or ROW_ADDR line 3376 equals the ground voltage supply voltage level (logic-0)), then the transistor stack comprising the three N-channel transistors 3382, 3384 and 3386 will be non-conductive. The P-channel transistor 3390 functions as a weak pull-up device pulling the voltage level on line 3388 to the positive power supply voltage (logic-1) when the N-channel transistor stack is non-conductive. This causes P-channel transistor 3392 to be non-conductive presenting high impedance to COL_BIT line 3378.

A weak pull-down (not shown in FIG. 33B) is coupled to COL_BIT line 3378. If all the memory cells coupled to COL_BIT line 3378 present high impedance, then the weak pull-down will pull the voltage level to ground (logic-0).

If the particular ERROR2 line 3372 in FIG. 33B is addressed (i.e., both COL_ADDR line 3374 and ROW_ADDR line 3376 are at the positive power supply voltage level (logic-1)), then the transistor stack comprising the three N-channel transistors 3382, 3384 and 3386 will be non-conductive if ERROR2=logic-0 and conductive if ERROR2=logic-1. Thus the logic value of ERROR2 may be propagated through P-channel transistors 3390 and 3392 and onto the COL_BIT line 3378.

An advantage of the addressing scheme of FIG. 33B is that a broadcast ready mode is available by addressing all of the rows and columns simultaneously and monitoring all of the column bit lines 3378. If all the column bit lines 3378 are logic-0, all of the ERROR2 signals are logic-0 meaning there are no bad logic cones present on Layer 2. Since field correctable errors will be relatively rare, this can save a lot of time locating errors relative to a scan flip flop chain approach. If one or more bit lines is logic-1, faulty logic cones will only be present on those columns and the row addresses can be cycled quickly to find their exact addresses. Another advantage of the scheme is that large groups or all of the LAYER_SEL latches can be initialized simultaneously to the default value of logic-1 quickly during a power up or reset condition.

At each location where a faulty logic cone is present, if any, the defect is isolated to a particular layer so that the correctly functioning logic cone may be selected by the corresponding scan flip flop on both Layer 1 and Layer 2. If a large non-volatile memory is present in the 3D IC 3300 or in the external system, then automatic test pattern generated (ATPG) vectors may be used in a manner similar to the factory repair embodiments. In this case, the scan itself is capable of identifying both the location and the correctly functioning layer. Unfortunately, this requires a large number of vectors and a correspondingly large amount of available non-volatile memory which may not be available in all embodiments.

Using some form of Built In Self Test (BIST) has the advantage of being self contained inside 3D IC 3300 without needing the storage of large numbers of test vectors. Unfortunately, BIST tests tend to be of the "go" or "no go" variety. They identify the presence of an error, but are not particularly good at diagnosing either the location or the nature of the fault. Fortunately, there are ways to combine the monitoring of the error signals previously described with BIST techniques and appropriate design methodology to quickly determine the correct values of the LAYER_SEL latches.

Figure 34:
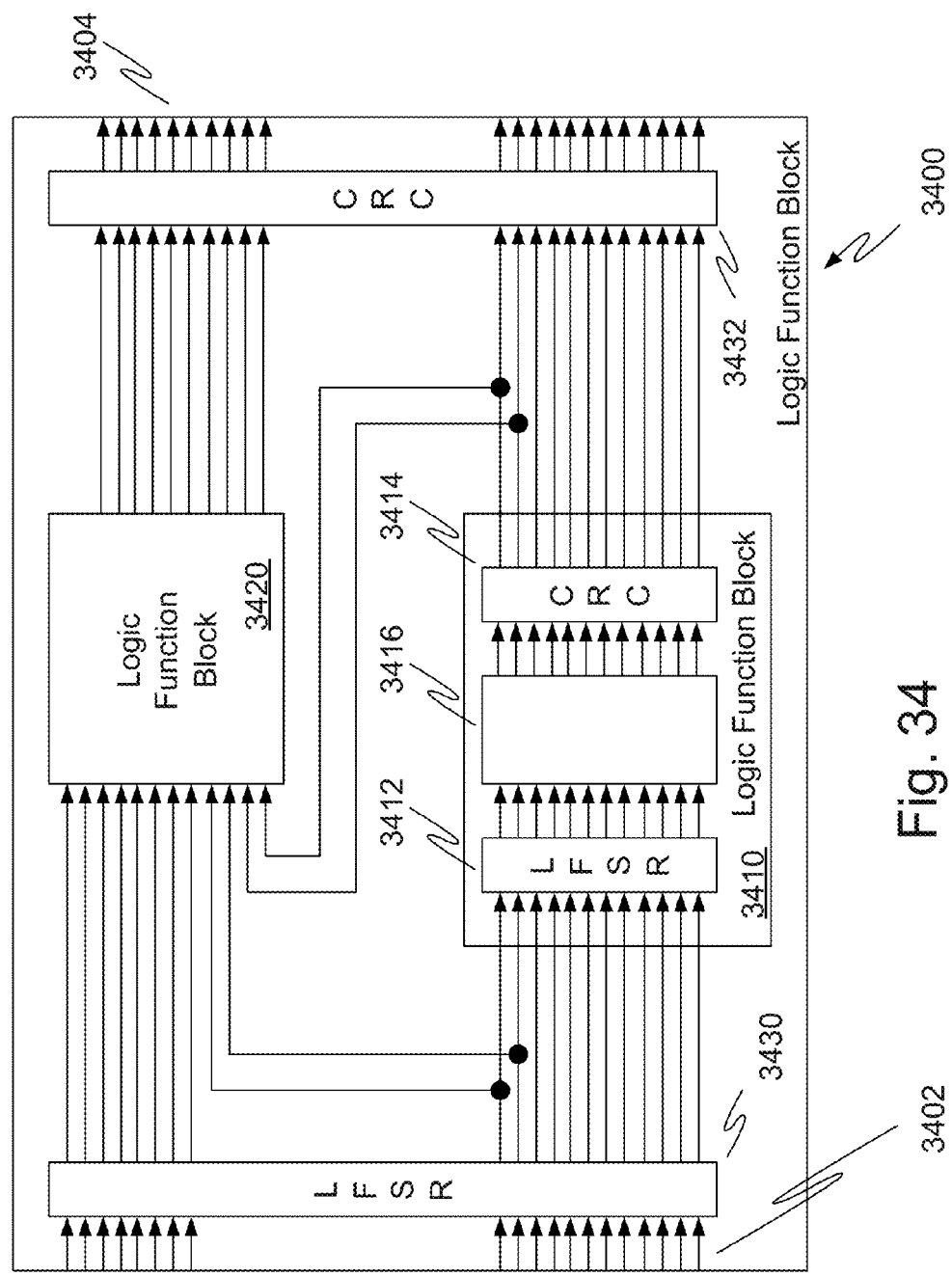
FIG. 34 illustrates a fourth field repairable 3D IC according to the present invention.

FIG. 34 illustrates an exemplary portion of the logic design implemented in a 3D IC such as 3100 of FIG. 31 or 3300 of FIG. 33A. The logic design is present on both Layer 1 and Layer 2 with substantially identical gate-level implementations. Preferably, all of the flip flops (not illustrated in FIG. 34) in the design are implemented using scan flip flops similar or identical in function to scan flip flop 3200 of FIG. 32. Preferably, all of the scan flip flops on each Layer have the sort of interconnections with the corresponding scan flip flop on the other Layer as described in conjunction with FIG. 33A. Preferably, each scan flip flop will have an associated error signal generator (e.g., an XOR gate) for detecting the presence of a faulty logic cone, and a LAYER_SEL latch to control which logic cone is fed to the flip flop in normal operating mode as described in conjunction with FIGS. 33A and 33B.

Present in FIG. 34 is an exemplary logic function block (LFB) 3400. Typically LFB 3400 has a plurality of inputs, an exemplary instance being indicated by reference number input 3402, and a plurality of outputs, an exemplary instance being indicated by reference number output 3404. Preferably LFB 3400 is designed in a hierarchical manner, meaning that it typically has smaller logic function blocks such as 3410 and 3420 instantiated within it. Circuits internal to LFBs 3410 and 3420 are considered to be at a "lower" level of the hierarchy than circuits present in the "top" level of LFB 3400 which are considered to be at a "higher" level in the hierarchy. LFB 3400 is exemplary only. Many other configurations are possible. There may be more (or less) than two LFBs instantiated internal to LFB 3400. There may also be individual logic gates and other circuits instantiated internal to LFB 3400 not shown in FIG. 34 to avoid overcomplicating the disclosure. LFBs 3410 and 3420 may have internally instantiated even smaller blocks forming even lower levels in the hierarchy. Similarly, Logic Function Block 3400 may itself be instantiated in another LFB at an even higher level of the hierarchy of the overall design.

Present in LFB 3400 is Linear Feedback Shift Register (LFSR) 3430 circuit for generating pseudo-random input vectors for LFB 3400 in a manner well known in the art. In FIG. 34 one bit of LFSR 3430 is associated with each of the inputs 3402 of LFB 3400. If an input 3402 couples directly to a flip flop (preferably a scan flip flop similar to 3200) then that scan flip flop may be modified to have the additional LFSR functionality to generate pseudo-random input vectors. If an input 3402 couples directly to combinatorial logic, it will be intercepted in test mode and its value determined and replaced by a corresponding bit in LFSR 3430 during testing. Alternatively, the LFSR 3430 circuit will intercept all input signals during testing regardless of the type of circuitry it connects to internal to LFB 3400.

Thus during a BIST test, all the inputs of LFB 3400 may be exercised with pseudo-random input vectors generated by LSFR 3430. As is known in the art, LSFR 3430 may be a single LSFR or a number of smaller LSFRs as a matter of design choice. LSFR 3430 is preferably implemented using a primitive polynomial to generate a maximum length sequence of pseudo-random vectors. LSFR 3430 needs to be seeded to a known value, so that the sequence of pseudo-random vectors is deterministic. The seeding logic can be inexpensively implemented internal to the LSFR 3430 flip flops and initialized, for example, in response to a reset signal.

Also present in LFB 3400 is Cyclic Redundancy Check (CRC) 3432 circuit for generating a signature of the LFB 3400 outputs generated in response to the pseudo-random input vectors generated by LFSR 3430 in a manner well known in the art. In FIG. 34 one bit of CRC 3432 is associated with each of the outputs 3404 of LFB 3400. If an output 3404 couples directly to a flip flop (preferably a scan flip flop similar to 3200) then that scan flip flop may be modified to have the additional CRC functionality to generate the signature. If an output 3404 couples directly to combinatorial logic, it will be monitored in test mode and its value coupled to a corresponding bit in CRC 3432. Alternatively, all the bits in CRC will passively monitor an output regardless of the source of the signal internal to LFB 3400.

Thus during a BIST test, all the outputs of LFB 3400 may be analyzed to determine the correctness of their responses to the stimuli provided by the pseudo-random input vectors generated by LSFR 3430. As is known in the art, CRC 3432 may be a single CRC or a number of smaller CRCs as a matter of design choice. As known in the art, a CRC circuit is a special case of an LSFR, with additional circuits present to merge the observed data into the pseudo-random pattern sequence generated by the base LSFR. The CRC 3432 is preferably implemented using a primitive polynomial to generate a maximum sequence of pseudo-random patterns. CRC 3432 needs to be seeded to a known value, so that the signature generated by the pseudo-random input vectors is deterministic. The seeding logic can be inexpensively implemented internal to the LSFR 3430 flip flops and initialized, for example, in response to a reset signal. After completion of the test, the value present in the CRC 3432 is compared to the known value of the signature. If all the bits in CRC 3432 match, the signature is valid and the LFB 3400 is deemed to be functioning correctly. If one or more of the bits in CRC 3432 does not match, the signature is invalid and the LFB 3400 is deemed to not be functioning correctly. The value of the expected signature can be inexpensively implemented internal to the CRC 3432 flip flops and compared internally to CRC 3432 in response to an evaluate signal.

As shown in FIG. 34, LFB 3410 comprises LFSR circuit 3412, CRC circuit 3414, and logic function 3416. Since its input/output structure is analogous to that of LFB 3400, it can be tested in a similar manner albeit on a smaller scale. If LFB 3400 is instantiated into a larger block with a similar input/output structure, LFB 3400 may be tested as part of that larger block or tested separately as a matter of design choice. It is not required that all blocks in the hierarchy have this input/output structure if it is deemed unnecessary to test them individually. An example of this is LFB 3420 instantiated inside LFB 3400 which does not have an LFSR circuit on the inputs and a CRC circuit on the outputs and which is tested along with the rest of LFB 3400.

Persons of ordinary skill in the art will appreciate that other BIST test approaches are known in the art and that any of them may be used to determine if LFB 3400 is functional or faulty.

In order to repair a 3D IC like 3D IC 3300 of FIG. 33A using the block BIST approach, the part is put in a test mode and the DATA1 and DATA2 signals are compared at each scan flip flop 3200 on Layer 1 and Layer 2 and the resulting ERROR1 and ERROR2 signals are monitored as described in the embodiments above or possibly using some other method. The location of the faulty logic cone is determined with regards to its location in the logic design hierarchy. For example, if the faulty logic cone were located inside LFB 3410 then the BIST routine for only that block would be run on both Layer 1 and Layer 2. The results of the two tests determine which of the blocks (and by implication which of the logic cones) is functional and which is faulty. Then the LAYER_SEL latches for the corresponding scan flip flops 3200 can be set so that each receives the repair signal from the functional logic cone and ignores the faulty signal. Thus the layer determination can be made for a modest cost in hardware in a shorter period of time without the need for expensive ATPG testing.

Figure 35:
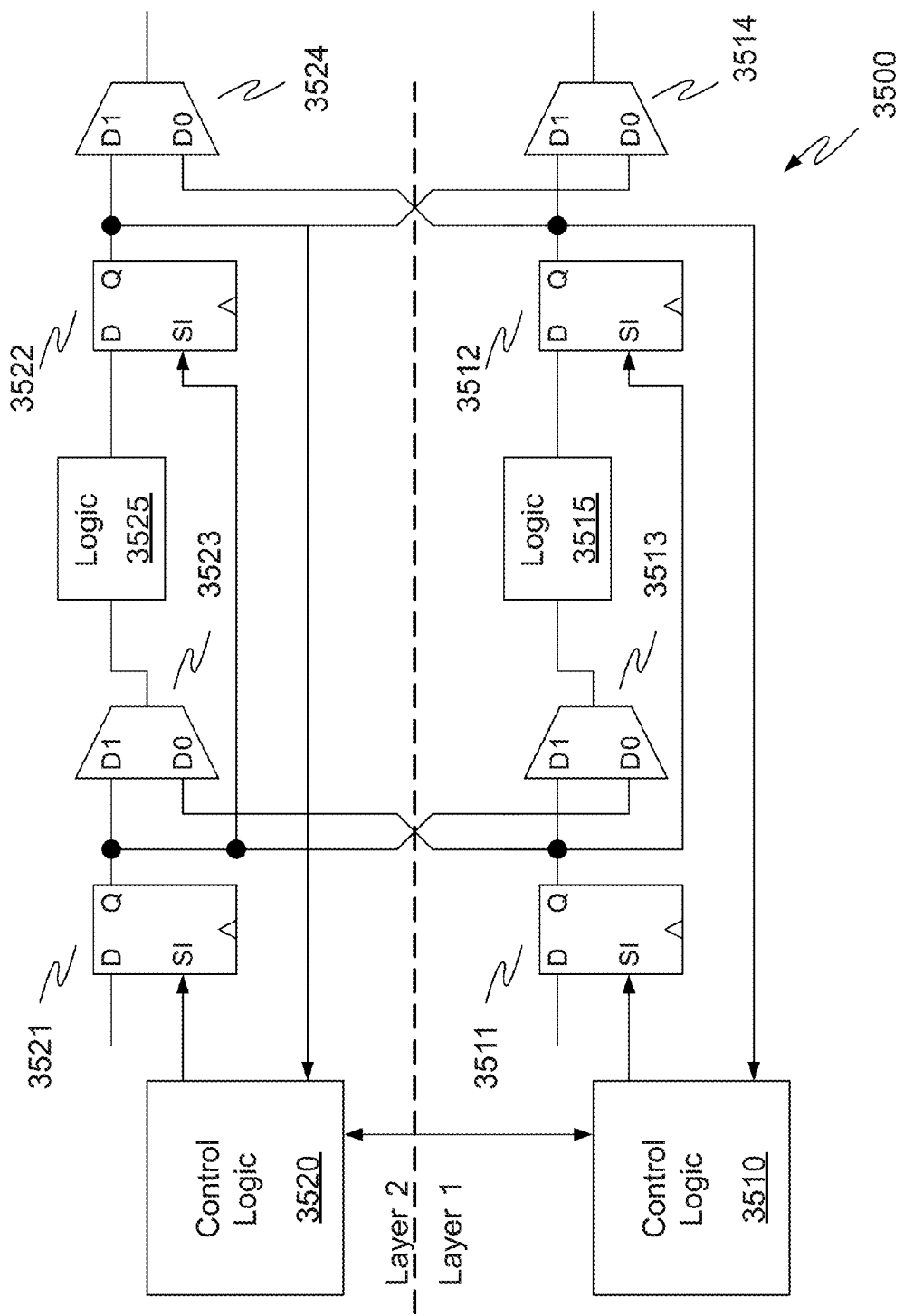
FIG. 35 illustrates a fifth field repairable 3D IC according to the present invention.

FIG. 35 illustrates an alternate embodiment with the ability to perform field repair of individual logic cones. An exemplary 3D IC indicated generally by 3500 comprises two layers labeled Layer 1 and Layer 2 and separated by a dashed line in the drawing figure. Layer 1 and Layer 2 are bonded together to form 3D IC 3500 using methods known in the art and interconnected using TSVs or some other interlayer interconnect technology. Layer 1 comprises Control Logic block 3510, scan flip flops 3511 and 3512, multiplexers 3513 and 3514, and Logic cone 3515. Similarly, Layer 2 comprises Control Logic block 3520, scan flip flops 3521 and 3522, multiplexers 3523 and 3524, and Logic cone 3525.

In Layer 1, scan flip flops 3511 and 3512 are coupled in series with Control Logic block 3510 to form a scan chain. Scan flip flops 3511 and 3512 can be ordinary scan flip flops of a type known in the art. The Q outputs of scan flip flops 3511 and 3512 are coupled to the D1 data inputs of multiplexers 3513 and 3514 respectively. Representative logic cone 3515 has a representative input coupled to the output of multiplexer 3513 and an output coupled to the D input of scan flip flop 3512.

In Layer 2, scan flip flops 3521 and 3522 are coupled in series with Control Logic block 3520 to form a scan chain. Scan flip flops 3521 and 3522 can be ordinary scan flip flops of a type known in the art. The Q outputs of scan flip flops 3521 and 3522 are coupled to the D1 data inputs of multiplexers 3523 and 3524 respectively. Representative logic cone 3525 has a representative input coupled to the output of multiplexer 3523 and an output coupled to the D input of scan flip flop 3522.

The Q output of scan flip flop 3511 is coupled to the D0 input of multiplexer 3523, the Q output of scan flip flop 3521 is coupled to the D0 input of multiplexer 3513, the Q output of scan flip flop 3512 is coupled to the D0 input of multiplexer 3524, and the Q output of scan flip flop 3522 is coupled to the D0 input of multiplexer 3514. Control Logic block 3510 is coupled to Control Logic block 3520 in a manner that allows coordination between testing functions between layers. In some embodiments the Control Logic blocks 3510 and 3520 can test themselves or each other and, if one is faulty, the other can control testing on both layers. These interlayer couplings may be realized by TSVs or by some other interlayer interconnect technology.

The logic functions performed on Layer 1 are substantially identical to the logic functions performed on Layer 2. The embodiment of 3D IC 3500 in FIG. 35 is similar to the embodiment of 3D IC 3100 shown in FIG. 31, with the primary difference being that the multiplexers used to implement the interlayer programmable or selectable cross couplings for logic cone replacement are located immediately after the scan flip flops instead of being immediately before them as in exemplary scan flip flop 3200 of FIG. 32 and in exemplary 3D IC 3100 of FIG. 31.

Figure 36:
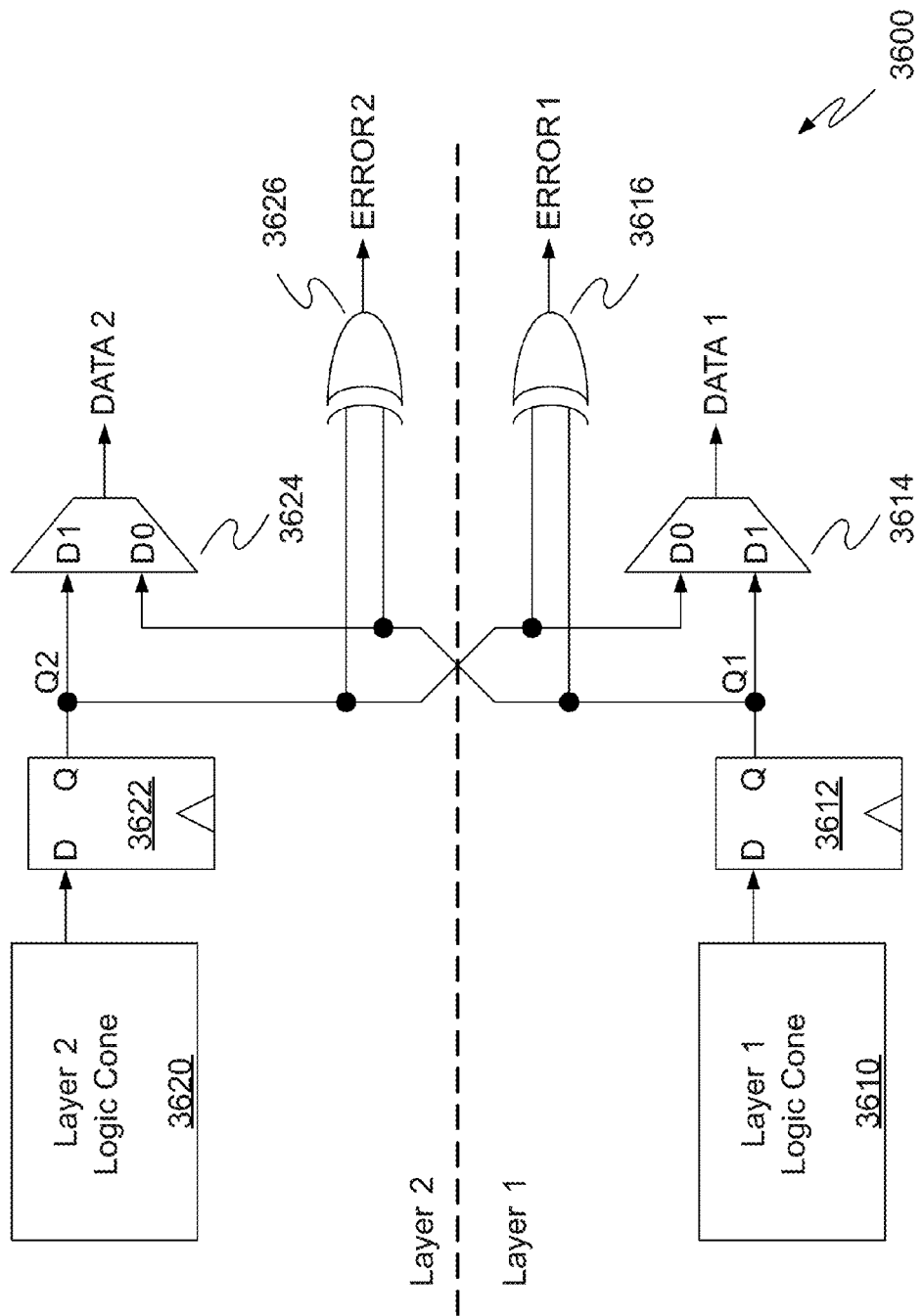
FIG. 36 illustrates a sixth field repairable 3D IC according to the present invention.

FIG. 36 illustrates an exemplary 3D IC indicated generally by 3600 which is also constructed using this approach Exemplary 3D IC 3600 comprises two Layers labeled Layer 1 and Layer 2 and separated by a dashed line in the drawing figure. Layer 1 and Layer 2 are bonded together to form 3D IC 3600 and interconnected using TSVs or some other interlayer interconnect technology. Layer 1 comprises Layer 1 Logic Cone 3610, scan flip flop 3612, multiplexer 3614, and XOR gate 3616. Similarly, Layer 2 comprises Layer 2 Logic Cone 3620, scan flip flop 3622, multiplexer 3624, and XOR gate 3626.

Layer 1 Logic Cone 3610 and Layer 2 Logic Cone 3620 implement substantially identical logic functions. In order to detect a faulty logic cone, the output of the logic cones 3610 and 3620 are captured in scan flip flops 3612 and 3622 respectively in a test mode. The Q outputs of the scan flip flops 3612 and 3622 are labeled Q1 and Q2 respectively in FIG. 36. Q1 and Q2 are compared using the XOR gates 3616 and 3626 to generate error signals ERROR1 and ERROR2 respectively. Each of the multiplexers 3614 and 3624 has a select input coupled to a layer select latch (not shown in FIG. 36) preferably located in the same layer as the corresponding multiplexer within relatively close proximity to allow selectable or programmable coupling of Q1 and Q2 to either DATA1 or DATA2.

All the methods of evaluating ERROR1 and ERROR2 described in conjunction with the embodiments of FIGS. 33A, 33B and 34 may be employed to evaluate ERROR1 and ERROR2 in FIG. 36. Similarly, once ERROR1 and ERROR2 are evaluated, the correct values may be applied to the layer select latches for the multiplexers 3614 and 3624 to effect a logic cone replacement if necessary. In this embodiment, logic cone replacement also includes replacing the associated scan flip flop.

Figure 37A:
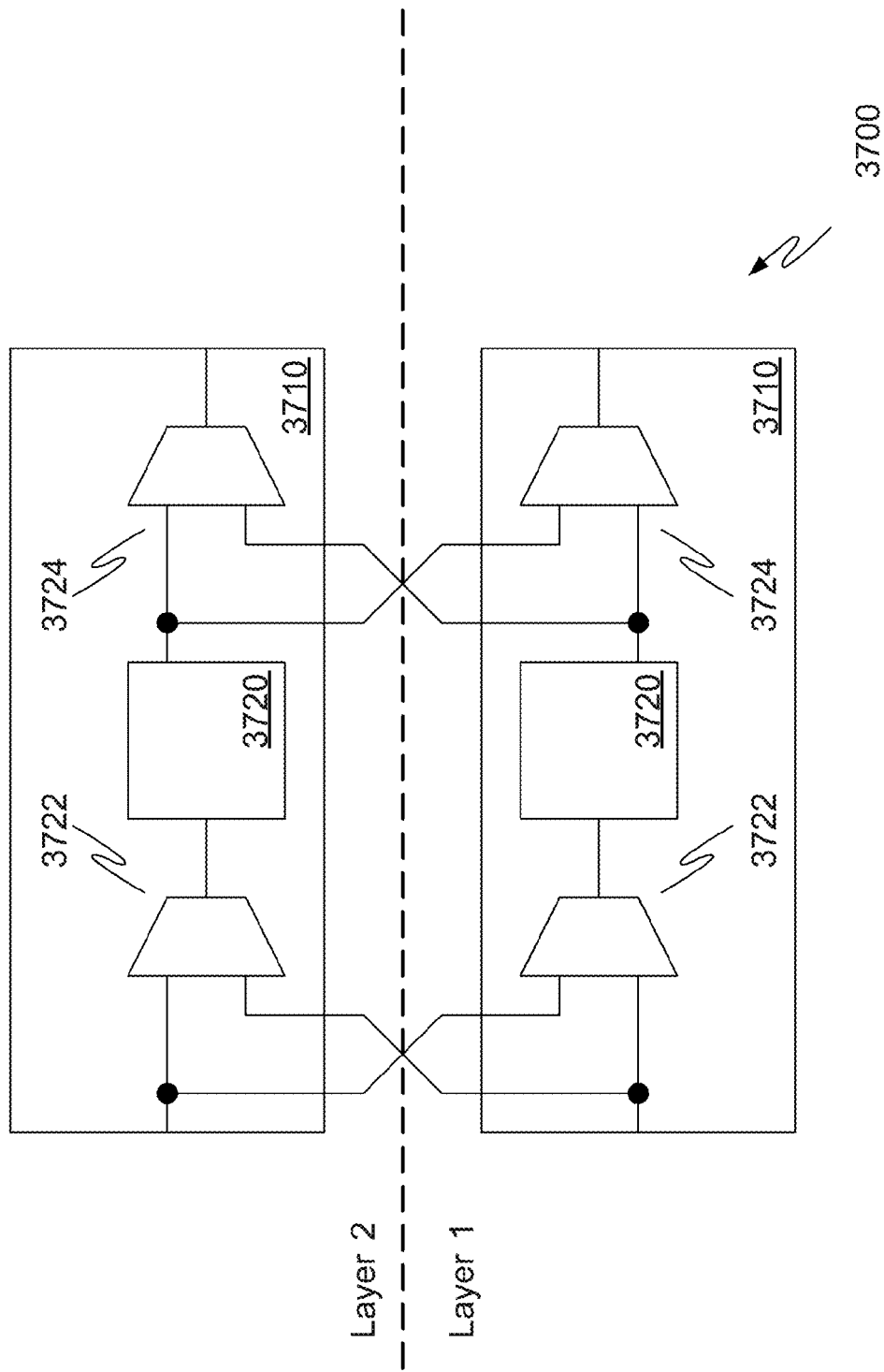
FIG. 37A illustrates a seventh field repairable 3D IC according to the present invention.

FIG. 37A illustrates an exemplary embodiment with an even more economical approach to field repair. An exemplary 3D IC generally indicated by 3700 which comprises two Layers labeled Layer 1 and Layer 2 and separated by a dashed line in the drawing figure. Each of Layer 1 and Layer 2 comprises at least one Circuit Layer. Layer 1 and Layer 2 are bonded together using techniques known in the art to form 3D IC 3700 and interconnected with TSVs or other interlayer interconnect technology. Each Layer further comprises an instance of Logic Function Block 3710, each of which in turn comprises an instance of Logic Function Block (LFB) 3720. LFB 3720 comprises LSFR circuits on its inputs (not shown in FIG. 37A) and CRC circuits on its outputs (not shown in FIG. 37A) in a manner analogous to that described with respect to LFB 3400 in FIG. 34.

Each instance of LFB 3720 has a plurality of multiplexers 3722 associated with its inputs and a plurality of multiplexers 3724 associated with its outputs. These multiplexers may be used to programmably or selectively replace the entire instance of LFB 3720 on either Layer 1 or Layer 2 with its counterpart on the other layer.

On power up, system reset, or on demand from control logic located internal to 3D IC 3700 or elsewhere in the system where 3D IC 3700 is deployed, the various blocks in the hierarchy can be tested. Any faulty block at any level of the hierarchy with BIST capability may be programmably and selectively replaced by its corresponding instance on the other Layer. Since this is determined at the block level, this decision can be made locally by the BIST control logic in each block (not shown in FIG. 37A), though some coordination may be required with higher level blocks in the hierarchy with regards to which Layer the plurality of multiplexers 3722 sources the inputs to the functional LFB 3720 in the case of multiple repairs in the same vicinity in the design hierarchy. Since both Layer 1 and Layer 2 preferably leave the factory fully functional, or alternatively nearly fully functional, a simple approach is to designate one of the Layers, for example, Layer 1, as the primary functional layer. Then the BIST controllers of each block can coordinate locally and decide which block should have its inputs and outputs coupled to Layer 1 through the Layer 1 multiplexers 3722 and 3724.

Persons of ordinary skill in the art will appreciate that significant area can be saved by employing this embodiment. For example, since LFBs are evaluated instead of individual logic cones, the interlayer selection multiplexers for each individual flip flop like multiplexer 3206 in FIG. 32 and multiplexer 3614 in FIG. 36 can be removed along with the LAYER_SEL latches 3370 of FIG. 33B since this function is now handled by the pluralities of multiplexers 3722 and 3724 in FIG. 37A, all of which may be controlled one or more control signals in parallel. Similarly, the error signal generators (e.g., XOR gates 3314 and 3324 in FIG. 33A and 3616 and 3626 in FIG. 36) and any circuitry needed to read them like coupling them to the scan flip flops or the addressing circuitry described in conjunction with FIG. 33B may also be removed, since in this embodiment entire Logic Function Blocks rather than individual Logic Cones are replaced.

Even the scan chains may be removed in some embodiments, though this is a matter of design choice. In embodiments where the scan chains are removed, factory testing and repair would also have to rely on the block BIST circuits. When a bad block is detected, an entire new block would need to be crafted on the Repair Layer with Direct-Write e-Beam. Typically this takes more time than crafting a replacement logic cone due to the greater number of patterns to shape, and the area savings may need to be compared to the test time losses to determine the economically superior decision.

Removing the scan chains also entails a risk in the early debug and prototyping stage of the design, since BIST circuitry is not very good for diagnosing the nature of problems. If there is a problem in the design itself, the absence of scan testing will make it harder to find and fix the problem, and the cost in terms of lost time to market can be very high and hard to quantify Prudence might suggest leaving the scan chains in for reasons unrelated to the field repair aspects of the present invention.

Figure 37B:
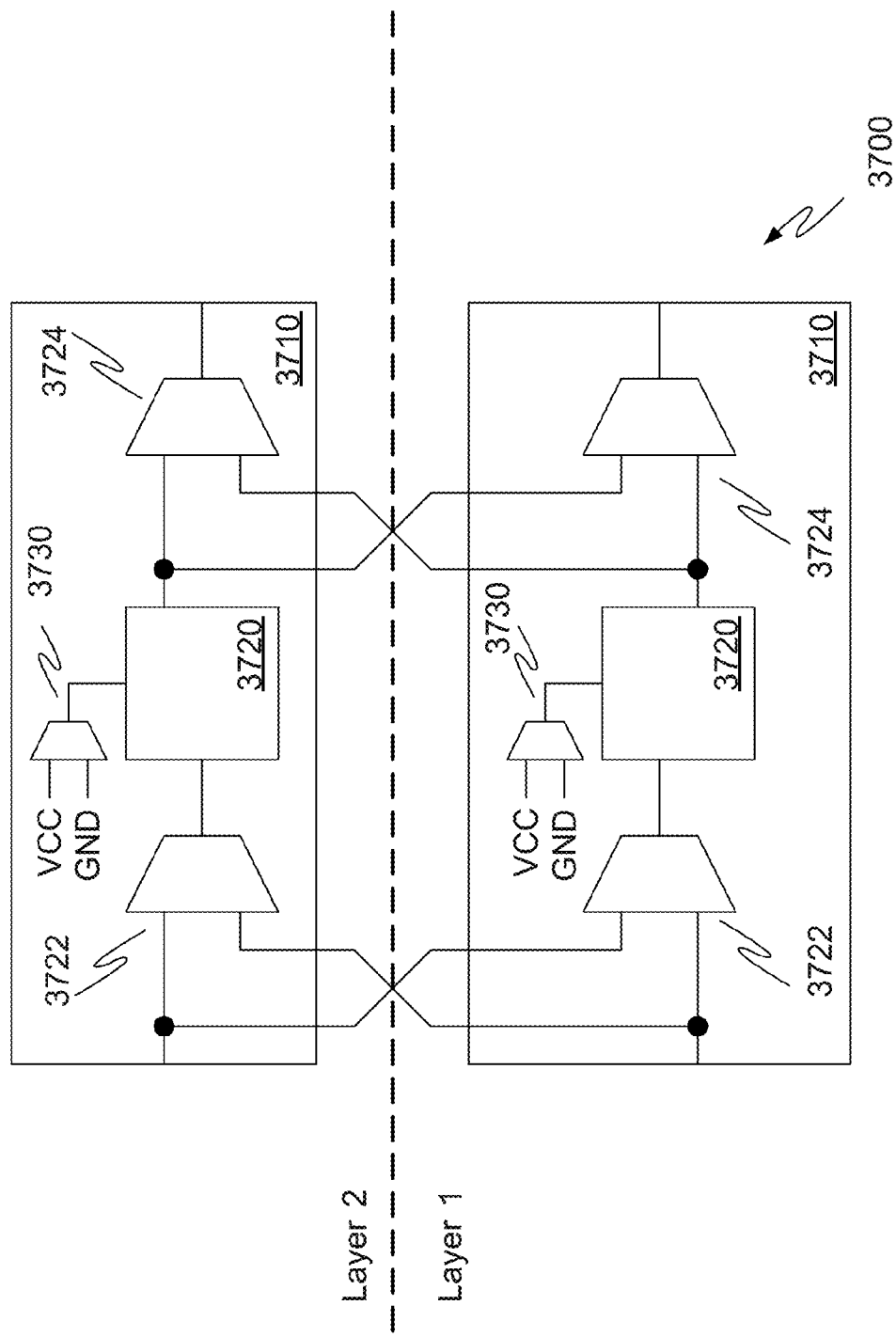
FIG. 37B illustrates additional aspects of the field repairable 3D IC of FIG. 37A.

Another advantage to embodiments using the block BIST approach is described in conjunction with FIG. 37B. One disadvantage to some of the earlier embodiments is that the majority of circuitry on both Layer 1 and Layer 2 is active during normal operation. Thus power can be substantially reduced relative to earlier embodiments by operating only one instance of a block on one of the layers whenever possible.

Present in FIG. 37B are 3D IC 3700, Layer 1 and Layer 2, and two instances each of LFBs 3710 and 3720, and pluralities of multiplexers 3722 and 3724 previously discussed. Also present in each Layer in FIG. 37B is a power select multiplexer 3730 associated with that layer's version of LFB 3720. Each power select multiplexer 3730 has an output coupled to the power terminal of its associated LFB 3720, a first select input coupled to the positive power supply (labeled VCC in the figure), and a second input coupled to the ground potential power supply (labeled GND in the figure). Each power select multiplexer 3730 has a select input (not shown in FIG. 37B) coupled to control logic (also not shown in FIG. 37B), typically present in duplicate on Layer 1 and Layer 2 though it may be located elsewhere internal to 3D IC 3700 or possibly elsewhere in the system where 3D IC 3700 is deployed.

Persons of ordinary skill in the art will appreciate that there are many ways to programmably or selectively power down a block inside an integrated circuit known in the art and that the use of power select multiplexer 3730 in the embodiment of FIG. 37B is exemplary only. Any method of powering down LFB 3720 is within the scope of the invention. For example, a power switch could be used for both VCC and GND. Alternatively, the power switch for GND could be omitted and the power supply node allowed to "float" down to ground when VCC is decoupled from LFB 3720. In some embodiments, VCC may be controlled by a transistor, like either a source follower or an emitter follower which is itself controlled by a voltage regulator, and VCC may be removed by disabling or switching off the transistor in some way. Many other alternatives are possible.

In some embodiments, control logic (not shown in FIG. 37B) uses the BIST circuits present in each block to stitch together a single copy of the design (using each block's plurality of input and output multiplexers which function similarly to pluralities of multiplexers 3722 and 3724 associated with LFB 3720) comprised of functional copies of all the LFBs. When this mapping is complete, all of the faulty LFBs and the unused functional LFBs are powered off using their associated power select multiplexers (similar to power select multiplexer 3730). Thus the power consumption can be reduced to the level that a single copy of the design would require using standard two dimensional integrated circuit technology.

Alternatively, if a layer, for example, Layer 1 is designated as the primary layer, then the BIST controllers in each block can independently determine which version of the block is to be used. Then the settings of the pluralities of multiplexers 3722 and 3724 are set to couple the used block to Layer 1 and the settings of multiplexers 3730 can be set to power down the unused block. Typically, this should reduce the power consumption by half relative to embodiments where power select multiplexers 3730 or equivalent are not implemented.

There are test techniques known in the art that are a compromise between the detailed diagnostic capabilities of scan testing with the simplicity of BIST testing. In embodiments employing such schemes, each BIST block (smaller than a typical LFB, but typically comprising a few tens to a few hundreds of logic cones) stores a small number of initial states in particular scan flip flops while most of the scan flip flops can use a default value. CAD tools may be used to analyze the design's net-list to identify the necessary scan flip flops to allow efficient testing.

During test mode, the BIST controller shifts in the initial values and then starts the clocking the design. The BIST controller has a signature register which might be a CRC or some other circuit which monitors bits internal to the block being tested. After a predetermined number of clock cycles, the BIST controller stops clocking the design, shifts out the data stored in the scan flip flops while adding their contents to the block signature, and compares the signature to a small number of stored signatures (one for each of the stored initial states.

This approach has the advantage of not needing a large number of stored scan vectors and the "go" or "no go" simplicity of BIST testing. The test block is less fine than identifying a single faulty logic cone, but much coarser than a large Logic Function Block. In general, the finer the test granularity (i.e., the smaller the size of the circuitry being substituted for faulty circuitry) the less chance of a delayed fault showing up in the same test block on both Layer 1 and Layer 2. Once the functional status of the BIST block has been determined, the appropriate values are written to the latches controlling the interlayer multiplexers to replace a faulty BIST block on one if the layers, if necessary. In some embodiments, faulty and unused BIST blocks may be powered down to conserve power.

While discussions of the various exemplary embodiments described so far concern themselves with finding and repairing defective logic cones or logic function blocks in a static test mode, embodiments of the present invention can address failures due to noise or timing. For example, in 3D IC 3100 of FIG. 31 and in 3D IC 3500 of FIG. 35 the scan chains can be used to perform at-speed testing in a manner known in the art. One approach involves shifting a vector in through the scan chains, applying two or more at-speed clock pulses, and then shifting out the results through the scan chain. This will catch any logic cones that are functionally correct at low speed testing but are operating too slowly to function in the circuit at full clock speed. While this approach will allow field repair of slow logic cones, it requires the time, intelligence and memory capacity necessary to store, run and evaluate scan vectors.

Another approach is to use block BIST testing at power up, reset, or on-demand to over-clock each block at ever increasing frequencies until one fails, determine which layer version of the block is operating faster, and then substitute the faster block for the slower one at each instance in the design. This has the more modest time, intelligence and memory requirements generally associated with block BIST testing, but it still requires placing the 3D IC in a test mode.

Figure 38:
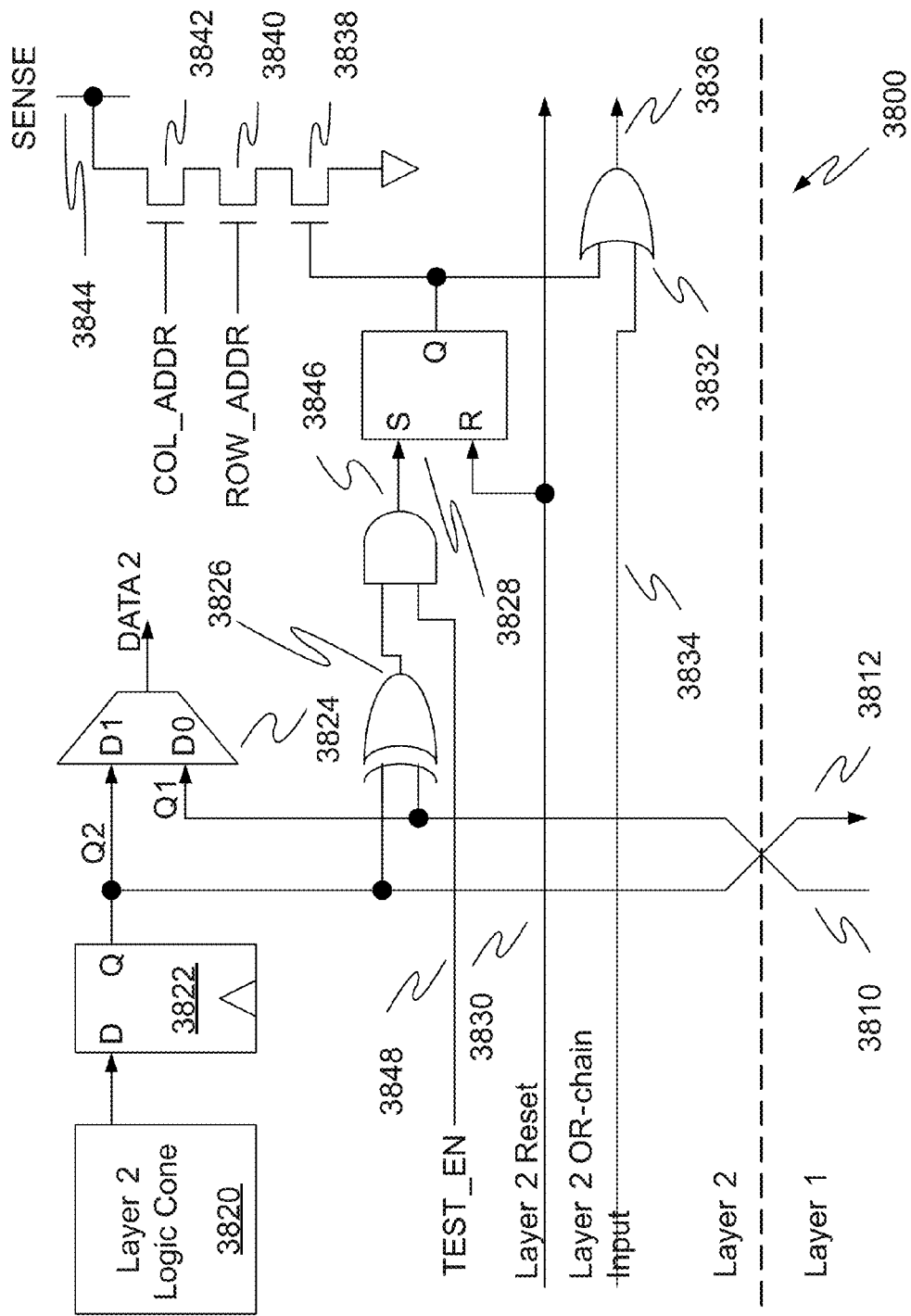
FIG. 38 illustrates an eighth field repairable 3D IC according to the present invention.

FIG. 38 illustrates an embodiment where errors due to slow logic cones can be monitored in real time while the circuit is in normal operating mode. An exemplary 3D IC generally indicated at 3800 comprises two Layers labeled Layer 1 and Layer 2 and separated by a dashed line in the drawing figure. The Layers each comprise one or more Circuit Layers and are bonded together to form 3D IC 3800. They are electrically coupled together using TSVs or some other interlayer interconnect technology.

FIG. 38 focuses on the operation of circuitry coupled to the output of a single Layer 2 Logic Cone 3820, though substantially identical circuitry is also present on Layer 1 (not shown in FIG. 38). Also present in FIG. 38 is scan flip flop 3822 with its D input coupled to the output of Layer 2 Logic Cone 3820 and its Q output coupled to the D1 input of multiplexer 3824 through interlayer line 3812 labeled Q2 in the figure. Multiplexer 3824 has an output DATA2 coupled to a logic cone (not shown in FIG. 38) and a D0 input coupled the Q1 output of the Layer 1 flip flop corresponding to flip flop 3822 (not shown in the figure) through interlayer line 3810.

XOR gate 3826 has a first input coupled to Q1, a second input coupled to Q2, and an output coupled to a first input of AND gate 3846. AND gate 3846 also has a second input coupled to TEST_EN line 3848 and an output coupled to the Set input of RS flip flop 3828. RS flip flop also has a Reset input coupled to Layer 2 Reset line 3830 and an output coupled to a first input of OR gate 3832 and the gate of N-channel transistor 3838. OR gate 3832 also has a second input coupled to Layer 2 OR-chain Input line 3834 and an output coupled to Layer 2 OR-chain Output line 3836.

Layer 2 control logic (not shown in FIG. 38) controls the operation of XOR gate 3826, AND gate 3846, RS flip flop 3828, and OR gate 3832. The TEST_EN line 3848 is used to disable the testing process with regards to Q1 and Q2. This is desirable in cases where, for example, a functional error has already been repaired and differences between Q1 and Q2 are routinely expected and would interfere with the background testing process looking for marginal timing errors.

Layer 2 Reset line 3830 is used to reset the internal state of RS flip flop 3828 to logic-0 along with all the other RS flip flops associated with other logic cones on Layer 2. OR gate 3832 is coupled together with all of the other OR-gates associated with other logic cones on Layer 2 to form a large Layer 2 distributed OR function coupled to all of the Layer 2 RS flip flops like 3828 in FIG. 38. If all of the RS flip flops are reset to logic-0, then the output of the distributed OR function will be logic-0. If a difference in logic state occurs between the flip flops generating the Q1 and Q2 signals, XOR gate 3826 will present a logic-1 through AND gate 3846 (if TEST_EN=logic-1) to the Set input of RS flip flop 3828 causing it to change state and present a logic-1 to the first input of OR gate 3832, which in turn will produce a logic-1 at the output of the Layer 2 distributed OR function (not shown in FIG. 38) notifying the control logic (not shown in the figure) that an error has occurred.

The control logic can then use the stack of N-channel transistors 3838, 3840 and 3842 to determine the location of the logic cone producing the error. N-channel transistor 3838 has a gate terminal coupled to the Q output of RS flip flop 3828, a source terminal coupled to ground, and a drain terminal coupled to the source of N-channel transistor 3840. N-channel transistor 3840 has a gate terminal coupled to the row address line ROW_ADDR line, a source terminal coupled to the drain of N-channel transistor 3838, and a drain terminal coupled to the source of N-channel transistor 3842. N-channel transistor 3842 has a gate terminal coupled to the column address line COL_ADDR line, a source terminal coupled to the drain of N-channel transistor 3840, and a drain terminal coupled to the sense line SENSE.

The row and column addresses are virtual addresses, since in a logic design the locations of the flip flops will not be neatly arranged in rows and columns In some embodiments a Computer Aided Design (CAD) tool is used to modify the net-list to correctly address each logic cone and then the ROW_ADDR and COL_ADDR signals are routed like any other signal in the design.

This produces an efficient way for the control logic to cycle through the virtual address space. If COL_ADDR=ROW_ADDR=logic-1 and the state of RS flip flop is logic-1, then the transistor stack will pull SENSE=logic-0. Thus a logic-1 will only occur at a virtual address location where the RS flip flop has captured an error. Once an error has been detected, RS flip flop 3828 can be reset to logic-0 with the Layer 2 Reset line 3830 where it will be able to detect another error in the future.

The control logic can be designed to handle an error in any of a number of ways. For example, errors can be logged and if a logic error occurs repeatedly for the same logic cone location, then a test mode can be entered to determine if a repair is necessary at that location. This is a good approach to handle intermittent errors resulting from marginal logic cones that only occasionally fail, for example, due to noise, and may test as functional in normal testing. Alternatively, action can be taken upon receipt of the first error notification as a matter of design choice.

As discussed earlier in conjunction with FIG. 27, using Triple Modular Redundancy at the logic cone level can also function as an effective field repair method, though it really creates a high level of redundancy that masks rather than repairs errors due to delayed failure mechanisms or marginally slow logic cones. If factory repair is used to make sure all the equivalent logic cones on each layer test functional before the 3D IC is shipped from the factory, the level of redundancy is even higher. The cost of having three layers versus having two layers, with or without a repair layer must be factored into determining the best embodiment for any application.

Figure 39:
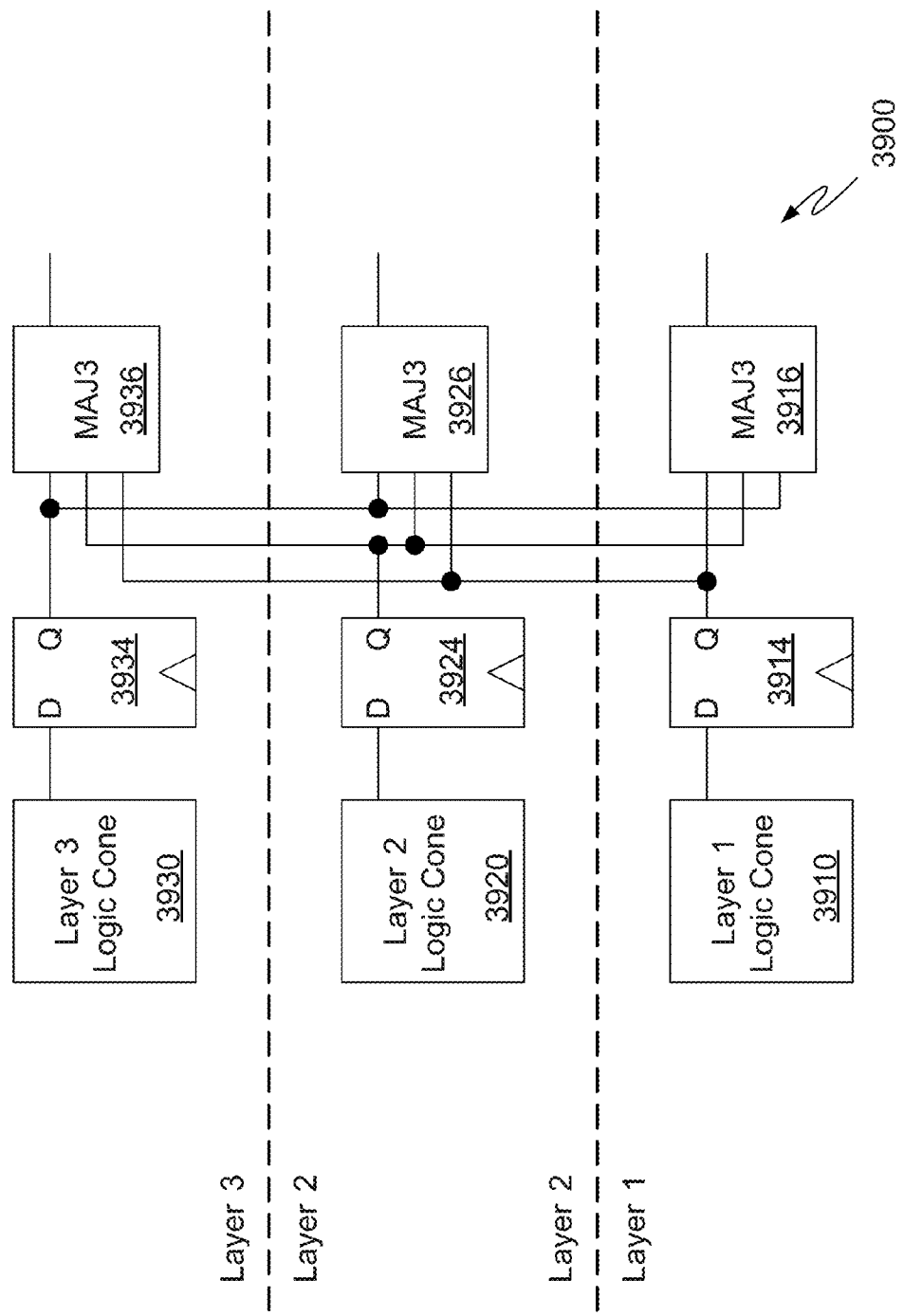
FIG. 39 illustrates a second Triple Modular Redundancy 3D IC according to the present invention.

An alternative TMR approach is shown in exemplary 3D IC 3900 in FIG. 39. Present in FIG. 39 are substantially identical Layers labeled Layer 1, Layer 2 and Layer 3 separated by dashed lines in the figure. Layer 1, Layer 2 and Layer 3 may each comprise one or more circuit layers and are bonded together to form 3D IC 3900 using techniques known in the art. Layer 1 comprises Layer 1 Logic Cone 3910, flip flop 3914, and majority-of-three (MAJ3) gate 3916. Layer 2 comprises Layer 2 Logic Cone 3920, flip flop 3924, and MAJ3 gate 3926. Layer 3 comprises Layer 3 Logic Cone 3930, flip flop 3934, and MAJ3 gate 3936.

The logic cones 3910, 3920 and 3930 all perform a substantially identical logic function. The flip flops 3914, 3924 and 3934 are preferably scan flip flops. If a Repair Layer is present (not shown in FIG. 39), then the flip flop 2502 of FIG. 25 may be used to implement repair of a defective logic cone before 3D IC 3900 is shipped from the factory. The MAJ3 gates 3916, 3926 and 3936 compare the outputs from the three flip flops 3914, 3924 and 3934 and output a logic value consistent with the majority of the inputs: specifically if two or three of the three inputs equal logic-0 then the MAJ3 gate will output logic-0 and if two or three of the three inputs equal logic-1 then the MAJ3 gate will output logic-1. Thus if one of the three logic cones or one of the three flip flops is defective, the correct logic value will be present at the output of all three MAJ3 gates.

One advantage of the embodiment of FIG. 39 is that Layer 1, Layer 2 or Layer 3 can all be fabricated using all or nearly all of the same masks. Another advantage is that MAJ3 gates 3916, 3926 and 3936 also effectively function as a Single Event Upset (SEU) filter for high reliability or radiation tolerant applications as described in Rezgui cited above.

Figure 40:
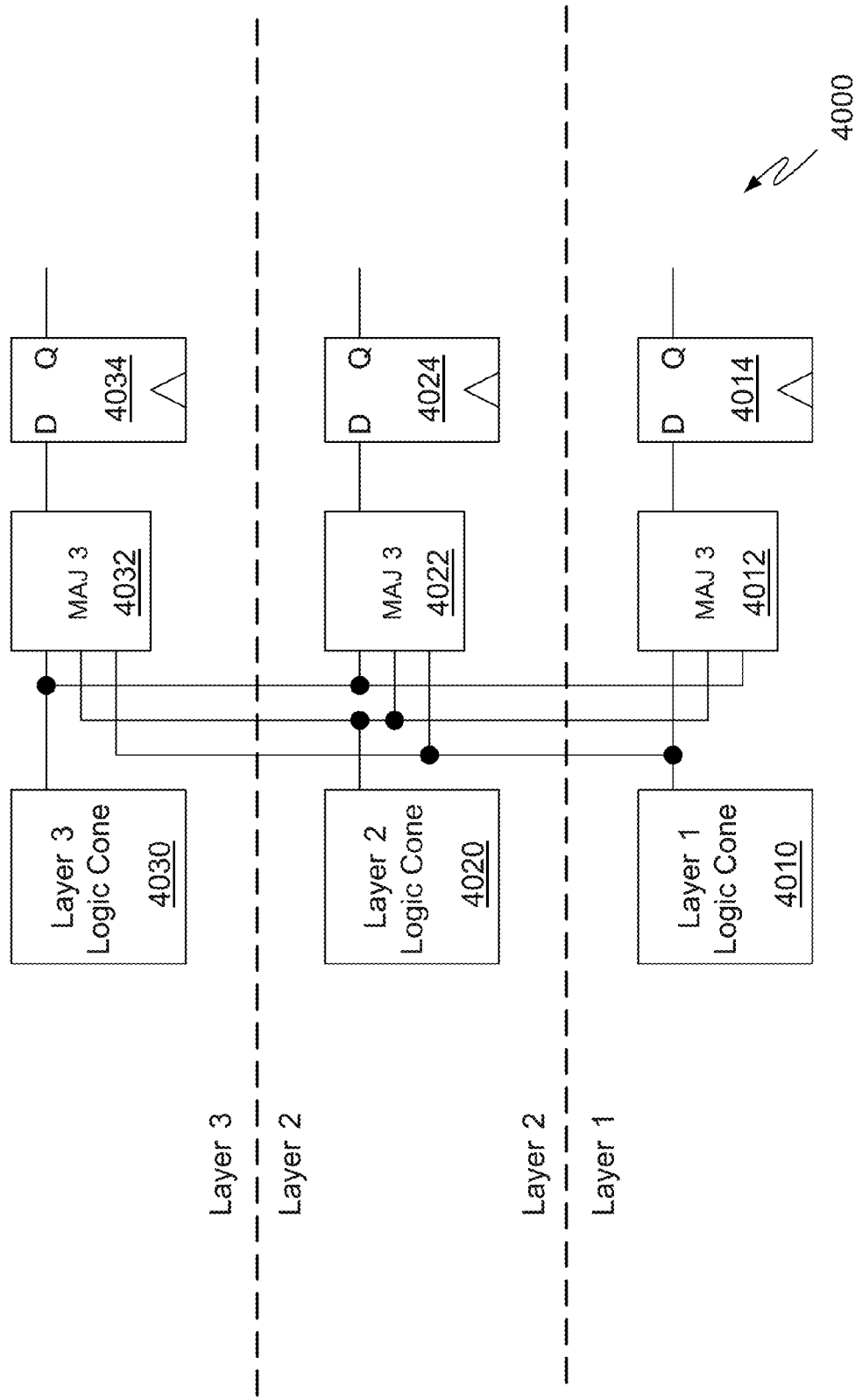
FIG. 40 illustrates a third Triple Modular Redundancy 3D IC according to the present invention.

Another TMR approach is shown in exemplary 3D IC 4000 in FIG. 40. In this embodiment, the MAJ3 gates are placed between the logic cones and their respective flip flops. Present in FIG. 40 are substantially identical Layers labeled Layer 1, Layer 2 and Layer 3 separated by dashed lines in the figure. Layer 1, Layer 2 and Layer 3 may each comprise one or more circuit layers and are bonded together to form 3D IC 4000 using techniques known in the art. Layer 1 comprises Layer 1 Logic Cone 4010, flip flop 4014, and majority-of-three (MAJ3) gate 4012. Layer 2 comprises Layer 2 Logic Cone 4020, flip flop 4024, and MAJ3 gate 4022. Layer 3 comprises Layer 3 Logic Cone 4030, flip flop 4034, and MAJ3 gate 4032.

The logic cones 4010, 4020 and 4030 all perform a substantially identical logic function. The flip flops 4014, 4024 and 4034 are preferably scan flip flops. If a Repair Layer is present (not shown in FIG. 40), then the flip flop 2502 of FIG. 25 may be used to implement repair of a defective logic cone before 3D IC 4000 is shipped from the factory. The MAJ3 gates 4012, 4022 and 4032 compare the outputs from the three logic cones 4010, 4020 and 4030 and output a logic value consistent with the majority of the inputs. Thus if one of the three logic cones is defective, the correct logic value will be present at the output of all three MAJ3 gates.

One advantage of the embodiment of FIG. 40 is that Layer 1, Layer 2 or Layer 3 can all be fabricated using all or nearly all of the same masks. Another advantage is that MAJ3 gates 3912, 3922 and 3932 also effectively function as a Single Event Transient (SET) filter for high reliability or radiation tolerant applications as described in Rezgui cited above.

Figure 41:
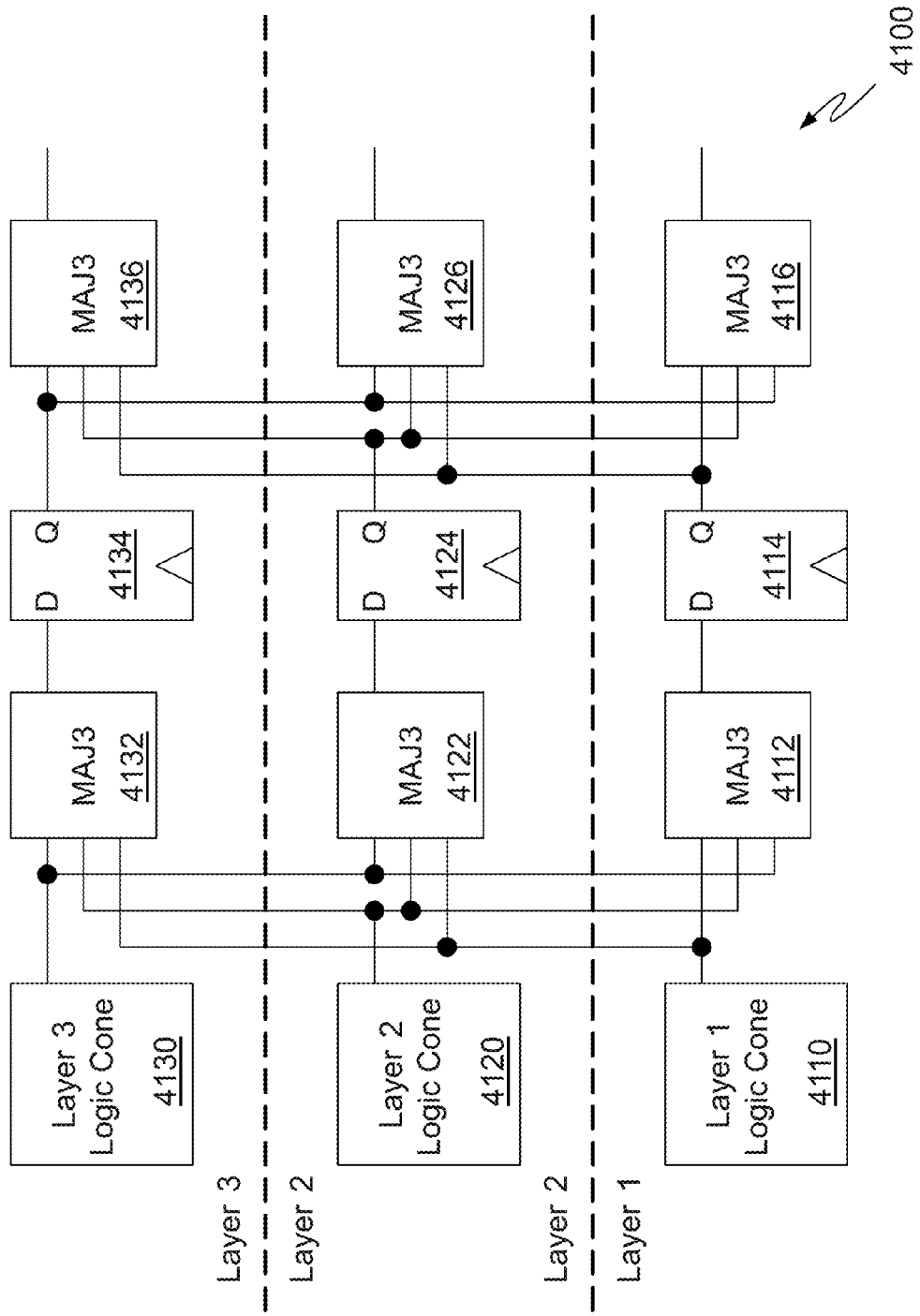
FIG. 41 illustrates a fourth Triple Modular Redundancy 3D IC according to the present invention.

Another TMR embodiment is shown in exemplary 3D IC 4100 in FIG. 41. In this embodiment, the MAJ3 gates are placed between the logic cones and their respective flip flops. Present in FIG. 41 are substantially identical Layers labeled Layer 1, Layer 2 and Layer 3 separated by dashed lines in the figure. Layer 1, Layer 2 and Layer 3 may each comprise one or more circuit layers and are bonded together to form 3D IC 4100 using techniques known in the art. Layer 1 comprises Layer 1 Logic Cone 4110, flip flop 4114, and majority-of-three (MAJ3) gates 4112 and 4116. Layer 2 comprises Layer 2 Logic Cone 4120, flip flop 4124, and MAJ3 gates 4122 and 4126. Layer 3 comprises Layer 3 Logic Cone 4130, flip flop 4134, and MAJ3 gates 4132 and 4136.

The logic cones 4110, 4120 and 4130 all perform a substantially identical logic function. The flip flops 4114, 4124 and 4134 are preferably scan flip flops. If a Repair Layer is present (not shown in FIG. 41), then the flip flop 2502 of FIG. 25 may be used to implement repair of a defective logic cone before 3D IC 4100 is shipped from the factory. The MAJ3 gates 4112, 4122 and 4132 compare the outputs from the three logic cones 4110, 4120 and 4130 and output a logic value consistent with the majority of the inputs. Similarly, the MAJ3 gates 4116, 4126 and 4136 compare the outputs from the three flip flops 4114, 4124 and 4134 and output a logic value consistent with the majority of the inputs. Thus if one of the three logic cones or one of the three flip flops is defective, the correct logic value will be present at the output of all six of the MAJ3 gates.

One advantage of the embodiment of FIG. 41 is that Layer 1, Layer 2 or Layer 3 can all be fabricated using all or nearly all of the same masks. Another advantage is that MAJ3 gates 4112, 4122 and 4132 also effectively function as a Single Event Transient (SET) filter while MAJ3 gates 4116, 4126 and 4136 also effectively function as a Single Event Upset (SEU) filter for high reliability or radiation tolerant applications as described in Rezgui cited above.

The present invention can be applied to a large variety of commercial as well as high reliability, aerospace and military applications. The ability to fix defects in the factory with Repair Layers combined with the ability to automatically fix delayed defects (by masking them with three layer TMR embodiments or replacing faulty circuits with two layer replacement embodiments) allows the creation of much larger and more complex three dimensional systems than is possible with conventional two dimensional integrated circuit (IC) technology. These various aspects of the present invention can be traded off against the cost requirements of the target application.

In order to reduce the cost of a 3D IC according to the present invention, it is desirable to use substantially (or a majority) the same set of masks to manufacture each Layer. This can be done by creating an identical structure of vias in an appropriate pattern on each layer and then offsetting it by a desired amount when aligning Layer 1 and Layer 2.

FIG. 42A illustrates a via pattern 4200 which is constructed on Layer 1 of 3DICs like 3100, 3300, 3400, 3500, 3600, 3700 and 3800 previously discussed. At a minimum the metal overlap pad at each via location 4202, 4204, 4206 and 4208 may be present on the top and bottom metal layers of Layer 1. Via pattern 4200 occurs in proximity to each repair or replacement multiplexer on Layer 1 where via metal overlap pads 4202 and 4204 (labeled L1/D0 for Layer 1 input D0 in the figure) are coupled to the D0 multiplexer input at that location, and via metal overlap pads 4206 and 4208 (labeled L1/D1 for Layer 1 input D1 in the figure) are coupled to the D1 multiplexer input.

Similarly, FIG. 42B illustrates a substantially identical via pattern 4210 which is constructed on Layer 2 of 3DICs like 3100, 3300, 3400, 3500, 3600, 3700 and 3800 previously discussed. At a minimum the metal overlap pad at each via location 4212, 4214, 4216 and 4218 may be present on the top and bottom metal layers of Layer 2. Via pattern 4210 occurs in proximity to each repair or replacement multiplexer on Layer 2 where via metal overlap pads 4212 and 4214 (labeled L2/D0 for Layer 2 input D0 in the figure) are coupled to the D0 multiplexer input at that location, and via metal overlap pads 4216 and 4218 (labeled L2/D1 for Layer 2 input D1 in the figure) are coupled to the D1 multiplexer input.

Figure 42C:
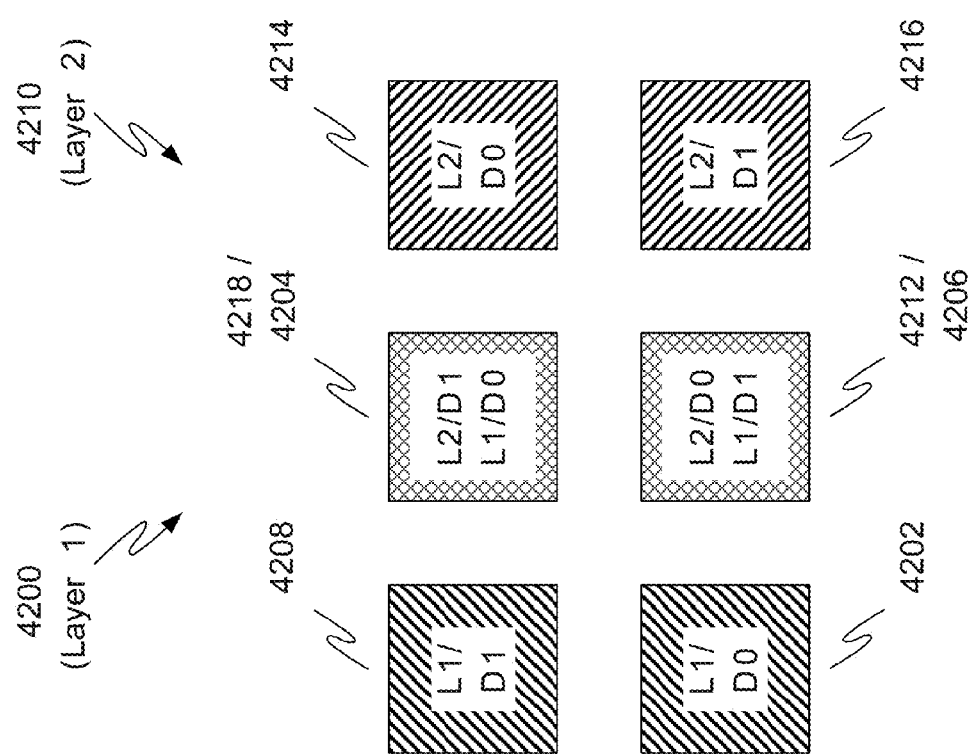
FIG. 42C illustrates the alignment of the via metal overlap patterns of FIGS. 42A and 42B in a 3D IC according to the present invention.

FIG. 42C illustrates a top view where via patterns 4200 and 4210 are aligned offset by one interlayer interconnection pitch. The interlayer interconnects may be TSVs or some other interlayer interconnect technology. Present in FIG. 42C are via metal overlap pads 4202, 4204, 4206, 4208, 4212, 4214, 4216 and 4218 previously discussed. In FIG. 42C Layer 2 is offset by one interlayer connection pitch to the right relative to Layer 1. This causes via metal overlap pads 4204 and 4218 to physically overlap with each other. Similarly, this causes via metal overlap pads 4206 and 4212 to physically overlap with each other. If Through Silicon Vias or other interlayer vertical coupling points are placed at these two overlap locations (using a single mask) then multiplexer input D1 of Layer 2 is coupled to multiplexer input D0 of Layer 1 and multiplexer input D0 of Layer 2 is coupled to multiplexer input D1 of Layer 1. This is precisely the interlayer connection topology necessary to realize the repair or replacement of logic cones and functional blocks in, for example, the embodiments of FIGS. 33A and 35.

Figure 42D:
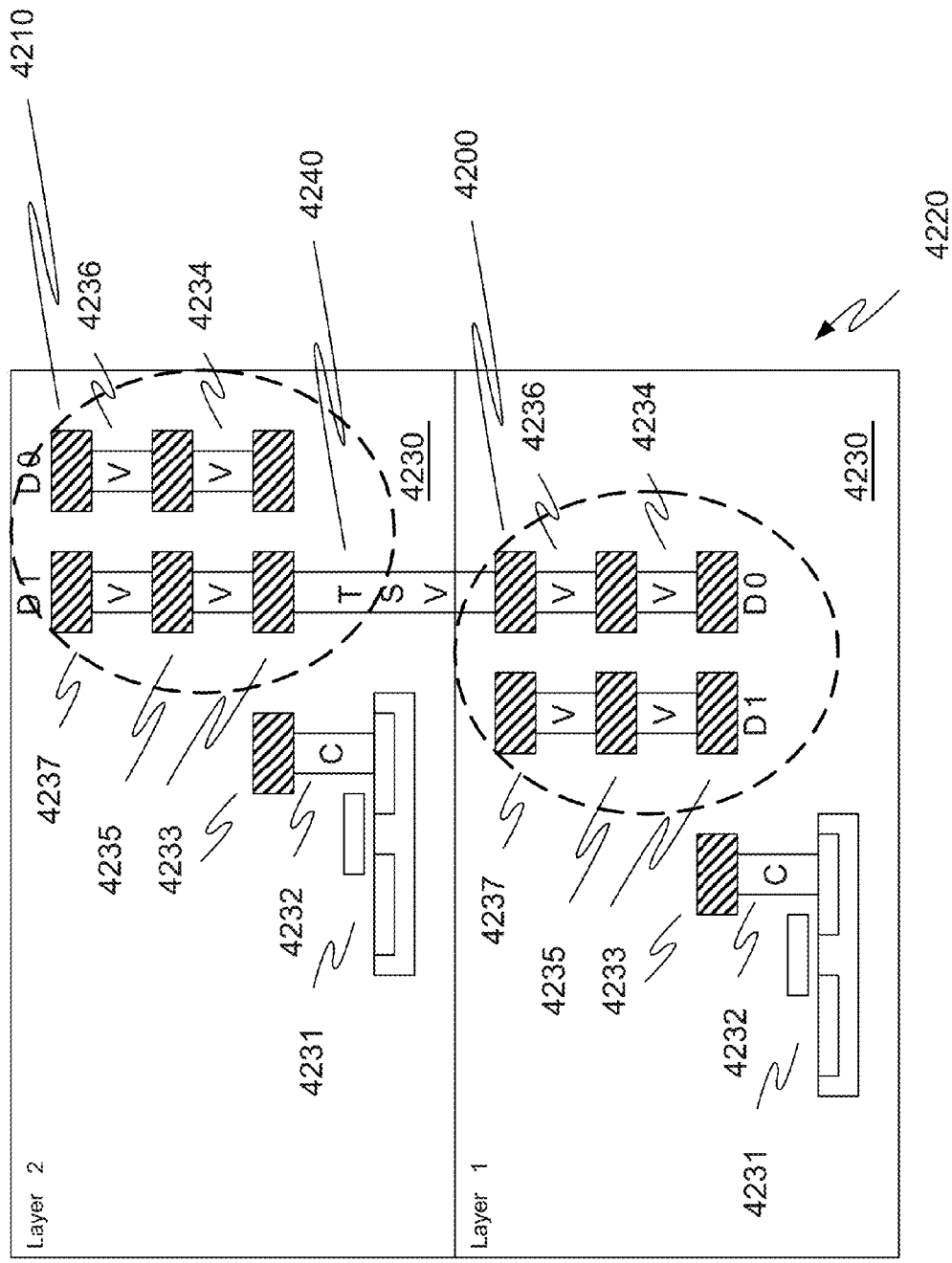
FIG. 42D illustrates a side view of the structure of FIG. 42C.

FIG. 42D illustrates a side view of a structure employing the technique described in conjunction with FIGS. 42A, 42B and 42C. Present in FIG. 42D is an exemplary 3D IC generally indicated by 4220 comprising two instances of Layer 4230 stacked together with the top instance labeled Layer 2 and the bottom instance labeled Layer 1 in the figure. Each instance of Layer 4220 comprises an exemplary transistor 4231, an exemplary contact 4232, exemplary metal 1 4233, exemplary via 1 4234, exemplary metal 2 4235, exemplary via 2 4236, and exemplary metal 3 4237. The dashed oval labeled 4200 indicates the part of the Layer 1 corresponding to via pattern 4200 in FIGS. 42A and 42C. Similarly, the dashed oval labeled 4210 indicates the part of the Layer 2 corresponding to via pattern 4210 in FIGS. 42B and 42C. An interlayer via such as TSV 4240 in this example is shown coupling the signal D1 of Layer 2 to the signal D0 of Layer 1. A second interlayer via (not shown since it is out of the plane of FIG. 42D) couples the signal D01 of Layer 2 to the signal D1 of Layer 1. As can be seen in FIG. 42D, while Layer 1 is identical to Layer 2, Layer 2 is offset by one interlayer via pitch allowing the TSVs to correctly align to each layer while only requiring a single interlayer via mask to make the correct interlayer connections.

As previously discussed, in some embodiments of the present invention it is desirable for the control logic on each Layer of a 3D IC to know which layer it is. It is also desirable to use substantially all (or a majority) of the same masks for each Layers. In an embodiment using the one interlayer via pitch offset between layers to correctly couple the functional and repair connections, we can place a different via pattern in proximity to the control logic to exploit the interlayer offset and uniquely identify each of the layers to its control logic.

FIG. 43A illustrates a via pattern 4300 which is constructed on Layer 1 of 3DICs like 3100, 3300, 3400, 3500, 3600, 3700 and 3800 previously discussed. At a minimum the metal overlap pad at each via location 4302, 4304, and 4306 may be present on the top and bottom metal layers of Layer 1. Via pattern 4300 occurs in proximity to control logic on Layer 1. Via metal overlap pad 4302 is coupled to ground (labeled L1/G in the figure for Layer 1 Ground). Via metal overlap pad 4304 is coupled to a signal named ID (labeled L1/ID in the figure for Layer 1 ID). Via metal overlap pad 4306 is coupled to the power supply voltage (labeled L1/V in the figure for Layer 1 VCC).

FIG. 43B illustrates a via pattern 4310 which is constructed on Layer 2 of 3DICs like 3100, 3300, 3400, 3500, 3600, 3700 and 3800 previously discussed. At a minimum the metal overlap pad at each via location 4312, 4314, and 4316 may be present on the top and bottom metal layers of Layer 2. Via pattern 4310 occurs in proximity to control logic on Layer 2. Via metal overlap pad 4312 is coupled to ground (labeled L2/G in the figure for Layer 2 Ground). Via metal overlap pad 4314 is coupled to a signal named ID (labeled L2/ID in the figure for Layer 2 ID). Via metal overlap pad 4316 is coupled to the power supply voltage (labeled L2N in the figure for Layer 2 VCC).

FIG. 43C illustrates a top view where via patterns 4300 and 4310 are aligned offset by one interlayer interconnection pitch. The interlayer interconnects may be TSVs or some other interlayer interconnect technology. Present in FIG. 42C are via metal overlap pads 4302, 4304, 4306, 4312, 4314, and 4216 previously discussed. In FIG. 42C Layer 2 is offset by one interlayer connection pitch to the right relative to Layer 1. This causes via metal overlap pads 4304 and 4312 to physically overlap with each other. Similarly, this causes via metal overlap pads 4306 and 4314 to physically overlap with each other. If Through Silicon Vias or other interlayer vertical coupling points are placed at these two overlap locations (using a single mask) then the Layer 1 ID signal is coupled to ground and the Layer 2 ID signal is coupled to VCC. This allows the control logic in Layer 1 and Layer 2 to uniquely know their vertical position in the stack.

Persons of ordinary skill in the art will appreciate that the metal connections between Layer 1 and Layer 2 will typically be much larger comprising larger pads and numerous TSVs or other interlayer interconnections. This makes alignment of the power supply nodes easy and ensures that L1/V and L2/V will both be at the positive power supply potential and that L1/G and L2/G will both be at ground potential.

Several embodiments of the present invention utilize Triple Modular Redundancy distributed over three Layers. In such embodiments it is desirable to use substantially (or majority of) the same masks for all three Layers.

Figure 44A:
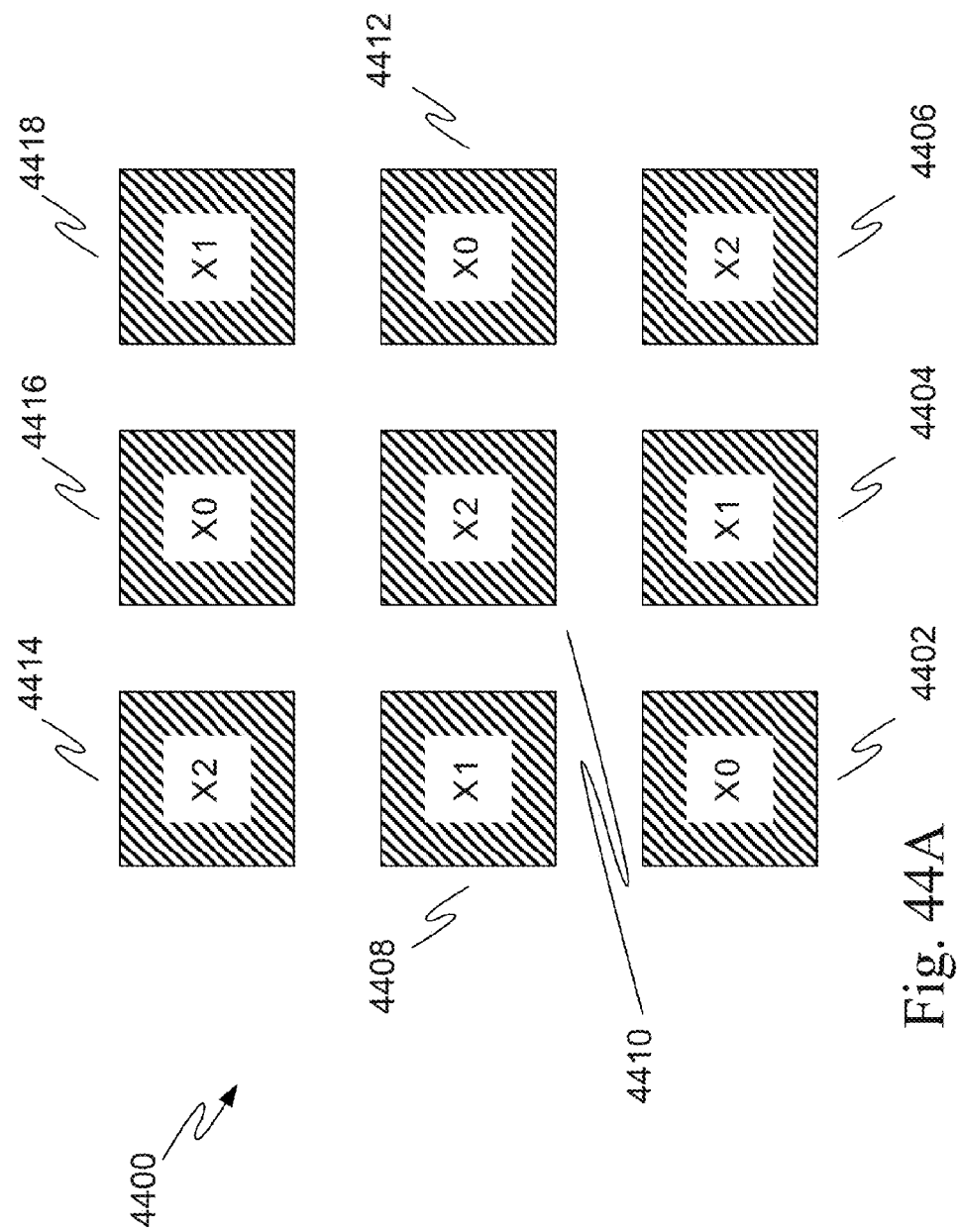
FIG. 44A illustrates a fifth via metal overlap pattern according to the present invention.

FIG. 44A illustrates a via metal overlap pattern 4400 comprising a 3×3 array of TSVs (or other interlayer coupling technology). The TMR interlayer connections occur in the proximity of a majority-of-three (MAJ3) gate typically forming in or out from either a flip flop or functional block. Thus at each location on each of the three layers we have the function f(X0, X1, X2)=MAJ3(X0, X1, X2) being implemented where X0, X1 and X2 are the three inputs to the MAJ3 gate. For purposes of this discussion the X0 input is always coupled to the version of the signal generated on the same layer as the MAJ3 gate and the X1 and X2 inputs come from the other two layers.

In via metal overlap pattern 4400, via metal overlap pads 4402, 4412 and 4416 are coupled to the X0 input of the MAJ3 gate on that layer, via metal overlap pads 4404, 4408 and 4418 are coupled to the X1 input of the MAJ3 gate on that layer, and via metal overlap pads 4406, 4410 and 4414 are coupled to the X2 input of the MAJ3 gate on that layer.

Figure 44B:
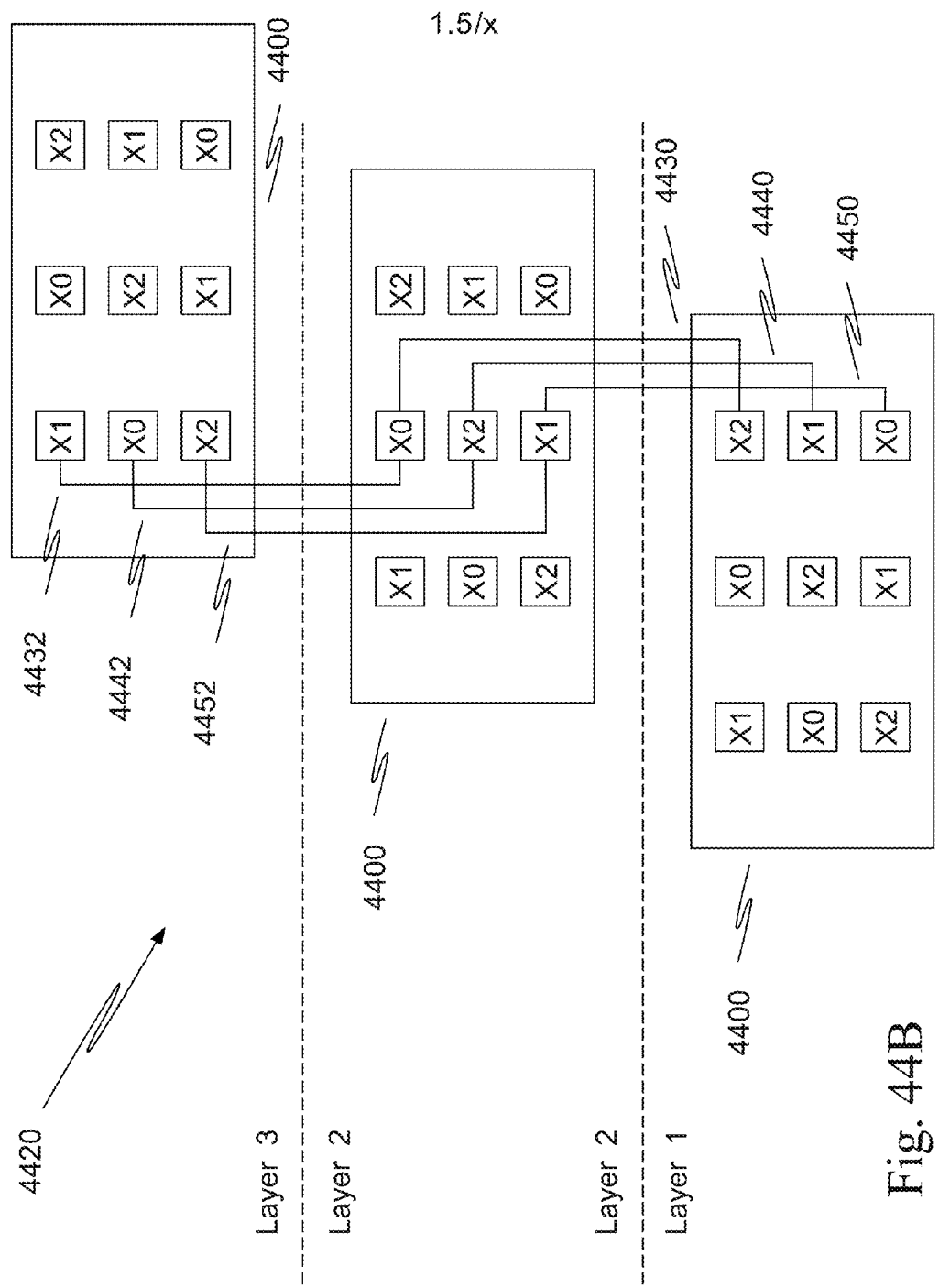
FIG. 44B illustrates the alignment of three instances of the via metal overlap patterns of FIG. 44A in a 3DIC according to the present invention.

FIG. 44B illustrates an exemplary 3D IC generally indicated by 4420 having three Layers labeled Layer 1, Layer 2 and Layer 3 from bottom to top. Each layer comprises an instance of via metal overlap pattern 4400 in the proximity of each MAJ3 gate used to implement a TMR related interlayer coupling. Layer 2 is offset one interlayer via pitch to the right relative to Layer 1 while Layer 3 is offset one interlayer via pitch to the right relative to Layer 2. The illustration in FIG. 44B is an abstraction. While it correctly shows the two interlayer via pitch offsets in the horizontal direction, a person of ordinary skill in the art will realize that each row of via metal overlap pads in each instance of via metal overlap pattern 4400 is horizontally aligned with the same row in the other instances.

Thus there are three locations where a via metal overlap pad is aligned on all three layers. FIG. 44B shows three interlayer vias 4430, 4440 and 4450 placed in those locations coupling Layer 1 to Layer 2 and three more interlayer vias 4432, 4442 and 4452 placed in those locations coupling Layer 2 to Layer 3. The same interlayer via mask may be used for both interlayer via fabrication steps.

Thus the interlayer vias 4430 and 4432 are vertically aligned and couple together the Layer 1 X2 MAJ3 gate input, the Layer 2 X0 MAJ3 gate input, and the Layer 3 X1 MAJ3 gate input. Similarly, the interlayer vias 4440 and 4442 are vertically aligned and couple together the Layer 1 X1 MAJ3 gate input, the Layer 2 X2 MAJ3 gate input, and the Layer 3 X0 MAJ3 gate input. Finally, the interlayer vias 4450 and 4452 are vertically aligned and couple together the Layer 1 X0 MAJ3 gate input, the Layer 2 X1 MAJ3 gate input, and the Layer 3 X2 MAJ3 gate input. Since the X0 input of the MAJ3 gate in each layer is driven from that layer, we can see that each driver is coupled to a different MAJ3 gate input on each layer assuring that no drivers are shorted together and the each MAJ3 gate on each layer receives inputs from each of the three drivers on the three Layers.

The present invention can be applied to a large variety of commercial as well as high reliability, aerospace and military applications. The ability to fix defects in the factory with Repair Layers combined with the ability to automatically fix delayed defects (by masking them with three layer TMR embodiments or replacing faulty circuits with two layer replacement embodiments) allows the creation of much larger and more complex three dimensional systems than is possible with conventional two dimensional integrated circuit (IC) technology. These various aspects of the present invention can be traded off against the cost requirements of the target application.

For example, a 3D IC targeted an inexpensive consumer products where cost is dominant consideration might do factory repair to maximize yield in the factory but not include any field repair circuitry to minimize costs in products with short useful lifetimes. A 3D IC aimed at higher end consumer or lower end business products might use factory repair combined with two layer field replacement. A 3D IC targeted at enterprise class computing devices which balance cost and reliability might skip doing factory repair and use TMR for both acceptable yields as well as field repair. A 3D IC targeted at high reliability, military, aerospace, space or radiation tolerant applications might do factory repair to ensure that all three instances of every circuit are fully functional and use TMR for field repair as well as SET and SEU filtering. Battery operated devices for the military market might add circuitry to allow the device to operate only one of the three TMR layers to save battery life and include a radiation detection circuit which automatically switches into TMR mode when needed if the operating environment changes. Many other combinations and tradeoffs are possible within the scope of the invention.

Some embodiments of the present invention may include alternative techniques to build IC (Integrated Circuit) devices including techniques and methods to construct 3D IC systems. Some embodiments of the present invention may enable device solutions with far less power consumption than prior art. These device solutions could be very useful for the growing application of mobile electronic devices or systems such as mobile phones, smart phone, cameras and the like. For example, incorporating the 3D IC semiconductor devices according to some embodiments of the present invention within these mobile electronic devices or systems could provide superior mobile units that could operate much more efficiently and for a much longer time than with prior art technology.

3D ICs according to some embodiments of the present invention could also enable electronic and semiconductor devices with much a higher performance due to the shorter interconnect as well as semiconductor devices with far more complexity via multiple levels of logic and providing the ability to repair or use redundancy. The achievable complexity of the semiconductor devices according to some embodiments of the present invention could far exceed what was practical with the prior art technology. These advantages could lead to more powerful computer systems and improved systems that have embedded computers.

Some embodiments of the present invention may also enable the design of state of the art electronic systems at a greatly reduced non-recurring engineering (NRE) cost by the use of high density 3D FPGAs or various forms of 3D array base ICs with reduced custom masks as been described previously. These systems could be deployed in many products and in many market segments. Reduction of the NRE may enable new product family or application development and deployment early in the product lifecycle by lowering the risk of upfront investment prior to a market being developed. The above advantages may also be provided by various mixes such as reduce NRE using generic masks for layers of logic and other generic mask for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. In fact there are many ways to mix the many innovative elements to form 3D IC to support the need of an end system and to provide it with competitive edge. Such end system could be electronic based products or other type of systems that include some level of embedded electronics, such as, for example, cars, remote controlled vehicles, etc.

It is worth noting that many of the principles of the present invention are also applicable to conventional two dimensional integrated circuits (2DICs). For example, an analogous of the two layer field repair embodiments could be built on a single layer with both versions of the duplicate circuitry on a single 2D IC employing the same cross connections between the duplicate versions. A programmable technology like, for example, fuses, antifuses, flash memory storage, etc., could be used to effect both factory repair and field repair. Similarly, an analogous version of some of the TMR embodiments are unique topologies in 2DICs as well as in 3DICs which would also improve the yield or reliability of 2D IC systems if implemented on a single layer.

Yet another variation on the invention is to use the concepts of repair and redundancy layers to implement extremely large designs that extend beyond the size of a single reticle, up to and inclusive of a full wafer. This concept of Wafer Scale Integration ("WSI") was attempted in the past by companies such as Trilogy Systems and was abandoned because of extremely low yield. The ability of the current invention to effect multiple repairs by using a repair layer, or of masking multiple faults by using redundancy layers, makes WSI with very high yield a viable option.

One embodiment of the present invention improves WSI by using the Continuous Array (CA) concept described above. In the case of WSI, however, the CA may extend beyond a single reticle and may potentially span the whole wafer. A custom mask may be used to etch away unused parts of the wafer.

Particular care must be taken when a design such as WSI crosses reticle boundaries. Alignment of features across a reticle boundary may be worse than the alignment of features within the reticle, and WSI designs must accommodate this potential misalignment. One way of addressing this is to use wider than minimum metal lines, with larger than minimum pitches, to cross the reticle boundary, while using a full lithography resolution within the reticle.

Another embodiment of the present invention uses custom reticles for location on the wafer, creating a partial of full custom design across the wafer. As in the previous case, wider lines and coarser line pitches may be used for reticle boundary crossing.

In substantially all WSI embodiments yield-enhancement is achieved through fault masking techniques such as TMR, or through repair layers, as illustrated in FIG. 24 through FIG. 44. At one extreme of granularity, a WSI repair layer on an individual flip flop level is illustrated in FIG. 26, which would provide a close to 100% yield even at a relatively high fault density. At the other end of granularity would be a block level repair scheme, with large granularity blocks at one layer effecting repair by replacing faulty blocks on the other layer. Connection techniques, such as illustrated in FIG. 21, may be used to connect the peripheral input/output signals of a large-granularity block across vertical device layers.

In another variation on the WSI invention one can selectively replace blocks on one layer with blocks on the other layer to provide speed improvement rather than to effect logical repair.

In another variation on the WSI invention one can use vertical stacking techniques as illustrated in FIGS. 12A-12E to flexibly provide variable amounts of specialized functions, and I/O in particular, to WSI designs.

An additional variation is to mix and match different redundancy techniques. For example, memory devices have been using redundancy for repair for many years. In a 3D system there is an advantage to have strata/stratum dedicated to the memory function of the system, as has been described above. Those dedicated to the memory function strata could carry the memory redundancy as well, so they could repair by spare rows or spare cells. The technique associated with logic cone could be used for some strata while conventional memory repair techniques could be used for memory strata, increasing the overall effectiveness without losing yield or reparability.

An additional variation is to utilize the technique of redundancy illustrated by FIG. 26 and FIG. 31 in a selective manner. Instead of constructing everything in two strata, one serving as a redundancy to the other, the redundancy could be used to repair only the non-yielding dies. In such approach the repair die could be connected only for the non-yielding dies. To allow good connectivity between the non-yielding die and its repair die, a face to face bonding might be preferable. In such a case it might be desired to build the repair dies on a wafer that is a mirror image of the die to be repaired so that the face to face connection would be properly aligned. Alternatively a TSV may be used to connect the dies so that the repair die could be connected to the non-yielding die without change of the device orientation. After wafer fab the wafer could be tested and for each non-yielding die a repair die would be connected on top to repair the non-yielding die. This could be done before the wafer is diced or alternatively on a single die at a time after dicing.

An additional variation is to perform device testing while the wafer is still in process. Accordingly following each stratum testing a decision could be made as to what the best path is for the wafer to continue. Such paths could include adding a stratum for repair, or not, based on the testing results. Another path option could include identifying faulty reticle locations that one may want to skip in subsequent lithography manufacturing steps, and as such, reduce lithography cost. Another path could be determining the number strata that might be effective to add on, based on current yield. Such in-fab testing could utilize the contact less testing described before.

FIG. 45A is a drawing illustration of prior art of reticle design. A reticle image 4500, which is the largest area that can be conveniently exposed on the wafer for patterning, can be made up of a multiplicity of identical integrated circuits (IC) such as 4501. In other cases (not shown) it can be made up of a multiplicity of non-identical ICs. Between the ICs are the dicing lanes 4503, all fitting within the reticle boundary 4505.

FIG. 45B is a drawing illustration how such reticle image can be used to pattern the surface of wafer 4510 (partially shown), where the reticle image 4500 is repeatedly tiling the wafer surface which may use a step-and-repeat process.

FIG. 46A is a drawing illustration of this process as applied to WSI design. In the general case there may be multiple types of reticles such as CA style reticle 4620 and ASIC style reticle 4610. In this situation the reticle may include a multiplicity of connecting lines 4614 that are perpendicular to the reticle edges and touch the reticle boundary 4612. FIG. 46B is a drawing illustration where a large section of the wafer 4652 may have a combination of such reticle images, both ASIC style 4656 and CA style 4654, projected on adjacent sites of the wafer 4652. The inter-reticle boundary 4658 is in this case spanned by the connecting lines 4614. Because the alignment across reticles is typically lower than the resolution within the reticle, the width and pitch of these inter-reticle wires may need to be increased to accommodate the inter-reticle alignment errors.

The array of reticles comprising a WSI design may extend as necessary across the wafer, up to and inclusive of the whole wafer. In the case where the WSI is smaller than the full wafer, multiple WSI designs may be placed on a single wafer.

Another use of this invention is in bringing to market, in a cost-effective manner, semiconductor devices in the early stage of introducing a new lithography process to the market, when the process yield is low. Currently, low yield poses major cost and availability challenges during the new lithography process introduction stage. Using any or all three-dimensional repair or fault tolerance techniques described in this invention and illustrated in FIGS. 24 through 44 would allow an inexpensive way to provide functional parts during that stage. Once the lithography process matures, its fault density drops, and its yield increases, the repair layers can be inexpensively stripped off as part of device cost reduction, permanently steering signal propagation only within the base layer through programming or through tying-off the repair control logic. Another possibility would be to continue offering the original device as a higher-priced fault-tolerant option, while offering the stripped version without fault-tolerance at a lower price point.

Despite best simulation and verification efforts, many designs end up containing design bugs even after implementation and manufacturing as semiconductor devices. As design complexity, size, and speed grow, debugging modern devices after manufacturing, the so-called "post-silicon debugging," becomes more difficult and more expensive. A major cause for this difficulty lies in the need to access a large number of signals over many clock cycles, on top of the fact that some design errors may manifest themselves only when the design is run at-speed. U.S. Pat. No. 7,296,201 describes how to overcome this difficulty by incorporating debugging elements into design itself, providing the ability to control and trace logic circuits, to assist in their debugging. DAFCA of Framingham, Mass. offers technology based on this principle.

Figure 47:
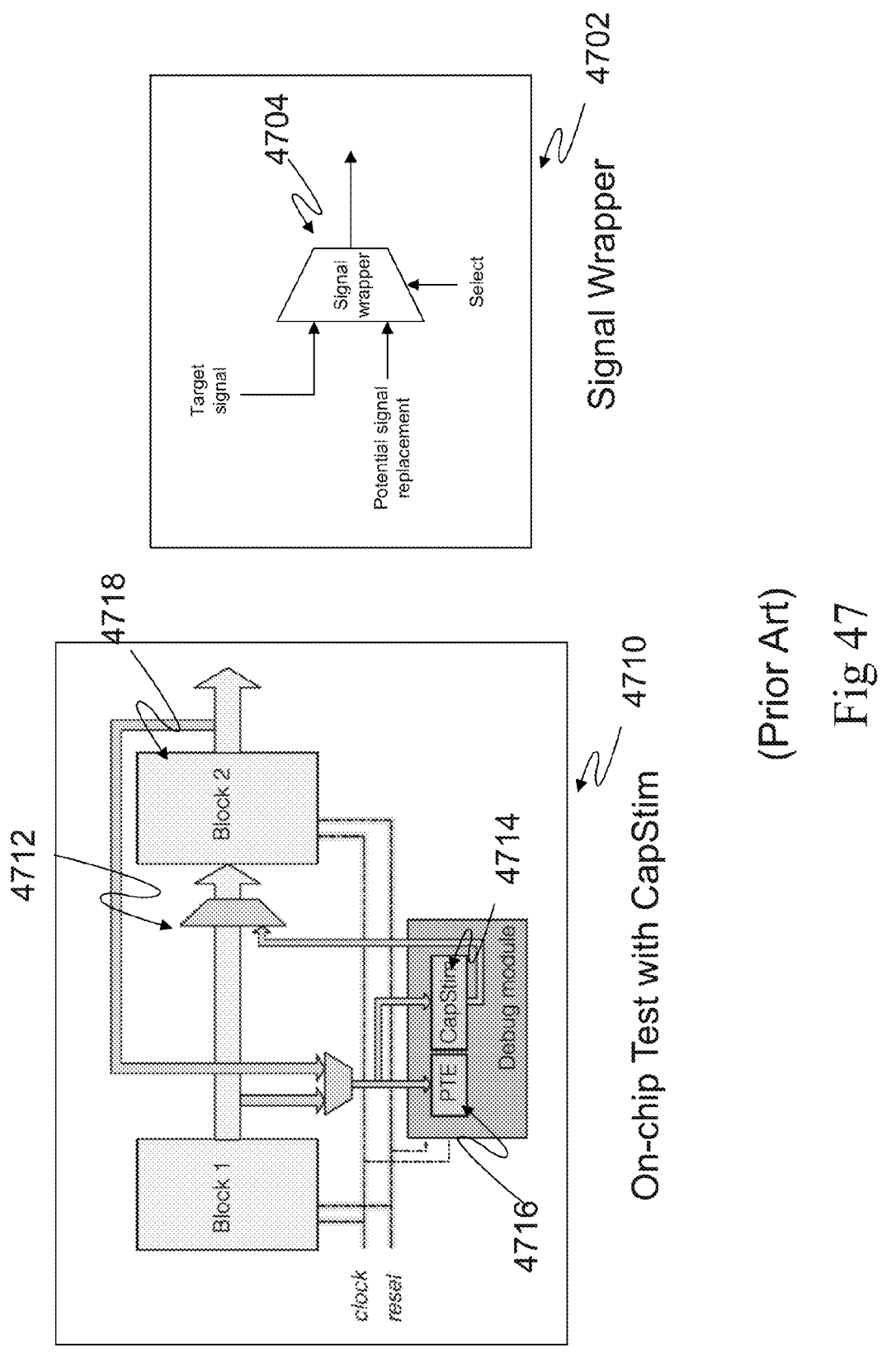
FIG. 47 illustrates prior art of Design for Debug Infrastructure.

FIG. 47 illustrates prior art of Design for Debug Infrastructure ("DFDI") as described in M. Abramovici, "In-system Silicon Validation and Debug", IEEE Design and Test of Computers 25(3), 2008. 4702 is a signal wrapper that allows controlling what gets propagated to a target object. 4704 is a multiplexer implementing this function. 4710 is an illustration of such DFDI using said signal wrappers 4712, in conjunction with CapStim 4714—capture/stimulus module—and PTE, a Programmable Trigger Engine 4716, make together a debug module that fully observes and controls signals of target validation module 4718. Yet this ability to debug comes at cost—the addition of DFDI to the design increases the size of the design while still being limited to the number of signals it can store and monitor.

Figure 48:
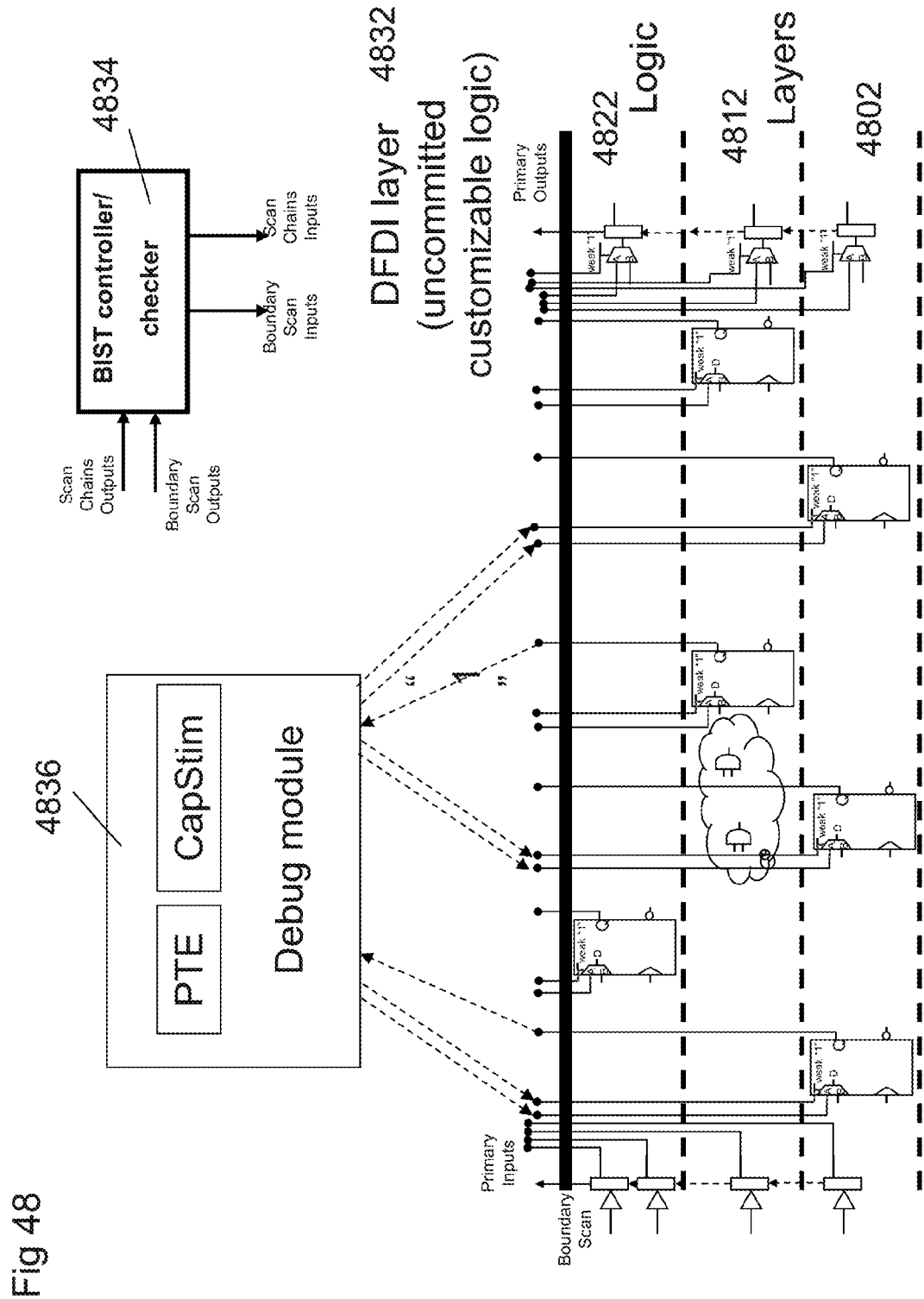
FIG. 48 illustrates implementation of Design for Debug Infrastructure using repair layer's uncommitted logic.

The current invention of 3D devices, including monolithic 3D devices, offers new ways for cost-effective post-silicon debugging. One possibility is to use an uncommitted repair layer 2432 such as illustrated in FIG. 24A and construct a dedicated DFDI to assist in debugging the functional logic layers 2402, 2412 and 2422 at-speed. FIG. 48 is a drawing illustration of such implementation, noting that signal wrapper 4702 is functionally equivalent to multiplexer 2514 of FIG. 25, which is already present in front of every flip flop of layers or strata 4802, 4812, and 4822. The construction of such debug module 4836 on the uncommitted logic layer 4832 can be accomplished using Direct-Write e-Beam technology such as available from Advantest or Fujitsu to write custom masking patterns in photo-resist. The only difference is that the new repair layer, the uncommitted logic layer 4832, now also includes register files needed to implement PTE and CaptStim and should be designed to work with the existing BIST controller/checker 4834. Using e-Beam is a cost effective option for this purpose as there is a need for only a small number of so-instrumented devices. Existing faults in the functional levels may also need to be repaired using the same e-beam technique. Alternatively, only fully functional devices can be selected for instrumentation with DFDI. After the design is debugged, the repair layer is used for regular device repair for yield enhancement as originally intended.

Figure 49:
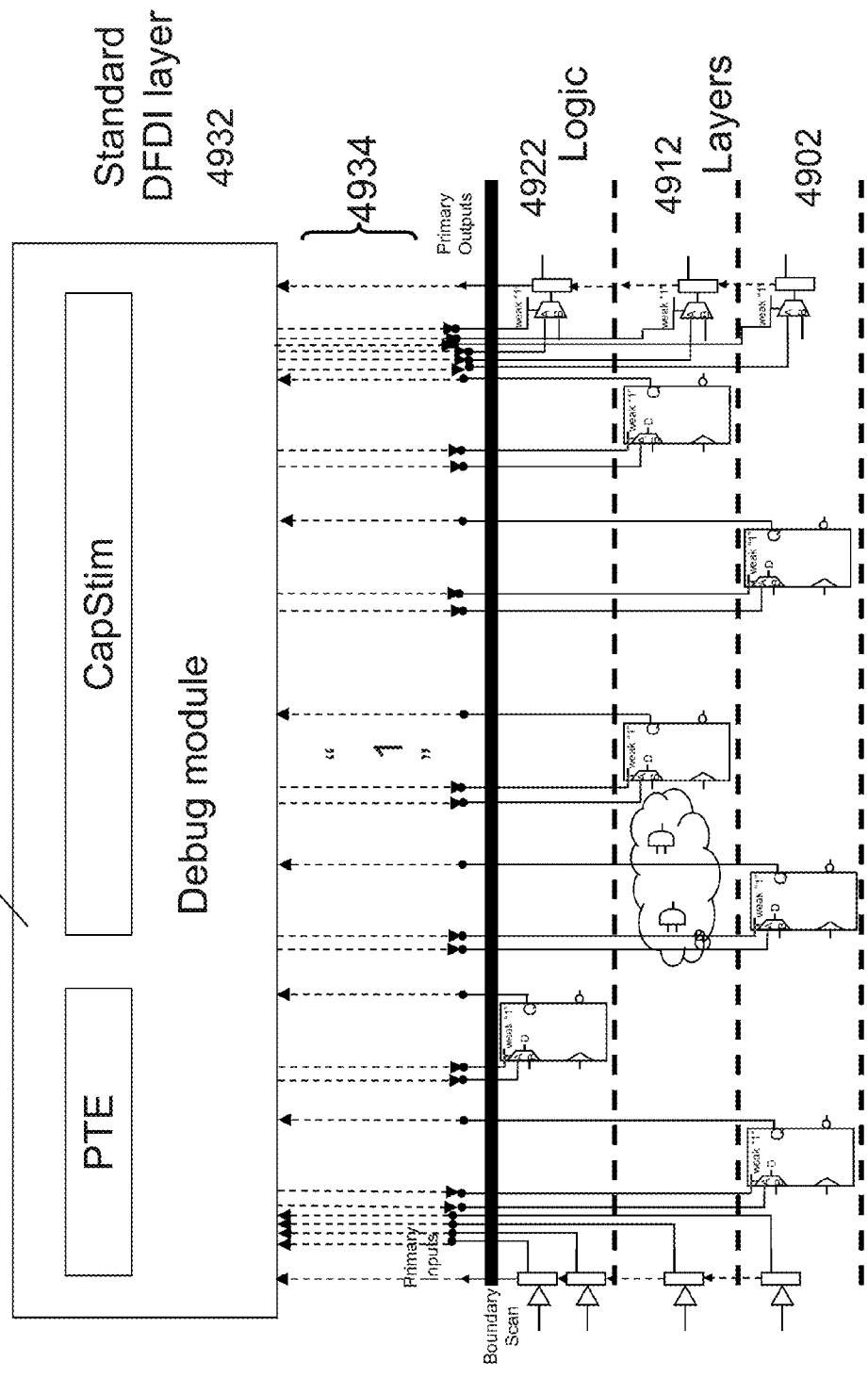
FIG. 49 illustrates customized dedicated Design for Debug Infrastructure layer with connections on a regular grid to connect to flip-flops on other layers with connections on a similar grid.

Designing customized DFDI is in itself an expensive endeavor. FIG. 49 is a drawing illustration of a variation on this invention. It uses functional logic layers or strata such as 4902, 4912 and 4922 with flip flops manufactured on a regular grid 4934. In such case a standardized DFDI layer 4932 that includes sophisticated debug module 4936 can be designed and used to replace the ad-hoc DFDI layer, made from the uncommitted logic layer 4832, which has the ability to efficiently observe and control all, or a very large number, of the flip flops on the functional logic layers. This standard DFDI can be placed on one or more early wafers just for the purpose of post-silicon debugging on multiple designs. This will make the design of a mask set for this DFDI layer cost-effective, spreading it across multiple projects. After the debugging is accomplished, this standard DFDI layer may be replaced by a regular repair layer 2432.

Another variation on this invention uses logic layers or strata that do not include flip flops manufactured on a regular grid but still uses standardized DFDI 5032 as described above. In this case a relatively inexpensive custom metal interconnect masks can be designed just to create an interposer 5034 to translate the irregular flip flop pattern on logic layers 5002, 5012 and 5022 to the regular interconnect of standardized DFDI layer. Similarly to the previous cases, once the post-silicon debugging is completed, the interposer and the standardized DFDI are replaced by a regular repair layer 2432.

Figure 50:
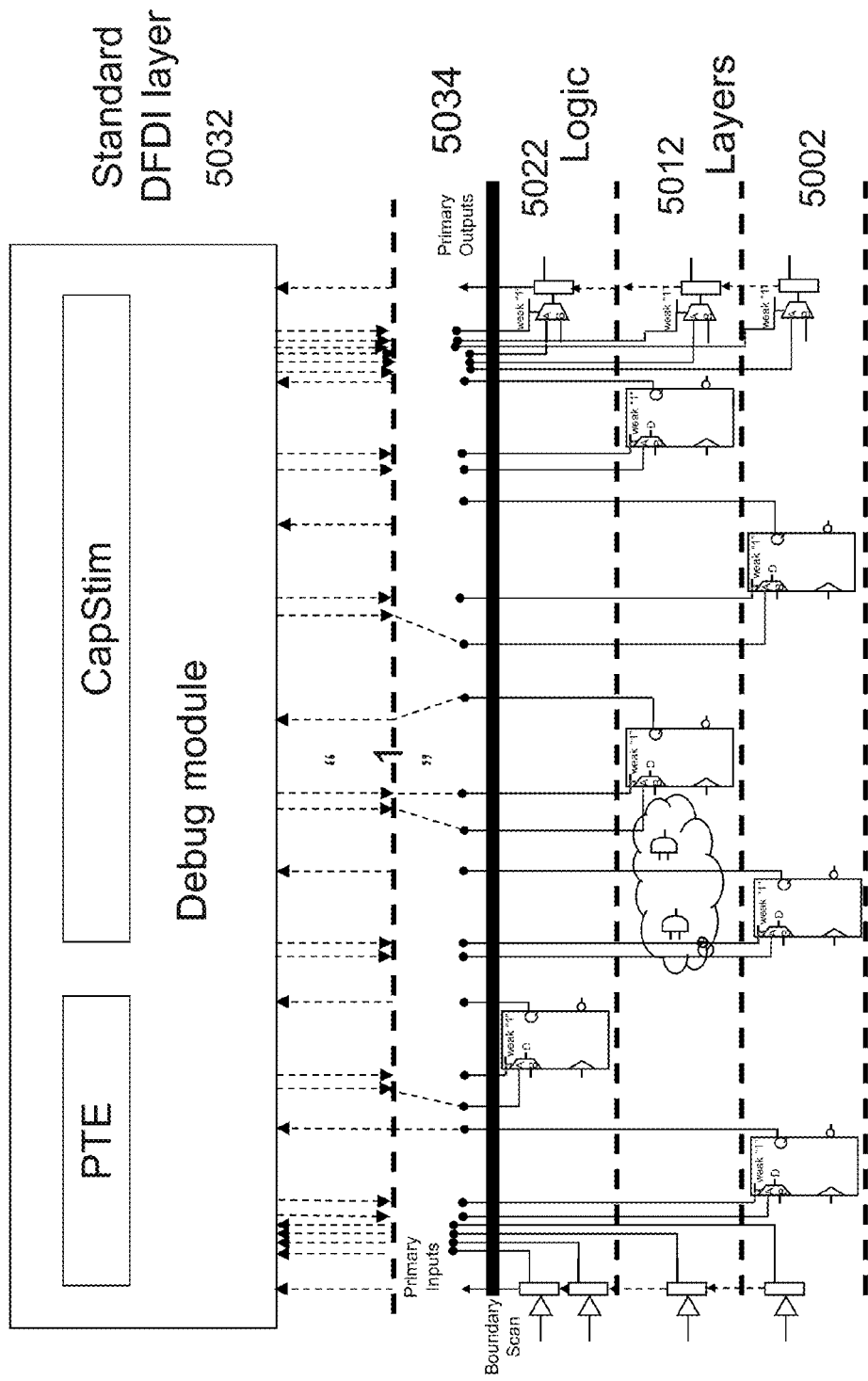
FIG. 50 illustrates customized dedicated Design for Debug Infrastructure layer with connections on a regular grid that uses interposer to connect to flip-flops on other layers with connections not on a similar grid.

Another variation on the DFDI invention illustrated in FIGS. 49 and 50 is to replace the DFDI layer or strata with a flexible and powerful standard BIST layer or strata. In contrast to a DFDI layer, the BIST layer will be potentially placed on every wafer throughout the design lifetime. While such BIST layer incurs additional manufacturing cost, it saves on using very expensive testers and probe cards. The mask cost and design cost of such BIST layer can be amortized over multiple designs as in the case of DFDI, and designs with irregularly placed flip flops can take advantage of it using inexpensive interposer layers as illustrated in FIG. 50.

A person of ordinary skills in the art will recognize that the DFDI invention such as illustrated in FIGS. 49 and 50 can be replicated on a more than one stratum of a 3D semiconductor device to accommodate a broad range of design complexity.

In some applications it may be desired to load the 3D system with a test pattern or patterns and to read out the test results. FIG. 50 may be used to illustrate such a 3D system. In such a situation it might be desirable to enable the upper most layer interposer 5034 to interface with the test equipment either in a contact-less method or by using probe card. The test information could be channeled from the top most layer interposer 5034 to the layer underneath, logic layer 5022, through logic layer 5022 to the layer below it, logic layer 5012 and so forth to the bottom most layer, logic layer 5002. Test results could be transferred back all the way to the top most layer interposer 5034 and from there to the external equipment or device. In a similar way other types of information could be communicated. For example, programming information that might be important for the 3D system set up. Setup information might include memory and Flip-Flop initialization, program memory to be loaded during boot, or programmable logic to be programmed, or other types of initialization as known to those skilled in the art.

In many 3D systems it might be desired to have many or substantially all of the signals to go in or out of the 3D system from the top-most layer. Similarly power and clock signals might be driven from the top-most layer interposer 5034 and then distributed throughout the 3D system all the way through the intermediate layers such as, for example, logic layer 5022, logic layer 5012 to the bottom-most layer, logic layer 5002.

Figure 55:
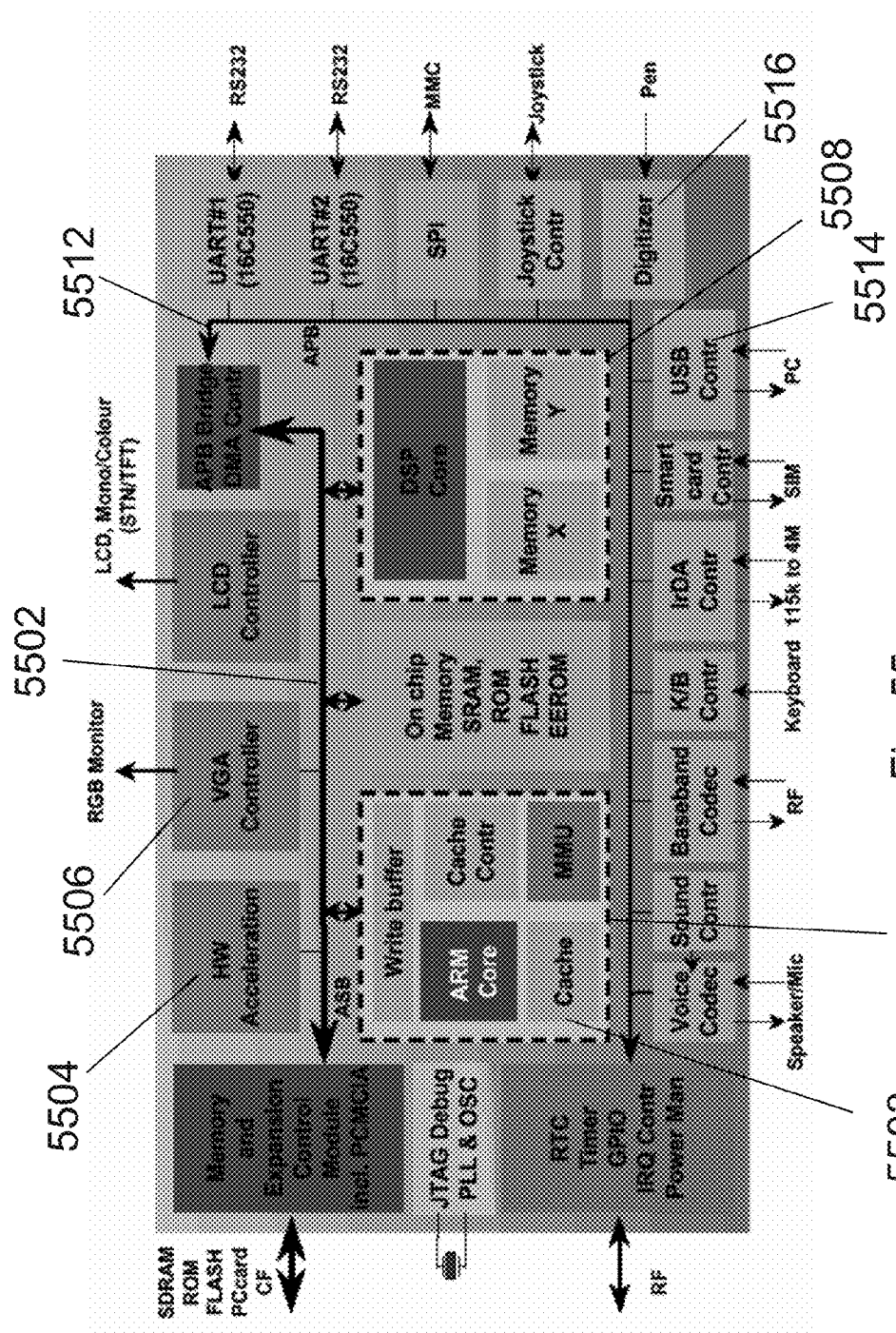
FIG. 55 illustrates a flowchart of a system that uses a processor and at least one bus.
Figure 56A:
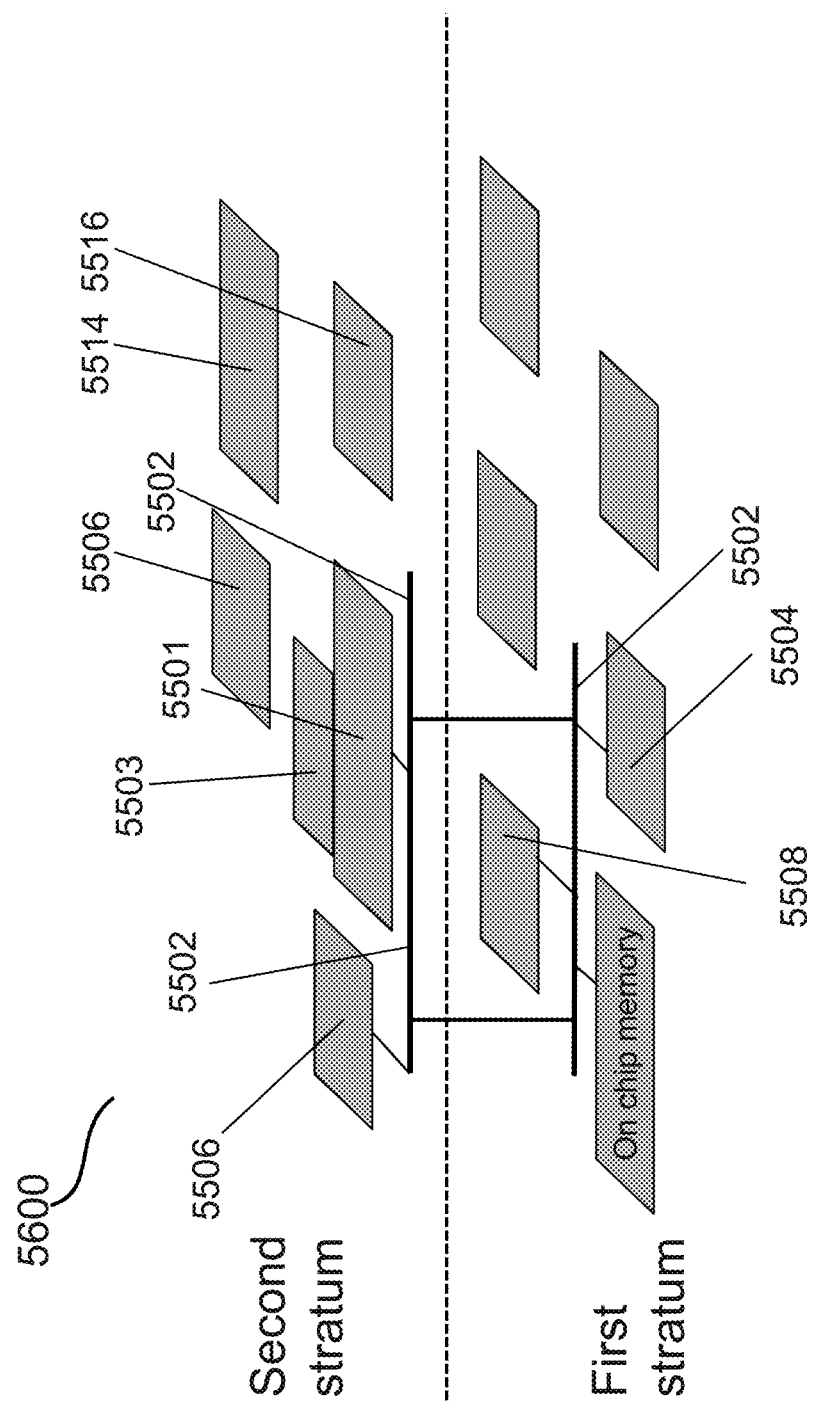
FIG. 56A illustrates an exemplary partitioned 3D system/device.

Many devices may have at least one processor on chip and often more than one. In most cases these processors use at least one bus to commonly communicate with multiple sub systems such as memory and peripherals. FIG. 55 is a drawing illustration of a system that uses a processor such as ARM processor 5501 that is connected directly with some cache memory 5503 and using a bus 5502 to connect to multiple sub systems, such as, for example, Hardware Acceleration 5504 and graphic controller 5506. Bus 5502 could be used by a second processing unit such as DSP 5508 to connect to other elements in the overall system. Such a system could also include additional secondary bus 5512 to manage the connection of peripheral units such as, for example, USB Controller 5514 and Digitizer 5516. In many cases a design objective may be to achieve a higher speed of processor operation or to reduce power by making the lines constructing the bus shorter. In a 3D system such objective might be achieved, for example, by properly splitting/partitioning the subsystems connecting to the bus 5502 between the stratum the processor 5501 is on and another stratum that is either above it or below it. (See, for example, FIG. 56A, an exemplary 3D system/device 5600). Another objective related to such splitting/partitioning relates to the fact that some of the units, for example, graphic controller 5506, USB Controller 5514 and Digitizer 5516, have at least one (typically many) connection to external devices, and it may be desired to place those particular logic units on the strata closer to the connection to the external devices, which in some cases might be the top-most stratum. Many types of buses may be utilized in a 3D system, such as, for example, an Advanced Microcontroller Bus Architecture (AMBA) bus, a CoreConnect bus, a STBus, a Wishbone bus, an Open Core Protocol (OCP) bus, or a Virtual Component Interface (VCI) bus.

Figure 56B:
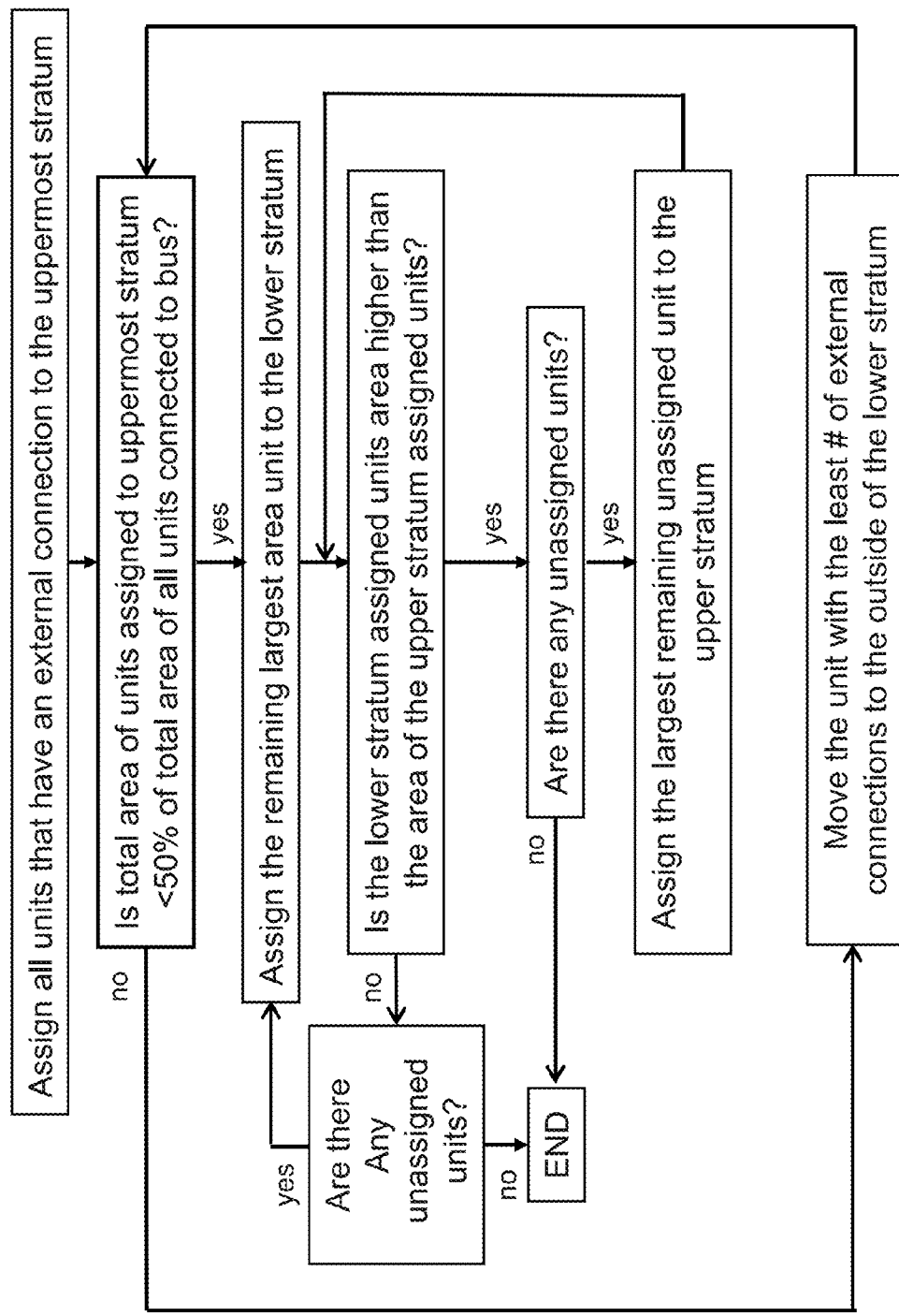
FIG. 56B illustrates a flowchart of partitioning logic units onto at least two stratums.

As illustrated in FIG. 56B, one such splitting/partitioning approach could suggest first placing the logic units that are connected to the bus and have an external connection on the upper stratum. Then, if the total area of these units is less than half of the total area of all the units connected to that bus, start assigning units to the lower stratum from the bigger units to the smaller until the area of those assigned to the lower stratum just exceeds the area of those logic units assigned to the upper stratum. Then assign the biggest un-assigned unit to the upper tier and repeat. If the total area of these units (those units first assigned to the upper stratum) is greater than half of the total area of all the units connected to that bus, then move the unit with the least number of external connections may be moved to the lower stratum (outside if possible for potentially better connectivity), and repeat if necessary to bring the upper stratum assigned area to just below 50% of the total area of all the units connected to that specific bus.

Figure 57A:
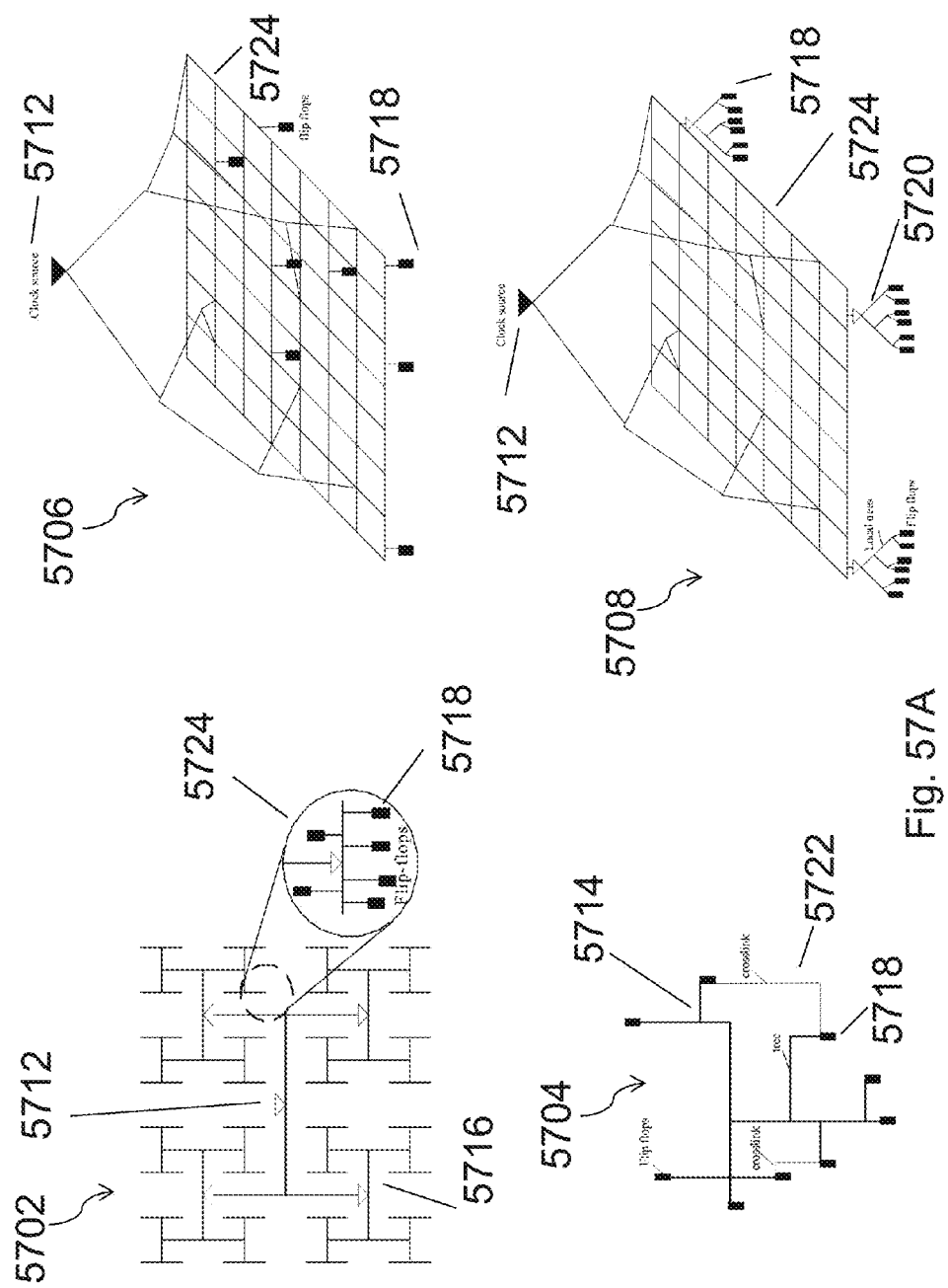
FIG. 57A illustrates different Clock distribution network styles.

FIG. 57A is a drawing illustration of different Clock distribution network styles. Many logic circuits or logic units use a clock tree to distribute a clock signal to the Flip-Flops. A common style of clock tree is the H-Clock Tree 5702. The origin point of the clock signal 5712 is driving a first H-Tree from the center of the H. Subsequently, each end-point of the H is an origin of the next H 5716, and so forth. The final edge 5724 drives the individual Flip-Flop cluster 5718.

Figure 57B:
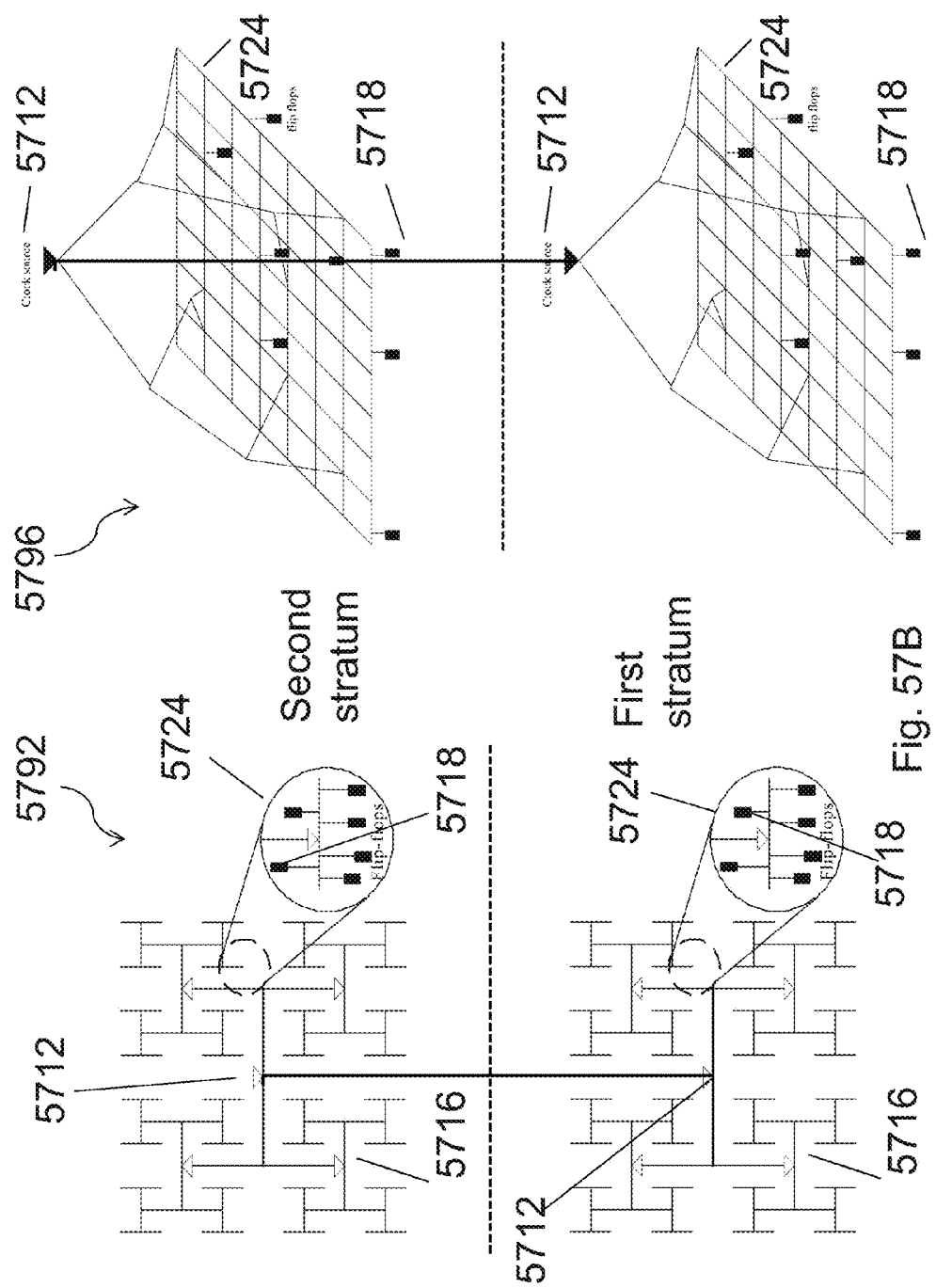
FIGS. 57B and 57C illustrate exemplary 3D system/device clock distribution networks.
Figure 57C:
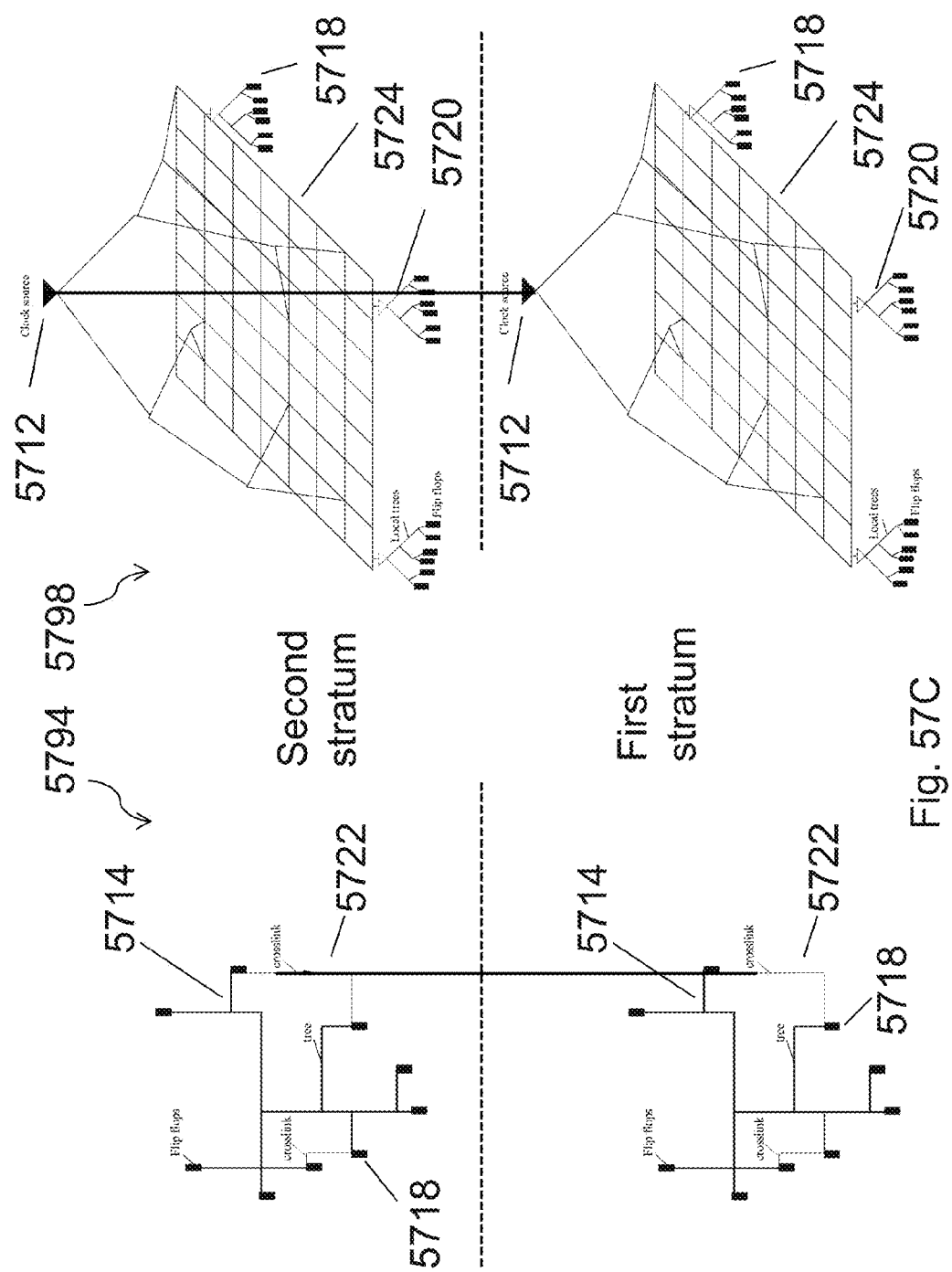

In some cases it may be desired to reduce the skew between edges as illustrated in the branch tree 5704 wherein a clock tree branches 5714 are shorted by cross-link 5722. Another style of clock distribution is called Mesh 5706 where a grid of connection is used to distribute the clock signal. These schemes may be combined to form a hybrid 5708 where a tree 5720 may be added to a grid 5725. In a 3D device it might be desired to split logic circuits between at least two strata including circuits that share the same clock domain In such case it might be desired to first connect the clock origin to each strata that has circuits that use that clock domain, then to construct within each stratum a clock distribution structure that might include a clock tree such as, for example, H tree, or grid and tree combination or other clock distribution scheme used in the art. (See, for example, FIGS. 57B and 57C, for exemplary 3D system/device clock distribution networks H-Clock 5792, Mesh 5796, branch tree 5794, hybrid 5798). Some circuits could have an interaction between strata wherein a signal may be generated in one stratum and that signal is used and latched on another stratum, and accordingly the skew between Flip-Flop on one stratum and the other would be reduced. A cross-link 5722 could be used between stratum, such as, for example, a TLV or TSV. Alternatively a grid 5724 could be constructed spanning multiple stratum reducing the clock skew between them. In some cases the origin of the clock may be either driven by a signal coming from outside of the 3D device or generated by a circuit on the 3D device such as for example, a Phase-Lock-Loop, which may be synchronized to a signal from outside of the 3D device. Accordingly it might be desired to first process the clock signal at the upper-most stratum and then drive it down to the origins of the clock distribution structures at the desired stratum or stratums. The clock origin of the clock distribution structure and circuits on one stratum may be connected to the origin of the clock distribution structure and circuits of a second stratum, with one feeding the other.

Another serious problem with designing semiconductor devices as the lithography minimum feature size scales down is signal re-buffering using repeaters. With the increased resistivity of metal traces in the deep sub-micron regime, signals need to be re-buffered at rapidly decreasing intervals to maintain circuit performance and immunity to circuit noise. This phenomenon has been described at length in "Prashant Saxena, et al., Repeater Scaling and Its Impact on CAD, IEEE Transactions On Computer-Aided Design of Integrated Circuits and Systems, Vol. 23, No. 4, April 2004." The current invention offers a new way to minimize the routing impact of such re-buffering. Long distance signals are frequently routed on high metal layers to give them special treatment like wire size or isolation from crosstalk. When signals present on high metal layers need re-buffering, an embodiment of the present invention is to use the active layer or strata above to insert repeaters, rather than drop the signal all the way to the diffusion layer of its current layer or strata. This approach reduces the routing blockages created by the large number of vias created when signals repeatedly need to move between high metal layers and the diffusion below, and suggests to selectively replace them with fewer vias to the active layer above.

Manufacturing wafers with advanced lithography and multiple metal layers is expensive. Manufacturing three-dimensional devices, including monolithic 3D devices, where multiple advanced lithography layers or strata each with multiple metal layers are stacked on top of each other is even more expensive. The vertical stacking process offers new degree of freedom that can be leveraged with appropriate Computer Aided Design ("CAD") tools to lower the manufacturing cost.

Most designs are made of blocks, but the characteristics of these block is frequently not uniform. Consequently, certain blocks may require fewer routing resources, while other blocks may require very dense routing resources. In two dimensional devices the block with the highest routing density demands dictates the number of metal layers for the whole device, even if some device regions may not need them. Three dimensional devices offer a new possibility of partitioning designs into multiple layers or strata based on the routing demands of the blocks assigned to each layer or strata.

Another variation on this invention is to partition designs into blocks that require a particular advanced process technology for reasons of density or speed, and blocks that have less demanding requirements for reasons of speed, area, voltage, power, or other technology parameters. Such partitioning may be carried into two or more partitions and consequently different process technologies or nodes may be used on different vertical layers or strata to provide optimized fit to the design's logic and cost demands. This is particularly important in mobile, mass-produced devices, where both cost and optimized power consumption are of paramount importance.

Synthesis CAD tools currently used in the industry for two-dimensional devices include a single target library. For three-dimensional designs these synthesis tools or design automation tools may need to be enhanced to support two or more target libraries to be able to support synthesis for disparate technology characteristics of vertical layers or strata. Such disparate layers or strata will allow better cost or power optimization of three-dimensional designs.

Figure 51:
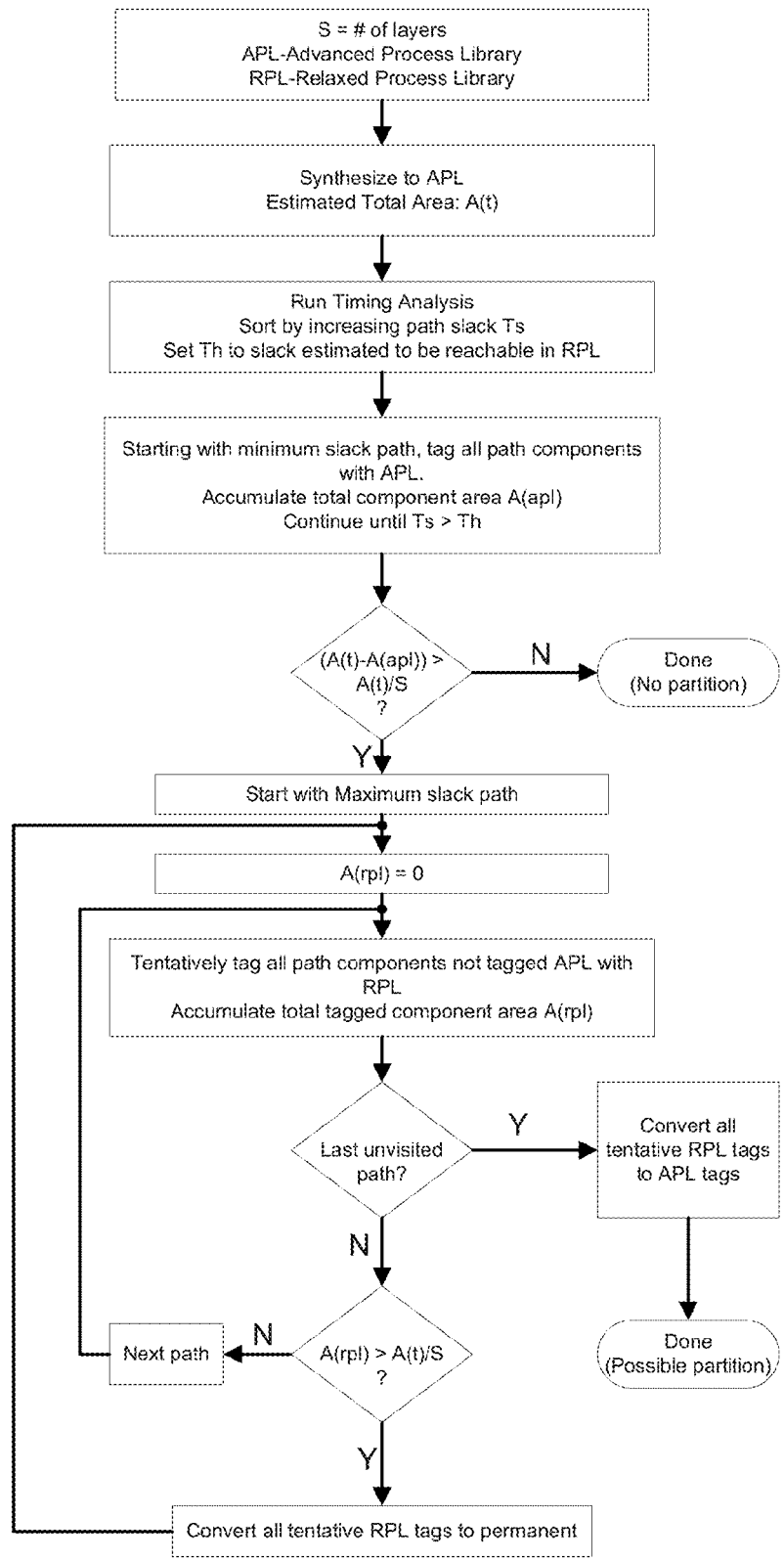
FIG. 51 illustrates a flowchart of partitioning a design into two disparate target technologies based on timing requirements.

FIG. 51 is a flowchart illustration for an algorithm partitioning a design into two target technologies, each to be placed on a separate layer or strata, when the synthesis tool or design automation tool does not support multiple target technologies. One technology, APL (Advanced Process Library), may be faster than the other, RPL (Relaxed Process Library), with concomitant higher power, higher manufacturing cost, or other differentiating design attributes. The two target technologies may be two different process nodes, wherein one process node, such as the APL, may be more advanced in technology than the other process node, such as the RPL. The RPL process node may employ much lower cost lithography tools and have lower manufacturing costs than the APL.

The partitioning starts with synthesis into APL with a target performance. Once complete, timing analysis may be done on the design and paths may be sorted by timing slack. The total estimated chip area A(t) may be computed and reasonable margins may be added as usual in anticipation of routing congestion and buffer insertion. The number of vertical layers S may be selected and the overall footprint A(t)/S may be computed.

In the first phase components belonging to paths estimated to require APL, based on timing slack below selected threshold Th, may be set aside (tagged APL). The area of these component may be computed to be A(apl). If A(apl) represents a fraction of total area A(t) greater than (S−1)/S then the process terminates and no partitioning into APL and RPL is possible—the whole design needs to be in the APL.

If the fraction of the design that requires APL is smaller than (S−1)/S then it is possible to have at least one layer of RPL. The partitioning process now starts from the largest slack path and towards lower slack paths. It tentatively tags all components of those paths that are not tagged APL with RPL, while accumulating the area of the marked components as A(rpl). When A(rpl) exceeds the area of a complete layer, A(t)/S, the components tentatively marked RPL may be permanently tagged RPL and the process continues after resetting A(rpl) to zero. If all paths are revisited and the components tentatively tagged RPL do not make for an area of a complete layer or strata, their tagging may be reversed back to APL and the process is terminated. The reason is that we want to err on the side of caution and a layer or strata should be an APL layer if it contains a mix of APL and RPL components.

The process as described assumes the availability of equivalent components in both APL and RPL technology.

Ordinary persons skilled in the art will recognize that variations on this process can be done to accommodate non-equivalent technology libraries through remapping of the RPL-tagged components in a subsequent synthesis pass to an RPL target library, while marking all the APL-tagged components as untouchable. Similarly, different area requirements between APL and RPL can be accommodated through scaling and de-rating factors at the decision making points of the flow. Moreover, the term layer, when used in the context of layers of mono-crystalline silicon and associated transistors, interconnect, and other associated device structures in a 3D device, such as, for example, uncommitted repair layer 2432, may also be referred to as stratum or strata.

The partitioning process described above can be re-applied to the resulting partitions to produce multi-way partitioning and further optimize the design to minimize cost and power while meeting performance objectives.

While embodiments and applications of the present invention have been shown and described, it would be apparent to those of ordinary skill in the art that many more modifications than mentioned above are possible without departing from the inventive concepts herein. It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Rather, the scope of the invention includes both combinations and sub-combinations of the various features described herein above as well as modifications and variations which would occur to such skilled persons upon reading the foregoing description. Thus the invention is to be limited only by the appended claims.

We claim:

1. A 3D structure, the structure comprising:
a first stratum overlaid by a second stratum, said second stratum is less than two microns thick,
   wherein said first stratum comprises an array of memory cells comprising at least four rows of memory cells, each of said rows is controlled by a bit-line,
   wherein said array of memory cells comprises a plurality of columns of memory cells, each of said columns is controlled by a word-line,
   wherein said second stratum comprises memory control circuits directly connected to said bit-lines and said word-lines,
   wherein said second stratum comprises a first layer comprising first transistors and a second layer comprising second transistors,
   wherein said first layer comprises a first bus, said first bus interconnecting a plurality of first logic units,
   wherein said second layer comprises a second bus, said second bus interconnecting a plurality of second logic units, and
   wherein said first bus and said second bus are interconnected so said second logic units could communicate through said first bus with at least one of said first logic units.

2. The 3D structure according to claim 1,
wherein said 3D structure is designed such that it could be processed to form a first 3D device and a second 3D device,
wherein said first 3D device comprises many more memory cells than said second 3D device.

3. The 3D structure according to claim 1,
wherein said 3D structure is designed to perform self-test and repair partly by activating a built-in redundancy.

4. The 3D structure according to claim 1,
wherein said second stratum is connected with a face to face connection to said first stratum.

5. The 3D structure according to claim 1, further comprising:
a wireless connection channel to at least one external device.

6. The 3D structure according to claim 1,
wherein said first bus is one of the following:
   i.) an Advanced Microcontroller Bus Architecture (AMBA) bus;
   ii) a CoreConnect bus;
   iii) a STBus;
   iv.) a Wishbone bus;
   v.) an Open Core Protocol (OCP) bus, or
   vi.) a Virtual Component Interface (VCI) bus.

7. The 3D structure according to claim 1, further comprising:
vias,
   wherein said directly connected comprises said vias, and
   wherein said vias have a radius of less than 400 nm.

8. A 3D structure, the structure comprising:
a first stratum overlaid by a second stratum, said second stratum is less than two microns thick,
   wherein said first stratum comprises an array of memory cells comprising at least four rows of memory cells, each of said rows is controlled by a bit-line,
   wherein said array of memory cells comprises a plurality of columns of memory cells, each of said columns is controlled by a word-line,
   wherein said second stratum comprises memory control circuits directly connected to control said memory cells,
   wherein said second stratum comprises a first layer comprising first transistors and a second layer comprising second transistors,
   wherein said first layer comprises a first bus, said first bus interconnecting a plurality of first logic units,
   wherein said second layer comprises a second bus, said second bus interconnecting a plurality of second logic units,
   wherein said first bus and said second bus are interconnected so said second logic units could communicate through said first bus with at least one of said first logic units,
   wherein said 3D structure is designed such that it could be processed to form a first 3D device and a second 3D device, and
   wherein said first 3D device comprises many more memory cells than said second 3D device.

9. The 3D structure according to claim 8,
wherein said 3D structure is designed to perform self-test and repair partly by activating a built-in redundancy.

10. The 3D structure according to claim 8,
wherein said second stratum is connected with a face to face connection to said first stratum.

11. The 3D structure according to claim 8, further comprising:
a wireless connection channel to at least one external device.

12. The 3D structure according to claim 8,
wherein said first stratum comprises a layer select to support selecting said first stratum.

13. The 3D structure according to claim 8, further comprising:
vias,
wherein said directly connected comprises said vias, and
wherein said vias have a radius of less than 400 nm.

14. The 3D structure according to claim 8,
wherein said first bus is one of the following:
 i.) an Advanced Microcontroller Bus Architecture (AMBA) bus;
 ii) a CoreConnect bus;
 iii) a STBus;
 iv.) a Wishbone bus;
 v.) an Open Core Protocol (OCP) bus, or
 vi.) a Virtual Component Interface (VCI) bus.

15. A 3D structure, the structure comprising:
a first stratum overlaid by a second stratum, said second stratum is less than two microns thick,
 wherein said first stratum comprises an array of memory cells comprising at least four rows of memory cells, each of said rows is controlled by a bit-line,
 wherein said array of memory cells comprises a plurality of columns of memory cells, each of said columns is controlled by a word-line,
 wherein said second stratum comprises memory control circuits directly connected to control said memory cells,
 wherein said second stratum comprises a first layer comprising first transistors and a second layer comprising second transistors,
 wherein said first layer comprises a first bus, said first bus interconnecting a plurality of first logic units,
 wherein said second layer comprises a second bus, said second bus interconnecting a plurality of second logic units, and
 wherein said first bus and said second bus are interconnected so said second logic units could communicate through said first bus with at least one of said first logic units, and
 wherein said 3D structure is designed to perform self-test and repair itself partly by activating a built-in redundancy.

16. The 3D structure according to claim 15,
wherein said first bus is one of the following:
 i.) an Advanced Microcontroller Bus Architecture (AMBA) bus;
 ii) a CoreConnect bus;
 iii) a STBus;
 iv.) a Wishbone bus;
 v.) an Open Core Protocol (OCP) bus, or
 vi.) a Virtual Component Interface (VCI) bus.

17. The 3D structure according to claim 15,
wherein said second stratum is connected with a face to face connection to said first stratum.

18. The 3D structure according to claim 15, further comprising:
a wireless connection channel to at least one external device.

19. The 3D structure according to claim 15,
wherein said first stratum comprises a layer select to support selecting said first stratum.

20. The 3D structure according to claim 15, further comprising:
vias,
wherein said directly connected comprises said vias, and
wherein said vias have a radius of less than 400 nm.

* * * * *